United States Patent
Cha et al.

(10) Patent No.: US 12,490,653 B2
(45) Date of Patent: Dec. 2, 2025

(54) ORGANIC LIGHT EMITTING DIODE

(71) Applicant: LG CHEM, LTD., Seoul (KR)

(72) Inventors: Yongbum Cha, Daejeon (KR); Boonjae Jang, Daejeon (KR); Sung Kil Hong, Daejeon (KR); Sang Duk Suh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 972 days.

(21) Appl. No.: 16/761,908

(22) PCT Filed: Jan. 28, 2019

(86) PCT No.: PCT/KR2019/001160
§ 371 (c)(1),
(2) Date: Jul. 30, 2020

(87) PCT Pub. No.: WO2019/151733
PCT Pub. Date: Aug. 8, 2019

(65) Prior Publication Data
US 2021/0050528 A1    Feb. 18, 2021

(30) Foreign Application Priority Data

Feb. 2, 2018    (KR) .................. 10-2018-0013360

(51) Int. Cl.
*H10K 85/60*    (2023.01)
*C09K 11/06*    (2006.01)
(Continued)

(52) U.S. Cl.
CPC ............ *H10K 85/654* (2023.02); *C09K 11/06* (2013.01); *H10K 85/115* (2023.02);
(Continued)

(58) Field of Classification Search
CPC .................... H10K 85/6572; C09K 11/06
See application file for complete search history.

(56) References Cited

U.S. PATENT DOCUMENTS

2004/0251816 A1    12/2004    Leo et al.
2005/0181232 A1*    8/2005    Ricks ............... H05B 33/14
                                                                        428/917
(Continued)

FOREIGN PATENT DOCUMENTS

CN    105612237 A    5/2016
CN    106164215 A    11/2016
(Continued)

*Primary Examiner* — Sean M DeGuire
(74) *Attorney, Agent, or Firm* — Bryan Cave Leighton Paisner LLP

(57) ABSTRACT

An organic light emitting device including: a positive electrode; a negative electrode facing the positive electrode; a light emitting layer between the positive electrode and the negative electrode; a first organic material layer comprising a compound of Formula 1 provided between the negative electrode and the light emitting layer; and a second organic material layer comprising at least one compound of Formulae 2 or 3 provided between the negative electrode and the first organic material layer: wherein the first organic layer Formula 1

(Continued)

-continued

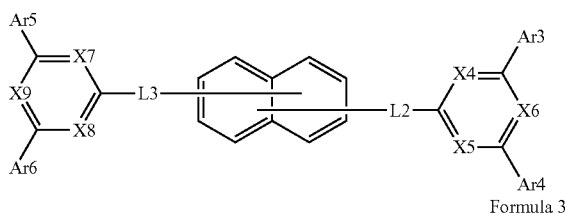

Formula 2

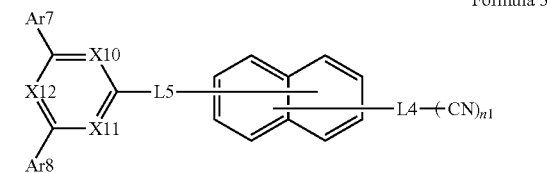

Formula 3 at least one of X1 to X3 is N, at least one of X4 to X6 is N, at least one of X7 to X9 is N, and at least one of X10 to X12 is N, and each remaining one is CH;

R1 and R2 are each independently a substituted or unsubstituted alkyl or aryl group, or together form a substituted or unsubstituted hydrocarbon ring;

each of L1, L2, L3 and L5 independently is a direct bond or a substituted or unsubstituted arylene group;

L4 is a divalent or trivalent aromatic hydrocarbon group;

Ar1 and Ar2 are each independently a substituted or unsubstituted aryl or heteroaryl group;

Ar3 to Ar8 are each independently a substituted or unsubstituted aryl group; and n1 is 1 or 2.

12 Claims, 1 Drawing Sheet

(51) Int. Cl.
| | | |
|---|---|---|
| *H10K 85/10* | (2023.01) | |
| *H10K 50/16* | (2023.01) | |
| *H10K 50/17* | (2023.01) | |
| *H10K 50/18* | (2023.01) | |

(52) U.S. Cl.
CPC ..... *H10K 85/6572* (2023.02); *H10K 85/6574* (2023.02); *H10K 85/6576* (2023.02); *H10K 50/16* (2023.02); *H10K 50/171* (2023.02); *H10K 50/18* (2023.02)

(56) References Cited

U.S. PATENT DOCUMENTS

| | | | |
|---|---|---|---|
| 2006/0177691 A1 | 8/2006 | Tai et al. | |
| 2007/0051944 A1* | 3/2007 | Vestweber | .......... C07D 251/24 |
| | | | 257/E51.012 |
| 2011/0049494 A1 | 3/2011 | Kim et al. | |
| 2015/0162543 A1* | 6/2015 | Lee | ...... C07D 213/06 |
| | | | 136/263 |
| 2016/0218288 A1 | 7/2016 | Huh et al. | |
| 2016/0276596 A1* | 9/2016 | Jang | ........... H10K 85/626 |
| 2017/0279055 A1 | 9/2017 | Jang et al. | |
| 2018/0066180 A1* | 3/2018 | Huh | ............ C07D 251/12 |
| 2018/0222872 A1* | 8/2018 | Jatsch | ............ C07D 405/10 |
| 2018/0354913 A1 | 12/2018 | Jung et al. | |
| 2019/0055222 A1 | 2/2019 | Han et al. | |
| 2019/0067591 A1 | 2/2019 | Jang | |

FOREIGN PATENT DOCUMENTS

| | | | | |
|---|---|---|---|---|
| KR | 10-20000051826 | | 8/2000 | |
| KR | 10-2011-0023090 A | | 3/2011 | |
| KR | 10-2013-0098226 | | 9/2013 | |
| KR | 2015037318 A | * | 4/2015 | .......... C07D 401/10 |
| KR | 10-20160049500 | | 5/2016 | |
| KR | 10-20160111780 | | 9/2016 | |
| KR | 10-20160126862 | | 11/2016 | |
| KR | 10-2017-0039020 | | 4/2017 | |
| KR | 2017039020 A | * | 4/2017 | .......... C07D 307/91 |
| KR | 10-20170049440 | | 5/2017 | |
| KR | 10-20170065317 | | 6/2017 | |
| KR | 10-20170111802 | | 10/2017 | |
| KR | 10-20170141144 | | 12/2017 | |
| KR | 10-20180010168 | | 1/2018 | |
| KR | 10-20180042818 | | 4/2018 | |
| TW | 200628583 A | | 8/2006 | |
| WO | 2003012890 | | 2/2003 | |
| WO | WO-2016171406 A2 | * | 10/2016 | .......... C07D 251/12 |

* cited by examiner

ORGANIC LIGHT EMITTING DIODE

CROSS-REFERENCE TO RELATED APPLICATIONS

This application is a National Stage Application of International Application No. PCT/KR2019/001160 filed on Jan. 28, 2019, which claims priority to and the benefit of Korean Patent Application No. 10-2018-0013360 filed in the Korean Intellectual Property Office on Feb. 2, 2018, the entire contents of which are incorporated herein by reference.

TECHNICAL FIELD

The present specification relates to an organic light emitting device.

BACKGROUND

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron transport layer, an electron injection layer, and the like. In the structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state.

There is a continuous need for developing a new material for the aforementioned organic light emitting device.

BRIEF DESCRIPTION

Technical Problem

The present specification provides an organic light emitting device.

Technical Solution

The present specification provides an organic light emitting device including: a positive electrode; a negative electrode provided to face the positive electrode; a light emitting layer provided between the positive electrode and the negative electrode; a first organic material layer provided between the negative electrode and the light emitting layer; and a second organic material layer provided between the negative electrode and the first organic material layer, in which the first organic material layer comprises a compound of the following Formula 1, and the second organic material layer comprises at least one compound of the following Formulae 2 and 3:

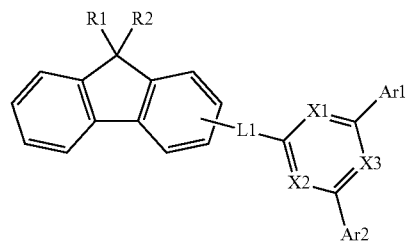

Formula 1 wherein in Formula 1:
at least one of X1 to X3 is N, and each of the remaining is CH;
R1 and R2 are the same as or different from each other, and are each independently a substituted or unsubstituted alkyl group, or a substituted or unsubstituted aryl group, or are bonded to each other to form a substituted or unsubstituted hydrocarbon ring;
L1 is a direct bond or a substituted or unsubstituted arylene group;
Ar1 and Ar2 are the same as or different from each other, and are each independently a substituted or unsubstituted aryl group or a substituted or unsubstituted heteroaryl group;

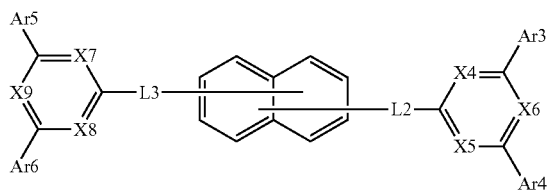

Formula 2 wherein in Formula 2:
at least one of X4 to X6 is N, and each remaining one is CH;
at least one of X7 to X9 is N, and each remaining one is CH;
L2 and L3 are the same as or different from each other, and are each independently a direct bond or a substituted or unsubstituted arylene group;
Ar3 to Ar6 are the same as or different from each other, and are each independently a substituted or unsubstituted aryl group;

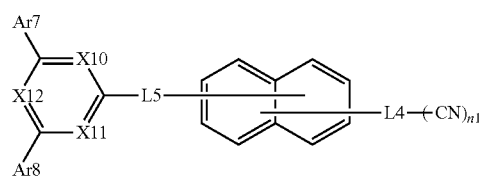

Formula 3 wherein in Formula 3:
at least one of X10 to X12 is N, and each remaining one is CH;
L4 is a divalent or trivalent aromatic hydrocarbon group;
L5 is a direct bond or a substituted or unsubstituted arylene group;

Ar7 and Ar8 are the same as or different from each other, and are each independently a substituted or unsubstituted aryl group; and n1 is 1 or 2.

Advantageous Effects

An organic light emitting device according to an exemplary embodiment of the present specification can improve a low voltage, service life characteristics and/or efficiency characteristics of the device.

Figure 1:
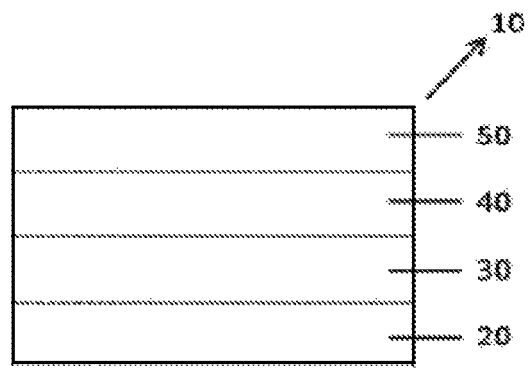
FIG. 1 illustrates an organic light emitting device 10 according to an exemplary embodiment of the present specification.

DESCRIPTION OF REFERENCE NUMERALS 10, 11: Organic light emitting device
20: Substrate
30: Positive electrode
40: Light emitting layer
50: Negative electrode
60: Hole injection layer
70: Hole transport layer
80: Hole blocking layer
90: Electron transport layer
100: Electron injection layer

DETAILED DESCRIPTION

Hereinafter, the present specification will be described in more detail.

The present specification provides an organic light emitting device including: a positive electrode; a negative electrode provided to face the positive electrode; a light emitting layer provided between the positive electrode and the negative electrode; a first organic material layer provided between the negative electrode and the light emitting layer; and a second organic material layer provided between the negative electrode and the first organic material layer, in which the first organic material layer comprises the compound of Formula 1 and the second organic material layer comprises at least one of the compounds of Formula 2 and 3.

According to an exemplary embodiment of the present specification, the first organic material layer is a hole blocking layer.

According to an exemplary embodiment of the present specification, Formula 1 is a compound in which a monocyclic hetero ring is bonded to a fluorene core through a linking group, and is excellent in the ability to block holes because holes transferred from a light emitting layer are blocked.

According to an exemplary embodiment of the present specification, the second organic material layer is an electron injection layer, an electron transport layer, or a layer which simultaneously injects and transports electrons.

According to an exemplary embodiment of the present specification, the second organic material layer is an electron injection layer.

According to an exemplary embodiment of the present specification, the second organic material layer is an electron transport layer.

According to an exemplary embodiment of the present specification, the second organic material layer is a layer which simultaneously injects and transports electrons.

According to an exemplary embodiment of the present specification, since a compound of Formula 2 has a structure in which both monocyclic heteroaryl groups are bonded with naphthalene as the center, and a compound of Formula 3 has aromatic hydrocarbon groups which are substituted with a monocyclic heteroaryl group and a nitrile group, respectively, with naphthalene as the center, compounds of Formulae 2 and 3 have an appropriate twisted structure, and electronic interactions caused by conjugation are reduced, so that independent characteristics of the substituents are maintained, and the appropriately maintained conjugation has structural characteristics capable of preventing a phenomenon in which the service life of an organic light emitting device deteriorates due to the excessive injection of electrons, and as a result, compounds of Formulae 2 and 3 are appropriate to be used for an electron transport layer.

Further, in compounds of Formulae 2 and 3, naphthalene serves as an electron donor and the substitution serve as an electron acceptor, and when the two units are spaced apart from each other by a predetermined distance, the orbital distributions of a HOMO and a LUMO are smooth, so that when at least one of the compounds of Formula 2 and 3 is included as an electron transport layer material, characteristics of an organic light emitting device are improved.

In addition, since compounds of Formulae 2 and 3 include a naphthalene core which is excellent in ability to inject electrons and heat stability and in which triazine is substituted, an organic light emitting device including a compound of Formulae 2 and 3 can improve a driving voltage, light emitting efficiency, and service life characteristics of the device.

When one part "comprises" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium, a halogen group, a nitrile group, a nitro group, an imide group, an amide group, a carbonyl group, an ether group, an ester group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, and a substituted or unsubstituted heterocyclic group or being substituted with a substituent to which two or more substituents are linked among the substituents exemplified above, or having no substituent. For example, "the substituent to which two or more substituents are linked" can be a biphenyl group. That is, the biphenyl group can also be an aryl group, and can be interpreted as a substituent to which two phenyl groups are linked.

In the present specification,

means a moiety bonded to another substituent or a bonding portion.

In the present specification, a halogen group can be fluorine, chlorine, bromine or iodine.

In the present specification, the number of carbon atoms of an imide group is not particularly limited, but is preferably 1 to 30. Specifically, the imide group can be a compound having the following structures, but is not limited thereto:

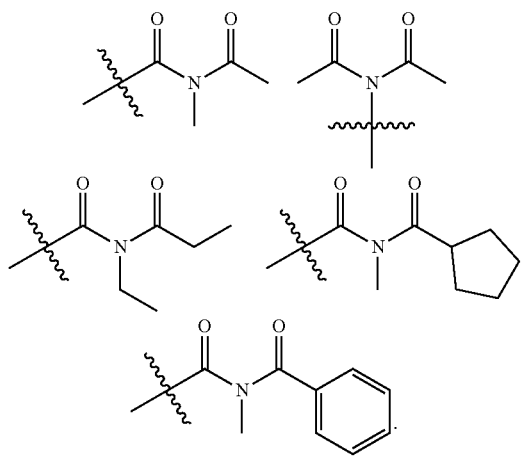

In the present specification, for an amide group, the nitrogen of the amide group can be substituted with hydrogen, a straight-chained, branched, or cyclic alkyl group having 1 to 30 carbon atoms, or an aryl group having 6 to 30 carbon atoms. Specifically, the amide group can be a compound having the following structural formulae, but is not limited thereto:

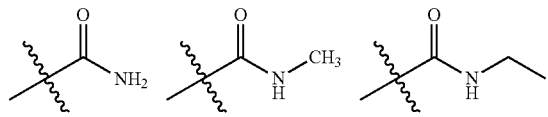

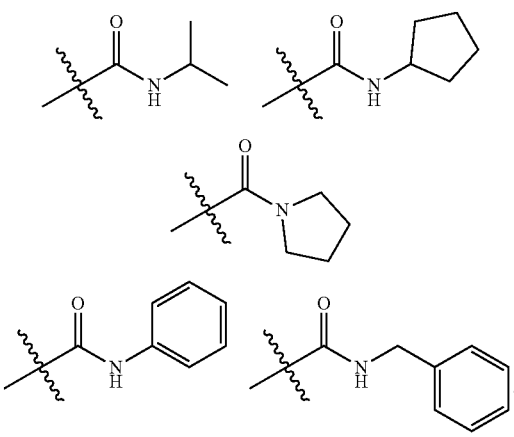

In the present specification, the number of carbon atoms of a carbonyl group is not particularly limited, but is preferably 1 to 30. Specifically, the carbonyl group can be a compound having the following structures, but is not limited thereto:

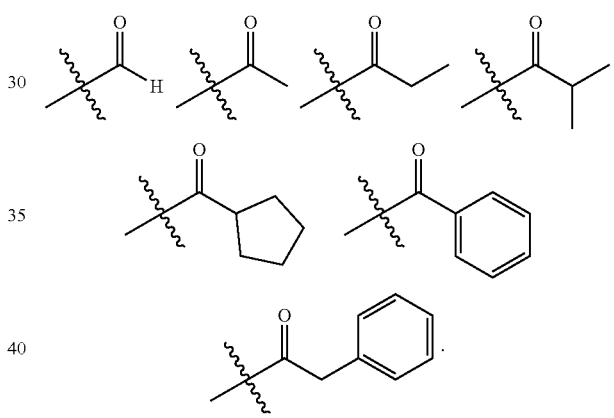

In the present specification, for an ester group, the oxygen of the ester group can be substituted with a straight-chained, branched, or cyclic alkyl group having 1 to 25 carbon atoms, or an aryl group having 6 to 30 carbon atoms. Specifically, the ester group can be a compound having the following structural formulae, but is not limited thereto:

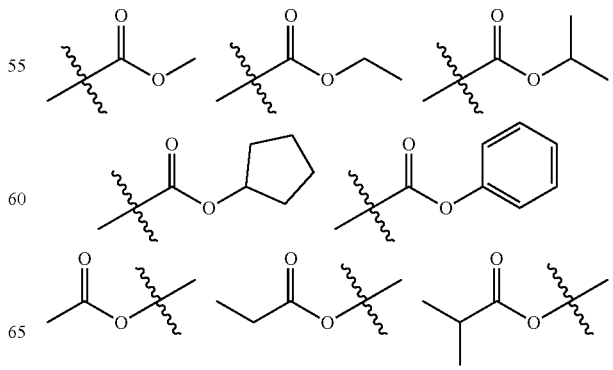

-continued

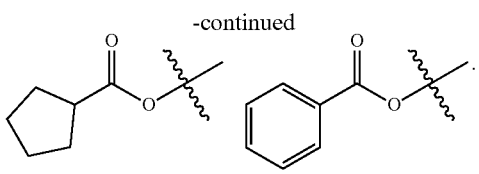

In the present specification, for an ether group, the oxygen of the ether group can be substituted with a straight-chained, branched, or cyclic alkyl group having 1 to 25 carbon atoms, or an aryl group having 6 to 30 carbon atoms. Specifically, the ether group can be a compound having the following structural formulae, but is not limited thereto:

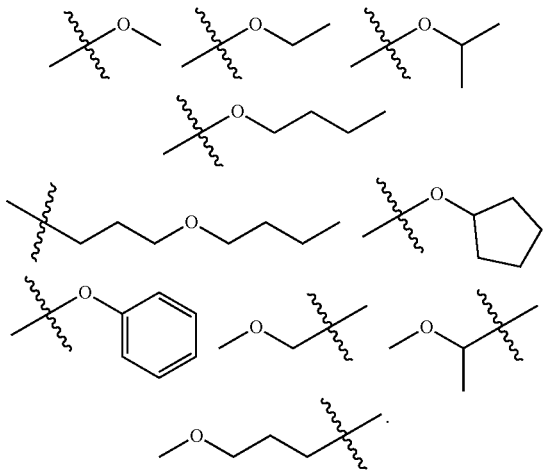

In the present specification, the alkyl group can be straight-chained or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methyl-pentyl, 4-methyl-2-pentyl, 3,3-dimethylbutyl, 2-ethyl-butyl, heptyl, n-heptyl, 1-methylhexyl, cyclopentyl-methyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methyl-cyclopentyl, 2,3-dimethyl-cyclopentyl, cyclohexyl, 3-methylcyclohexyl, 4-methylcyclo-hexyl, 2,3-dimethyl-cyclohexyl, 3,4,5-trimethylcy-clohexyl, 4-tert-butyl-cyclohexyl, cycloheptyl, cyclooctyl, and the like, but are not limited thereto.

In the present specification, the alkoxy group can be straight-chained, branched, or cyclic. The number of carbon atoms of the alkoxy group is not particularly limited, but is preferably 1 to 30. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methyl-benzyloxy, and the like, but are not limited thereto.

In the present specification, an amine group can be selected from the group consisting of —NH$_2$, a monoalkylamine group, a dialkylamine group, an N-alkylarylamine group, a monoarylamine group, a diarylamine group, an N-arylheteroarylamine group, an N-alkylheteroarylamine group, a monoheteroarylamine group, and a diheteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenyl-amine group, a diphenylamine group, a ditolylamine group, an N-phenyltolylamine group, a triphenylamine group, an N-phenylbiphenylamine group, an N-phenylnaphthylamine group, an N-biphenylnaphthylamine group, an N-naphthyl-fluorenyl-amine group, an N-phenylphenanthrenylamine group, an N-biphenylphenanthrenylamine group, an N-phenylfluorenyl-amine group, an N-phenyl terphenylamine group, an N-phenanthrenyl-fluorenylamine group, an N-biphenyl-fluorenylamine group, and the like, but are not limited thereto.

In the present specification, an N-alkylarylamine group means an amine group in which an alkyl group and an aryl group are substituted with N of the amine group.

In the present specification, an N-arylheteroaryl-amine group means an amine group in which an aryl group and a heteroaryl group are substituted with N of the amine group.

In the present specification, an N-alkylheteroaryl-amine group means an amine group in which an alkyl group and a heteroaryl group are substituted with N of the amine group.

In the present specification, examples of an alkylamine group include a substituted or unsubstituted monoalkylamine group or a substituted or unsubstituted dialkylamine group. The alkyl group in the alkylamine group can be a straight-chained or branched alkyl group. The alkylamine group including two or more alkyl groups can include a straight-chained alkyl group, a branched alkyl group, or both a straight-chained alkyl group and a branched alkyl group. For example, the alkyl group in the alkylamine group can be selected from the above-described examples of the alkyl group.

In the present specification, the alkyl group in the N-alkylarylamine group, the alkylthioxy group, the alkylsulfoxy group, and the N-alkylheteroarylamine group is the same as the above-described examples of the alkyl group. Specifically, examples of the alkylthioxy group include a methylthioxy group, an ethylthioxy group, a tert-butylthioxy group, a hexylthioxy group, an octyl-thioxy group, and the like, and examples of the alkyl-sulfoxy group include a methylsulfoxy group, an ethyl-sulfoxy group, a propylsulfoxy group, a butylsulfoxy group, and the like, but the examples are not limited thereto.

In the present specification, the alkenyl group can be straight-chained or branched, and the number of carbon atoms thereof is not particularly limited, but is preferably 2 to 30. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis-(diphenyl-1-yl)vinyl-1-yl, a stilbenyl group, a styrenyl group, and the like, but are not limited thereto.

In the present specification, specific examples of a silyl group include a trimethylsilyl group, a triethyl-silyl group, a t-butyldimethylsilyl group, a vinyl-dimethylsilyl group, a propyldimethylsilyl group, a triphenylsilyl group, a diphenylsilyl group, a phenyl-silyl group, and the like, but are not limited thereto.

In the present specification, a boron group can be —BR$_{100}$R$_{101}$, and R$_{100}$ and R$_{101}$ are the same as or different from each other, and each can be independently selected from the group consisting of hydrogen, deuterium, halogen, a nitrile group, a substituted or unsubstituted monocyclic or polycyclic cycloalkyl group having 3 to 30 carbon atoms, a substituted or unsubstituted straight-chained or branched alkyl group having 1 to 30 carbon atoms, a substituted or unsubstituted monocyclic or polycyclic aryl group having 6 to 30 carbon atoms, and a substituted or unsubstituted monocyclic or polycyclic heteroaryl group having 2 to 30 carbon atoms.

In the present specification, specific examples of a phosphine oxide group include a diphenylphosphine oxide group, a dinaphthylphosphine oxide group, and the like, but are not limited thereto.

In the present specification, an aryl group is not particularly limited, but has preferably 6 to 30 carbon atoms, and the aryl group can be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a triphenylenyl group, a pyrenyl group, a phenalenyl group, a perylenyl group, a chrysenyl group, a fluorenyl group, and the like, but are not limited thereto.

In the present specification, the fluorenyl group can be substituted, and adjacent substituents can be bonded to each other to form a ring.

When the fluorenyl group is substituted, the substituent can be

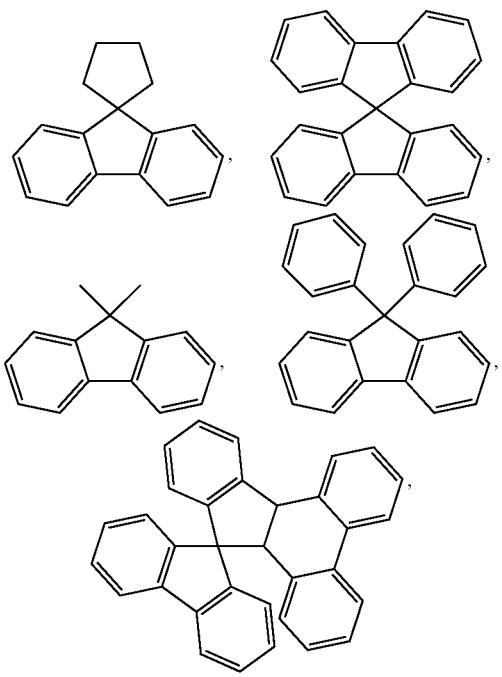

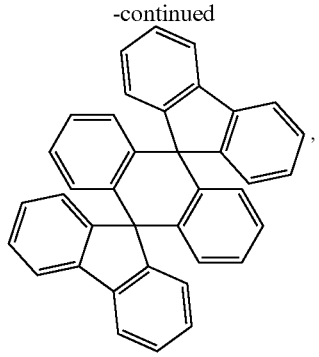

and the like.

However, the substituent is not limited thereto.

In the present specification, the "adjacent" group can mean a substituent substituted with an atom directly linked to an atom in which the corresponding substituent is substituted, a substituent disposed sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

In the present specification, the aryl group in the aryloxy group, the arylthioxy group, the arylsulfoxy group, the N-arylalkylamine group, the N-arylheteroaryl-amine group, and the arylphosphine group is the same as the above-described examples of the aryl group. Specifically, examples of the aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, examples of an arylamine group include a substituted or unsubstituted monoarylamine group or a substituted or unsubstituted diarylamine group. The aryl group in the arylamine group can be a monocyclic aryl group or a polycyclic aryl group. The arylamine group including two or more aryl groups can include a monocyclic aryl group, a polycyclic aryl group, or both a monocyclic aryl group and a polycyclic aryl group. For example, the aryl group in the arylamine group can be selected from the above-described examples of the aryl group.

In the present specification, a heteroaryl group includes one or more atoms other than carbon, that is, one or more heteroatoms, and specifically, the heteroatom can include one or more atoms selected from the group consisting of O, N, Se, S, and the like. The number of carbon atoms thereof is not particularly limited, but is preferably 2 to 30, and the heteroaryl group can be monocyclic or polycyclic. Examples of a heterocyclic group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinepyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthridine group, a phenanthrolinyl group (phenanthroline), an isoxazolyl group, a thiadiazolyl group, a phenothiazinyl group, a dibenzo-furan group, and the like, but are not limited thereto.

In the present specification, examples of a heteroarylamine group include a substituted or unsubstituted monoheteroarylamine group or a substituted or unsubstituted diheteroarylamine group. The heteroaryl-amine group including two or more heteroaryl groups can include a monocyclic heteroaryl group, a polycyclic heteroaryl group, or both a monocyclic heteroaryl group and a polycyclic heteroaryl group. For example, the heteroaryl group in the heteroarylamine group can be selected from the above-described examples of the heteroaryl group.

In the present specification, examples of the heteroaryl group in the N-arylheteroarylamine group and the N-alkylheteroarylamine group are the same as the above-described examples of the heteroaryl group.

In the present specification, in a substituted or unsubstituted hydrocarbon ring formed by bonding adjacent groups to each other, the "hydrocarbon ring" can be an aromatic ring, an aliphatic ring, or a fused ring of the aromatic ring and the aliphatic ring, and can be selected from the examples of the cycloalkyl group or the aryl group, except for the hydrocarbon ring which is not monovalent.

In the present specification, an arylene group means a group having two bonding positions in an aryl group, that is, a divalent group. The above-described description on the aryl group can be applied to the arylene group, except for a divalent group.

In the present specification, a divalent or trivalent aromatic hydrocarbon group can be monocyclic or polycyclic, and means a group having two or three bonding positions in the aryl group, that is, a divalent or trivalent group. The above-described description on the aryl group can be applied to the aromatic hydrocarbon group, except for a divalent or trivalent group.

According to an exemplary embodiment of the present specification, in Formula 1, R1 and R2 are the same as or different from each other, and are each independently an alkyl group or an aryl group.

According to an exemplary embodiment of the present specification, in Formula 1, R1 and R2 are the same as or different from each other, and are each independently a methyl group or a phenyl group.

According to an exemplary embodiment of the present specification, in Formula 1, R1 and R2 are a methyl group.

According to an exemplary embodiment of the present specification, in Formula 1, R1 and R2 are a phenyl group.

According to an exemplary embodiment of the present specification, in Formula 1, R1 and R2 are bonded to each other to form a hydrocarbon ring.

According to an exemplary embodiment of the present specification, in Formula 1, R1 and R2 are bonded to each other to form a fluorene ring.

According to an exemplary embodiment of the present specification, Formula 1 is any one of the following Formulae 1-1 to 1-3:

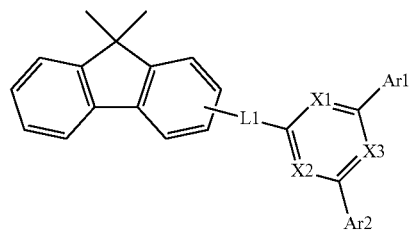

Formula 1-1

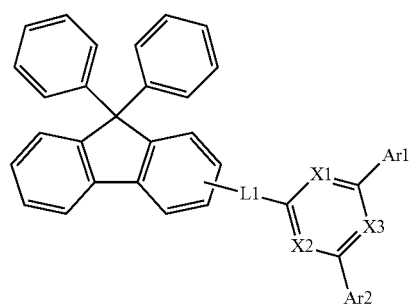

Formula 1-2

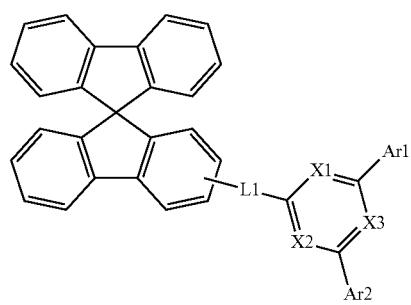

Formula 1-3 wherein in Formulae 1-1 to 1-3:

The definitions of L1, X1 to X3, Ar1, and Ar2 are the same as those defined in Formula 1.

According to an exemplary embodiment of the present specification, Formula 2 is any one of the following Formulae 2-1 to 2-8:

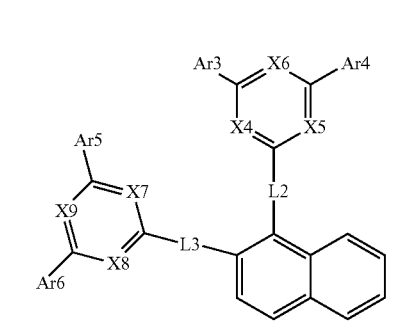

Formula 2-1

Formula 2-2
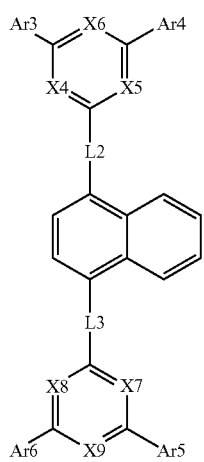
Formula 2-3
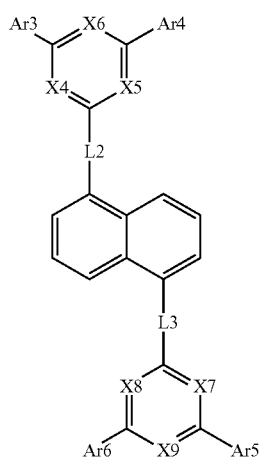
Formula 2-4
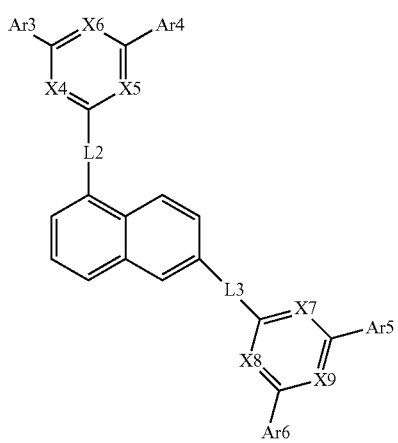
Formula 2-5
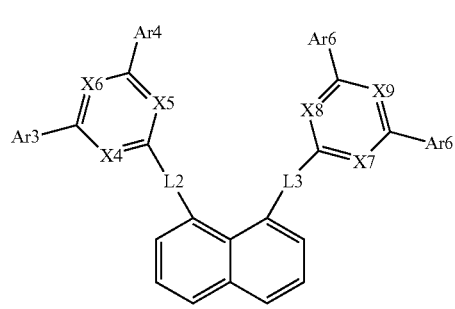
Formula 2-6
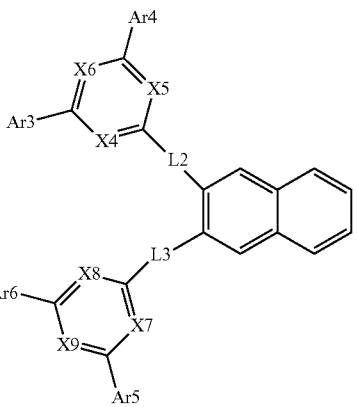
Formula 2-7
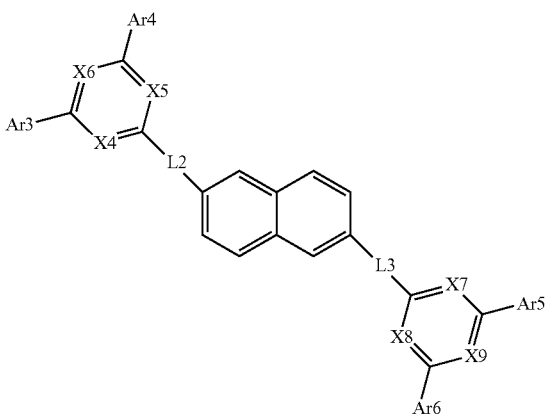
Formula 2-8
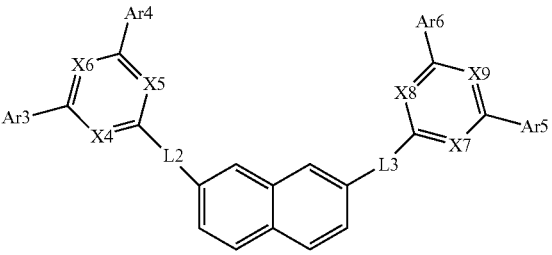
wherein Formulae 2-1 to 2-8:
definitions of X4 to X9, L2, L3, and Ar3 to Ar6 are the same as those defined in Formula 2.
According to an exemplary embodiment of the present specification, Formula 3 is any one of the following Formulae 3-1 to 3-8:
Formula 3-1
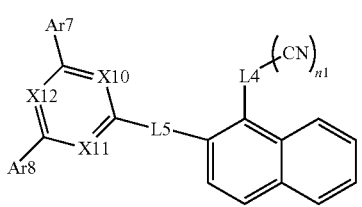

Formula 3-2

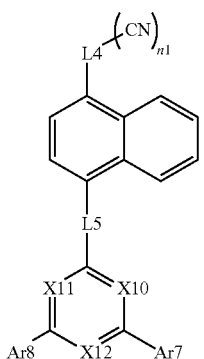

Formula 3-3

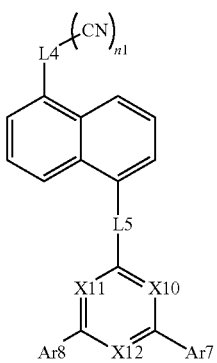

Formula 3-4

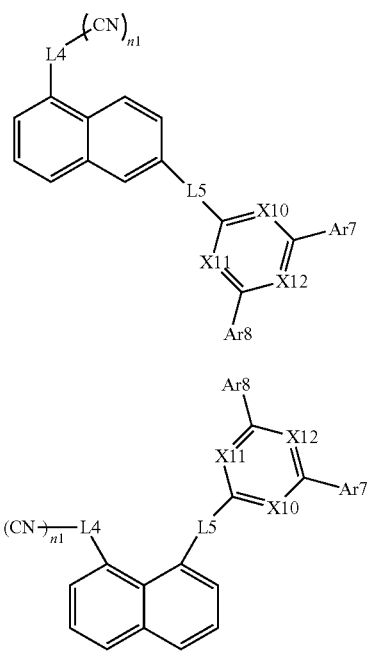

Formula 3-5

Formula 3-6

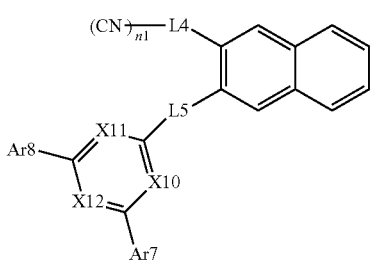

Formula 3-7

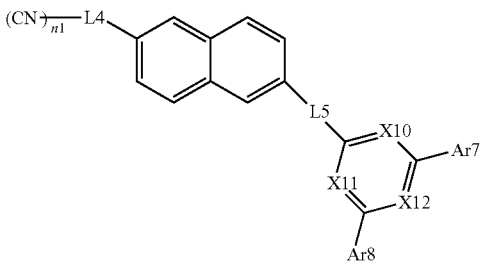

Formula 3-8

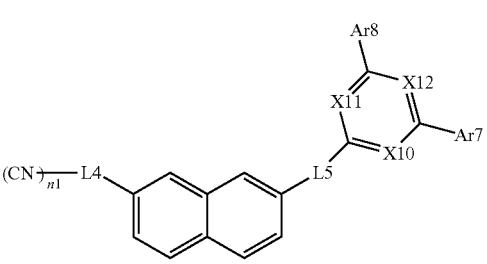

wherein in Formulae 3-1 to 3-8:
definitions of X10 to X12, L4, L5, Ar7, Ar8, and n1 are the same as those defined in Formula 3.

According to an exemplary embodiment of the present specification, L1 to L3 and L5 are the same as or different from each other, and are each independently a direct bond or an arylene group.

According to an exemplary embodiment of the present specification, L1 to L3 and L5 are the same as or different from each other, and are each independently a direct bond, a phenylene group, or a biphenylylene group.

According to an exemplary embodiment of the present specification, in Formula 1, any one of X1 to X3 is N, and any remaining one is CH.

According to an exemplary embodiment of the present specification, in Formula 1, X1 is N, and X2 and X3 are CH.

According to an exemplary embodiment of the present specification, in Formula 1, X2 is N, and X1 and X3 are CH.

According to an exemplary embodiment of the present specification, in Formula 1, X3 is N, and X1 and X2 are CH.

According to an exemplary embodiment of the present specification, in Formula 1, any two of X1 to X3 are N, and the remaining one is CH.

According to an exemplary embodiment of the present specification, in Formula 1, X1 and X2 are N, and X3 is CH.

According to an exemplary embodiment of the present specification, in Formula 1, X2 and X3 are N, and X1 is CH.

According to an exemplary embodiment of the present specification, in Formula 1, X1 and X3 are N, and X2 is CH.

According to an exemplary embodiment of the present specification, in Formula 1, X1 to X3 are N.

According to an exemplary embodiment of the present specification, in Formula 1, L1 is a direct bond or an arylene group.

According to an exemplary embodiment of the present specification, in Formula 1, L1 is a direct bond, a phenylene group, or a biphenylylene group.

According to an exemplary embodiment of the present specification, in Formula 1, Ar1 and Ar2 are the same as or different from each other, and are each independently an aryl group which is unsubstituted or substituted with an alkyl group; or a heteroaryl group.

According to an exemplary embodiment of the present specification, in Formula 1, Ar1 and Ar2 are the same as or different from each other, and are each independently a phenyl group; a biphenyl group; a naphthyl group; a fluorenyl group which is unsubstituted or substituted with an alkyl group; a dibenzofuran group; or a dibenzothiophene group.

According to an exemplary embodiment of the present specification, in Formula 1, Ar1 and Ar2 are the same as or different from each other, and are each independently a phenyl group, a biphenyl group, a naphthyl group, a fluorenyl group which is unsubstituted or substituted with a methyl group, a dibenzofuran group, or a dibenzothiophene group.

According to an exemplary embodiment of the present specification, in Formula 2, any one of X4 to X6 is N, and any remaining one is CH.

According to an exemplary embodiment of the present specification, in Formula 2, X4 is N, and X5 and X6 are CH.

According to an exemplary embodiment of the present specification, in Formula 2, X5 is N, and X4 and X6 are CH.

According to an exemplary embodiment of the present specification, in Formula 2, X6 is N, and X4 and X5 are CH.

According to an exemplary embodiment of the present specification, in Formula 2, any two of X4 to X6 are N, and the remaining one is CH.

According to an exemplary embodiment of the present specification, in Formula 2, X4 and X5 are N, and X6 is CH.

According to an exemplary embodiment of the present specification, in Formula 2, X5 and X6 are N, and X4 is CH.

According to an exemplary embodiment of the present specification, in Formula 2, X4 and X6 are N, and X5 is CH.

According to an exemplary embodiment of the present specification, in Formula 2, X4 to X6 are N.

According to an exemplary embodiment of the present specification, in Formula 2, any one of X7 to X9 is N, and any remaining one is CH.

According to an exemplary embodiment of the present specification, in Formula 2, X7 is N, and X8 and X9 are CH.

According to an exemplary embodiment of the present specification, in Formula 2, X8 is N, and X7 and X9 are CH.

According to an exemplary embodiment of the present specification, in Formula 2, X9 is N, and X7 and X8 are CH.

According to an exemplary embodiment of the present specification, in Formula 2, any two of X7 to X9 are N, and the remaining one is CH.

According to an exemplary embodiment of the present specification, in Formula 2, X7 and X8 are N, and X9 is CH.

According to an exemplary embodiment of the present specification, in Formula 2, X8 and X9 are N, and X7 is CH.

According to an exemplary embodiment of the present specification, in Formula 2, X7 and X9 are N, and X8 is CH.

According to an exemplary embodiment of the present specification, in Formula 2, X7 to X9 are N.

According to an exemplary embodiment of the present specification, in Formula 2, L2 and L3 are the same as or different from each other, and are each independently a direct bond or an arylene group.

According to an exemplary embodiment of the present specification, in Formula 2, L2 and L3 are the same as or different from each other, and are each independently a direct bond or a phenylene group.

According to an exemplary embodiment of the present specification, in Formula 2, Ar3 to Ar6 are the same as or different from each other, and are each independently an aryl group which is unsubstituted or substituted with an aryl group.

According to an exemplary embodiment of the present specification, in Formula 2, Ar3 to Ar6 are the same as or different from each other, and are each independently a phenyl group which is unsubstituted or substituted with an aryl group or a biphenyl group.

According to an exemplary embodiment of the present specification, in Formula 2, Ar3 to Ar6 are the same as or different from each other, and are each independently a phenyl group which is unsubstituted or substituted with a phenyl group or a biphenyl group.

According to an exemplary embodiment of the present specification, in Formula 3, any one of X10 to X12 is N, and any remaining one is CH.

According to an exemplary embodiment of the present specification, in Formula 3, X10 is N, and X11 and X12 are CH.

According to an exemplary embodiment of the present specification, in Formula 3, X11 is N, and X10 and X12 are CH.

According to an exemplary embodiment of the present specification, in Formula 3, X12 is N, and X10 and X11 are CH.

According to an exemplary embodiment of the present specification, in Formula 3, any two of X10 to X12 are N, and the remaining one is CH.

According to an exemplary embodiment of the present specification, in Formula 3, X10 and X11 are N, and X12 is CH.

According to an exemplary embodiment of the present specification, in Formula 3, X11 and X12 are N, and X10 is CH.

According to an exemplary embodiment of the present specification, in Formula 3, X10 and X12 are N, and X11 is CH.

According to an exemplary embodiment of the present specification, in Formula 3, X10 to X12 are N.

According to an exemplary embodiment of the present specification, in Formula 3, L4 is a divalent phenyl group, a trivalent phenyl group, a divalent biphenyl group, or a trivalent biphenyl group.

According to an exemplary embodiment of the present specification, in Formula 3, L5 is a direct bond or an arylene group.

According to an exemplary embodiment of the present specification, in Formula 3, L5 is a direct bond or a phenylene group.

According to an exemplary embodiment of the present specification, in Formula 3, L5 is an arylene group.

According to an exemplary embodiment of the present specification, in Formula 3, L5 is a phenylene group.

According to an exemplary embodiment of the present specification, in Formula 3, Ar7 and Ar8 are the same as or different from each other, and are each independently an aryl group which is unsubstituted or substituted with an aryl group.

According to an exemplary embodiment of the present specification, in Formula 3, Ar7 and Ar8 are the same as or different from each other, and are each independently a phenyl group which is unsubstituted or substituted with an aryl group or a biphenyl group.

According to an exemplary embodiment of the present specification, in Formula 3, Ar7 and Ar8 are the same as or different from each other, and are each independently a phenyl group which is unsubstituted or substituted with a phenyl group; or a biphenyl group.

According to an exemplary embodiment of the present specification, the compound of Formula 1 is selected from among the following compounds:
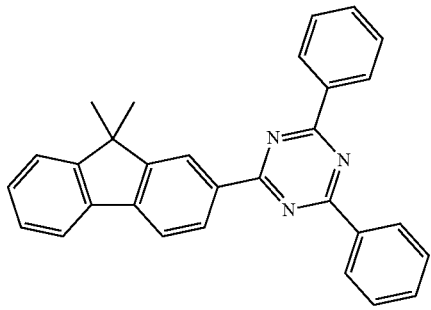
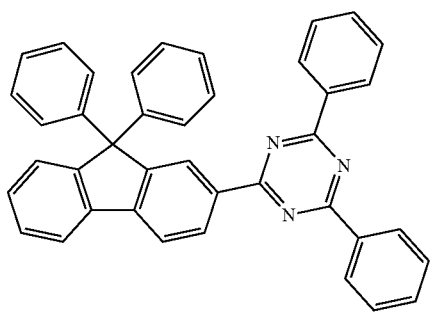
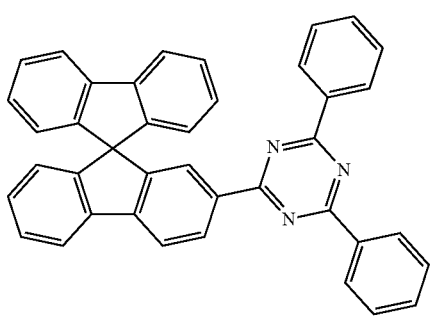
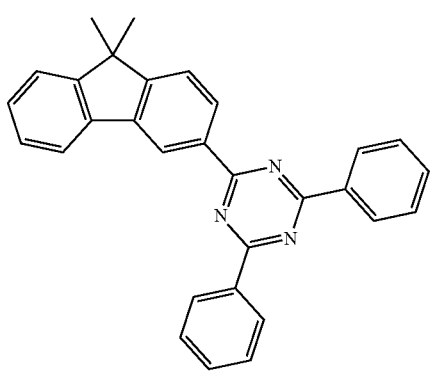
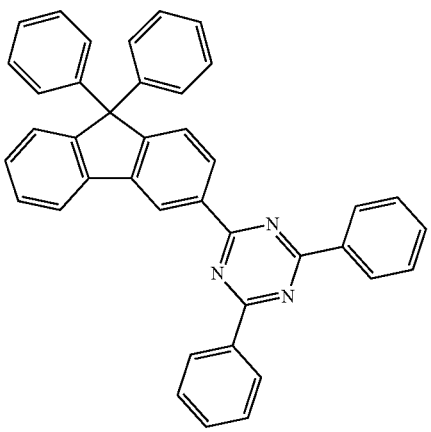
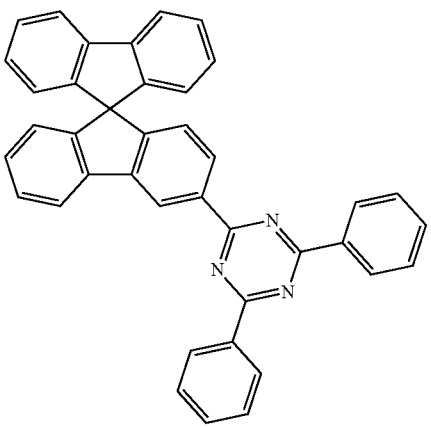
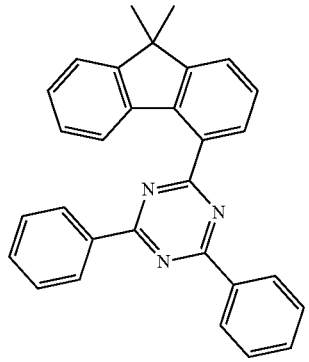
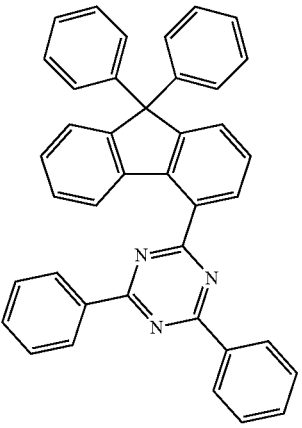

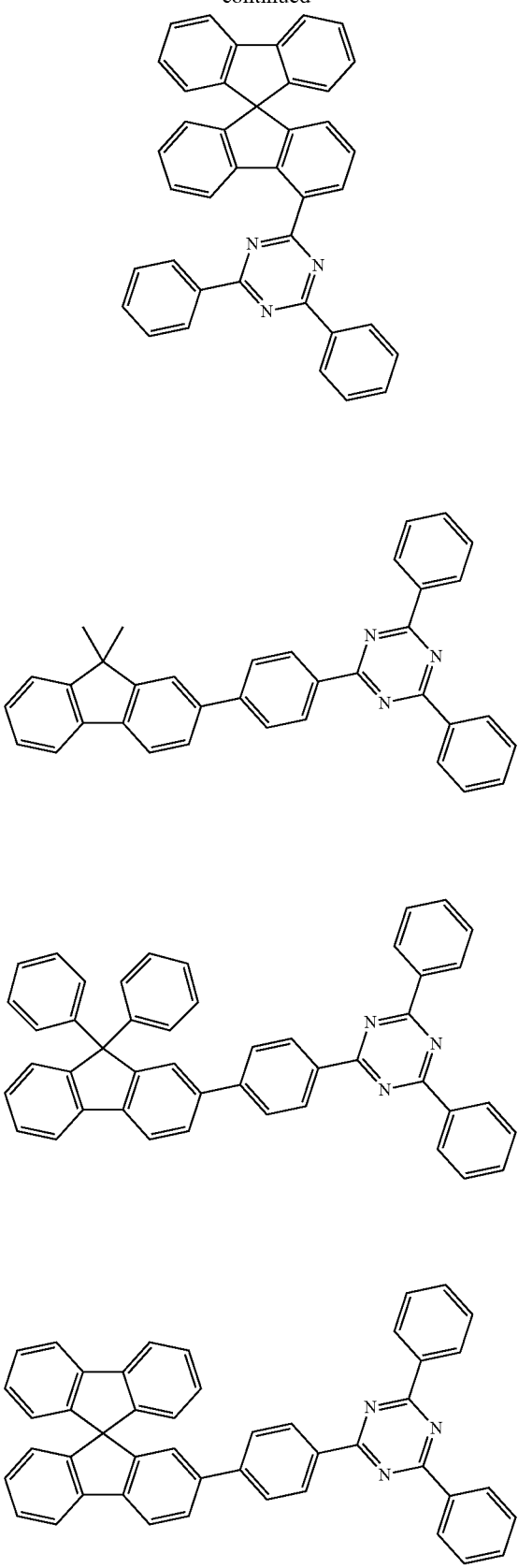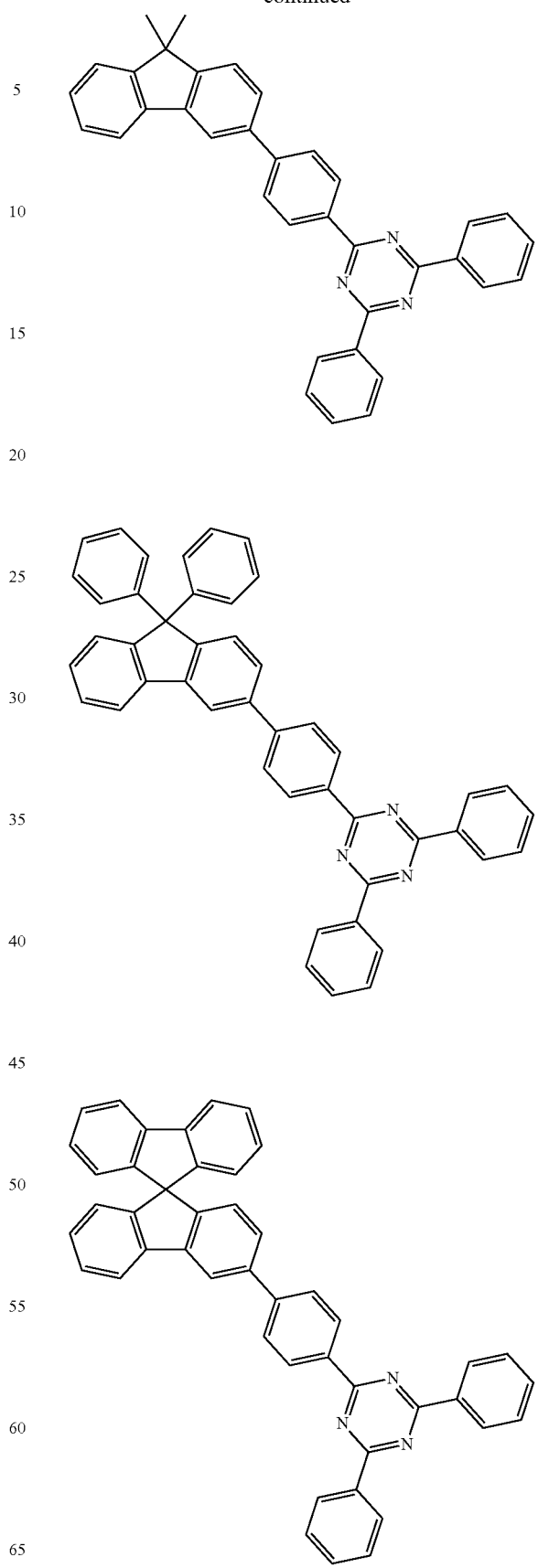

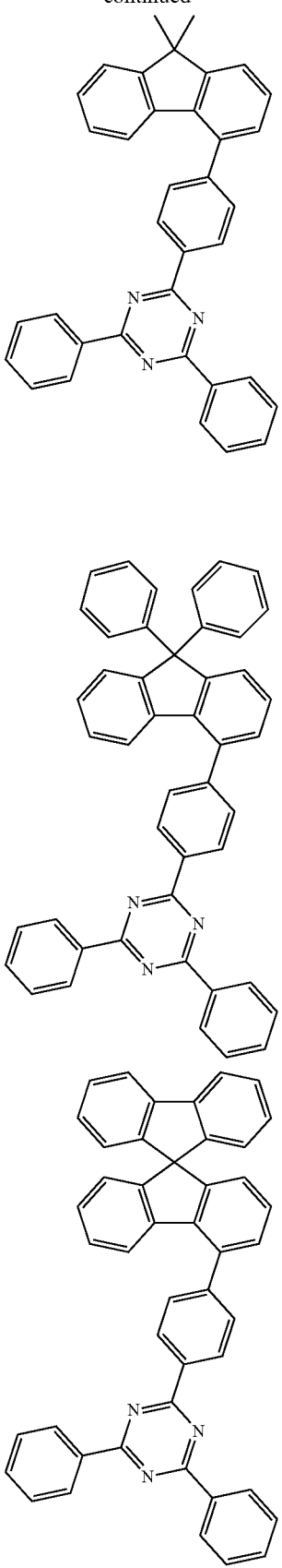
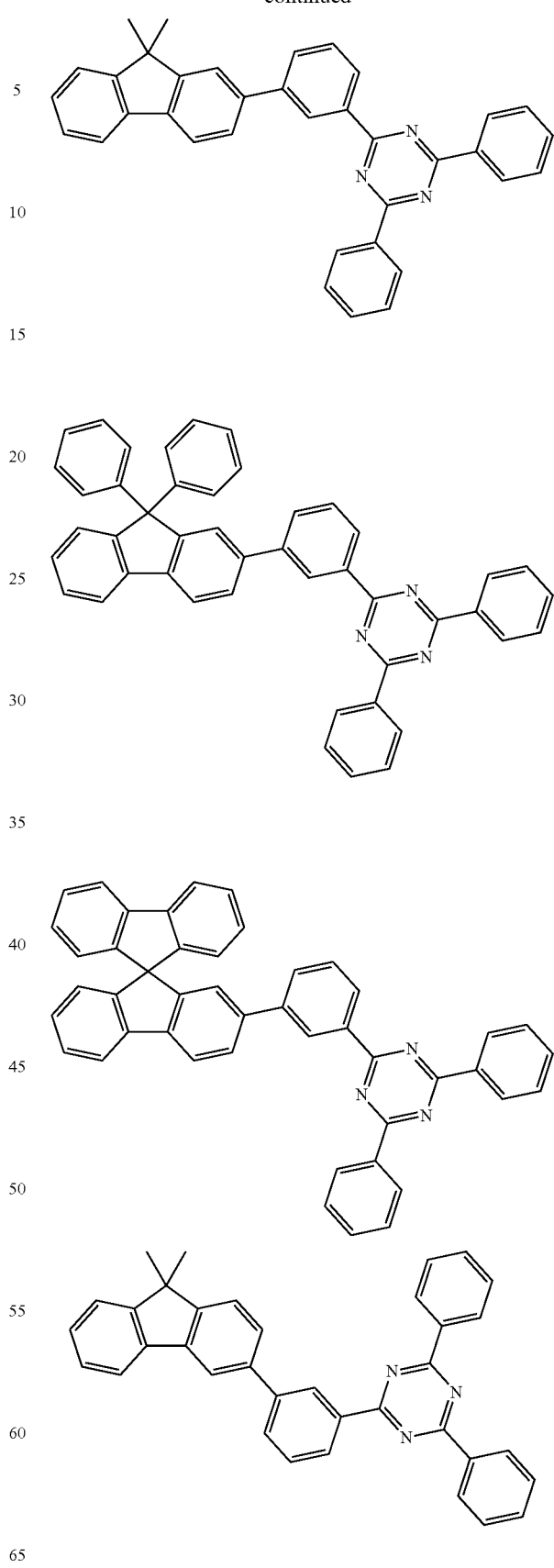

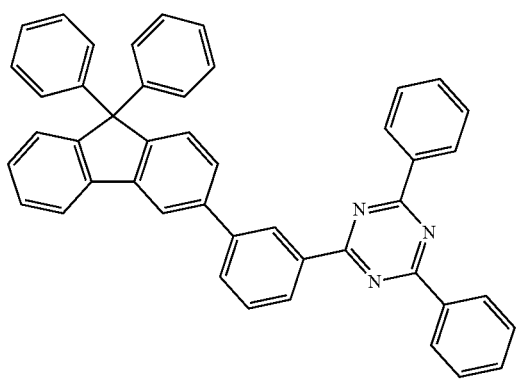
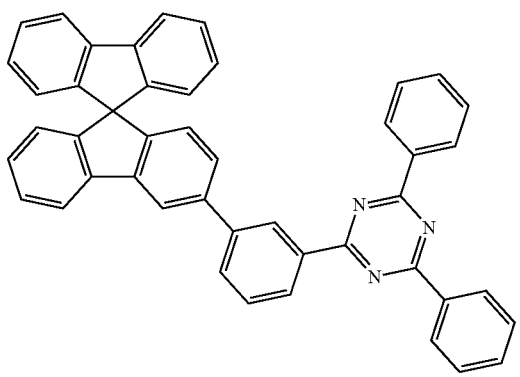
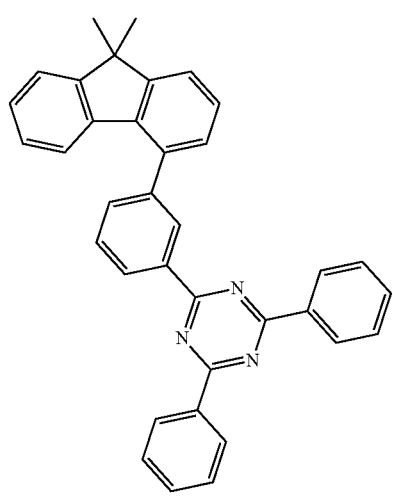
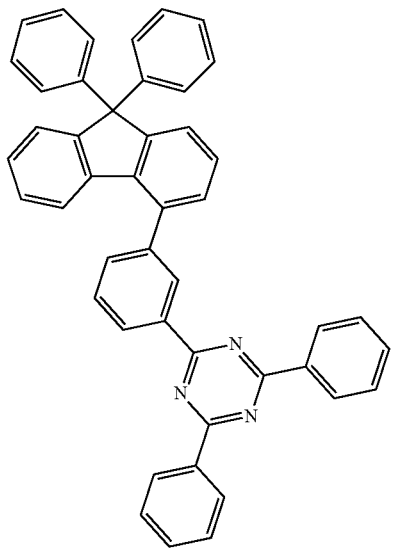
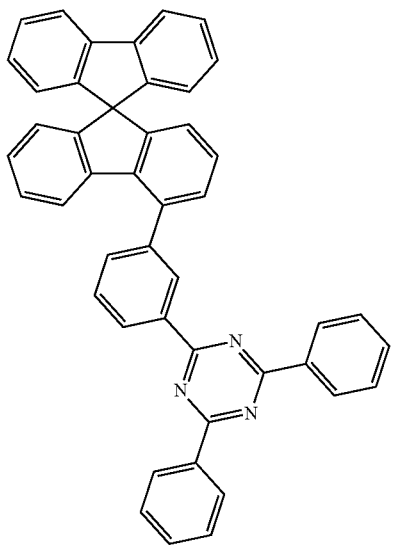
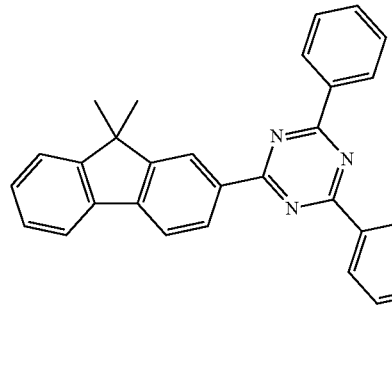

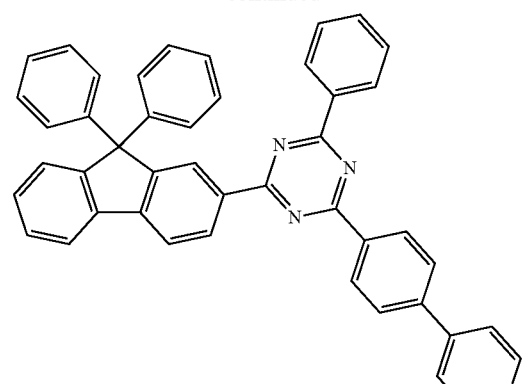
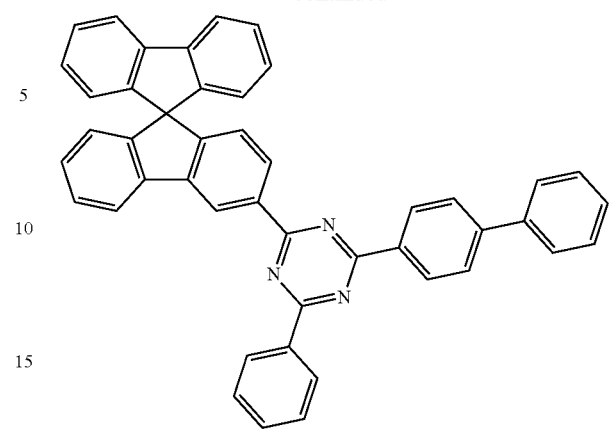
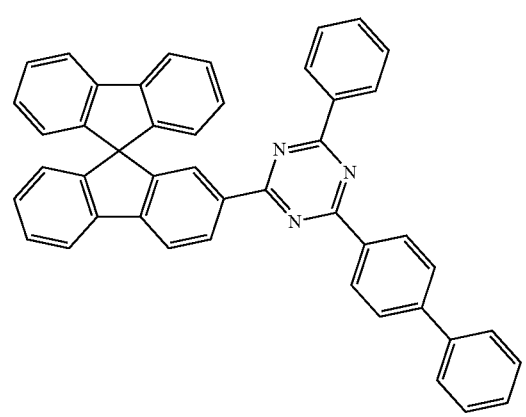
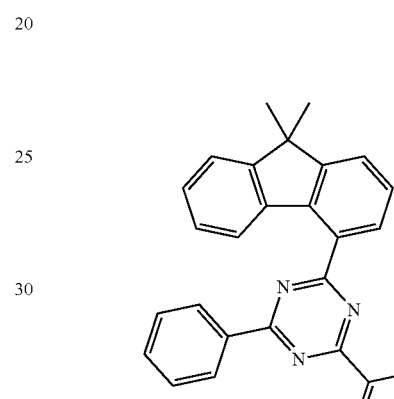
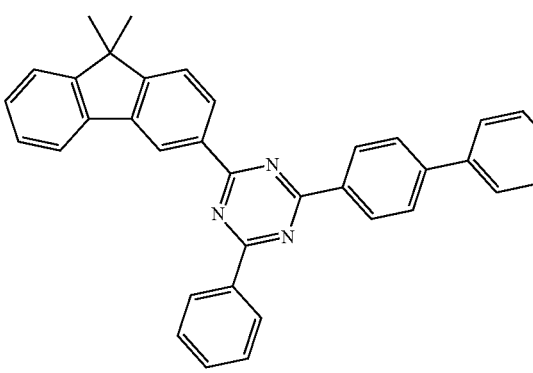
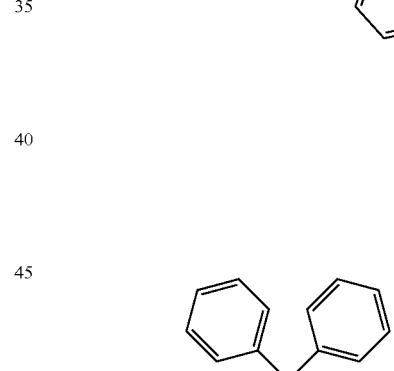
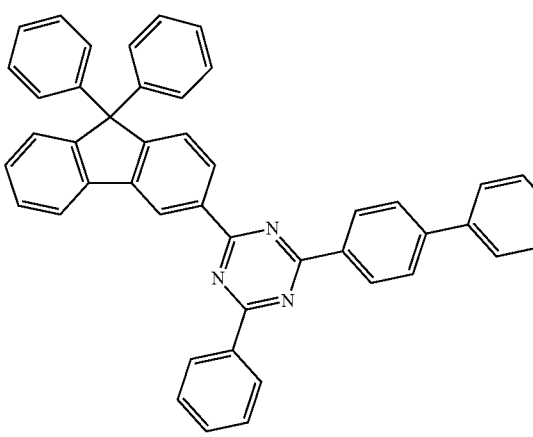
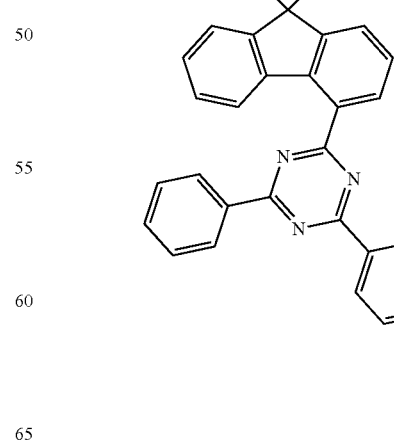

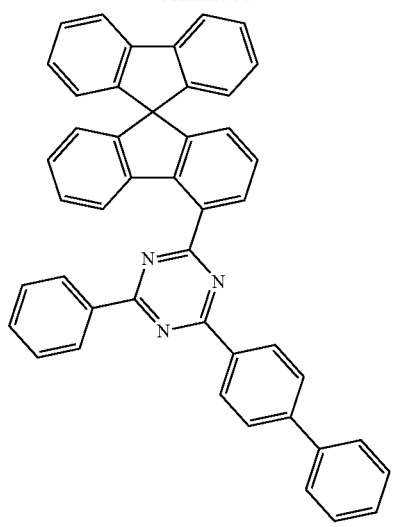
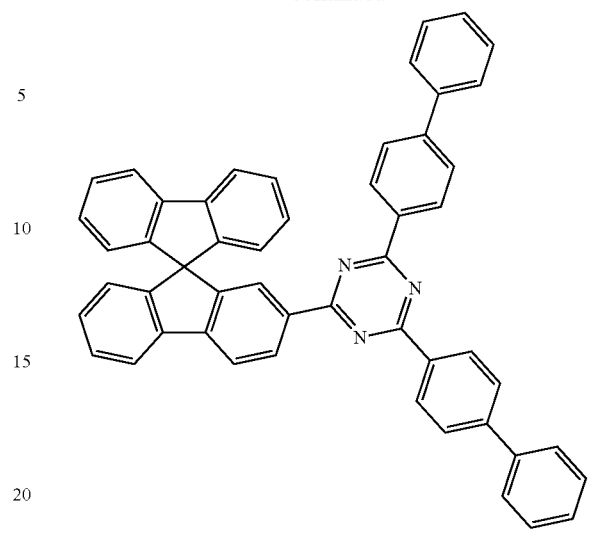
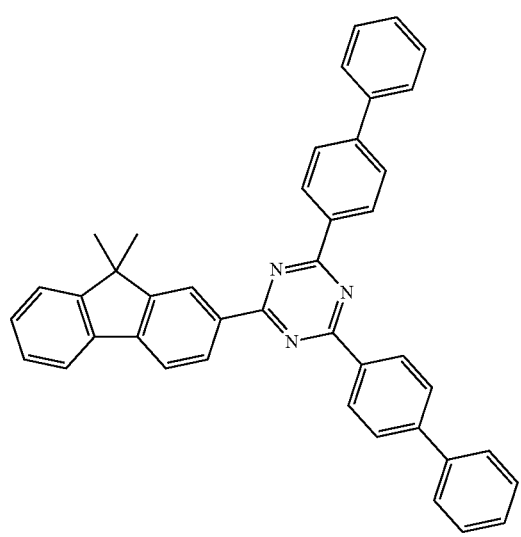
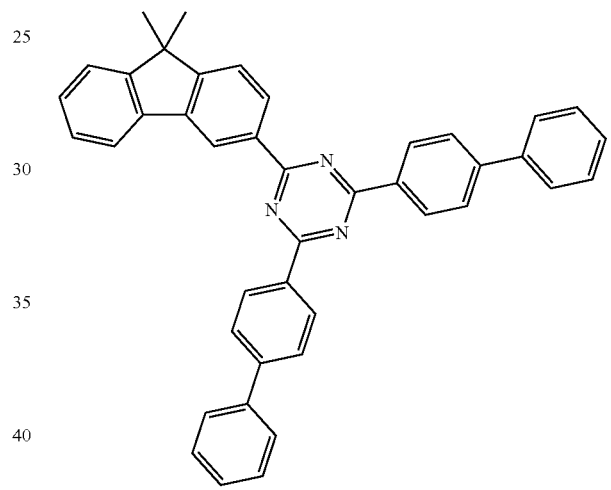
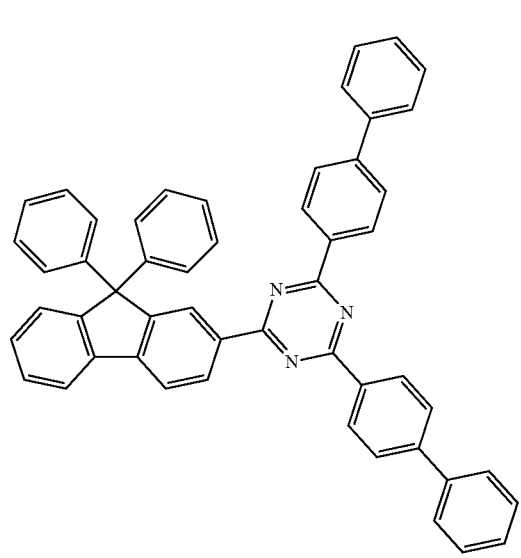
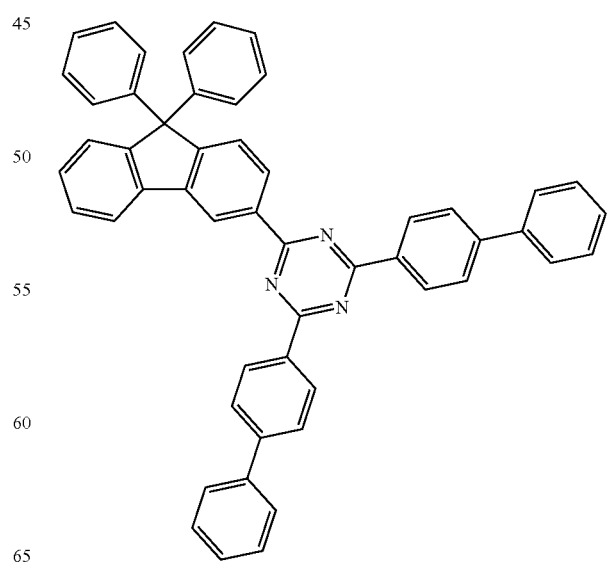

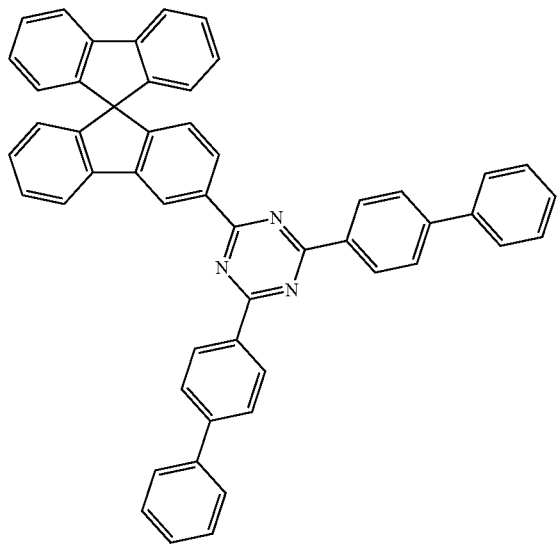
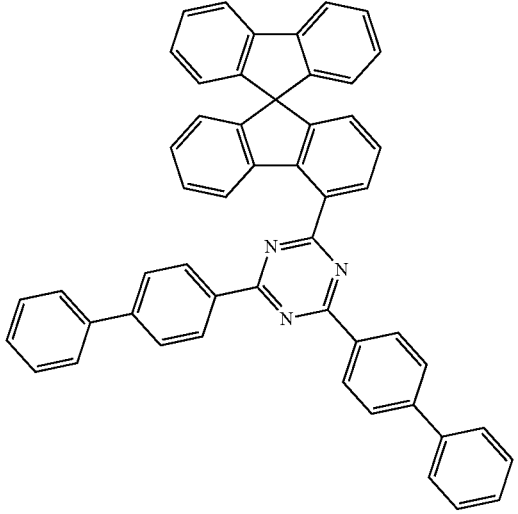
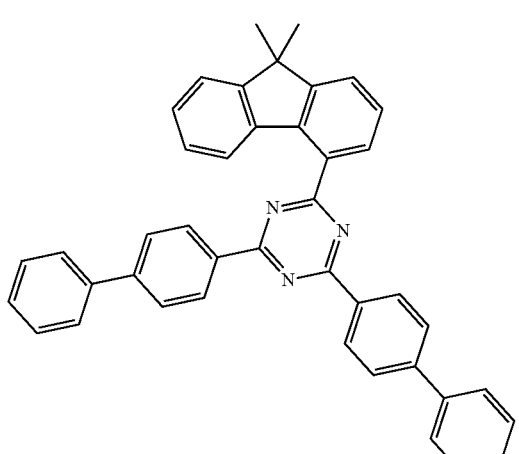
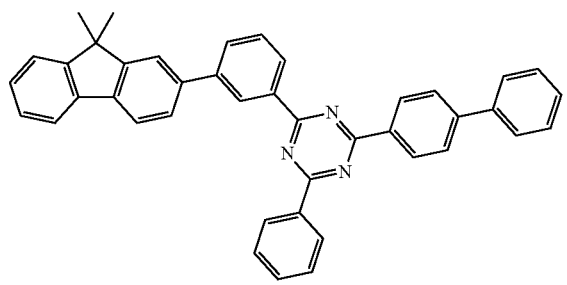
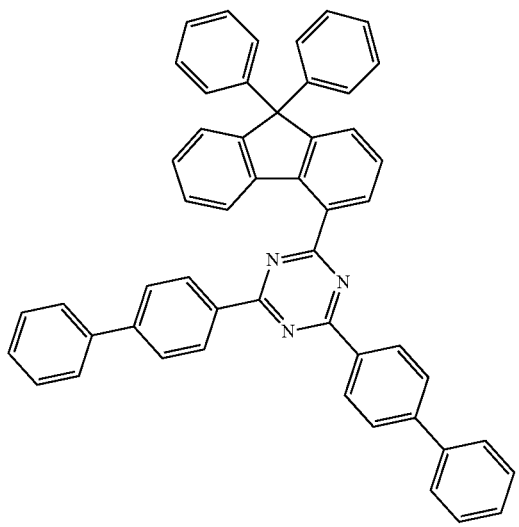
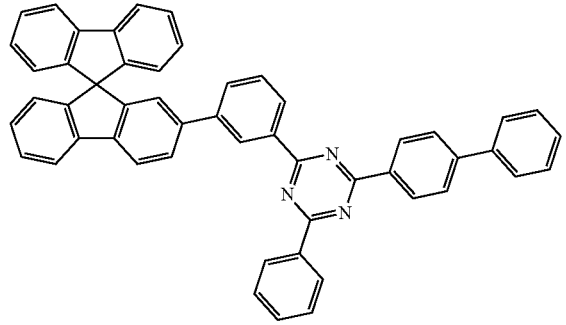

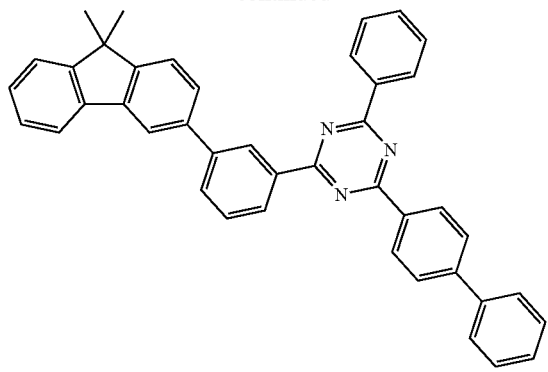
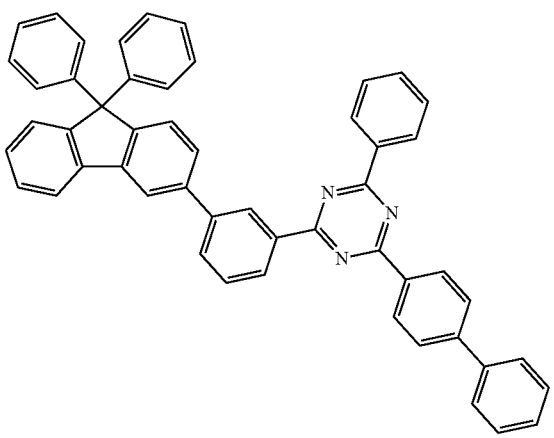
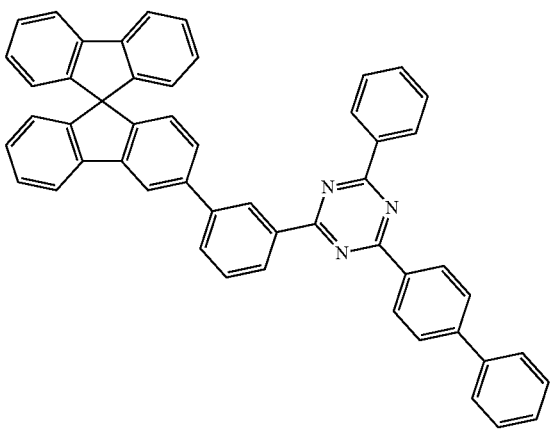
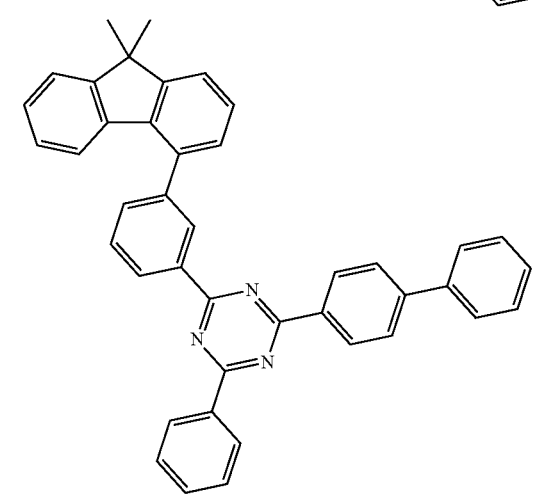
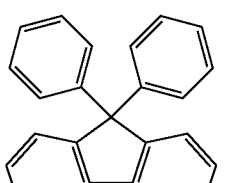
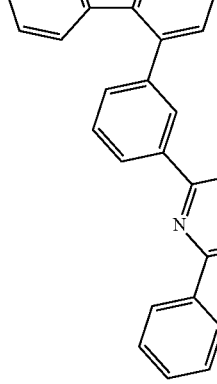
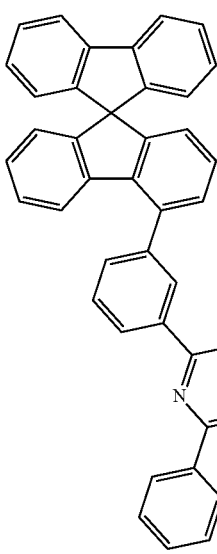
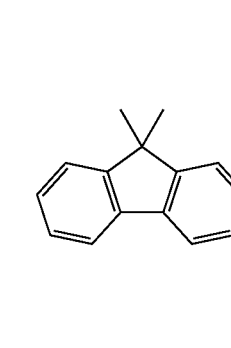

-continued
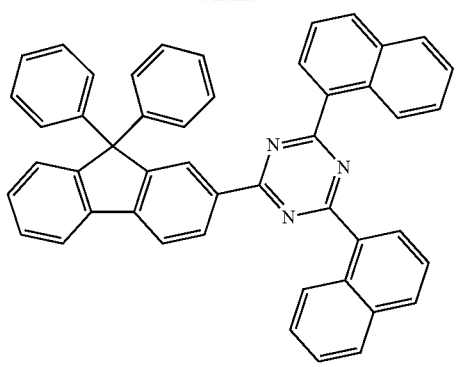
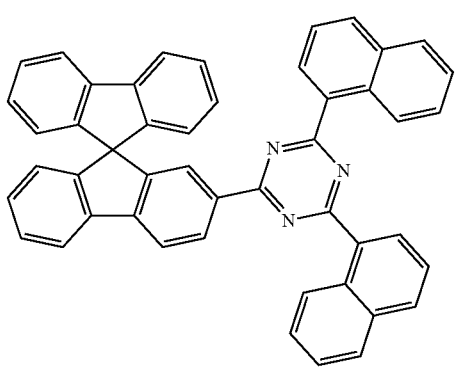
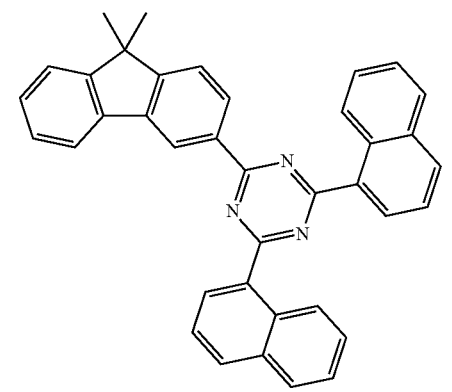
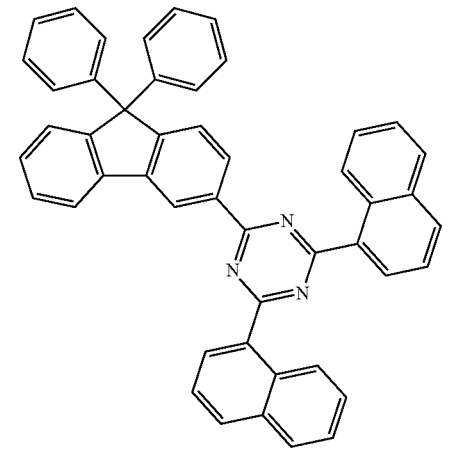
-continued
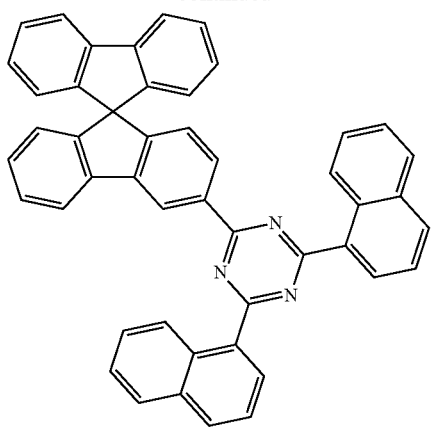
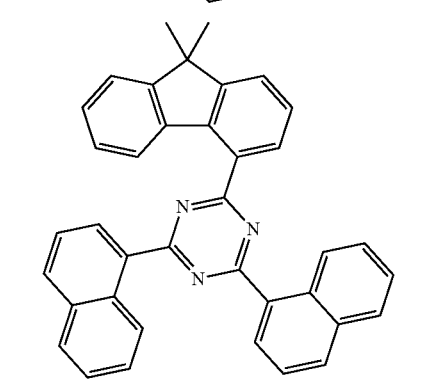
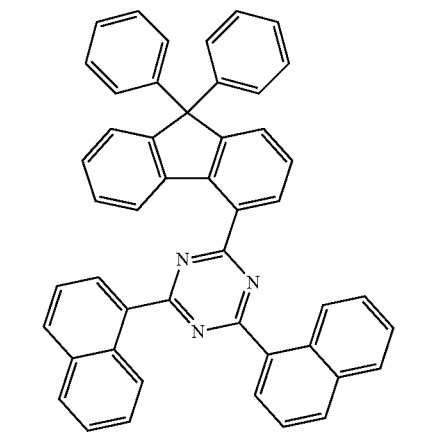
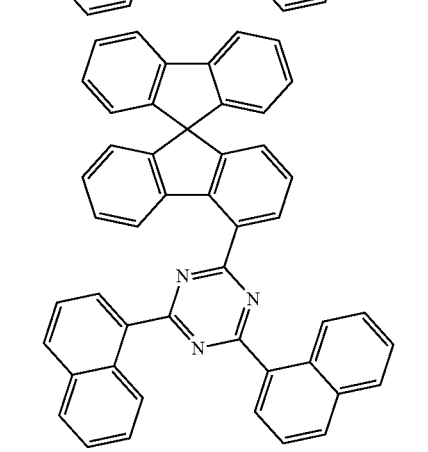

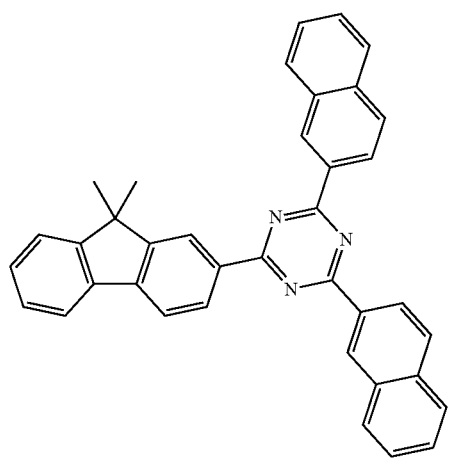
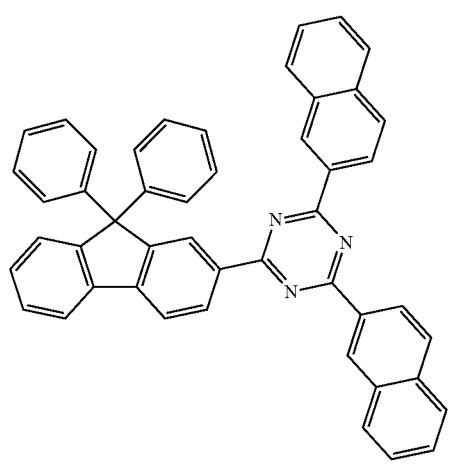
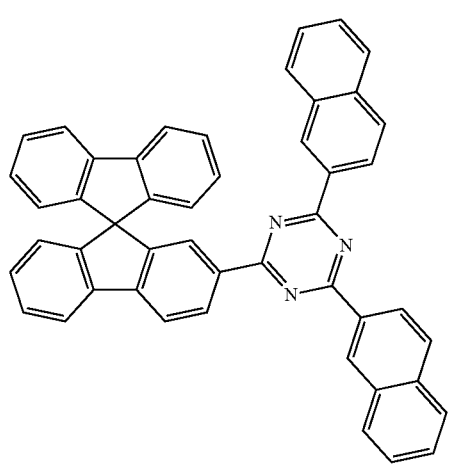
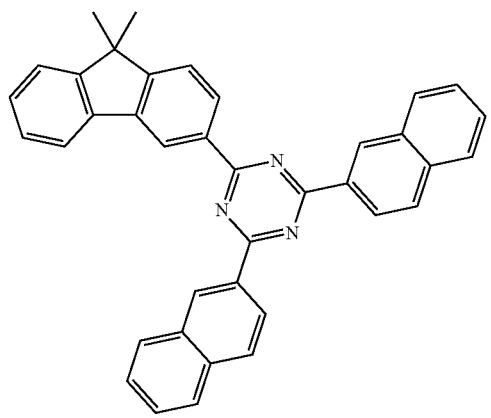
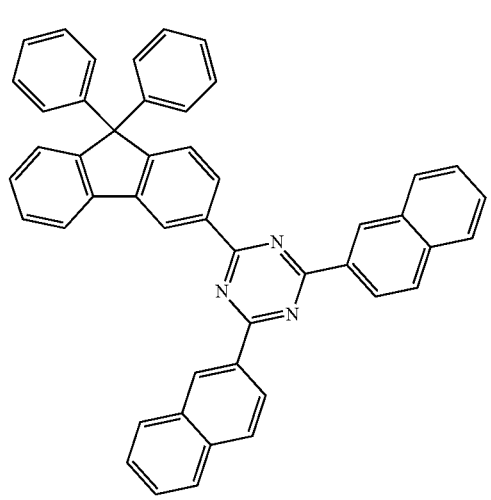
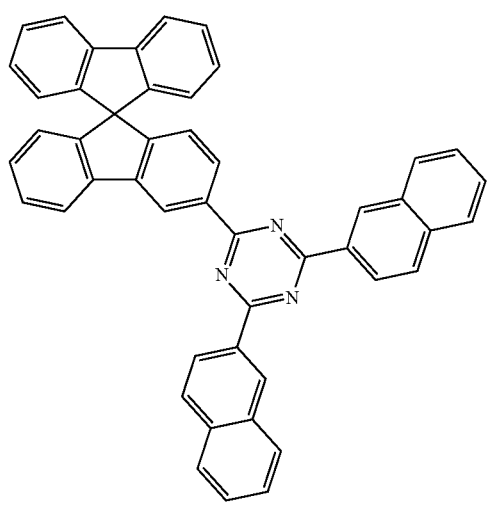

-continued
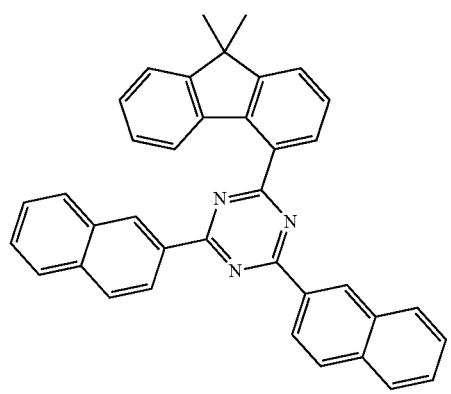
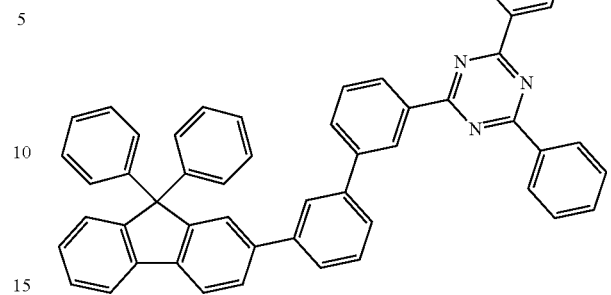
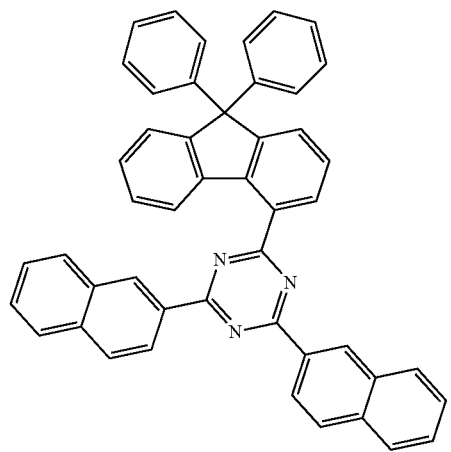
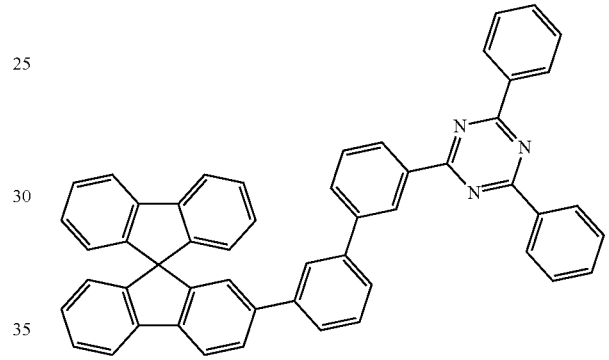
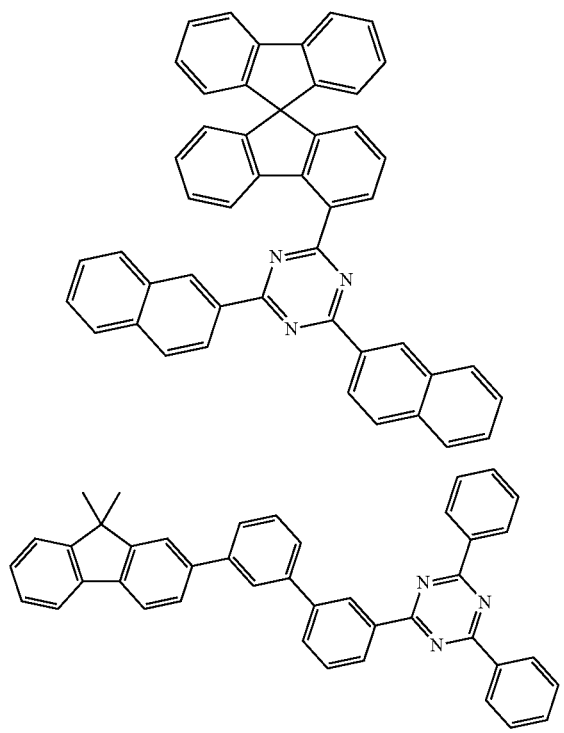
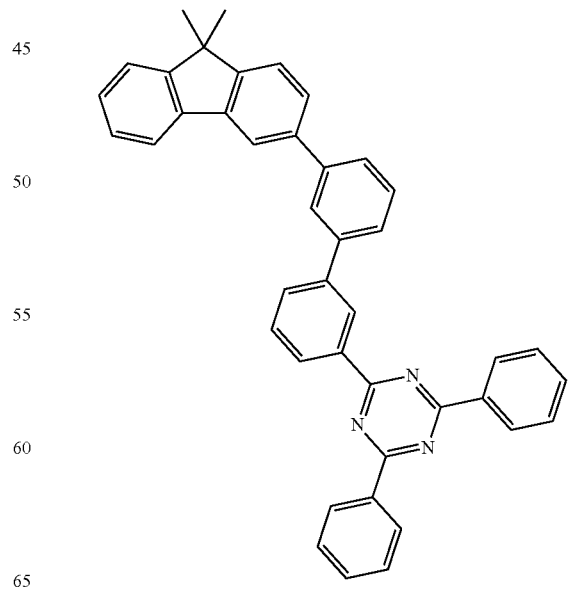

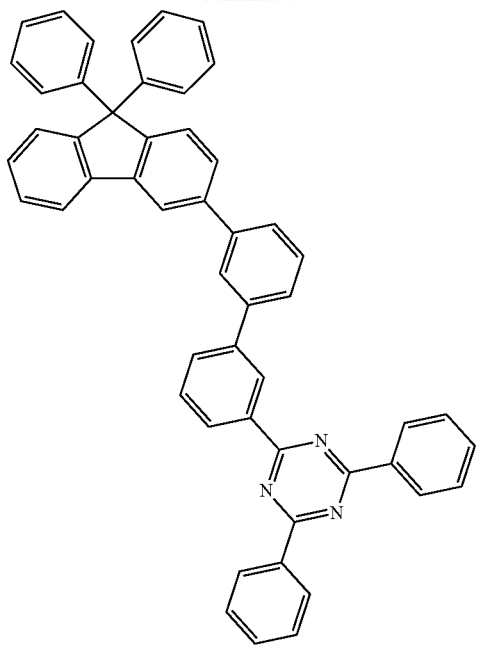
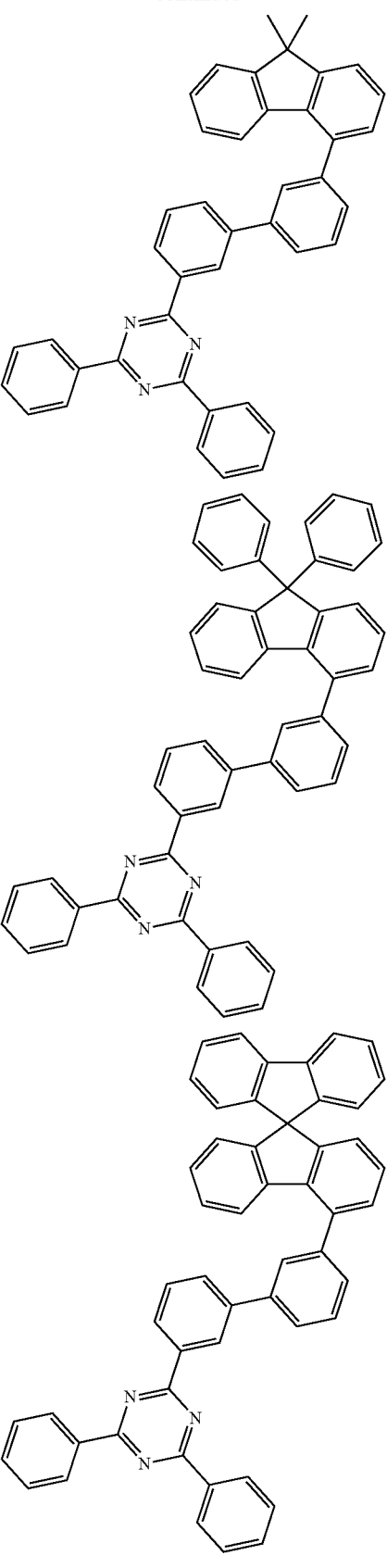
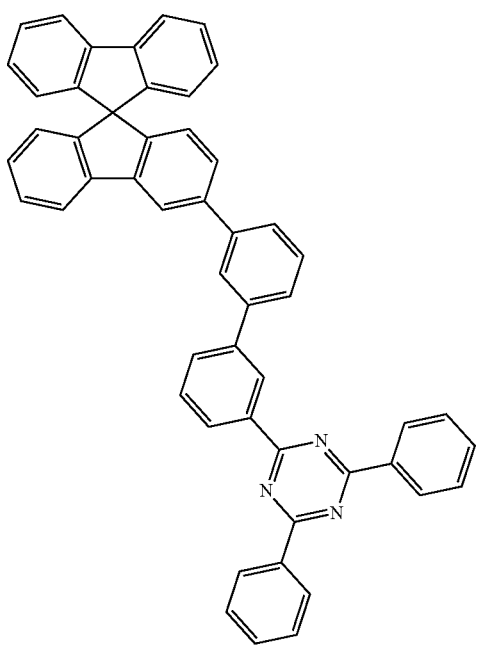

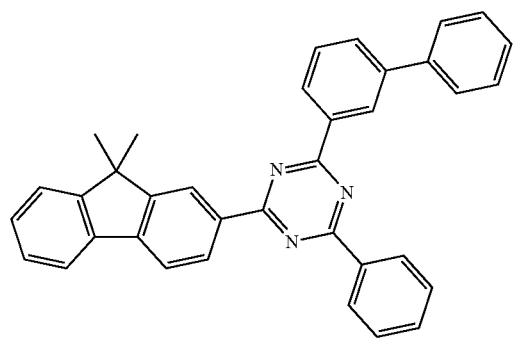
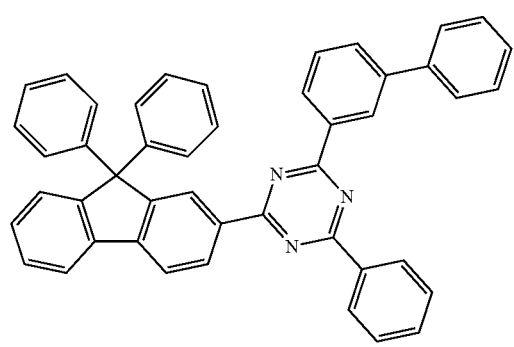
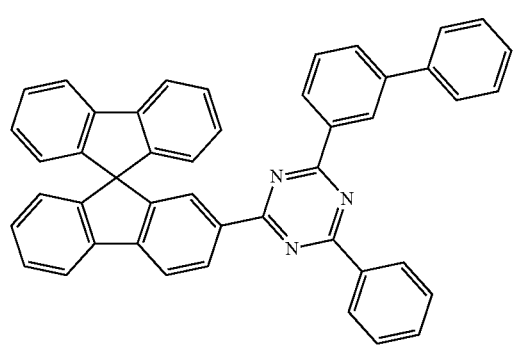
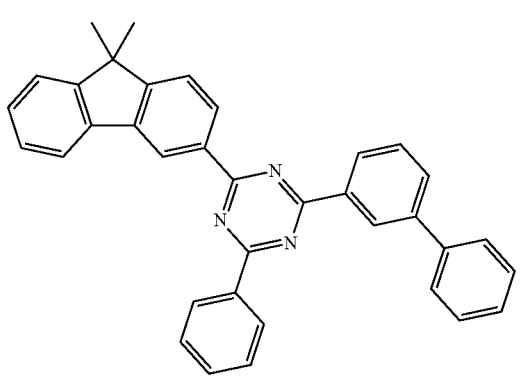
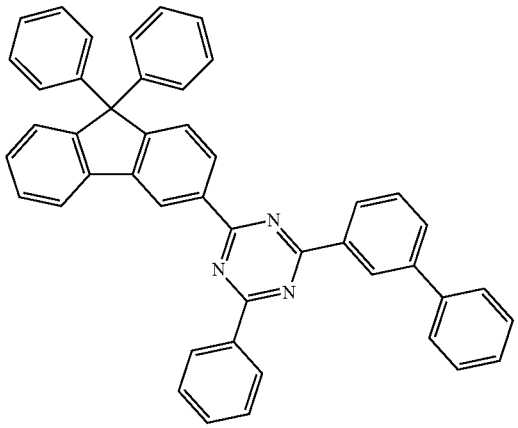
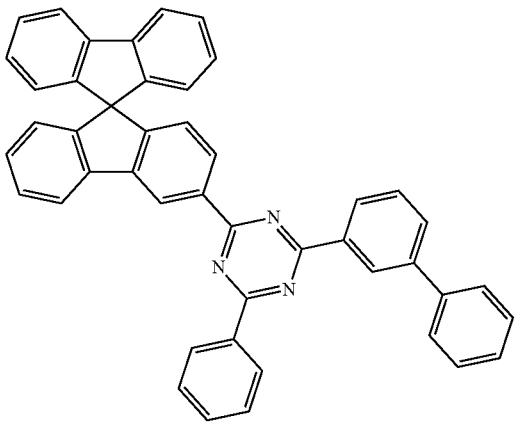
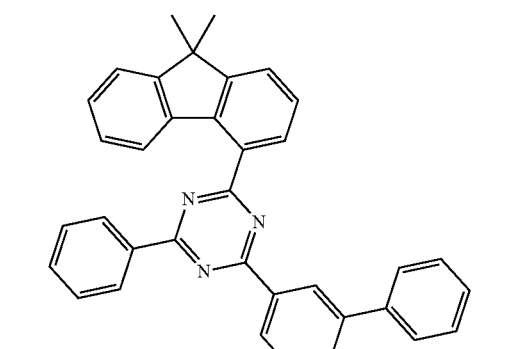
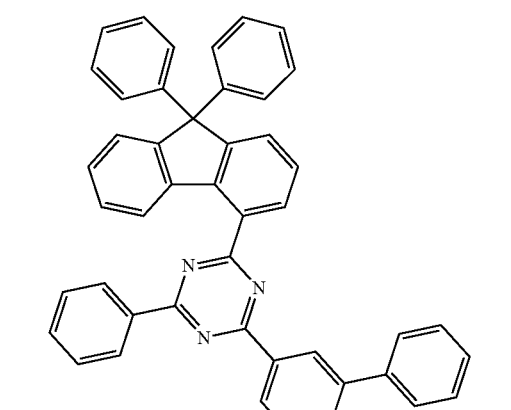

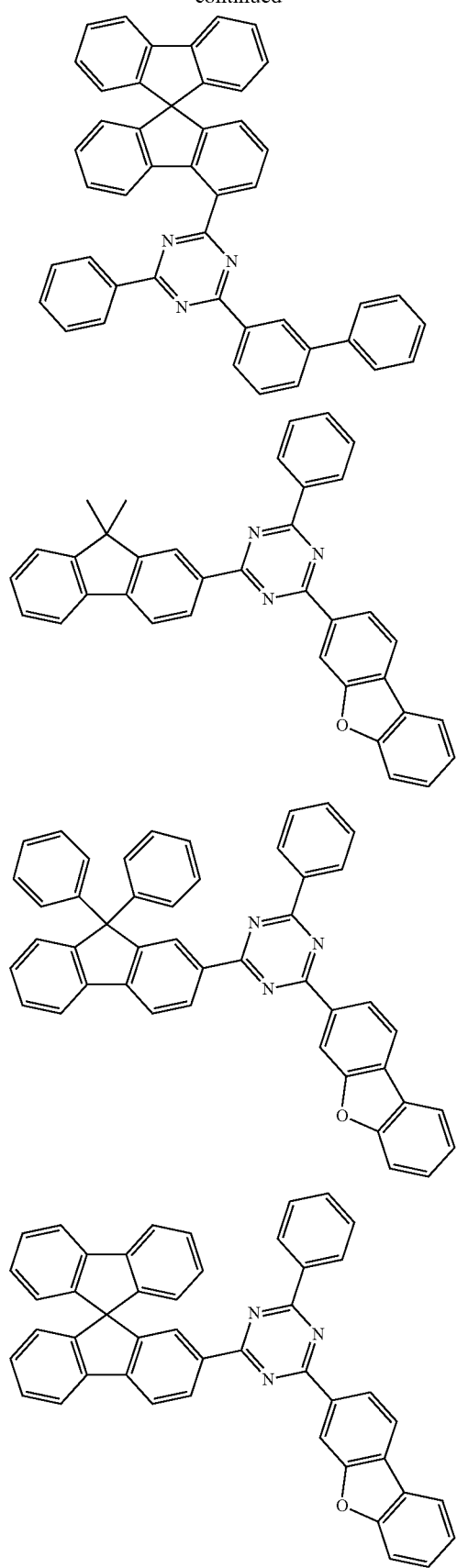
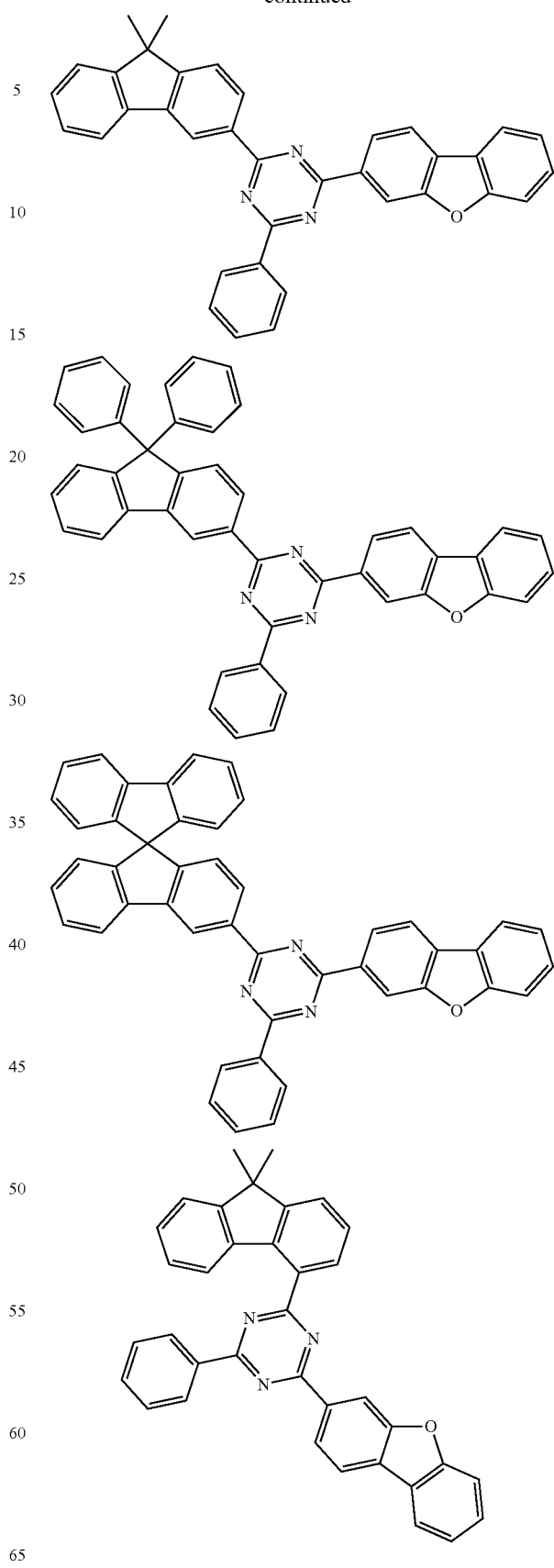

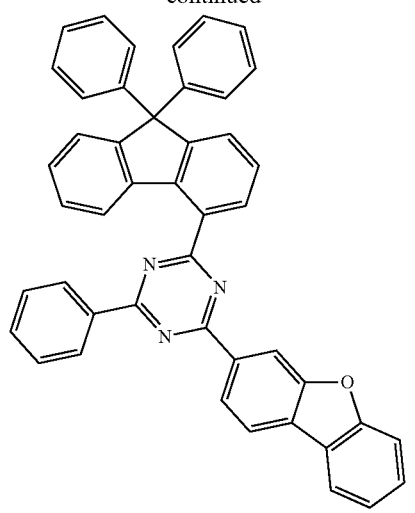
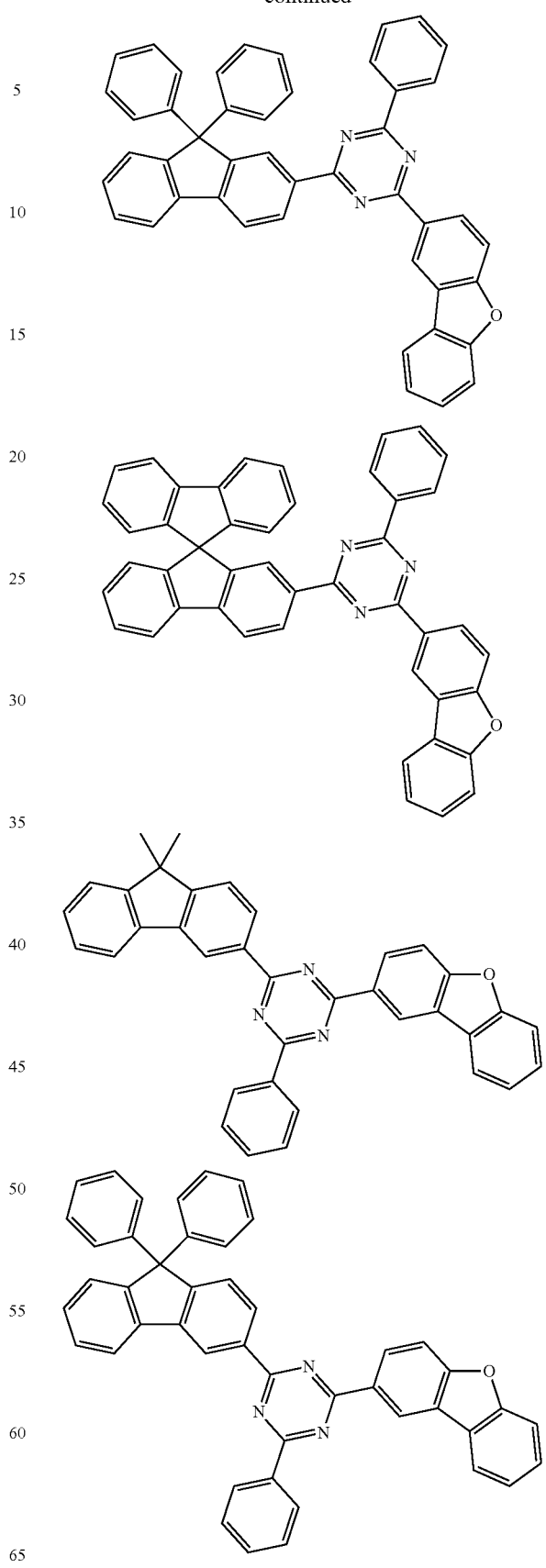

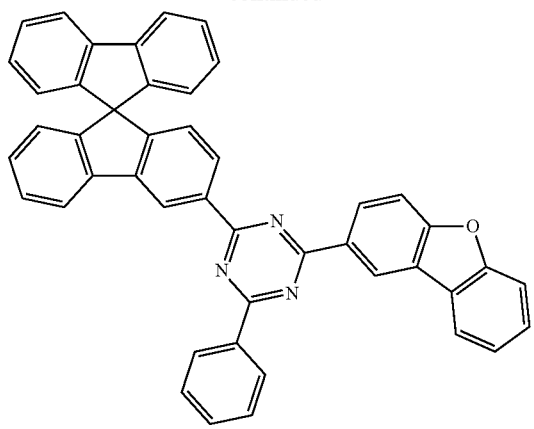 [SMILES: c1ccc(-c2nc(-c3ccc4c(c3)-c3ccccc3C43c4ccccc4-c4ccccc43)nc(-c3ccc4oc5ccccc5c4c3)n2)cc1]
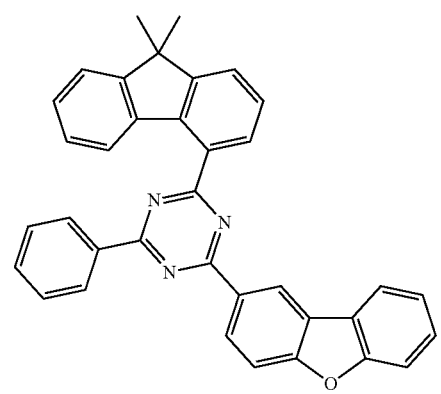
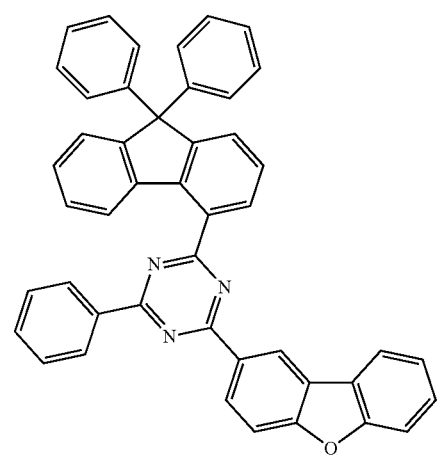
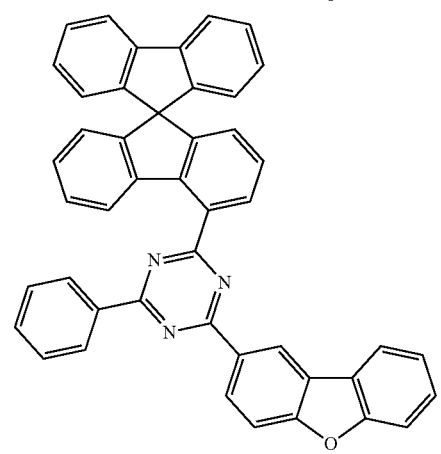
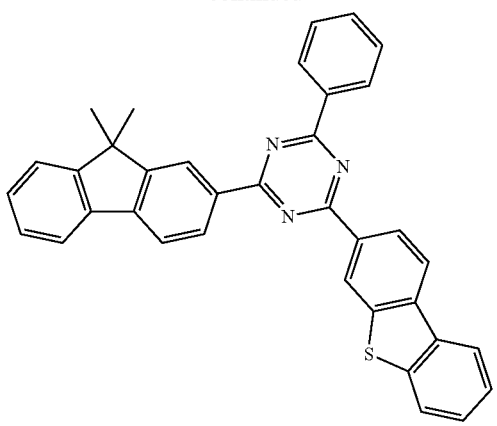
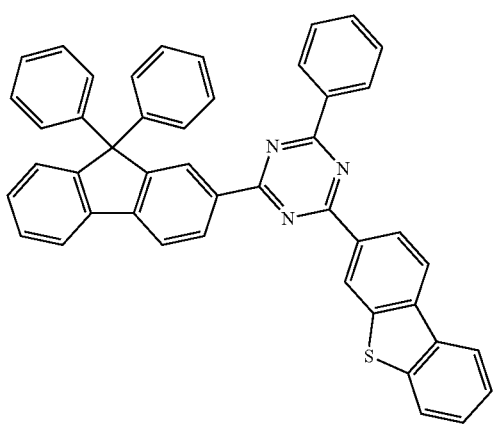
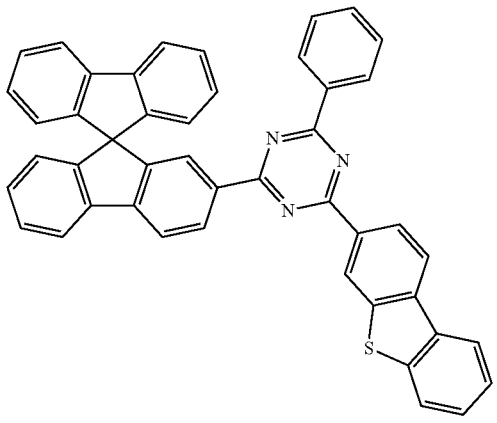
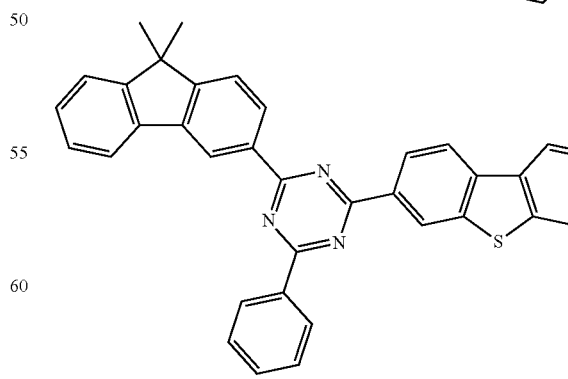

51
-continued
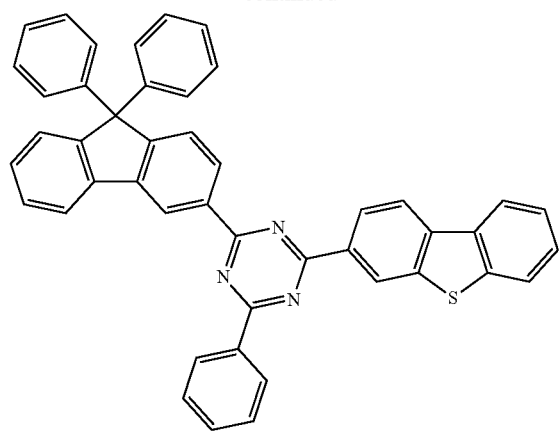
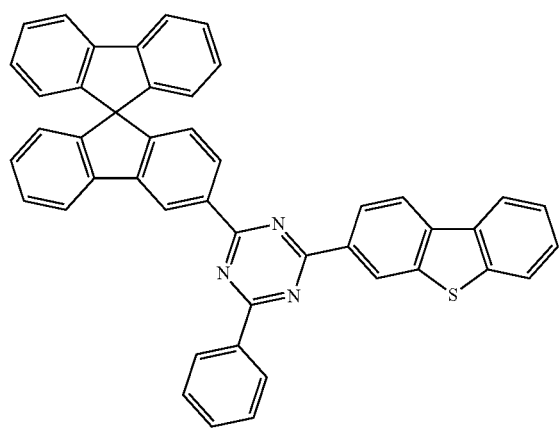
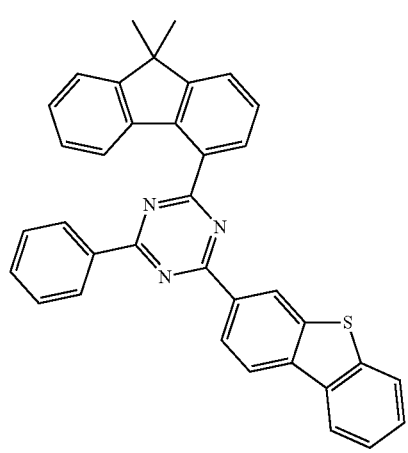
52
-continued
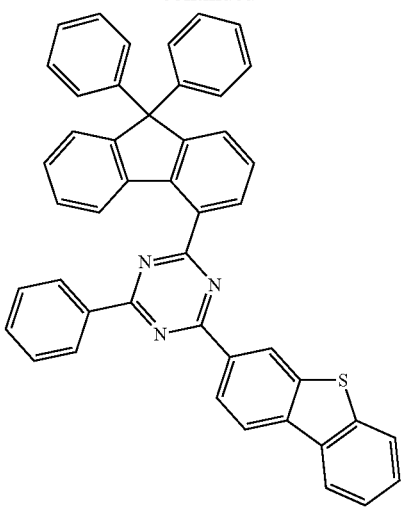
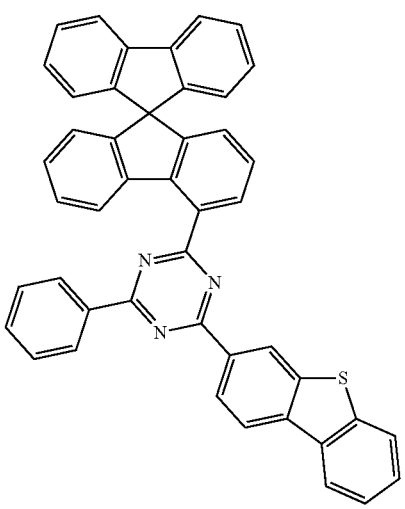
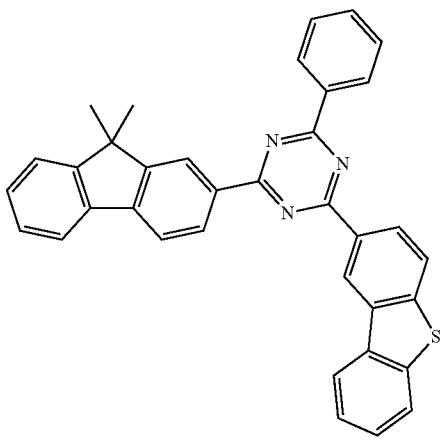

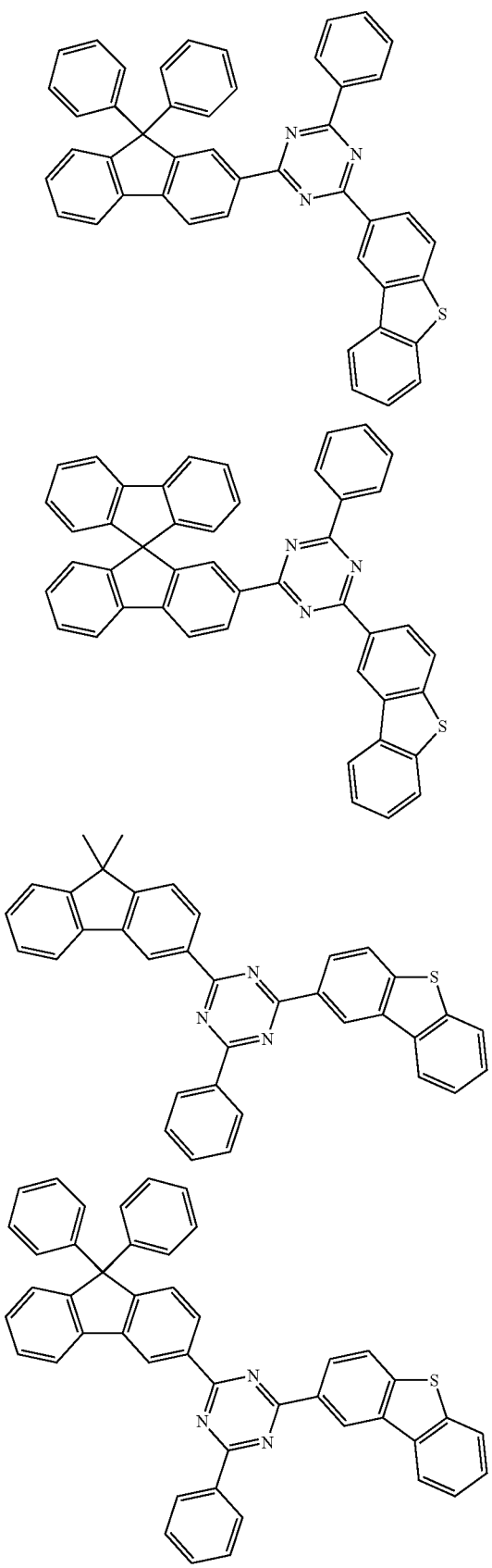
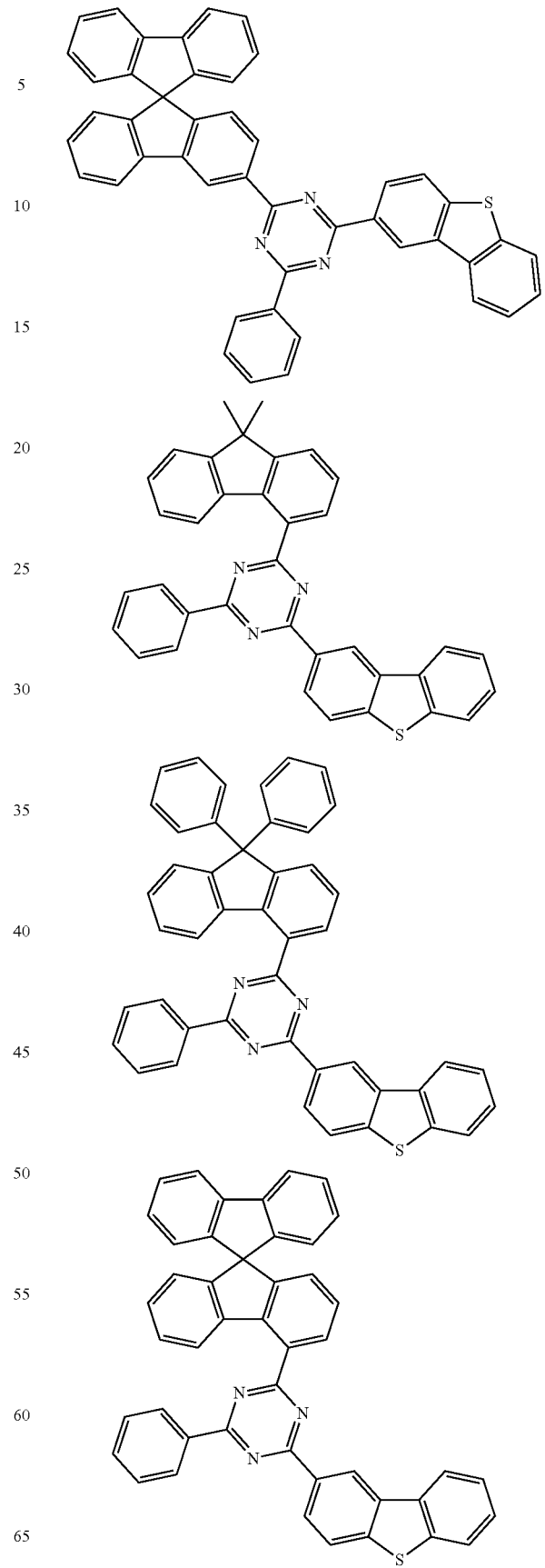

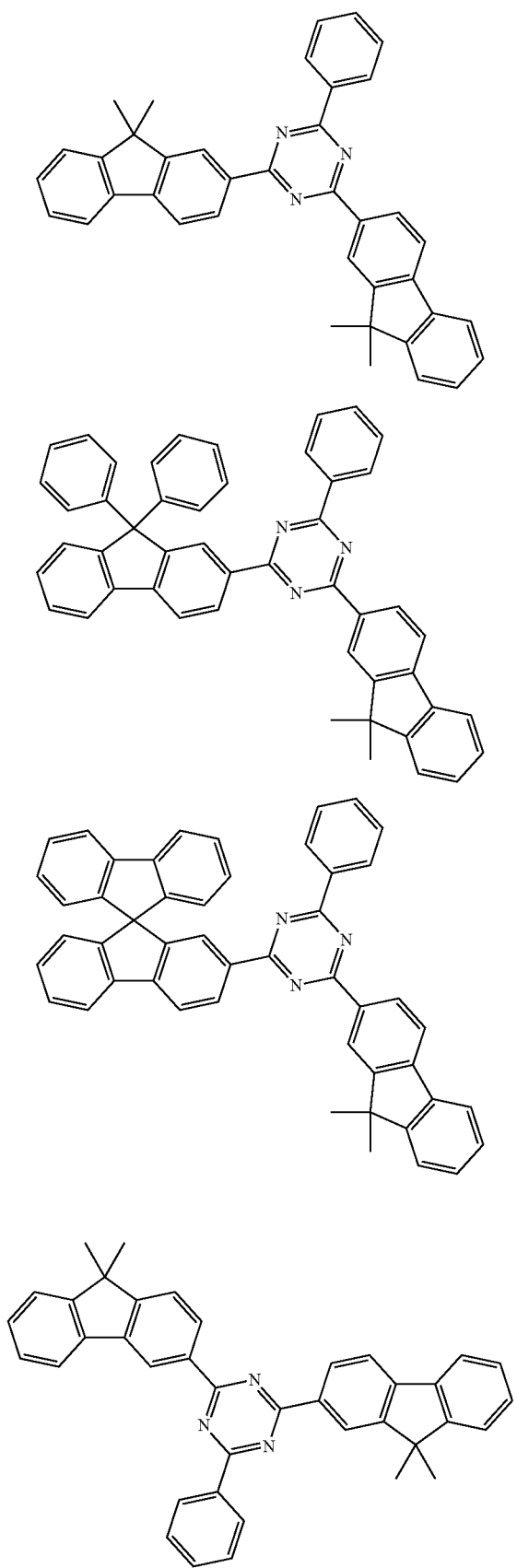 [SMILES: CC1(C)c2ccccc2-c2ccc(-c3nc(-c4ccccc4)nc(-c4ccc5c(c4)C(C)(C)c4ccccc4-5)n3)cc21 ; CC1(C)c2ccccc2-c2ccc(-c3nc(-c4ccccc4)nc(-c4ccc5c(c4)C(c4ccccc4)(c4ccccc4)c4ccccc4-5)n3)cc21 ; CC1(C)c2ccccc2-c2ccc(-c3nc(-c4ccccc4)nc(-c4ccc5c(c4)C4(c6ccccc6-c6ccccc64)c4ccccc4-5)n3)cc21 ; CC1(C)c2ccccc2-c2cc(-c3nc(-c4ccccc4)nc(-c4ccc5c(c4)C(C)(C)c4ccccc4-5)n3)ccc21]
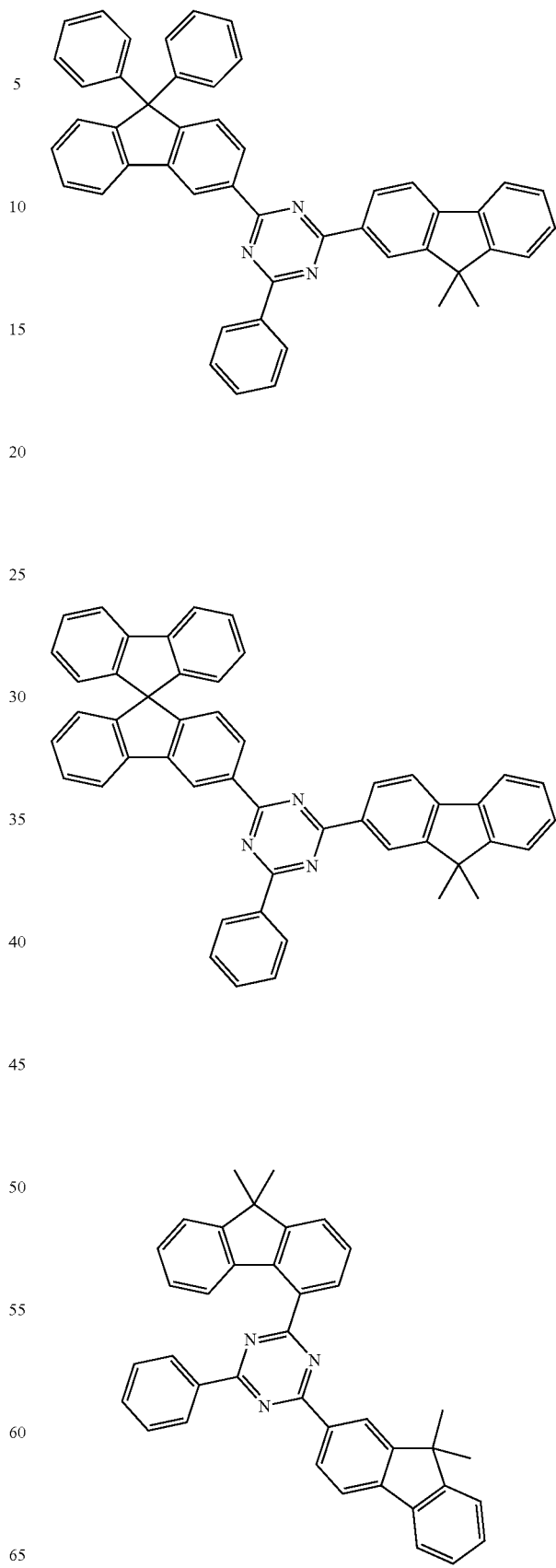

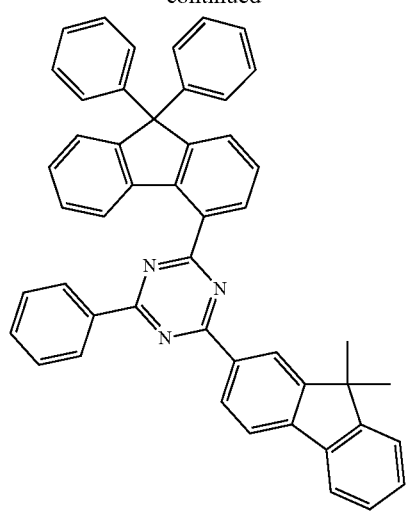
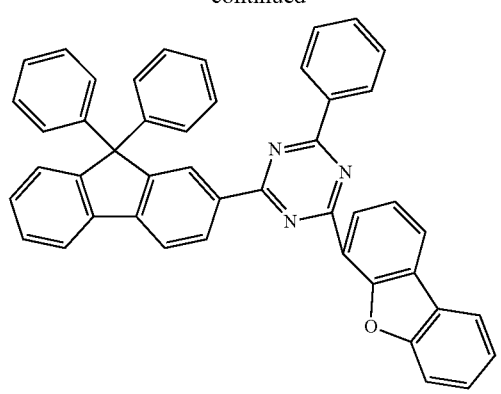
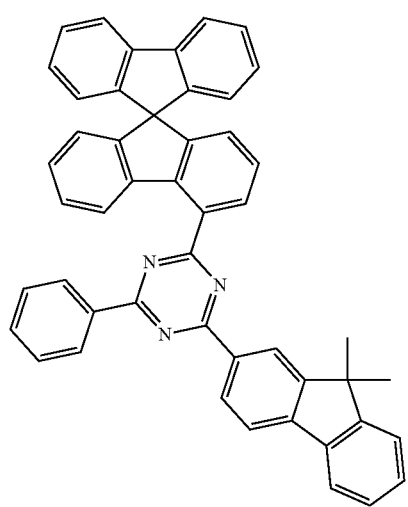
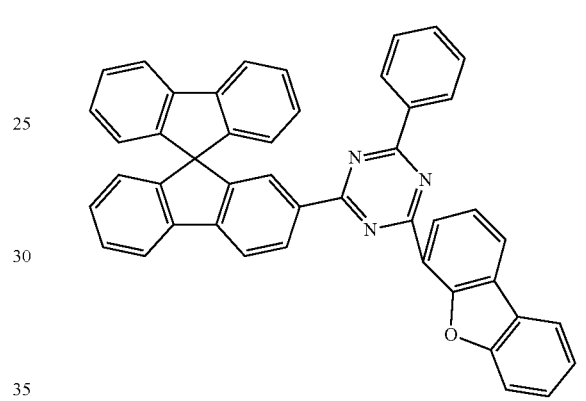
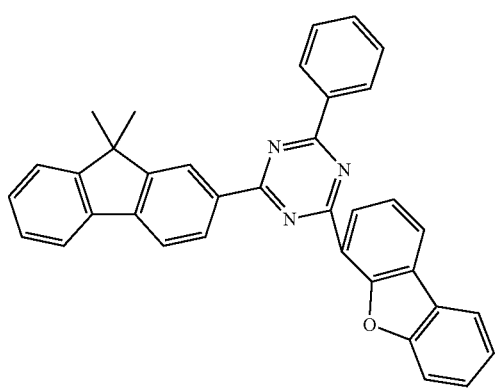
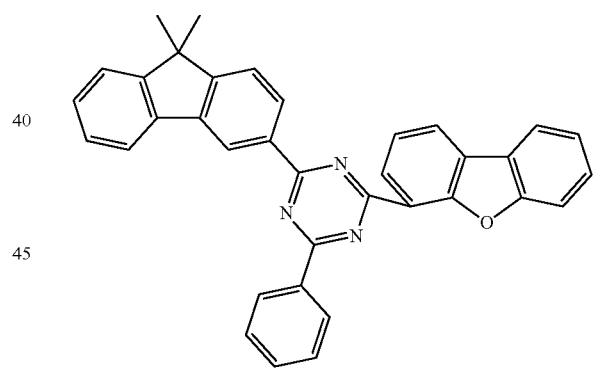
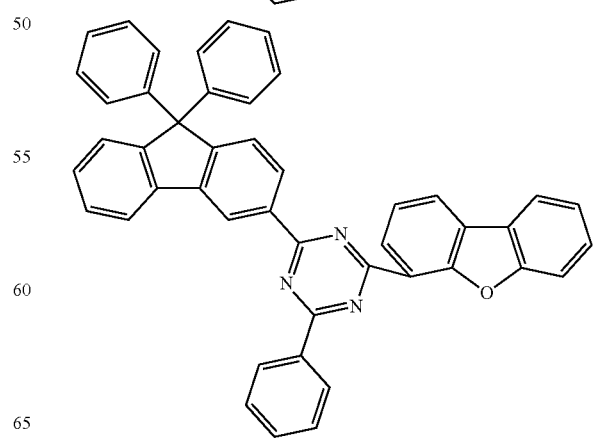

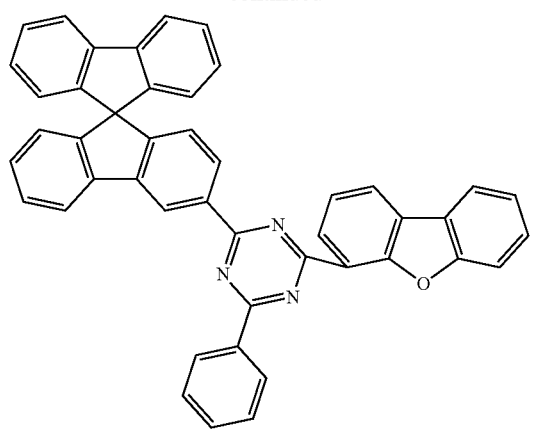
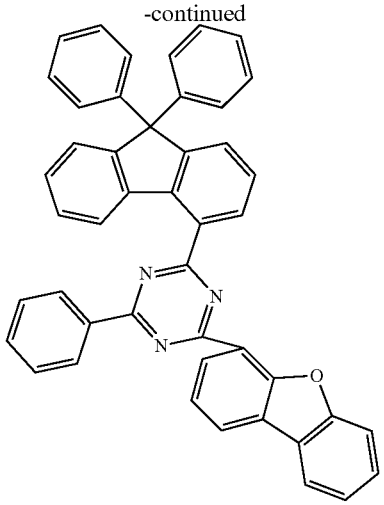
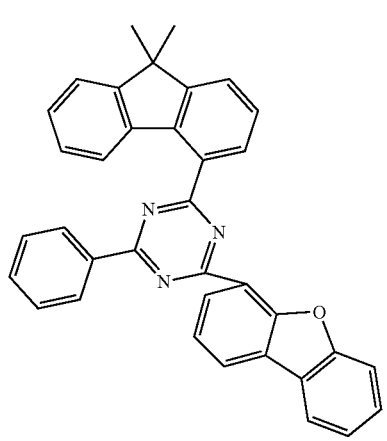
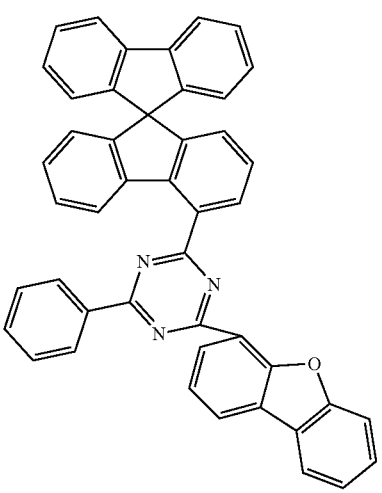
According to an exemplary embodiment of the present specification, the compound of Formula 2 is selected from among the following compounds:
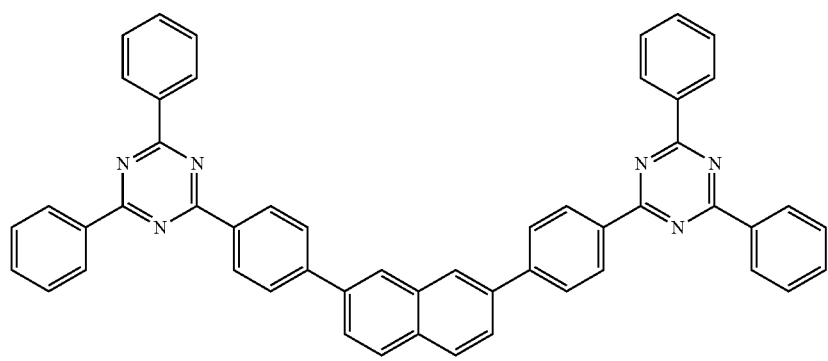

-continued
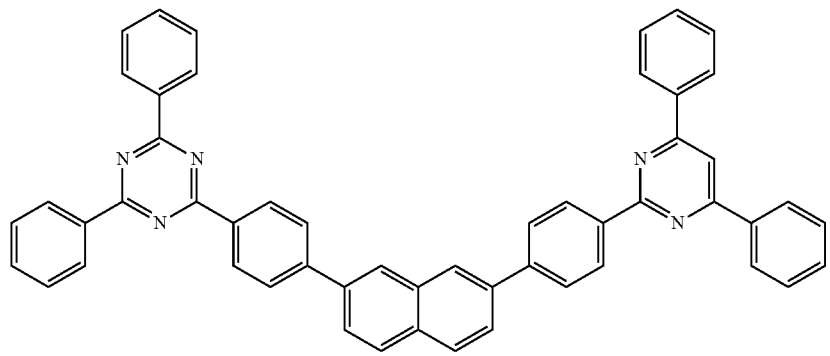
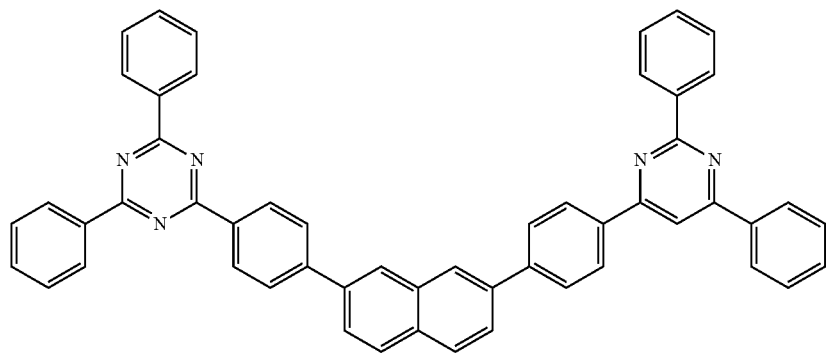
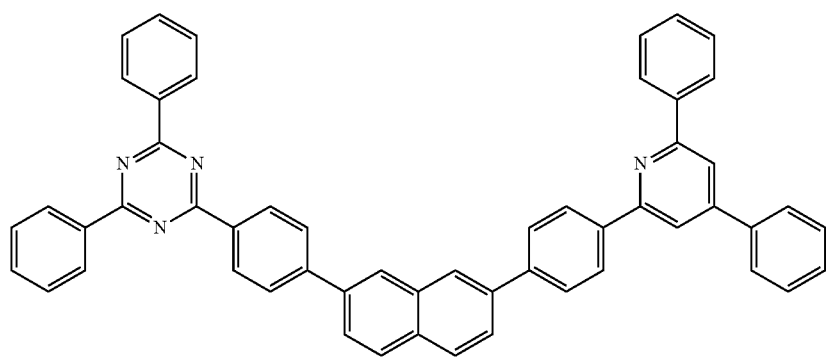
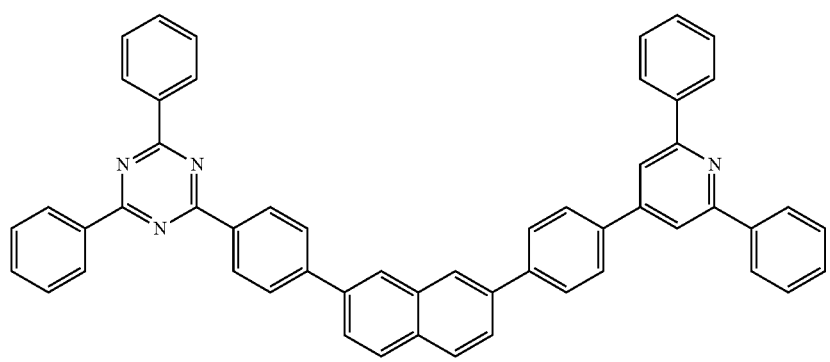

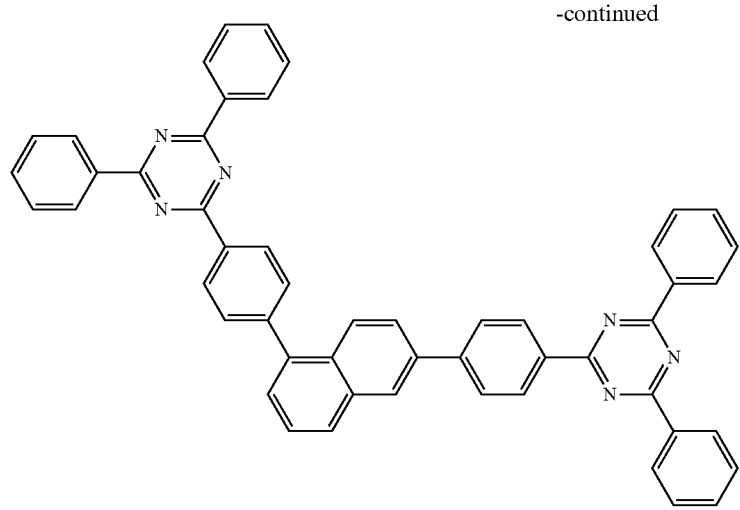
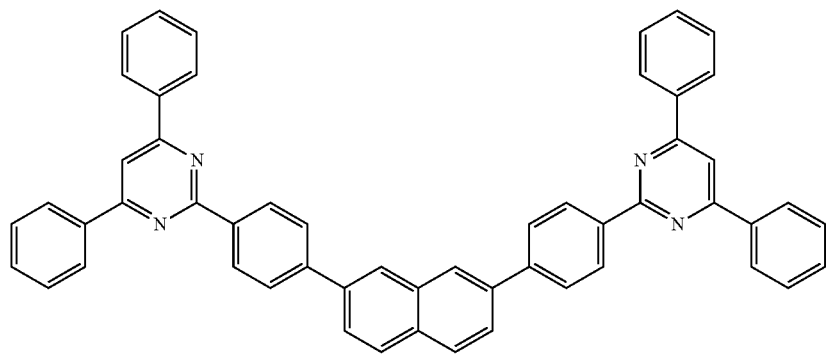
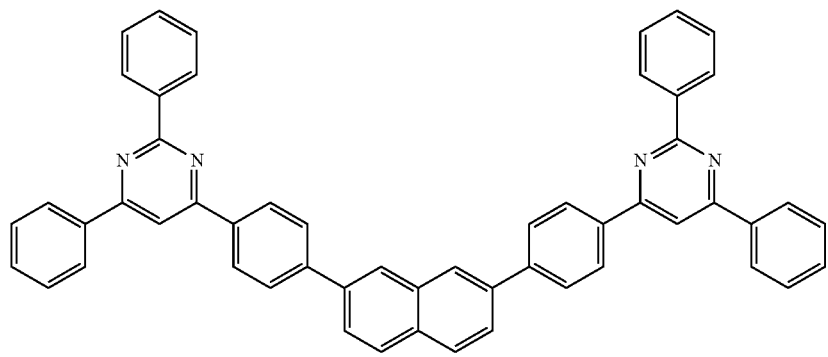
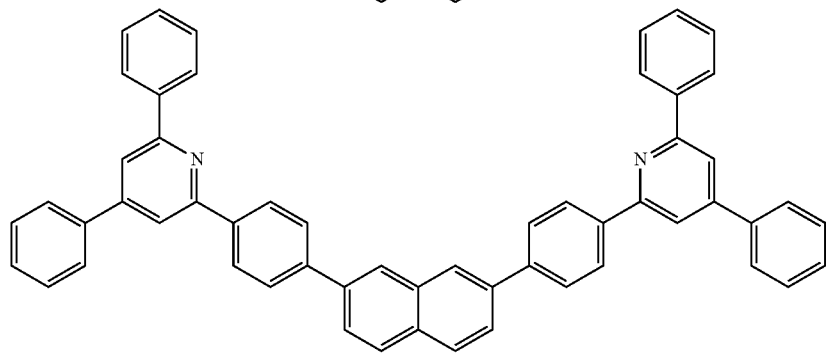

-continued
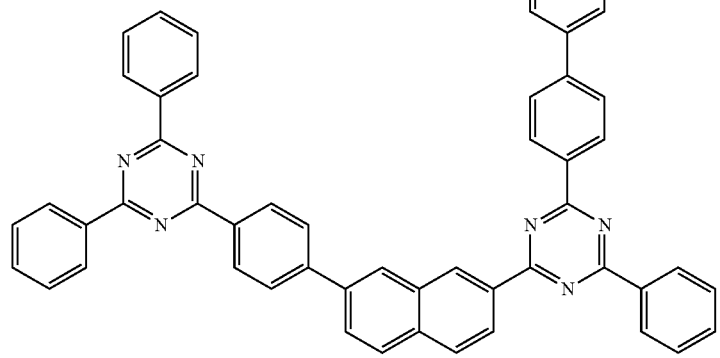
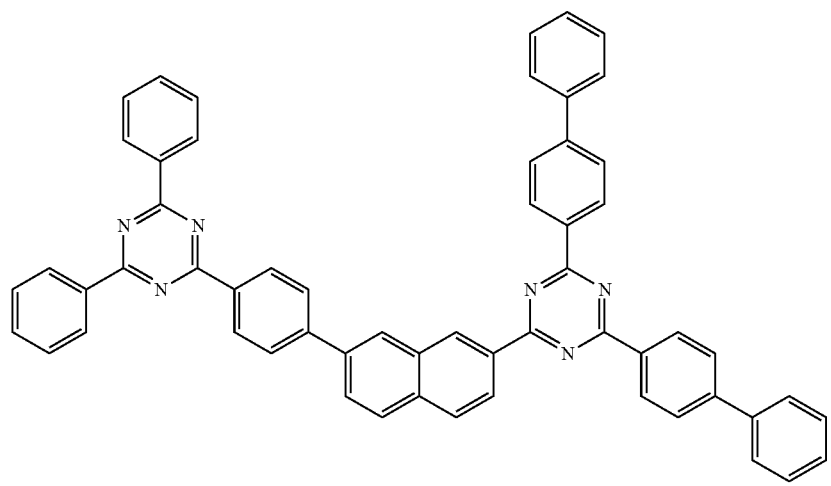
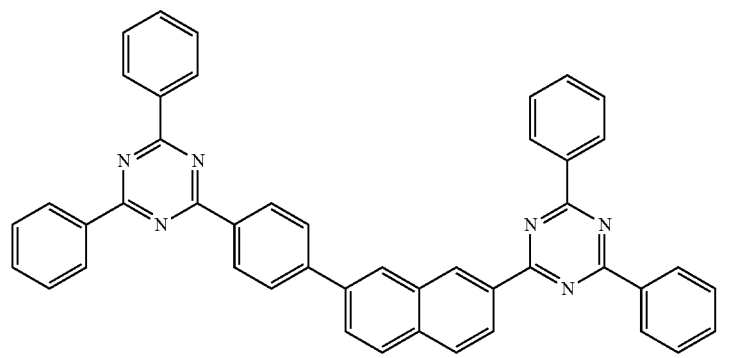
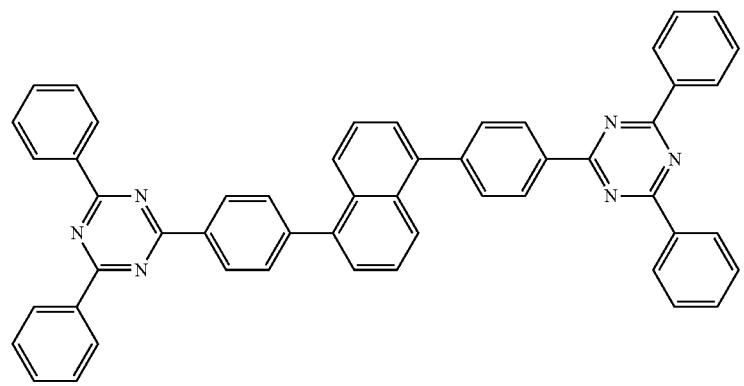

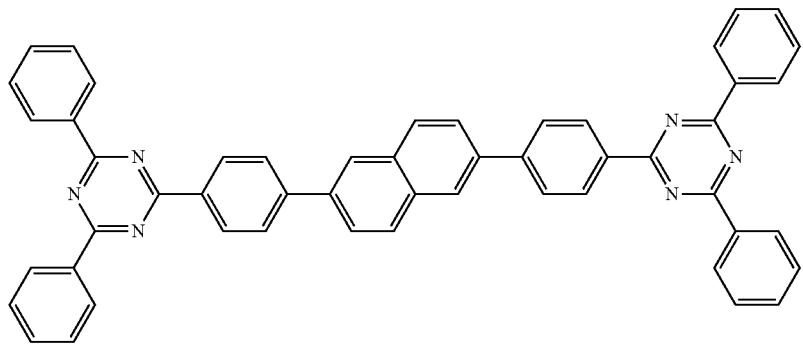
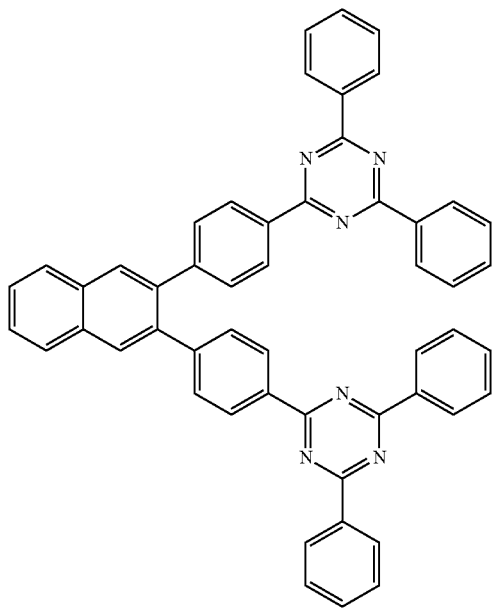
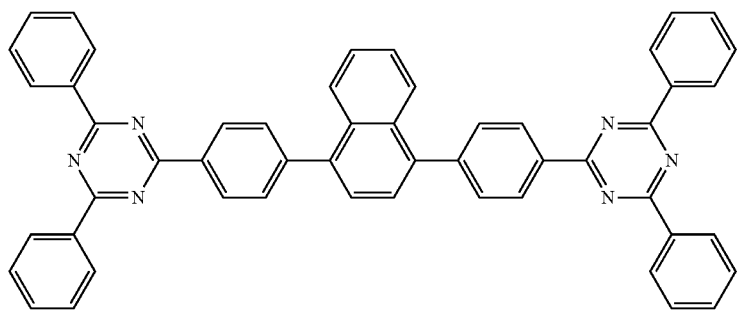

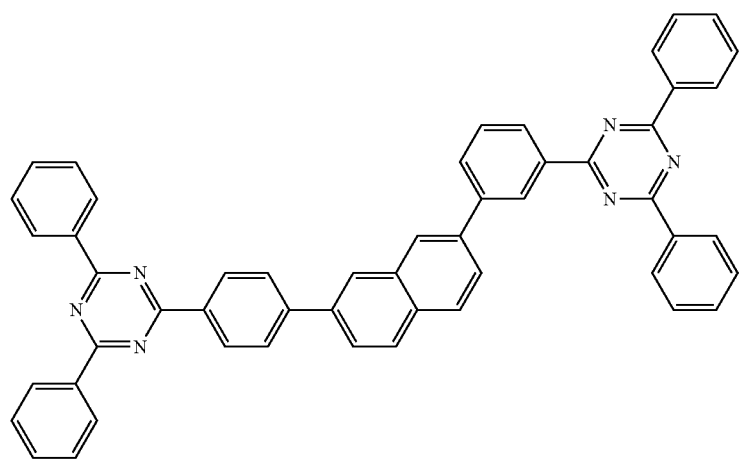
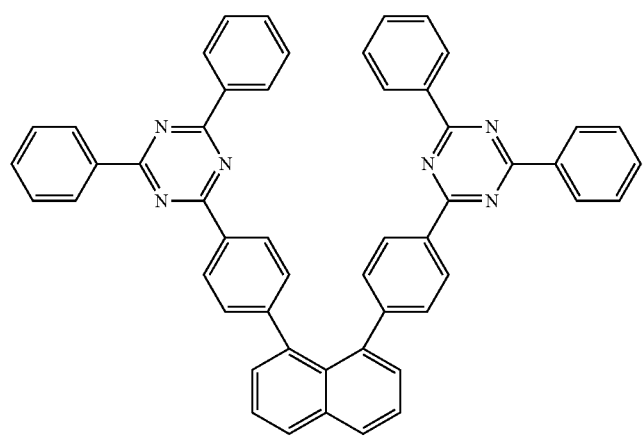
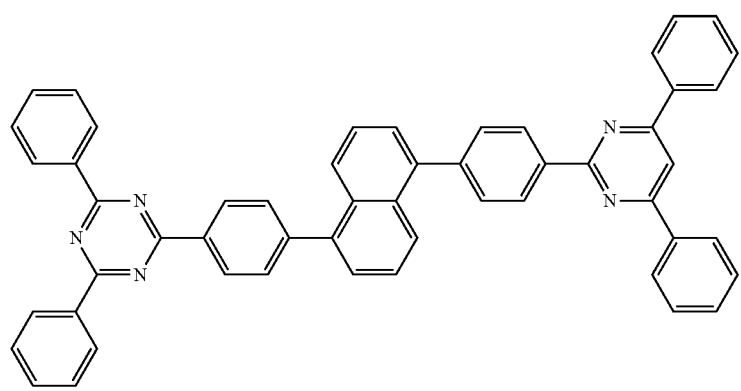
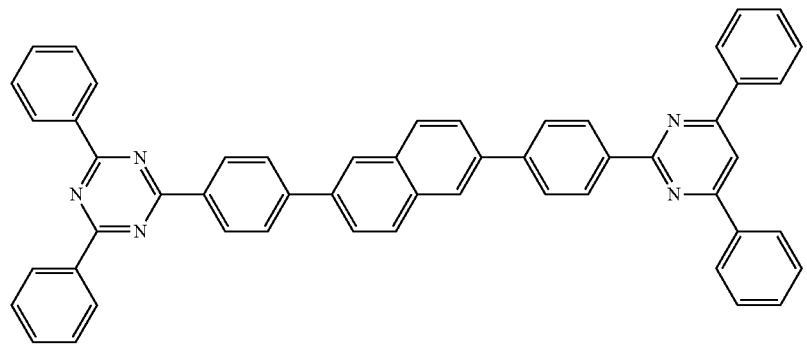

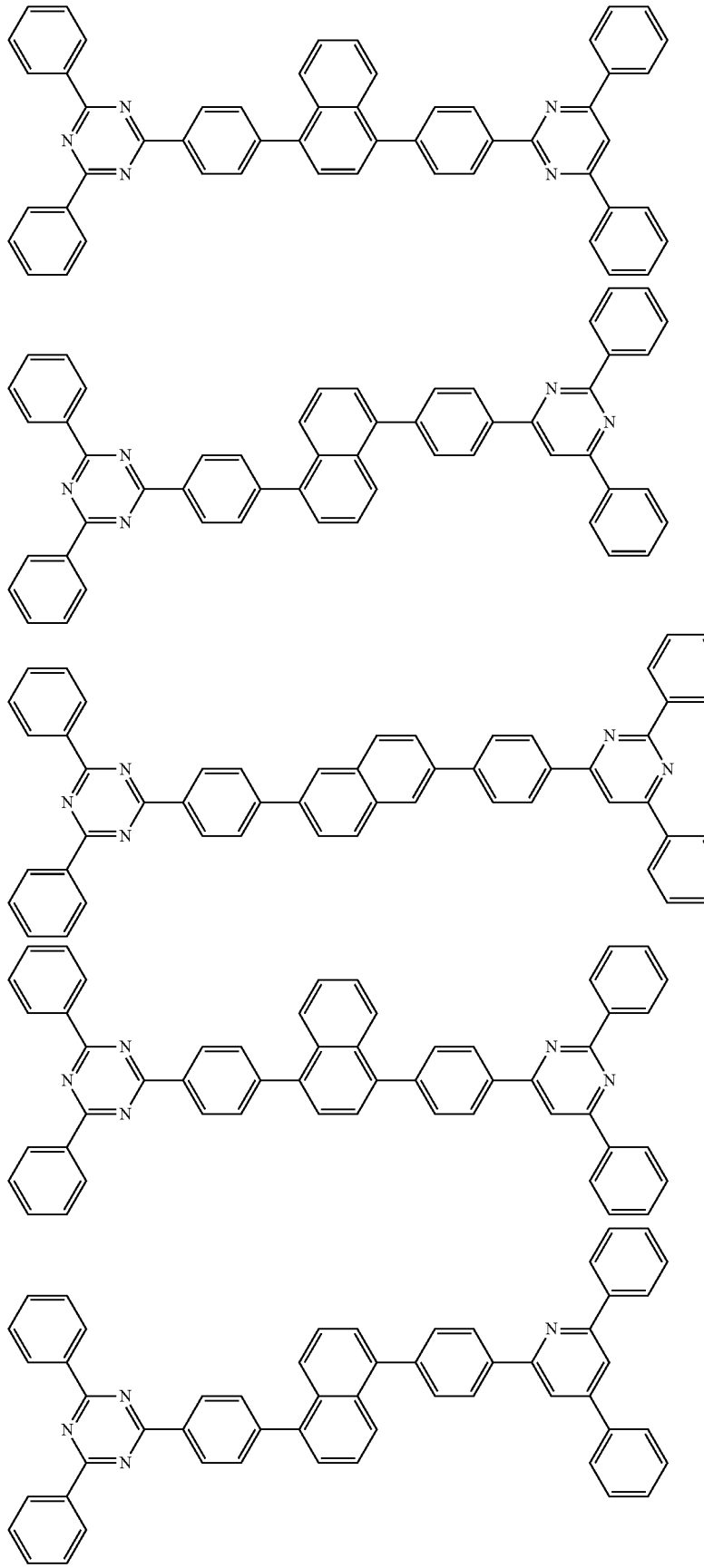

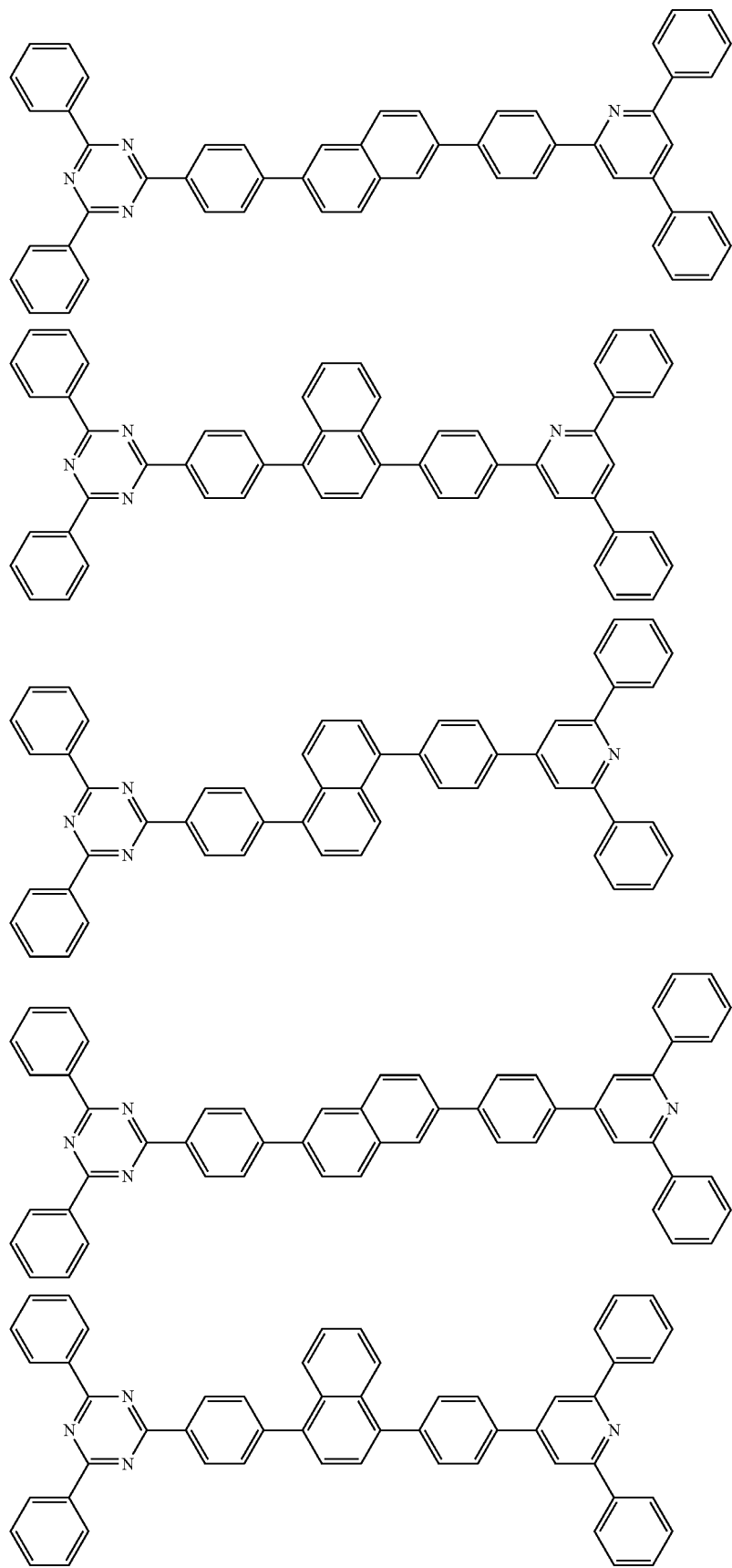

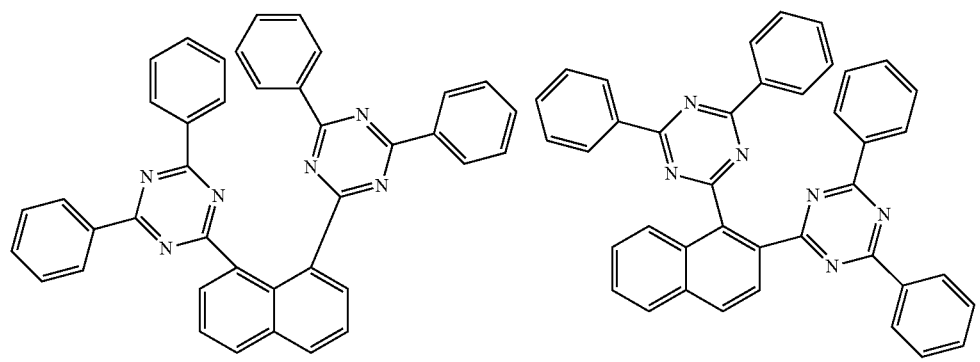
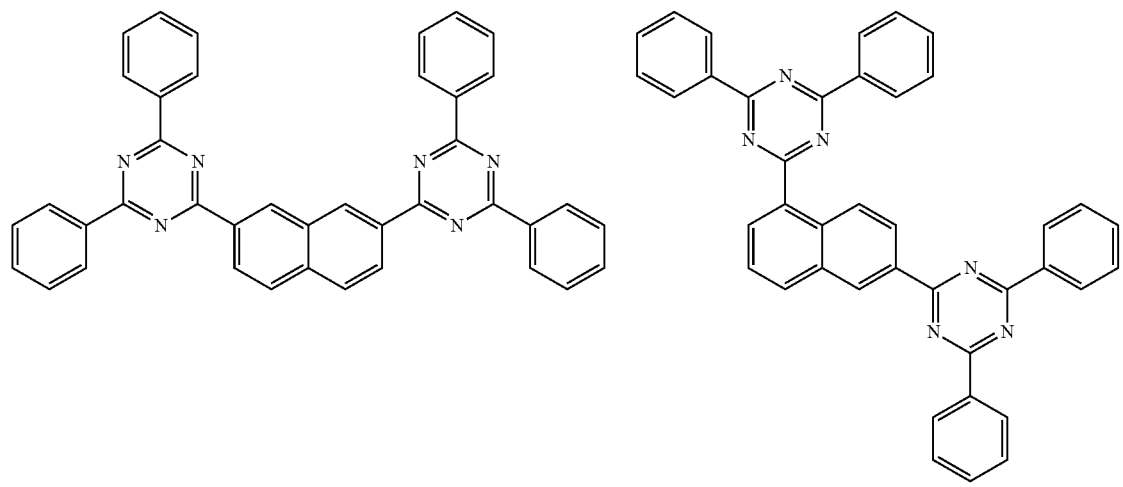
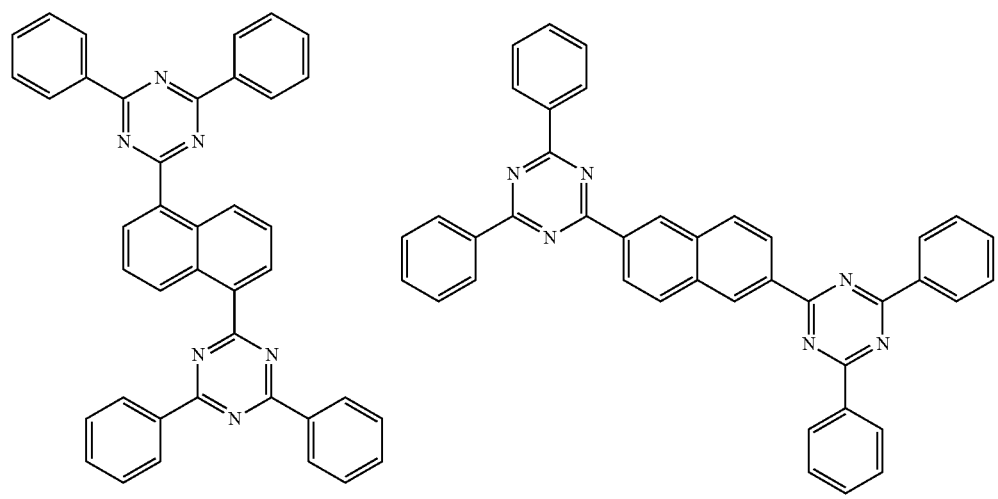

-continued
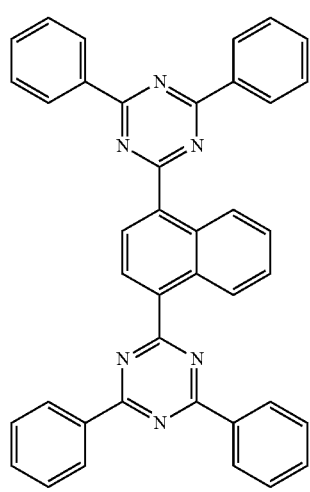
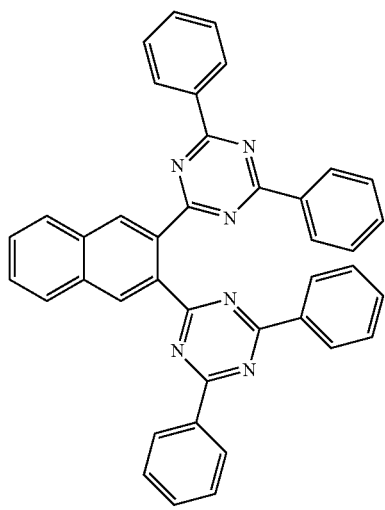
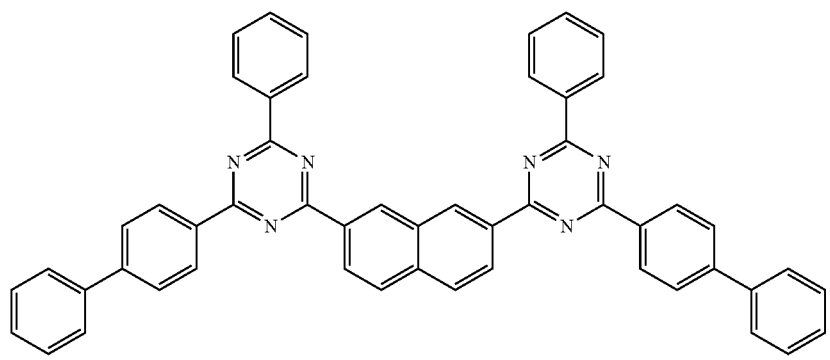
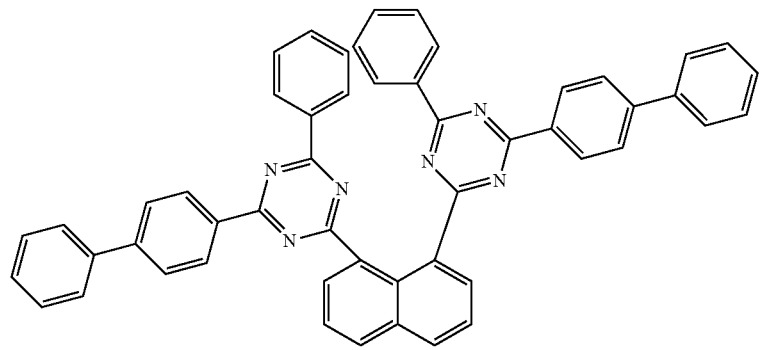
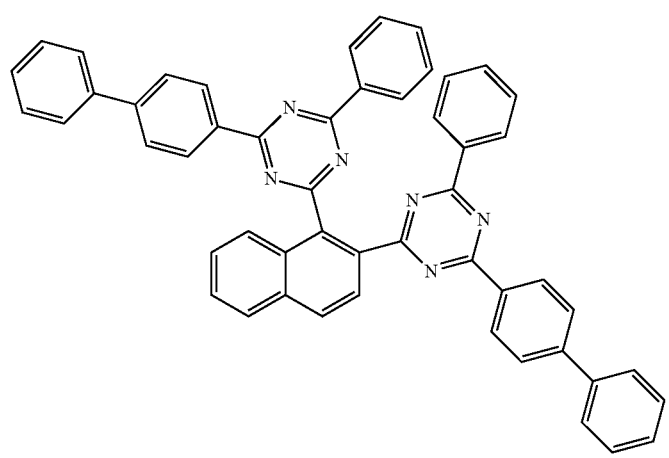

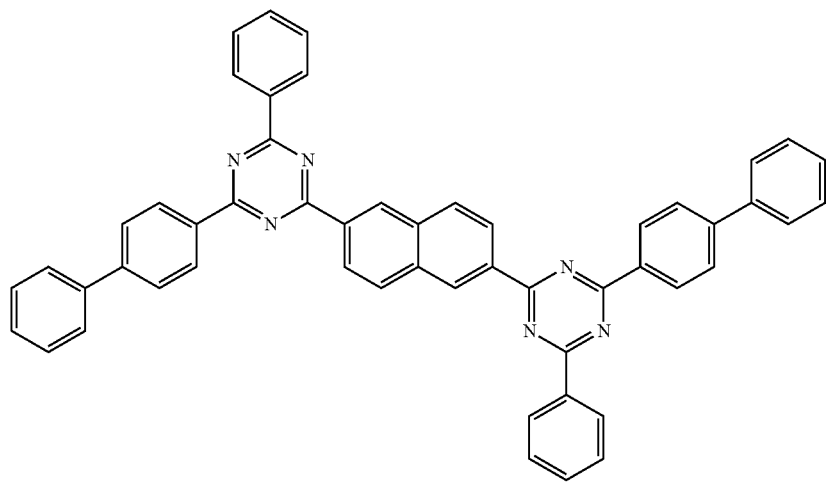
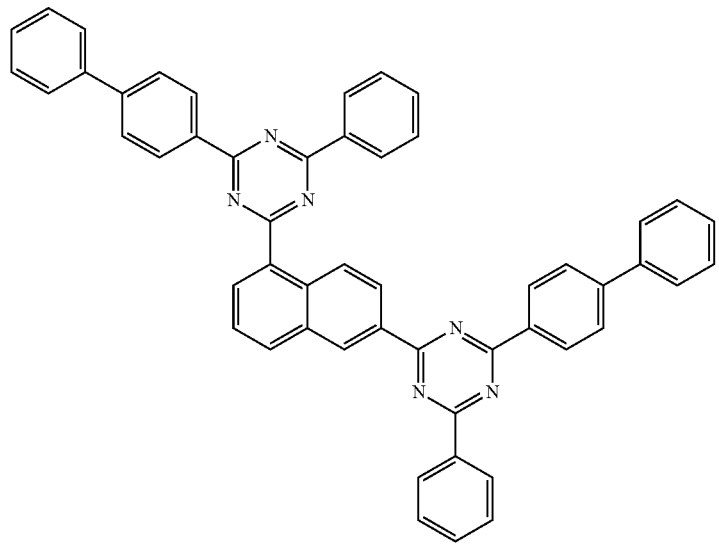
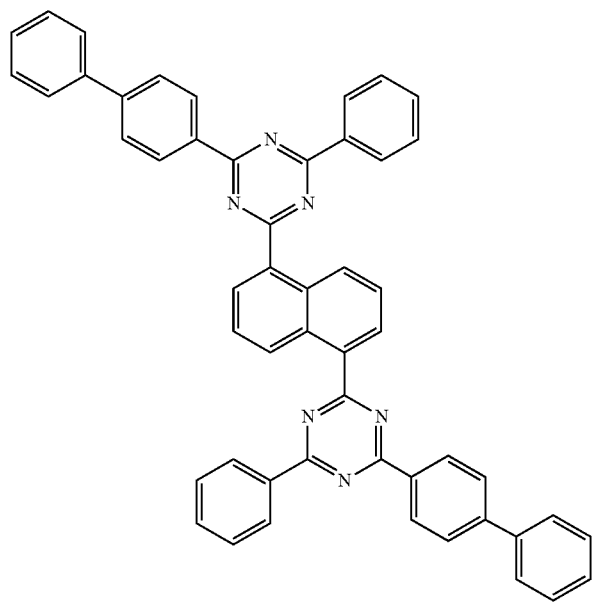
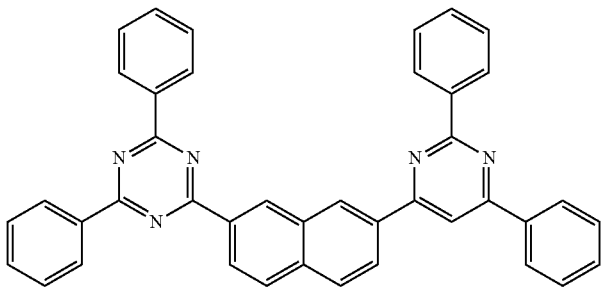

-continued
81
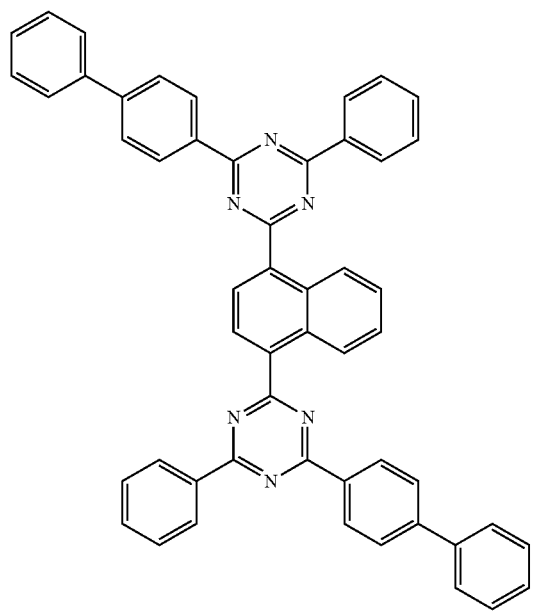
82
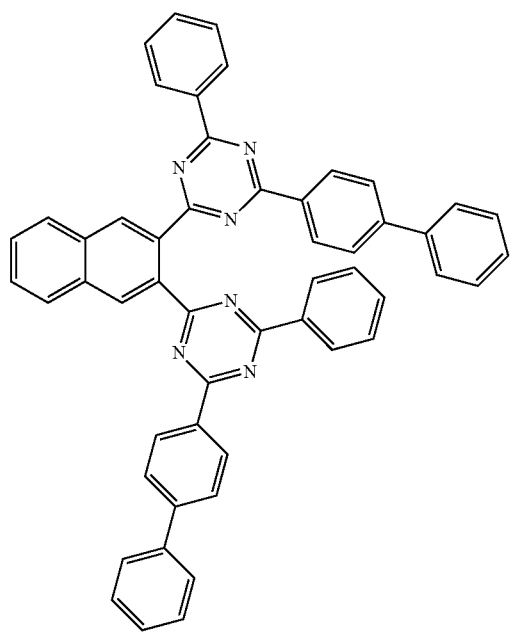
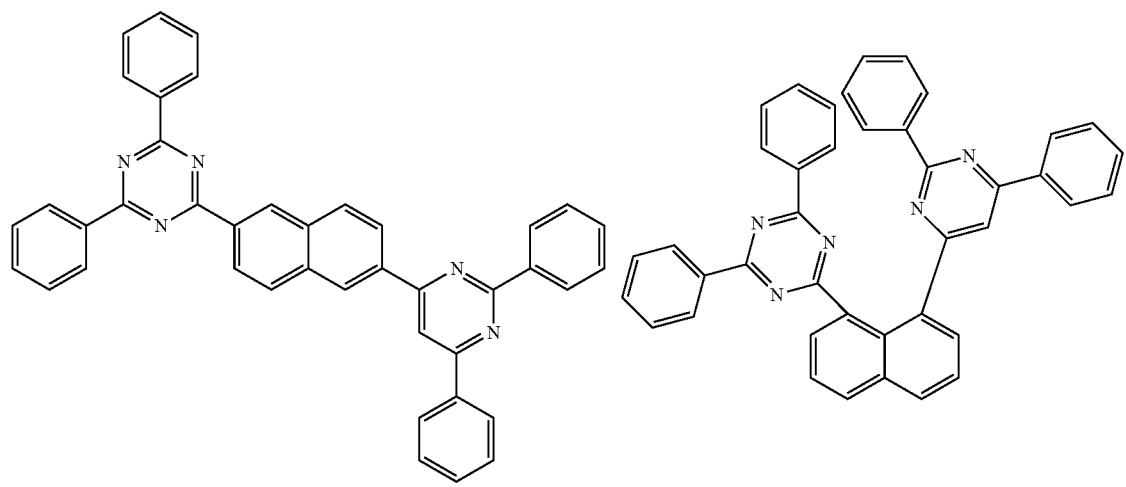

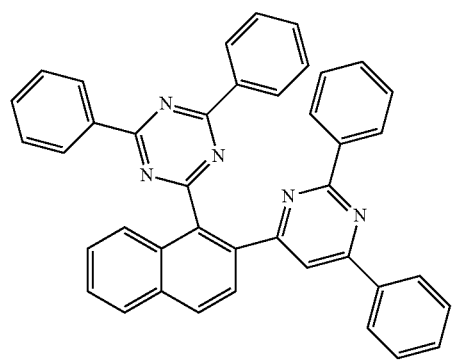
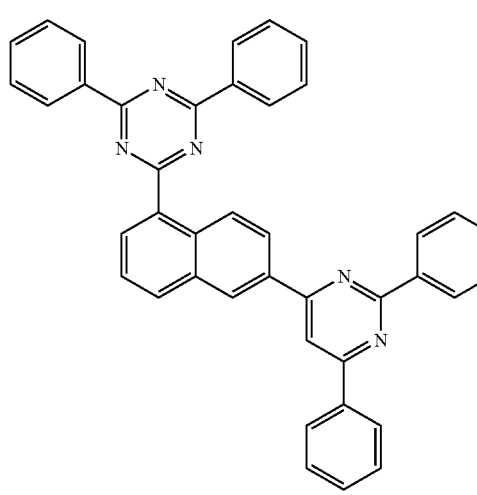
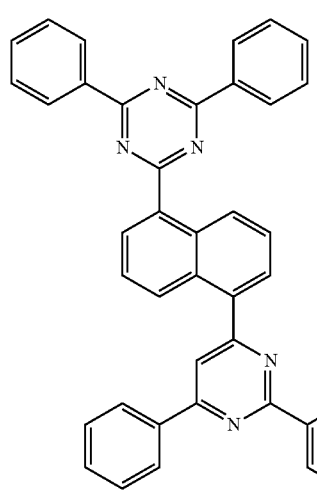
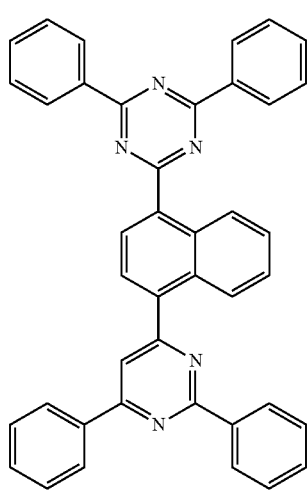
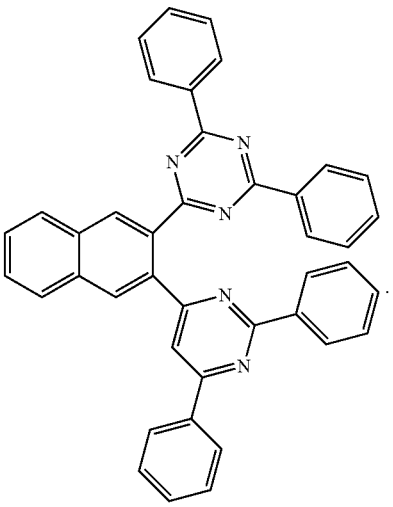
According to an exemplary embodiment of the present specification, the compound of Formula 3 is selected from among the following compounds:
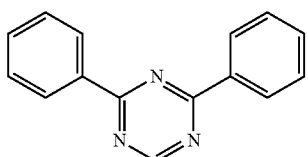
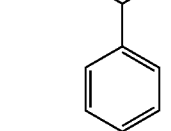
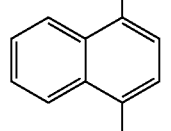
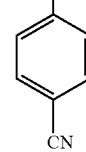

-continued
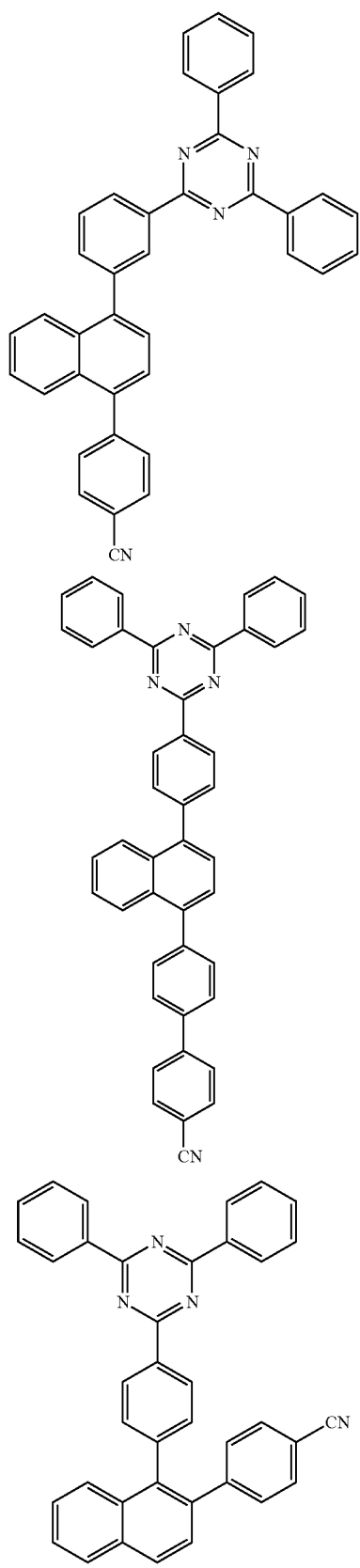
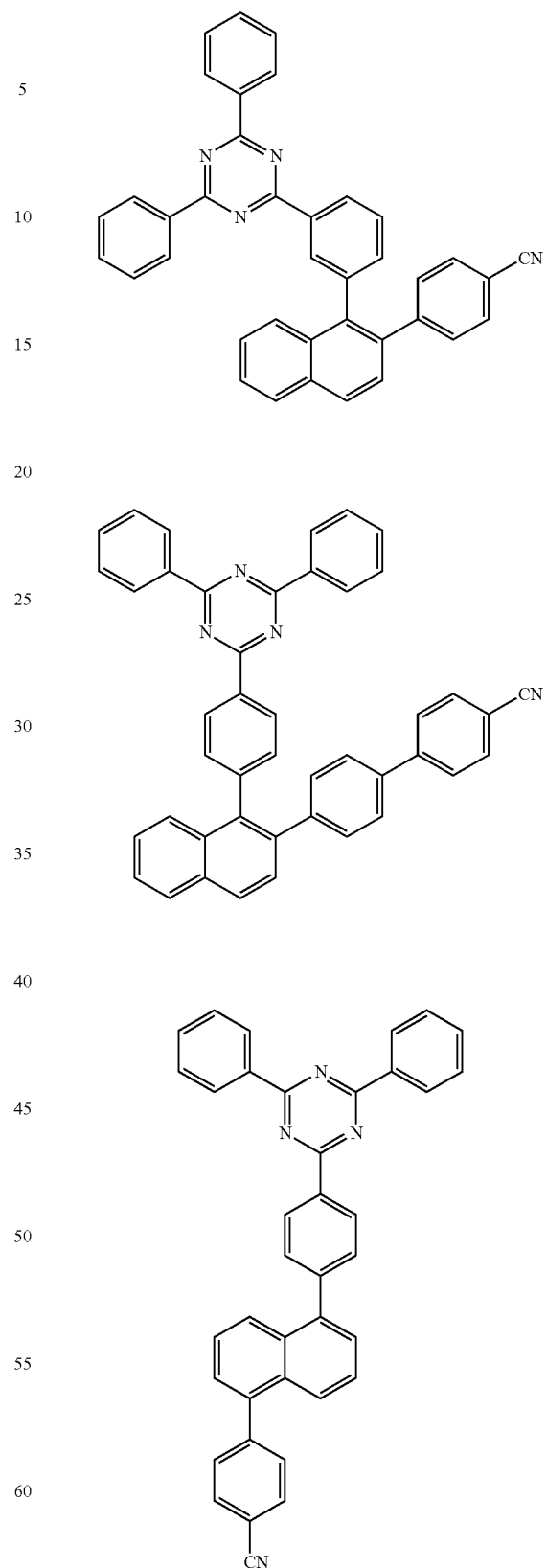

87
-continued
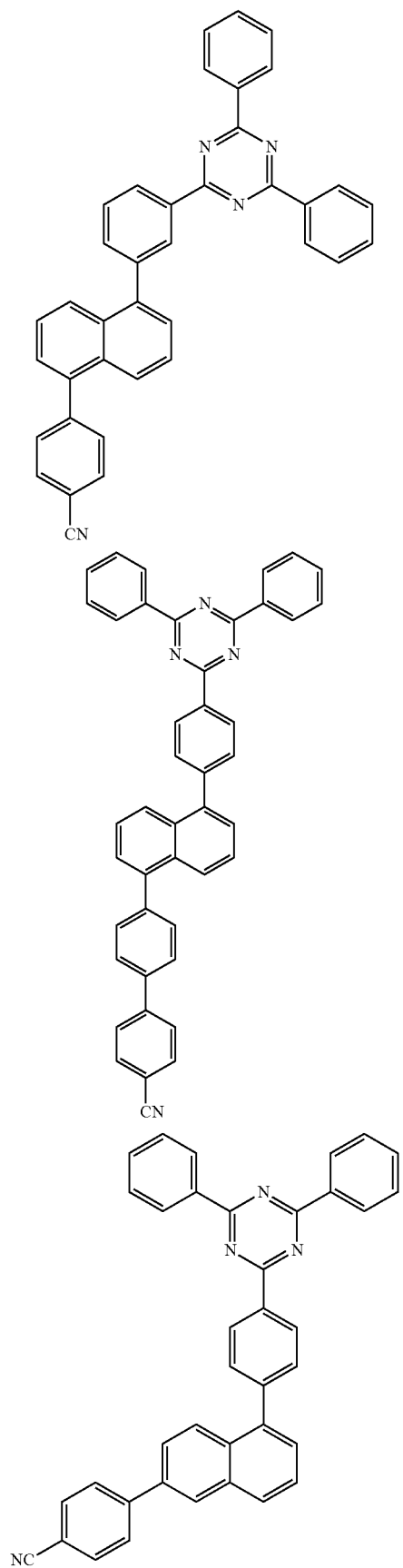
88
-continued
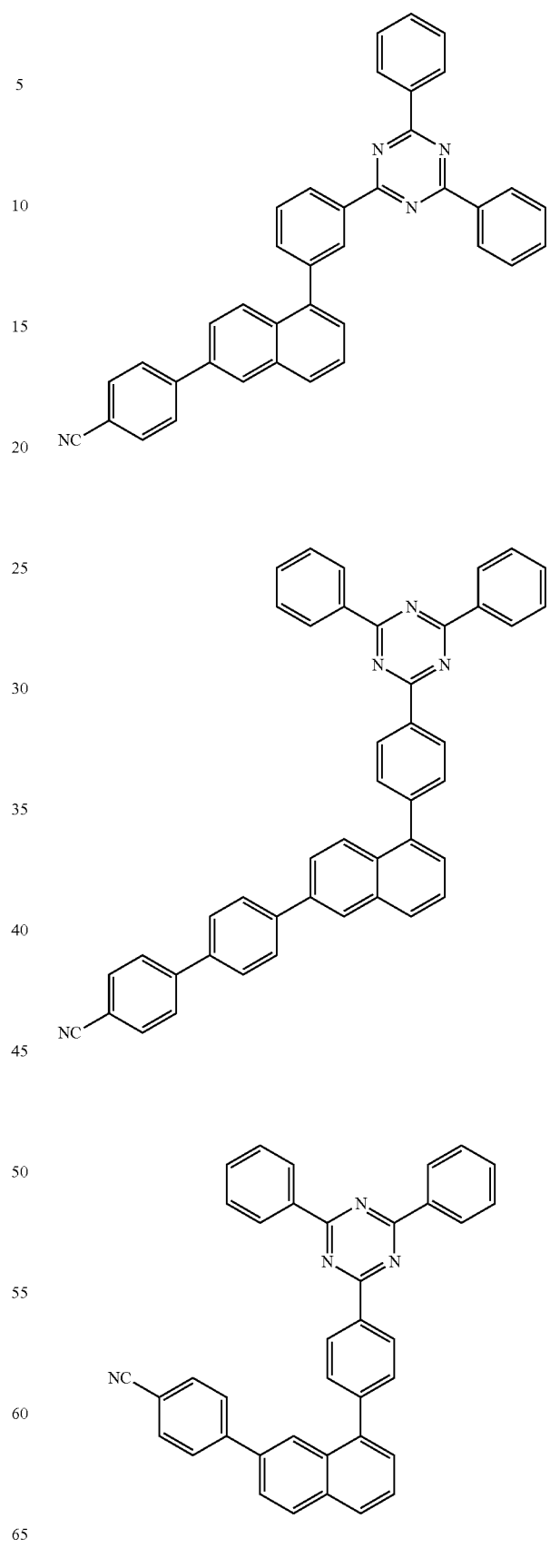

89
-continued
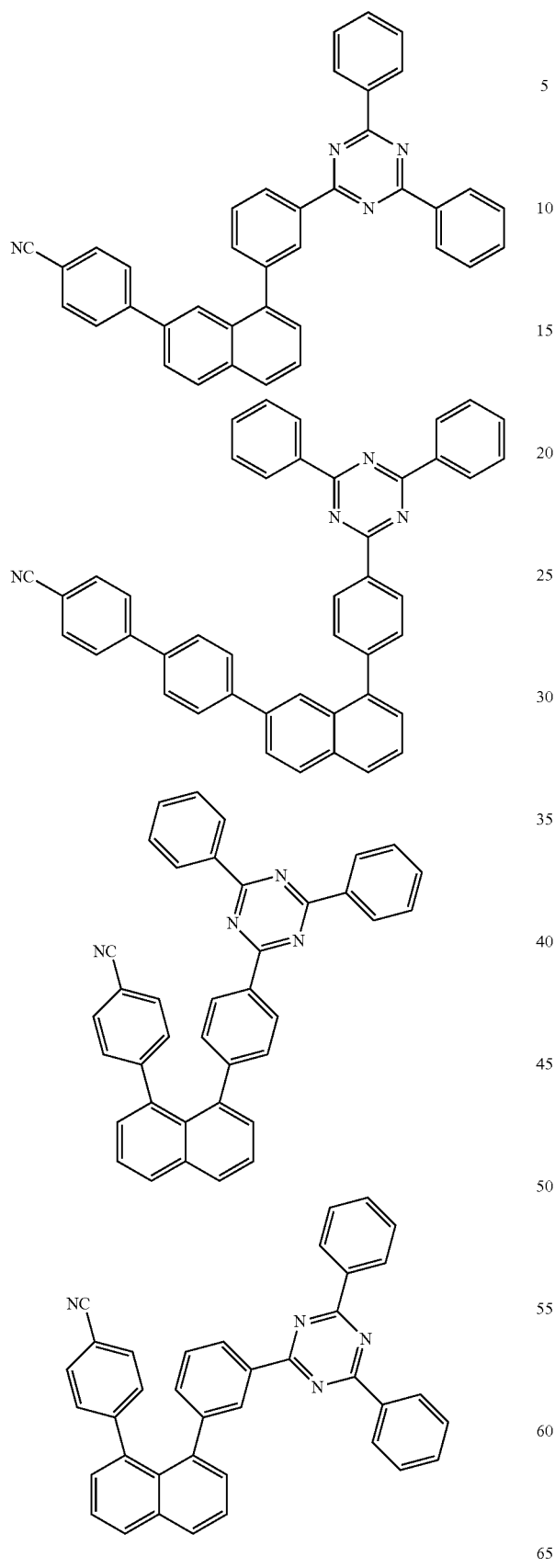
90
-continued
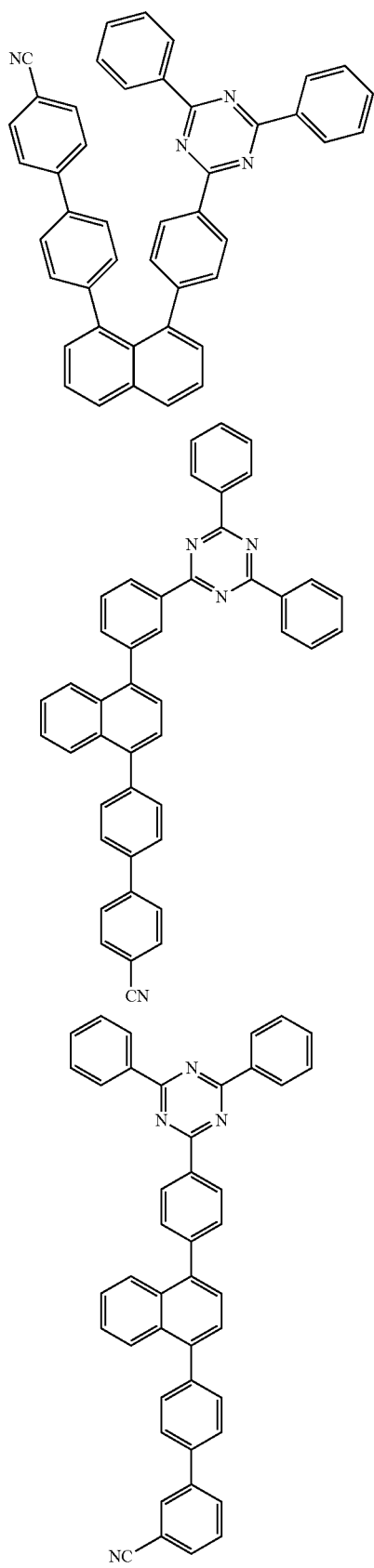

91
-continued
92
-continued
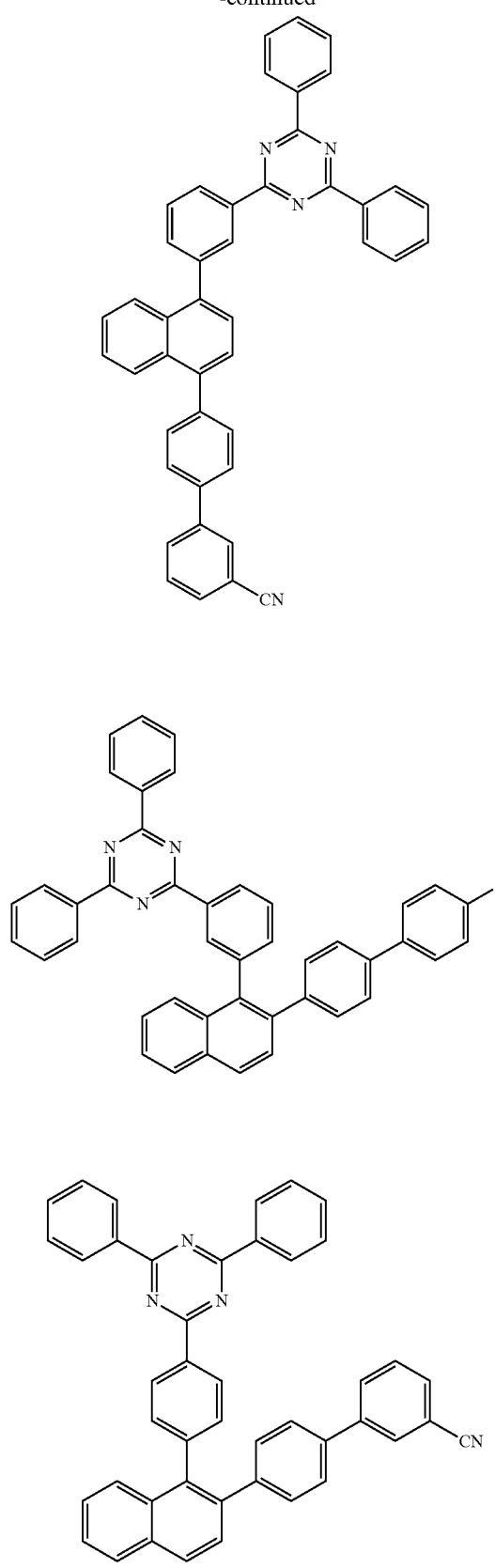
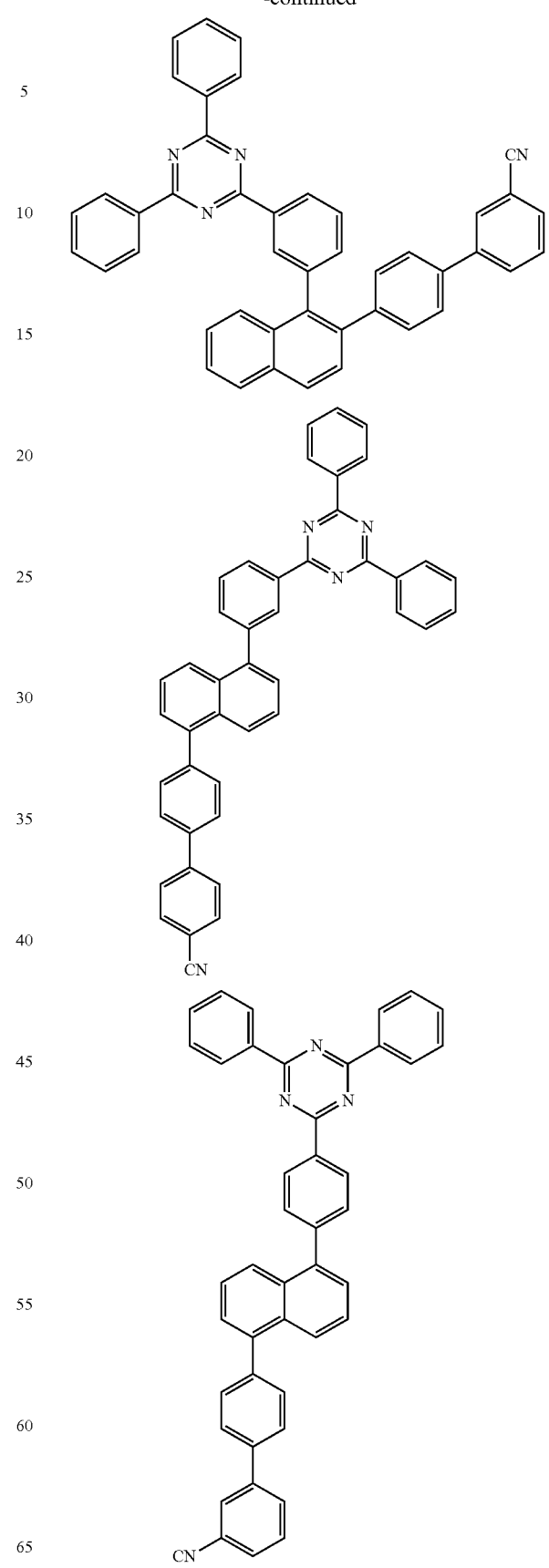

93
-continued
94
-continued
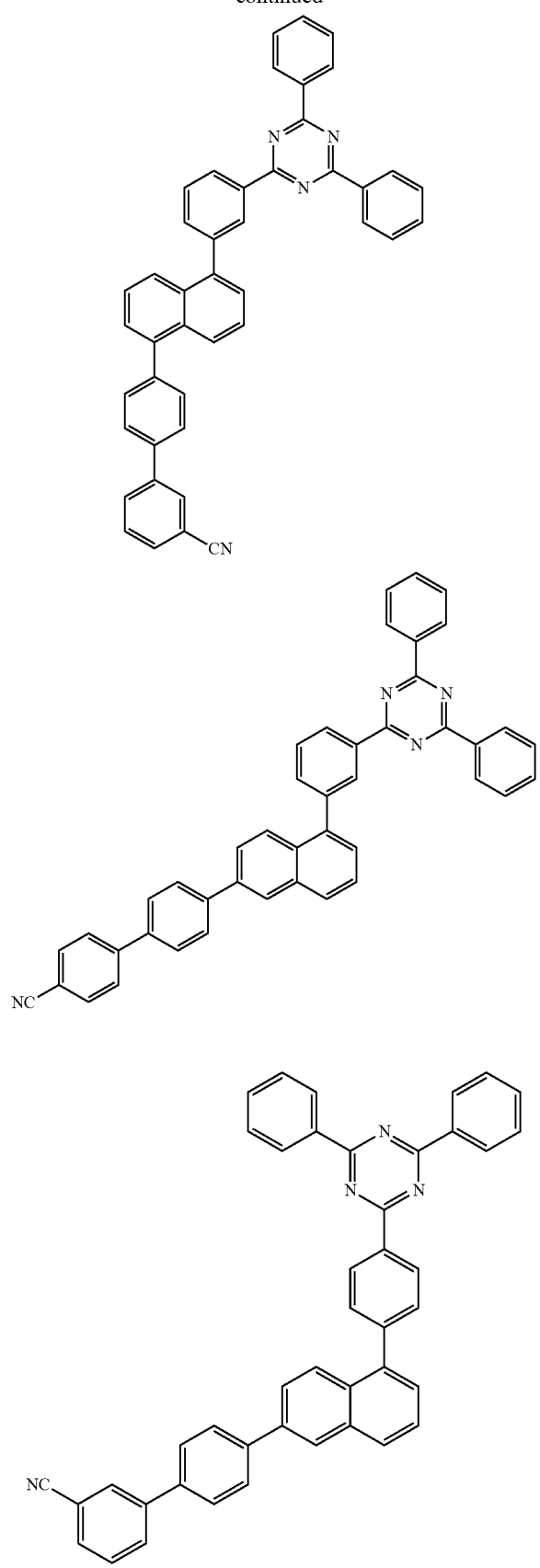
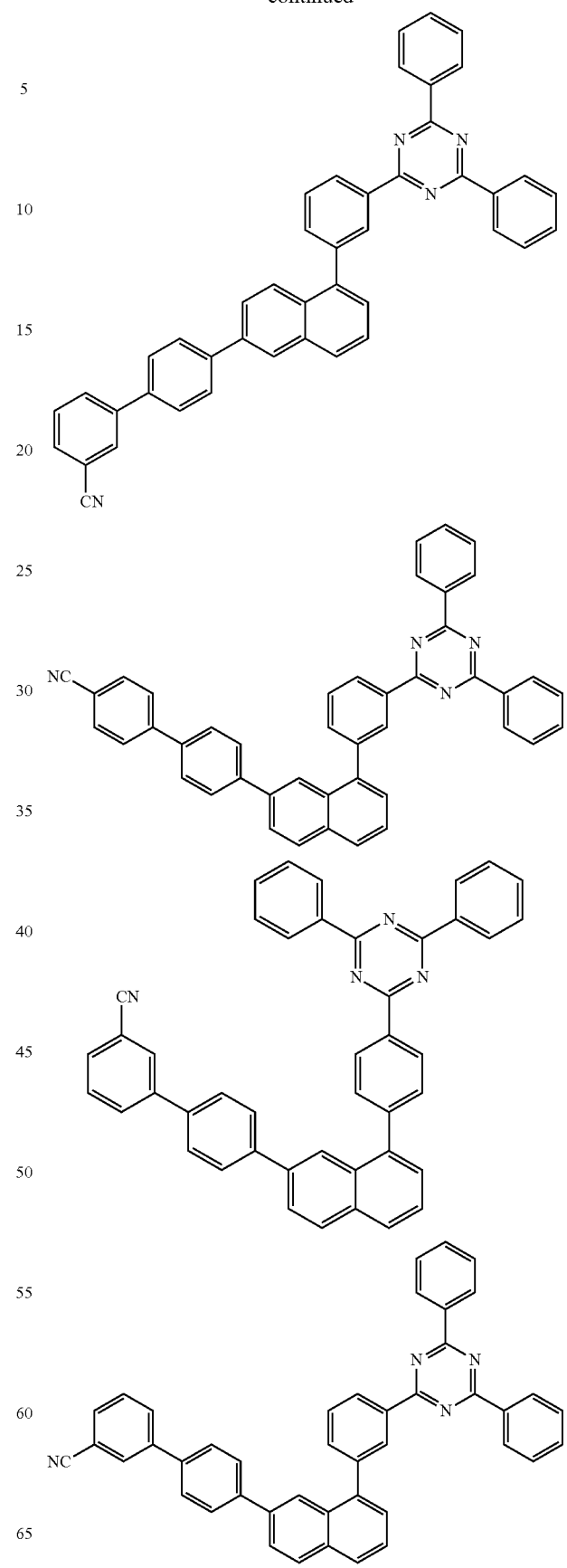

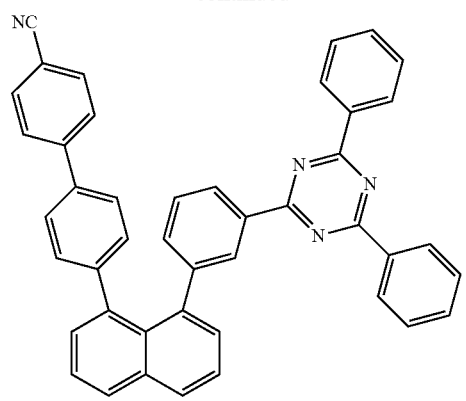
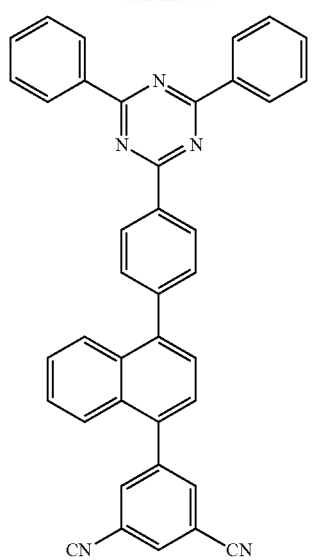
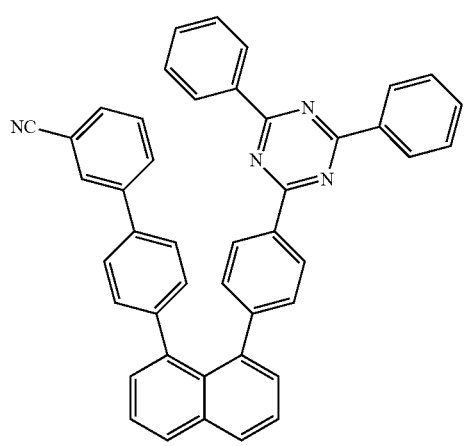
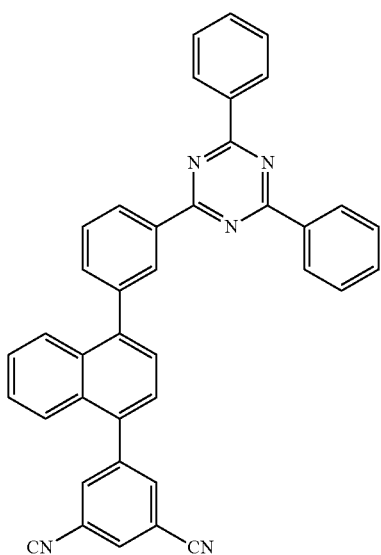

97
-continued
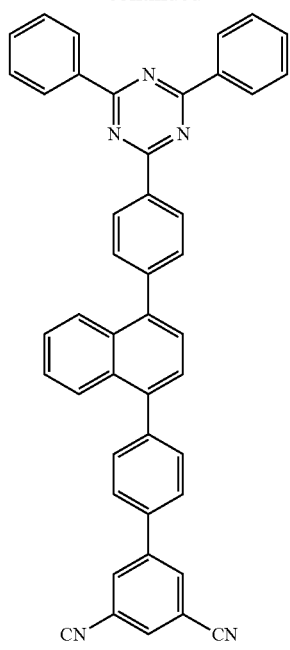
98
-continued
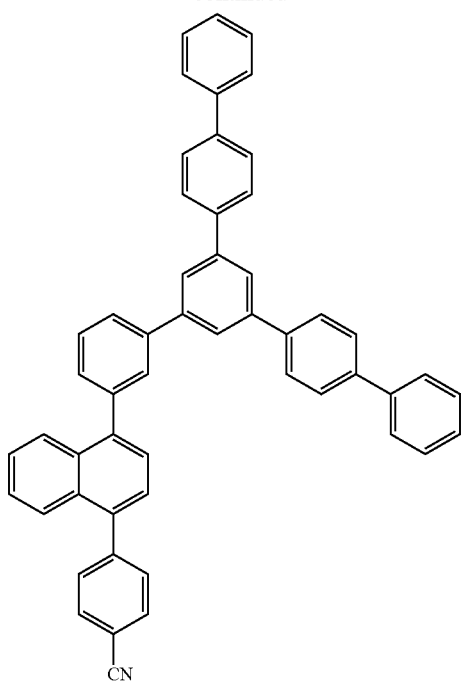
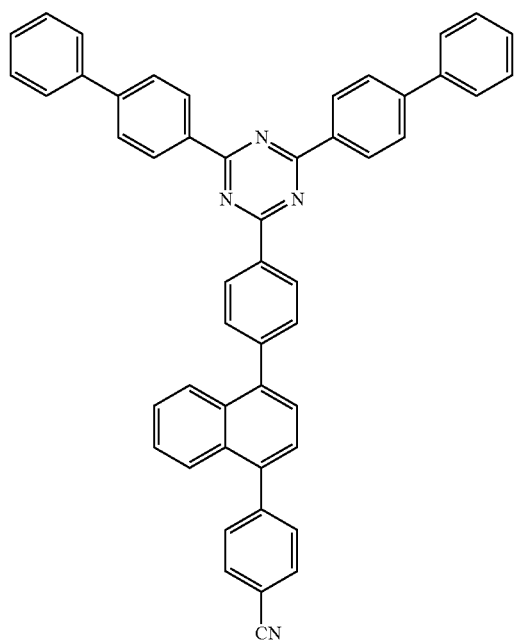
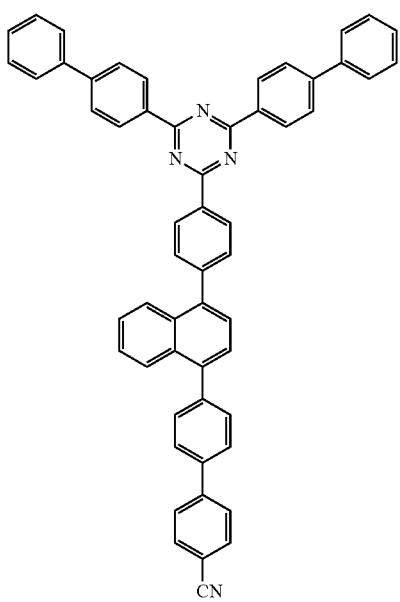

99
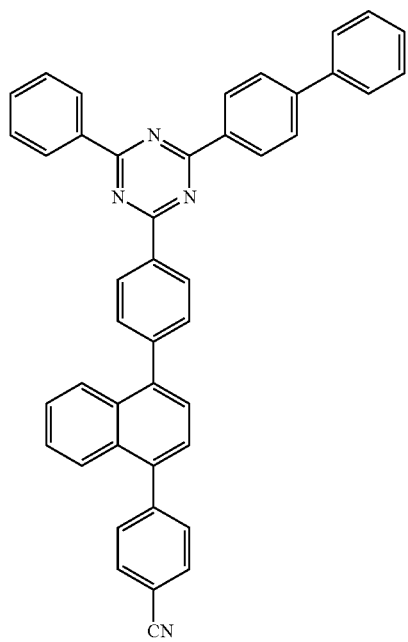
100
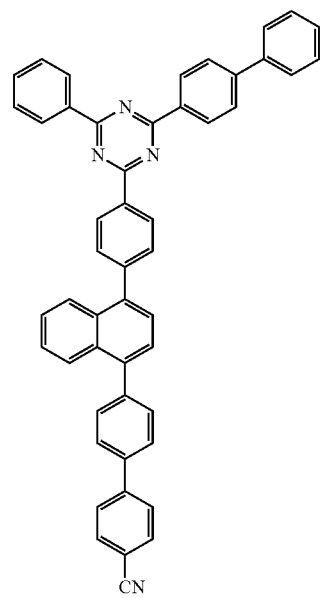
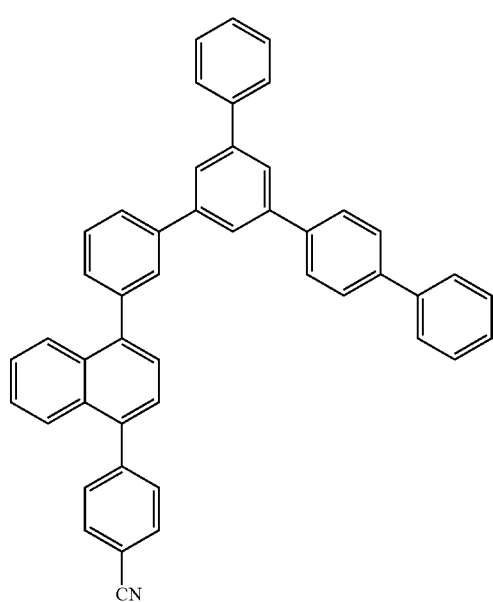
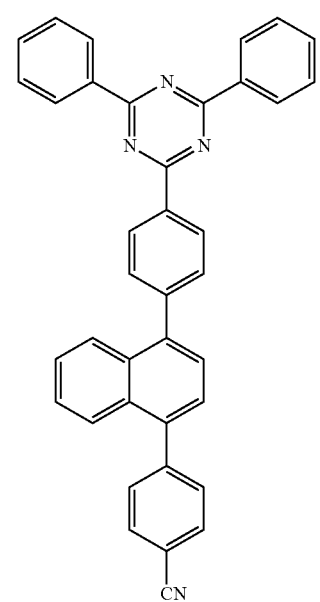

-continued
101
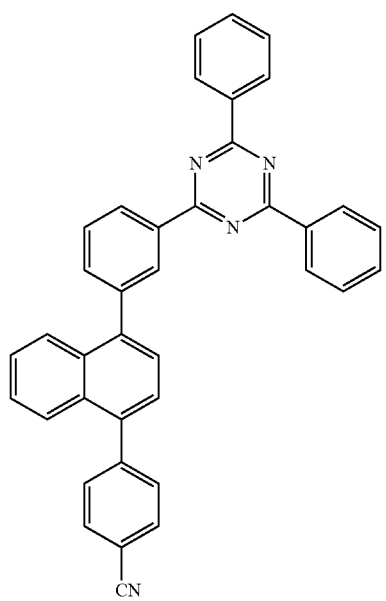
102
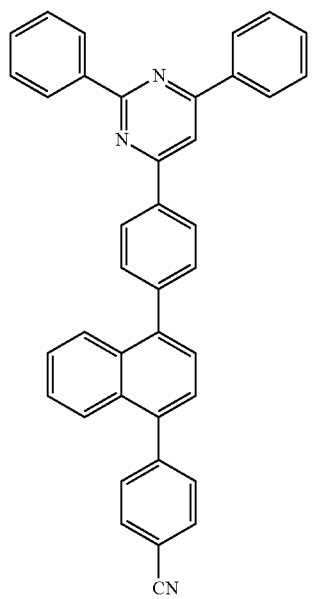
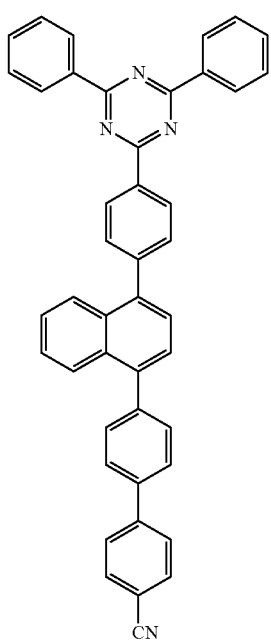
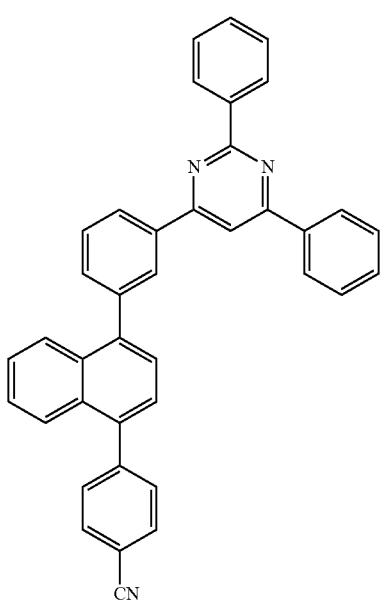

103
-continued
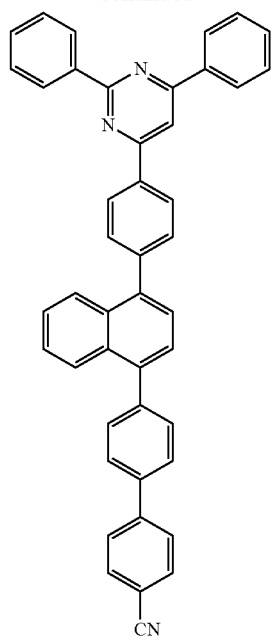
104
-continued
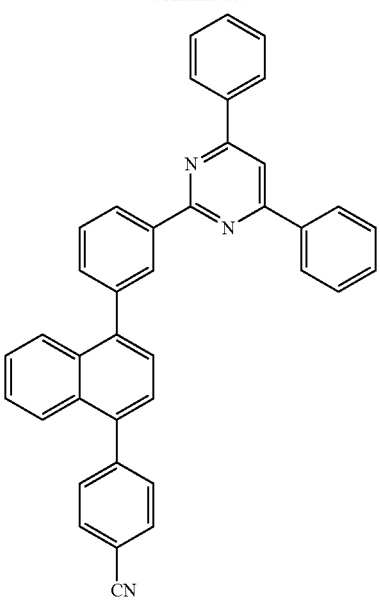
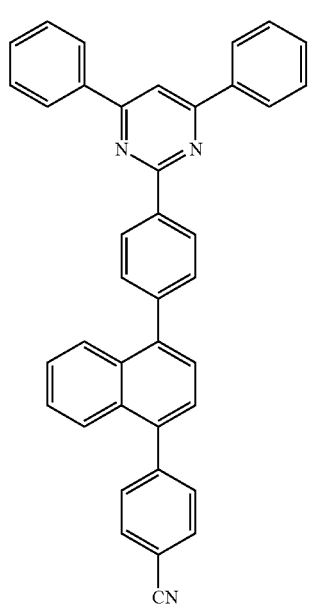
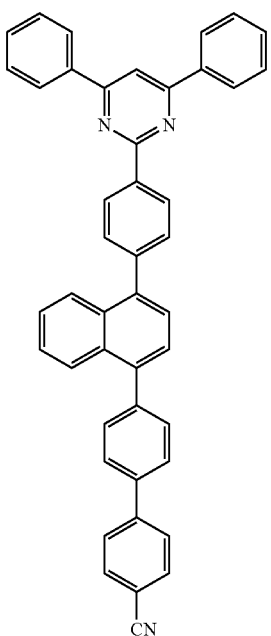

105
-continued
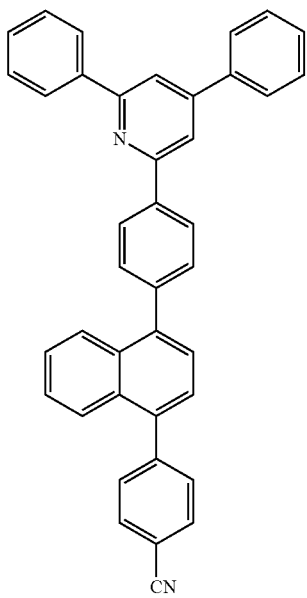
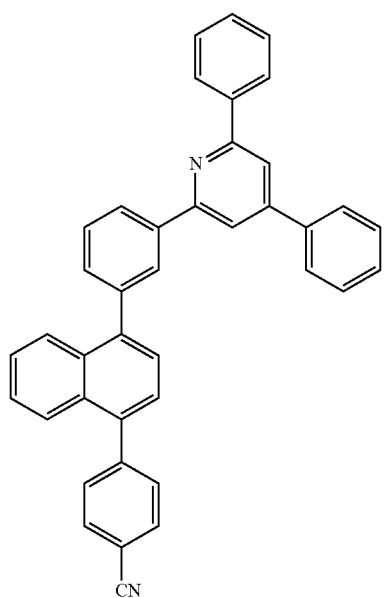
106
-continued
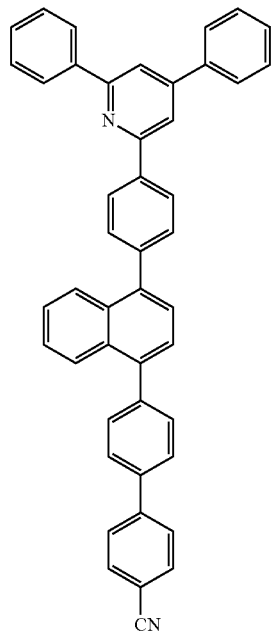
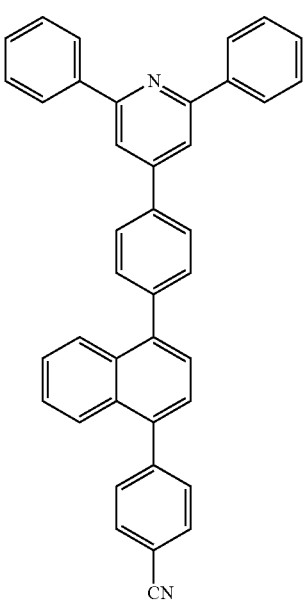

107
-continued
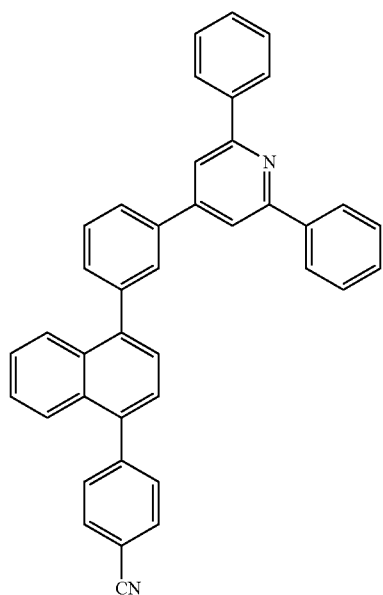
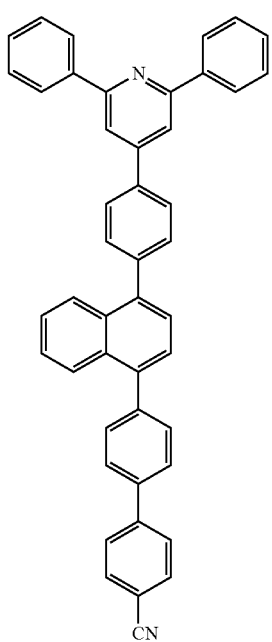
108
-continued
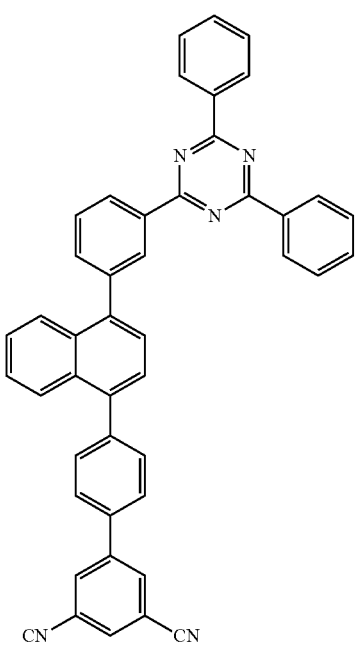
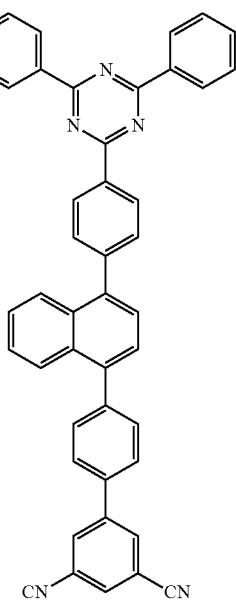

109
-continued
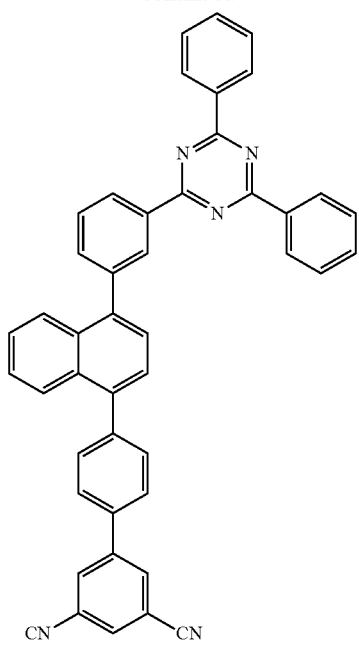
110
-continued
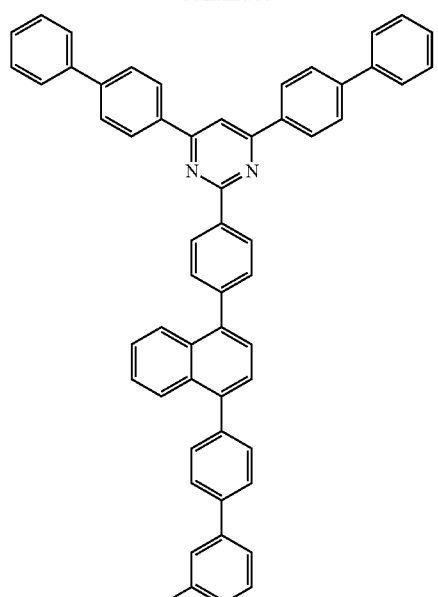
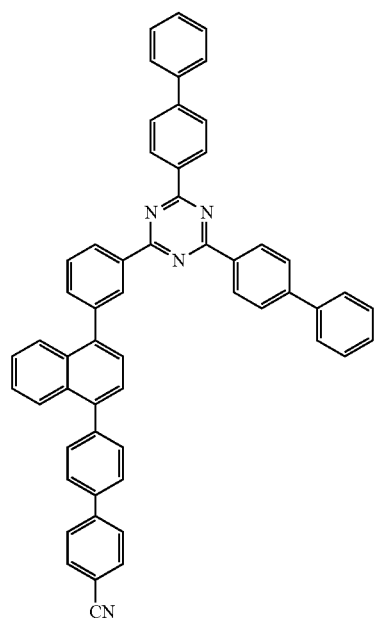
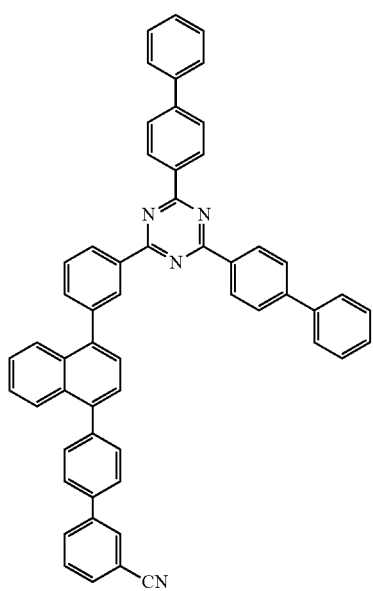

111
-continued
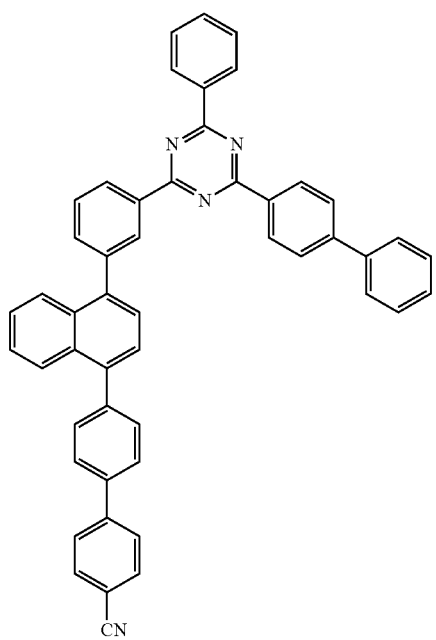
112
-continued
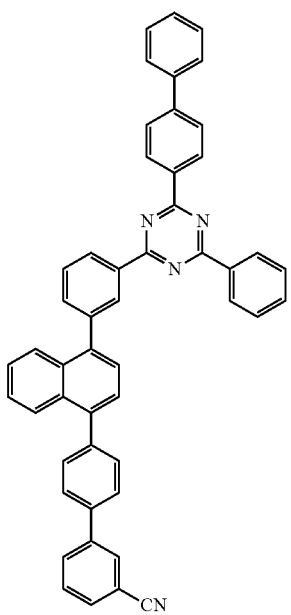
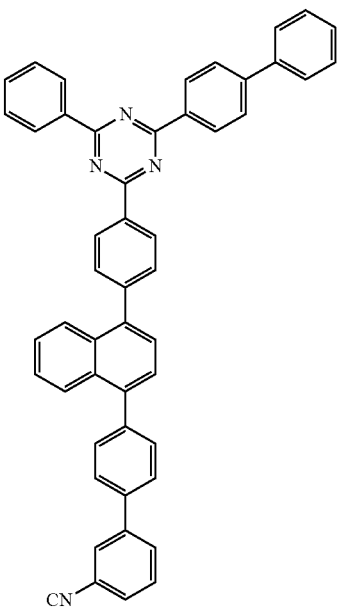
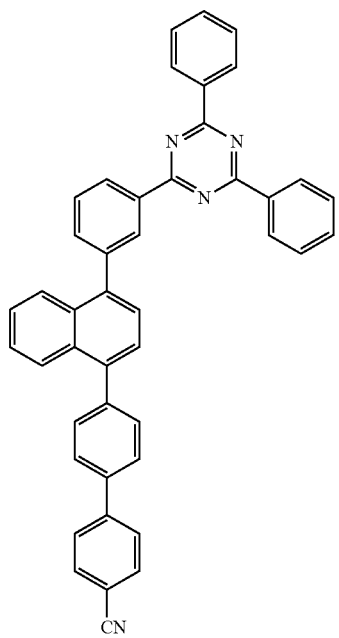

113
-continued
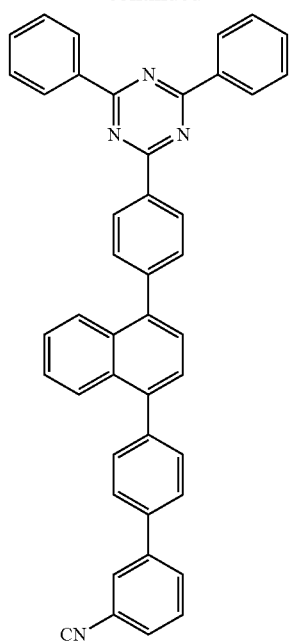
114
-continued
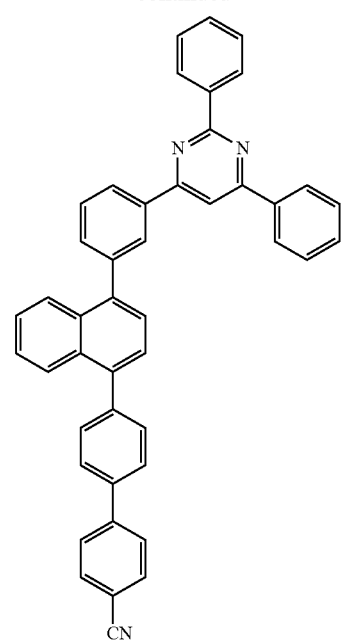
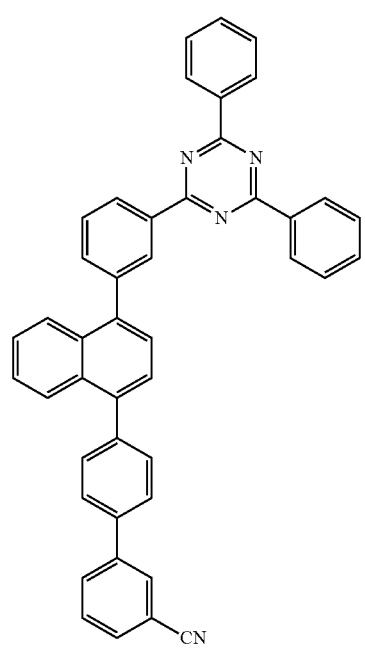
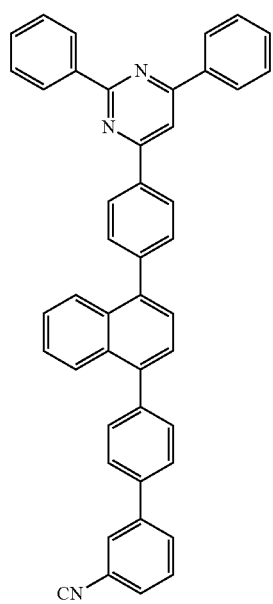

115
-continued
116
-continued
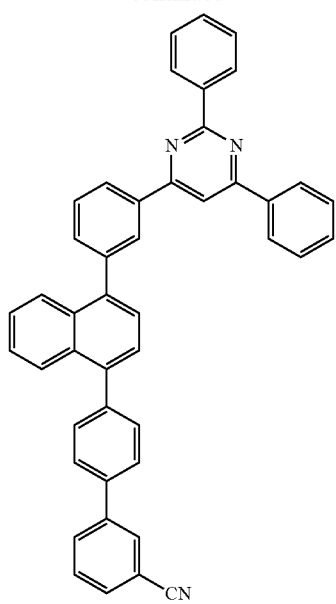
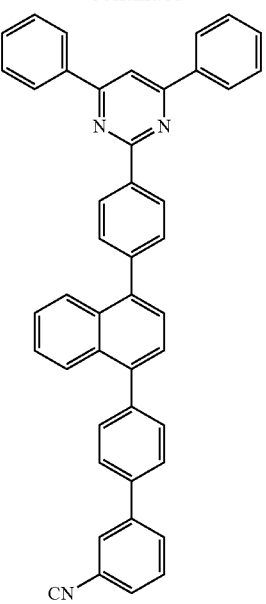
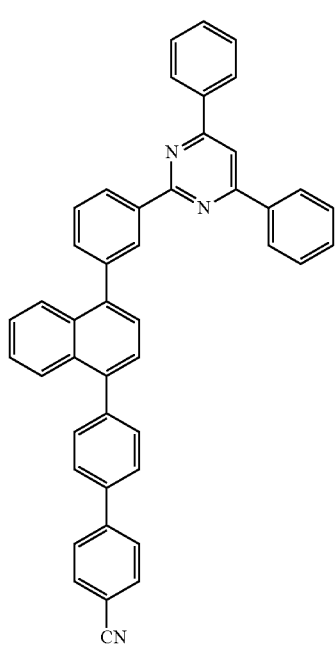
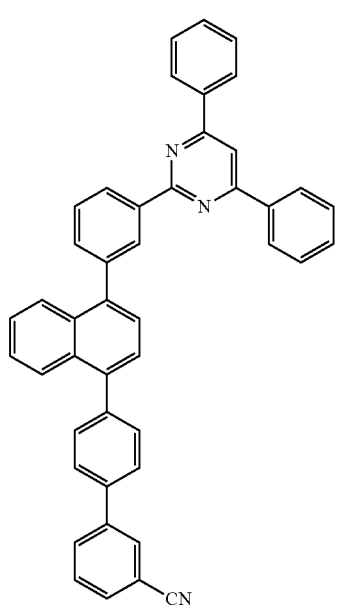

117
-continued
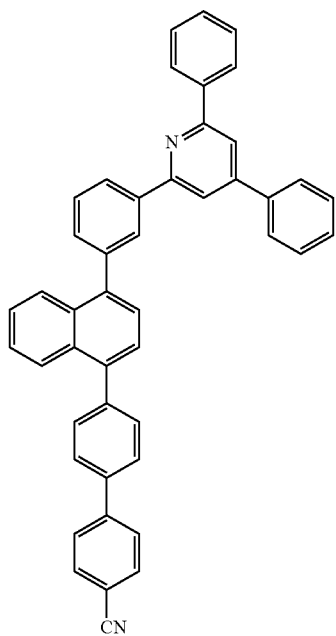
118
-continued
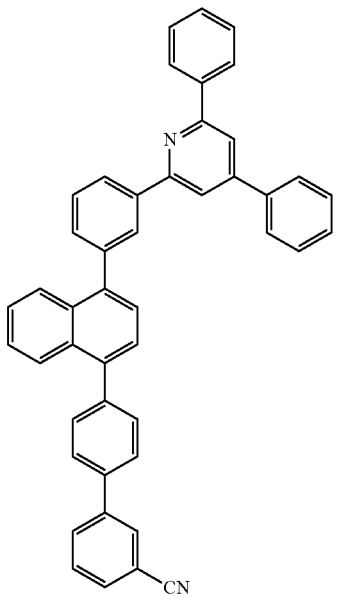
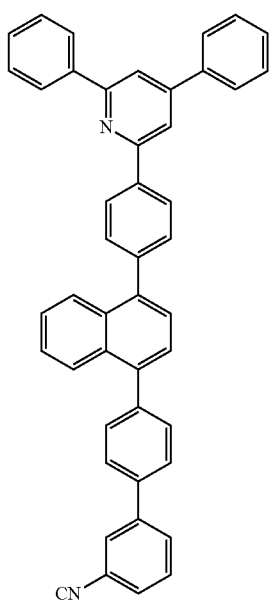
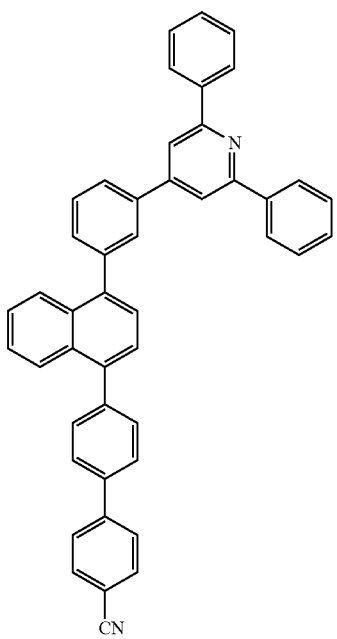

-continued

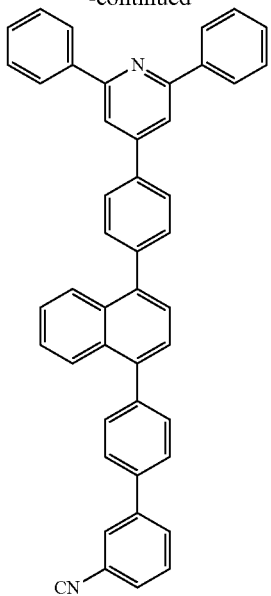

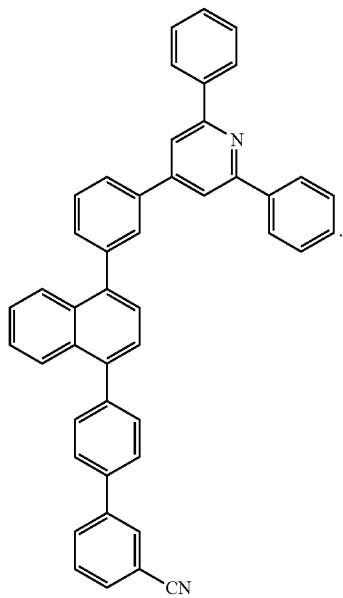

According to an exemplary embodiment of the present specification, the light emitting layer comprises a compound of Formula 4:

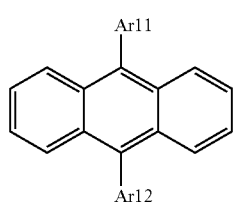

Formula 4 wherein in Formula 4:

Ar11 and Ar12 are the same as or different from each other, and are each independently a substituted or unsubstituted aryl group.

According to an exemplary embodiment of the present specification, in Formula 4, Ar11 and Ar12 are the same as or different from each other, and are each independently an aryl group which is unsubstituted or substituted with an alkyl group or an aryl group.

According to an exemplary embodiment of the present specification, in Formula 4, Ar11 and Ar12 are the same as or different from each other, and are each independently a phenyl group which is unsubstituted or substituted with an aryl group; a biphenyl group which is unsubstituted or substituted with an aryl group; a terphenyl group; a naphthyl group which is unsubstituted or substituted with an aryl group; an anthracenyl group which is substituted with an aryl group; a fluorenyl group which is unsubstituted or substituted with an alkyl group or an aryl group; a triphenylenyl group; or a phenanthrenyl group.

According to an exemplary embodiment of the present specification, in Formula 4, Ar11 and Ar12 are the same as or different from each other, and are each independently a phenyl group which is unsubstituted or substituted with a phenyl group, a biphenyl group, or a naphthyl group; a biphenyl group which is unsubstituted or substituted with a phenyl group; a terphenyl group; a naphthyl group which is unsubstituted or substituted with a phenyl group; an anthracenyl group which is substituted with a phenyl group, a biphenyl group, a naphthyl group, a terphenyl group, a phenanthrenyl group, or a triphenylenyl group; a fluorenyl group which is unsubstituted or substituted with a methyl group or a phenyl group; a triphenylenyl group; or a phenanthrenyl group.

According to an exemplary embodiment of the present specification, the compound of Formula 4 is selected from among the following compounds:

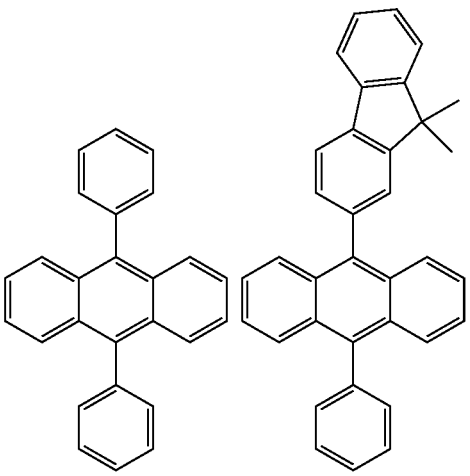

121
-continued
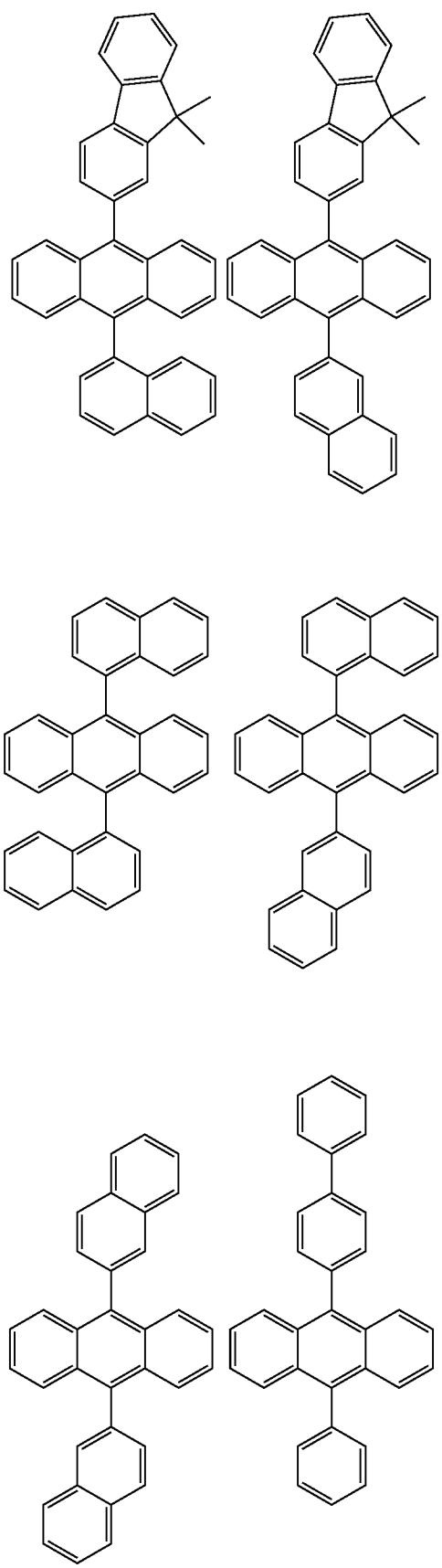
122
-continued
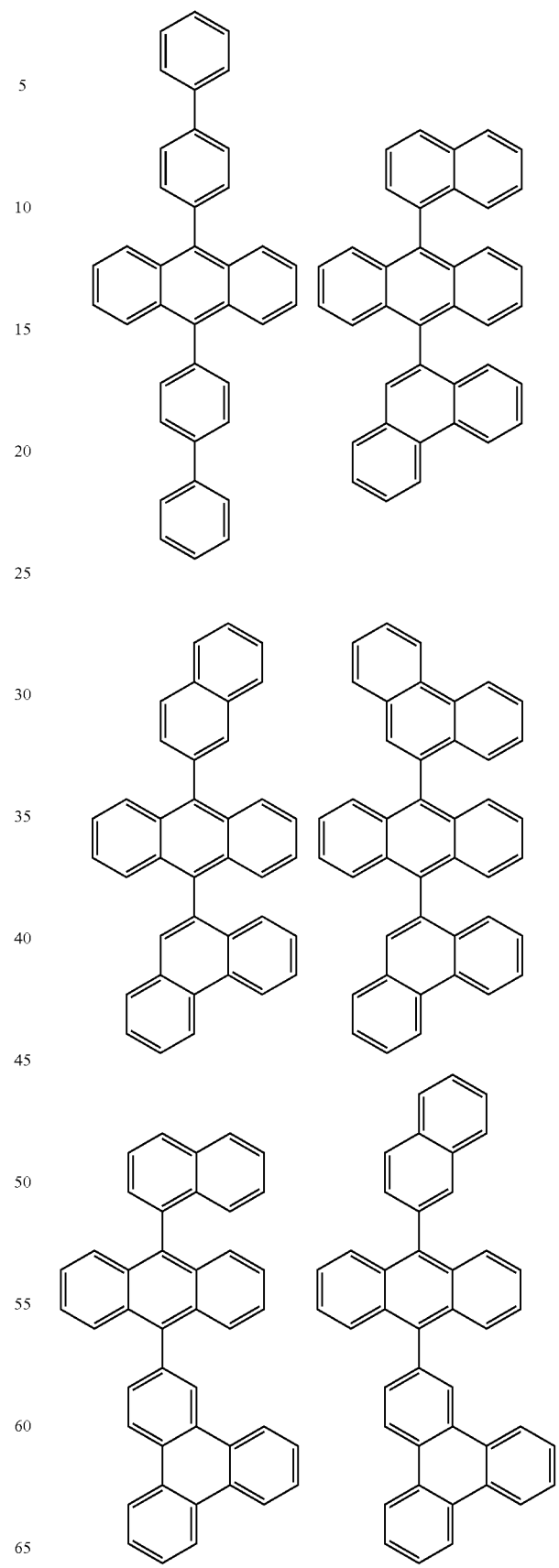

-continued
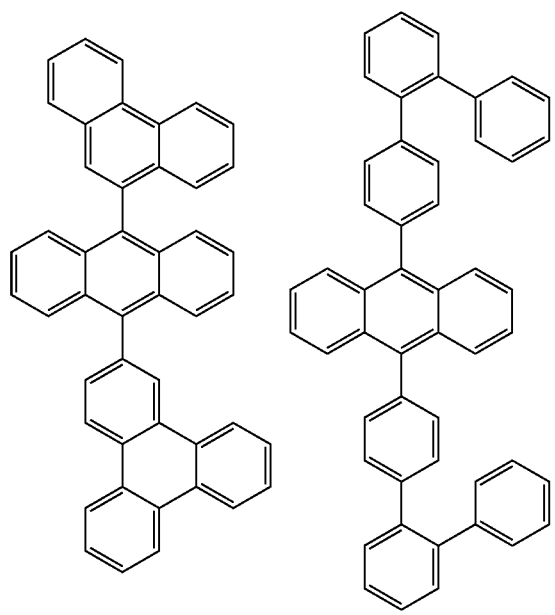
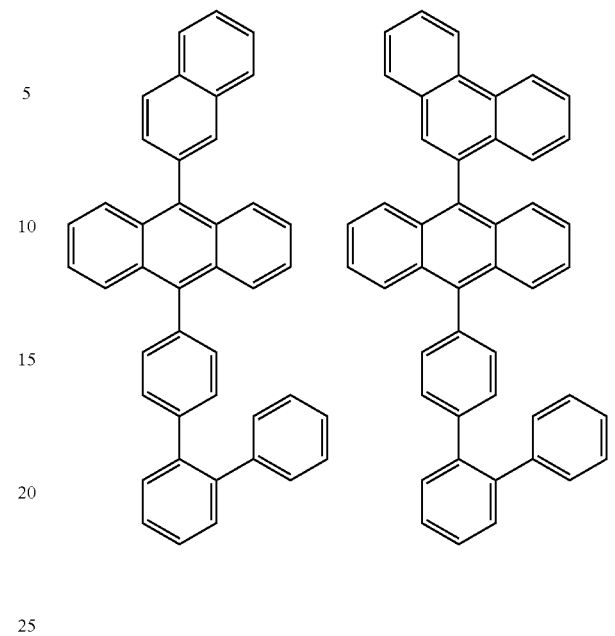
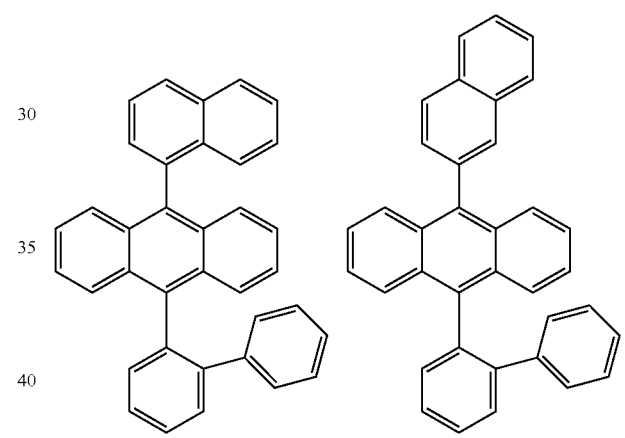
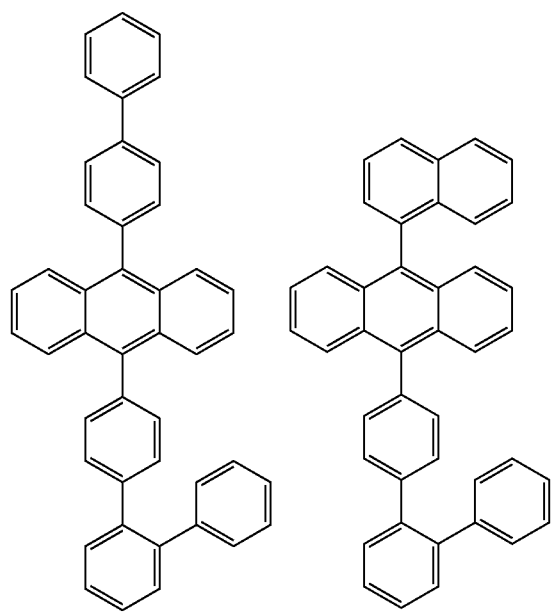
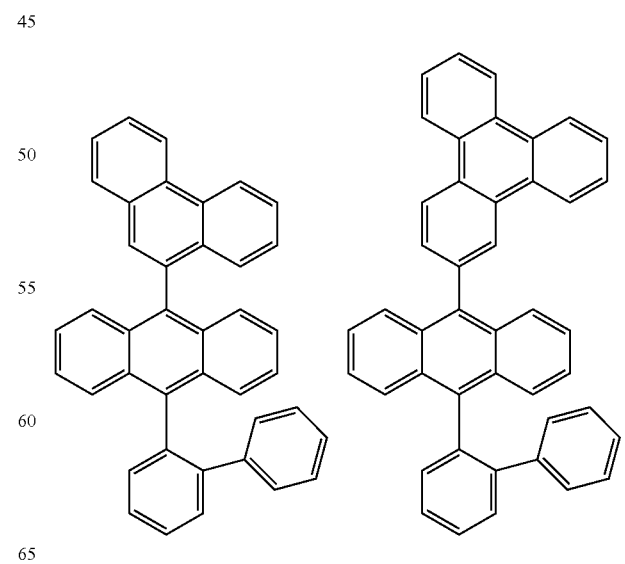

125
-continued
126
-continued
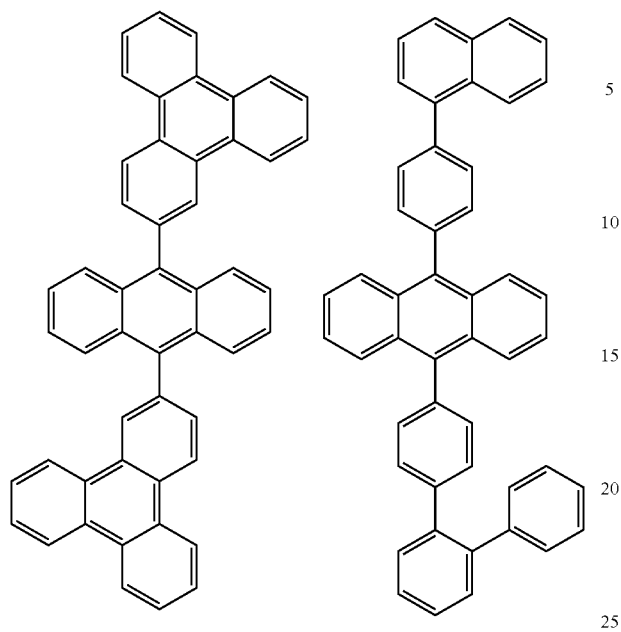
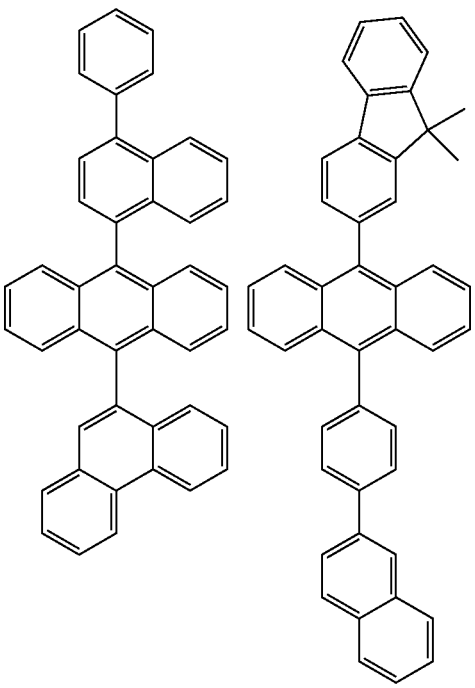

127
-continued
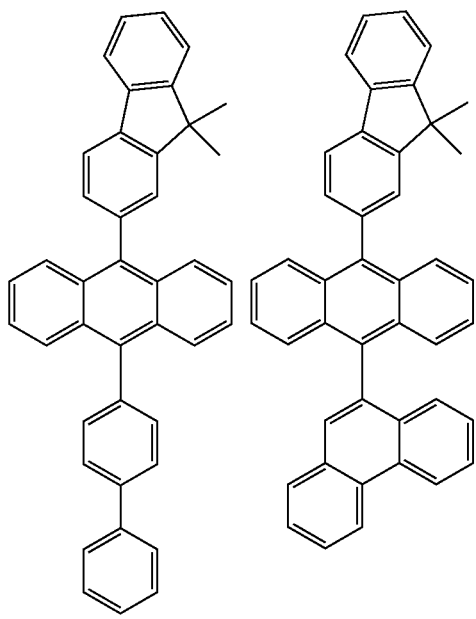
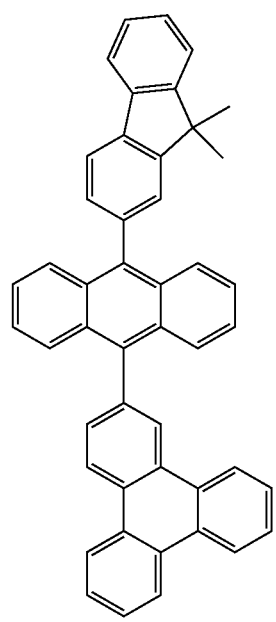
128
-continued
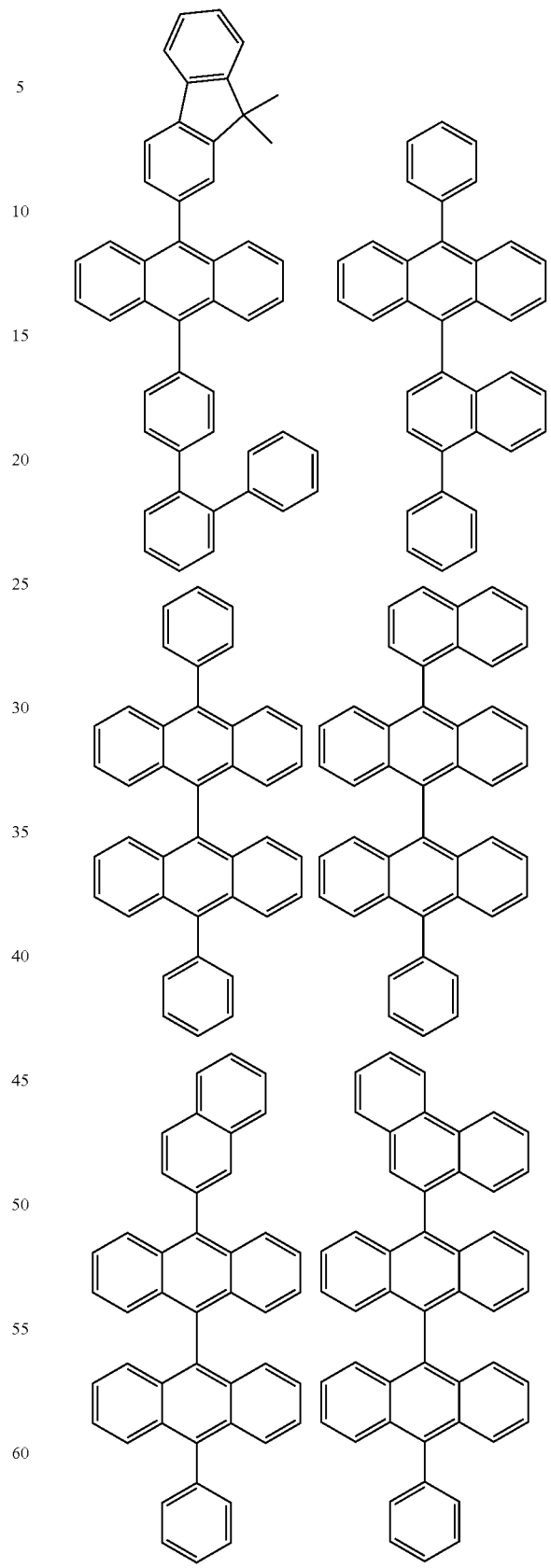

-continued
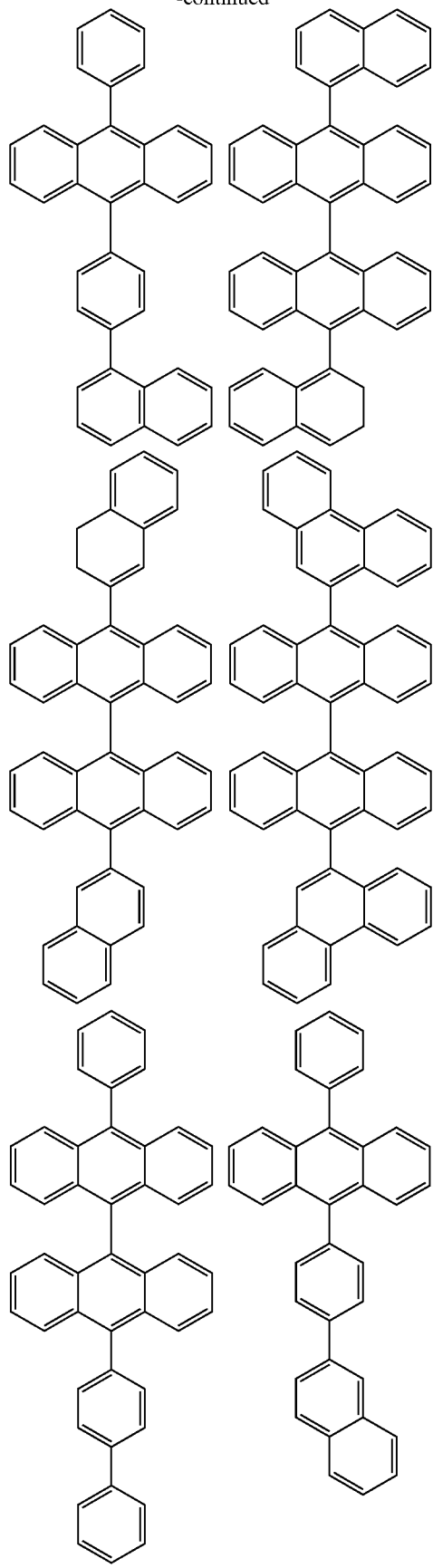
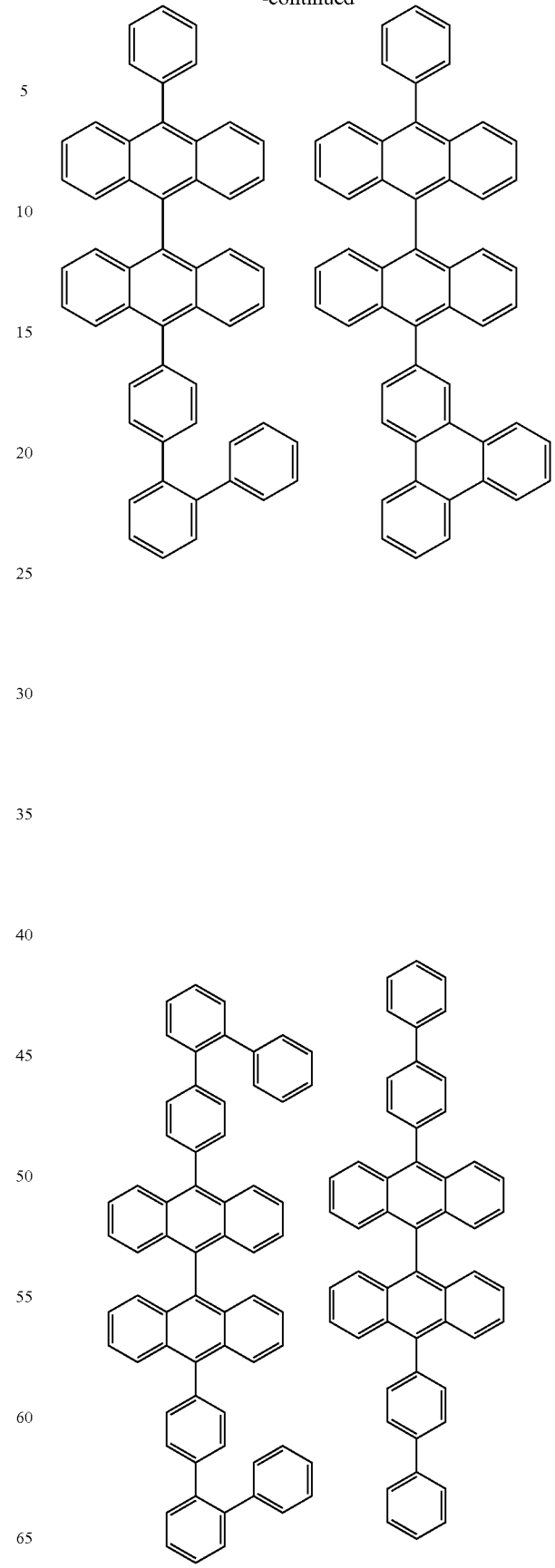

131
-continued
132
-continued
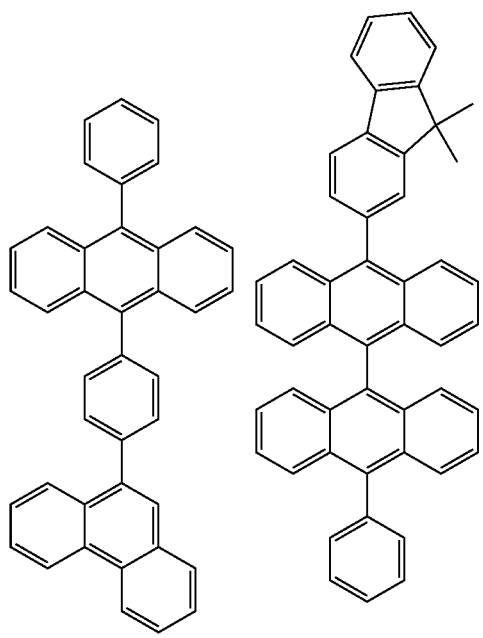
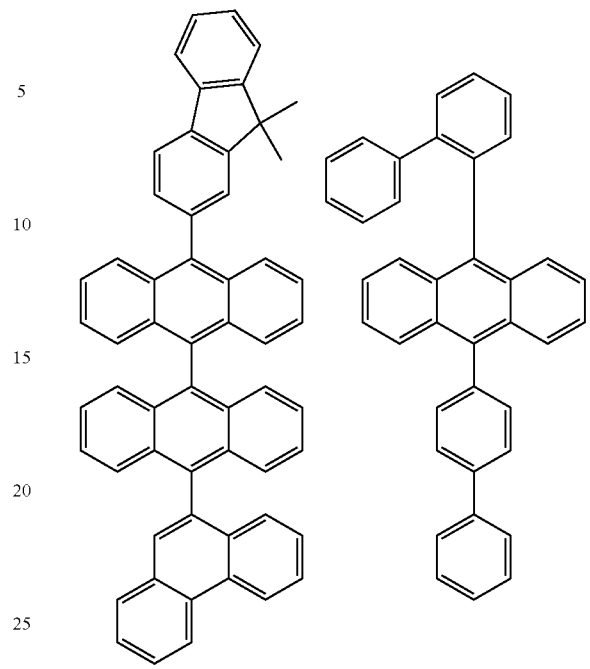
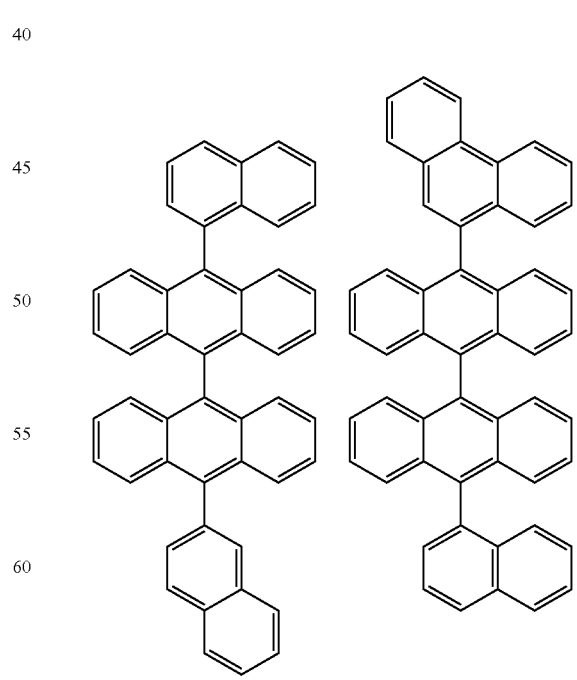

133
-continued
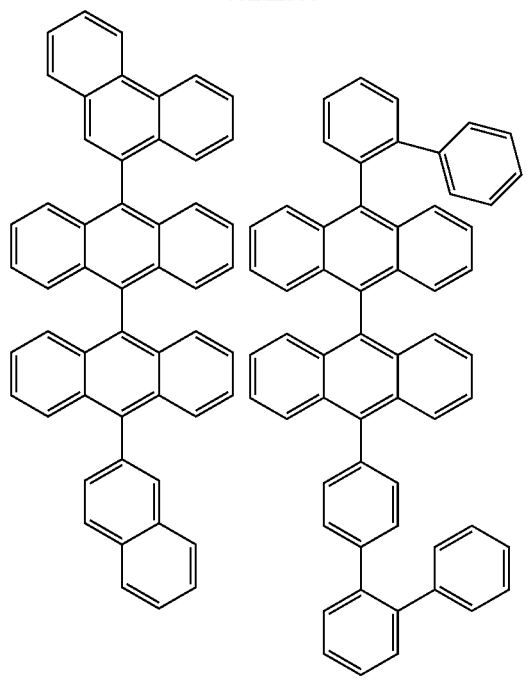
134
-continued
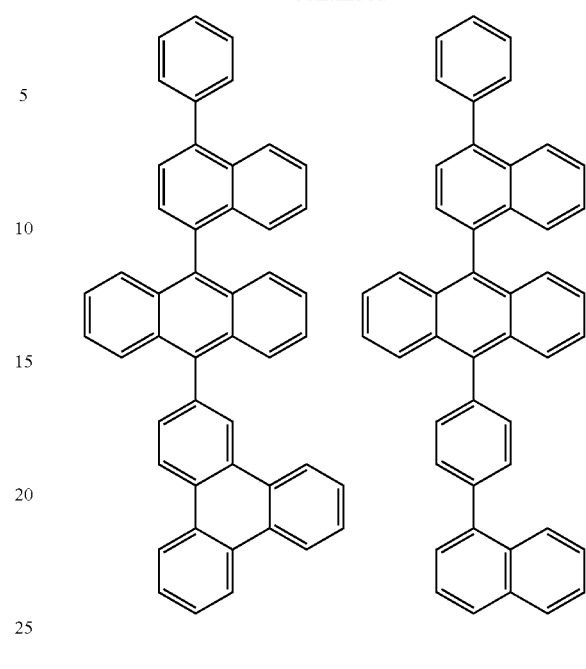
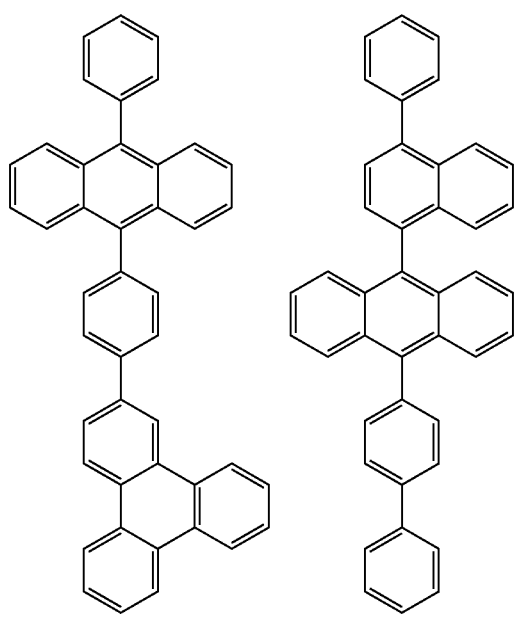
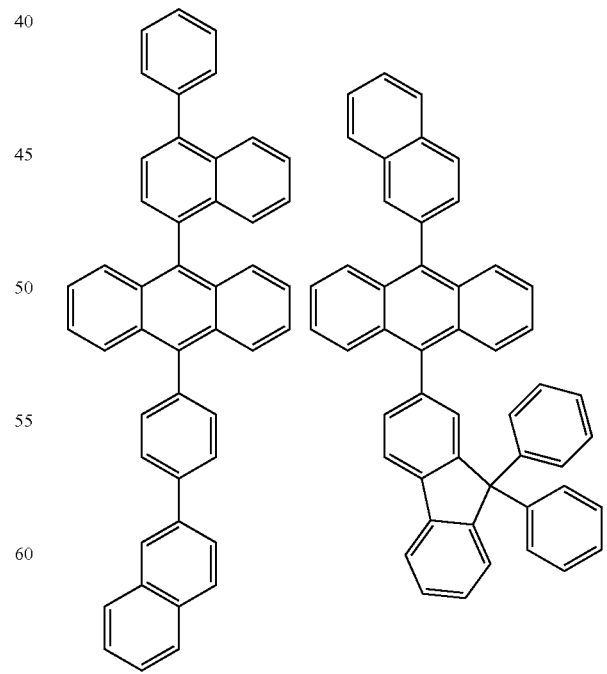

-continued

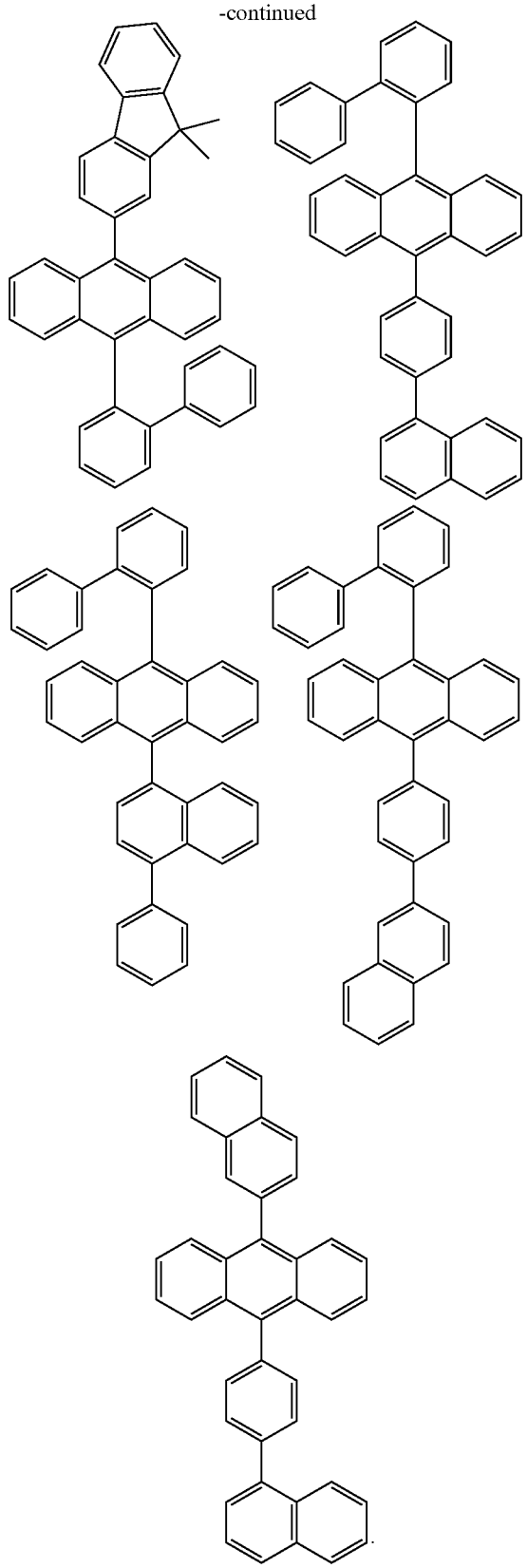

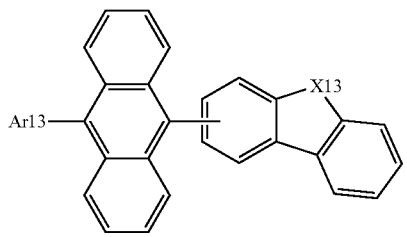

Formula 5 wherein in Formula 5:

X13 is O or S; and

Ar13 is a substituted or unsubstituted aryl group.

According to an exemplary embodiment of the present specification, in Formula 5, X13 is O.

According to an exemplary embodiment of the present specification, in Formula 5, X13 is S.

According to an exemplary embodiment of the present specification, in Formula 5, Ar13 is an aryl group which is unsubstituted or substituted with an aryl group.

According to an exemplary embodiment of the present specification, in Formula 5, Ar13 is a phenyl group which is unsubstituted or substituted with an aryl group; a biphenyl group; a naphthyl group which is unsubstituted or substituted with an aryl group; or a phenanthrenyl group.

According to an exemplary embodiment of the present specification, in Formula 5, Ar13 is a phenyl group which is unsubstituted or substituted with a phenyl group or a naphthyl group; a biphenyl group; a naphthyl group which is unsubstituted or substituted with a phenyl group; or a phenanthrenyl group.

According to an exemplary embodiment of the present specification, the compound of Formula 5 is selected from among the following compounds:

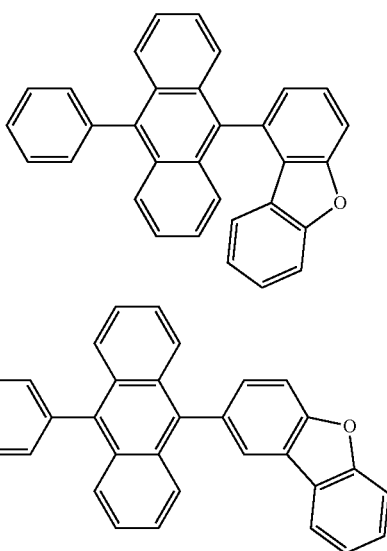

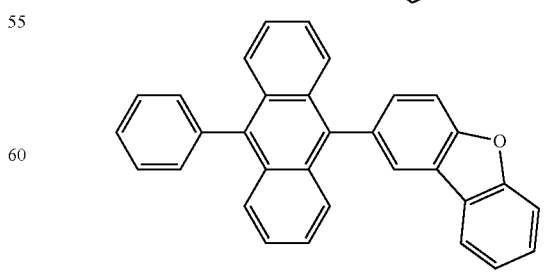

According to an exemplary embodiment of the present specification, the light emitting layer comprises a compound of Formula 5.

137
-continued
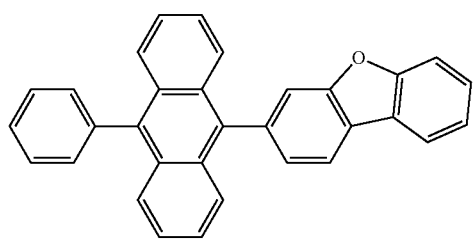
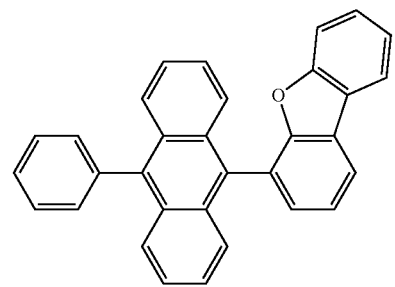
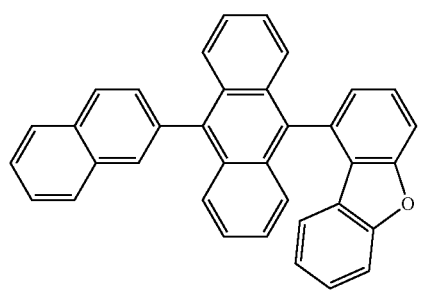
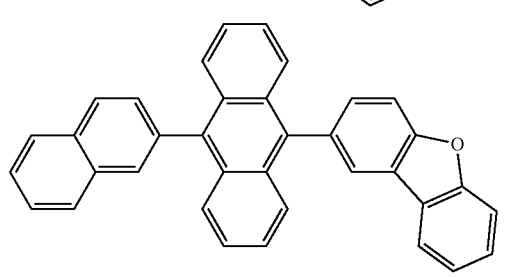
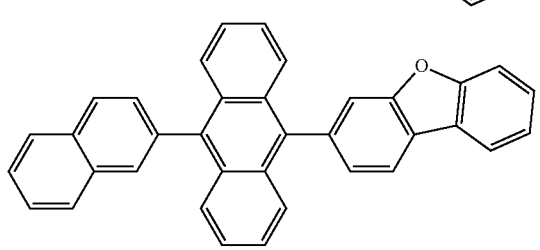
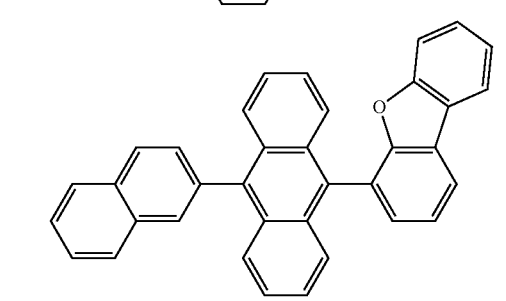
138
-continued
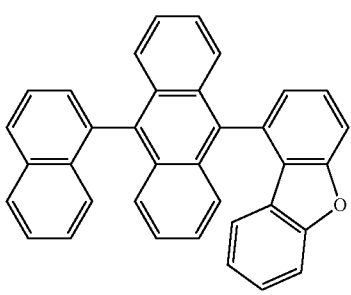
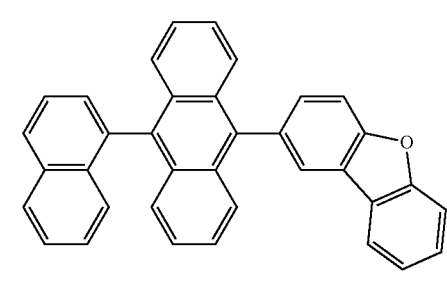
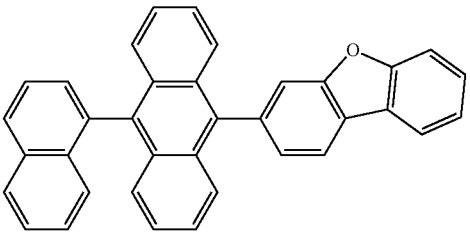
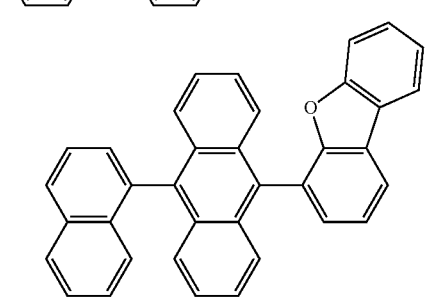
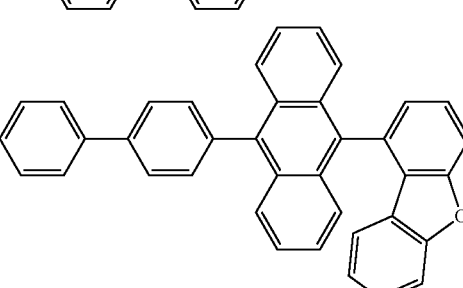
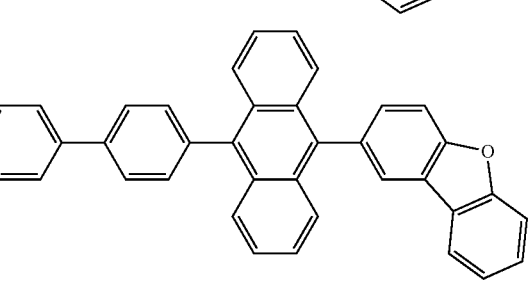

-continued
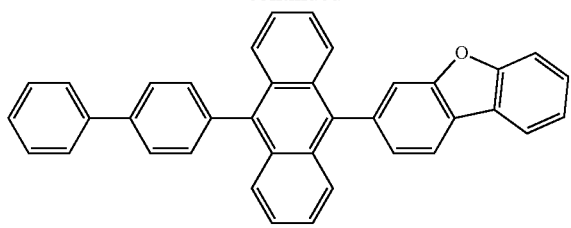
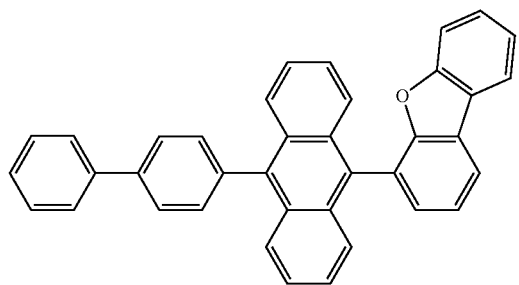
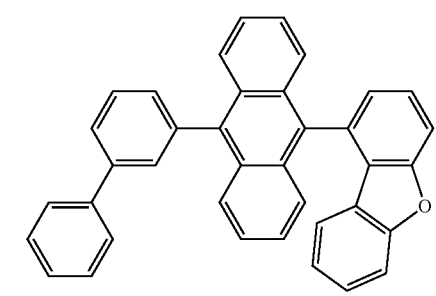
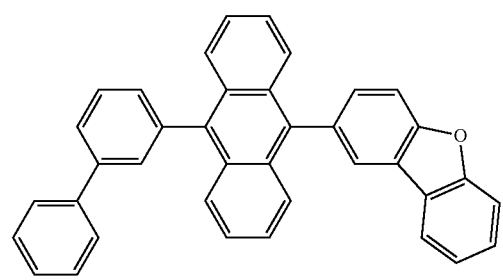
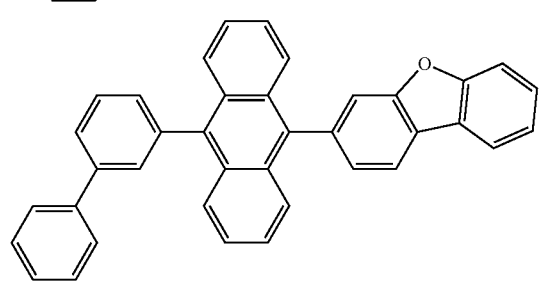
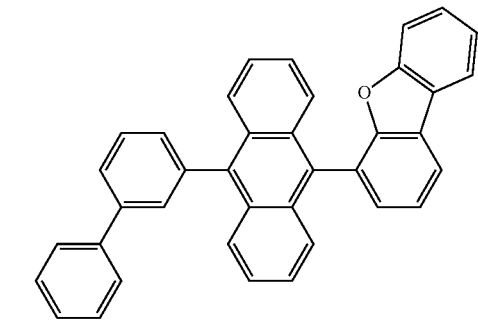
-continued
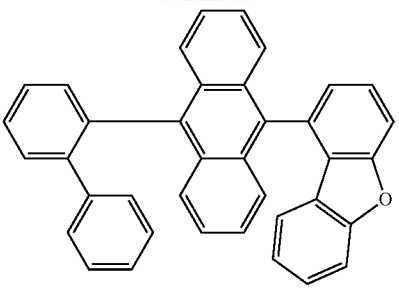
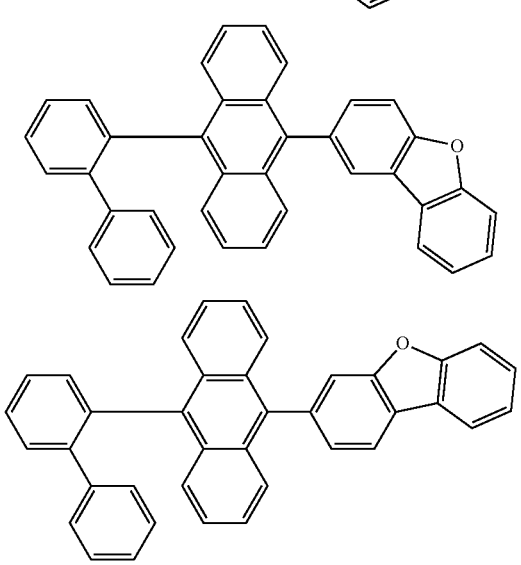
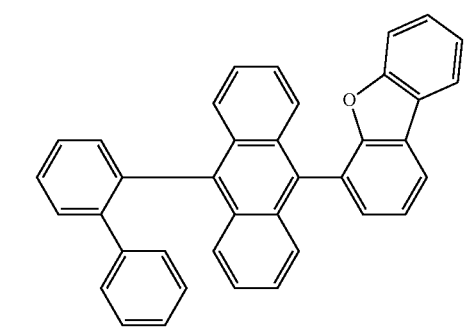
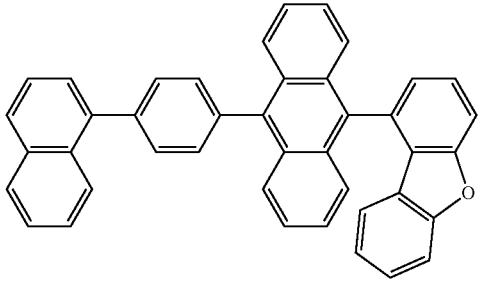
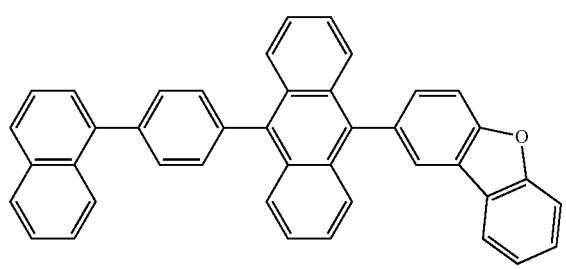

-continued
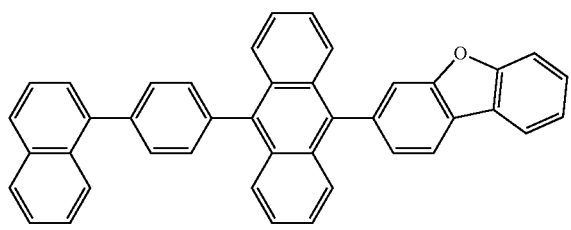
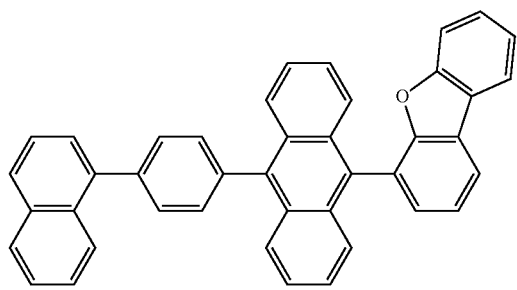
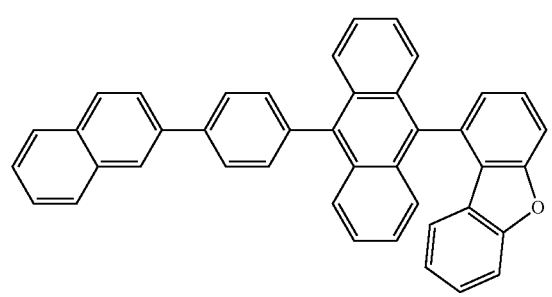
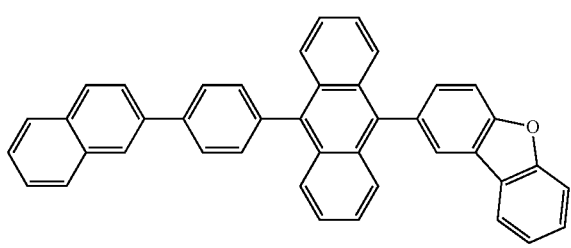
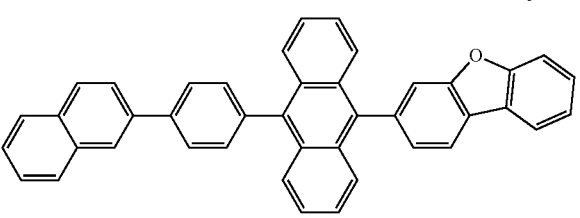
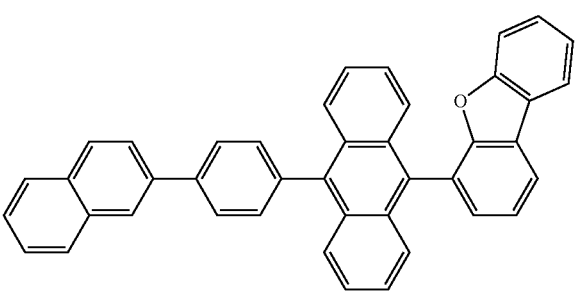
-continued
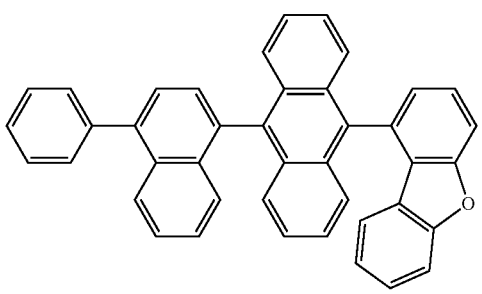
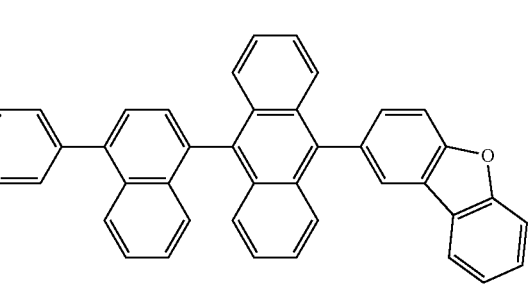
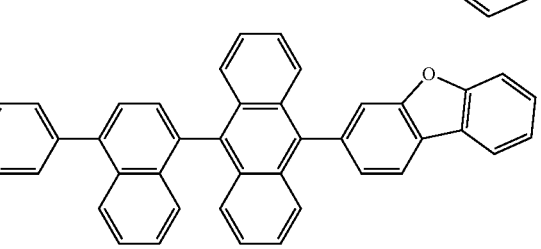
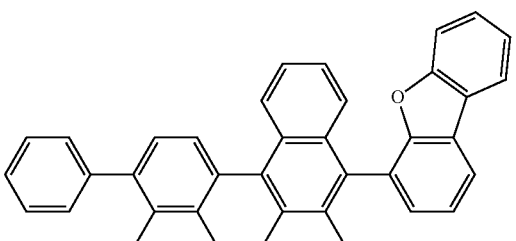
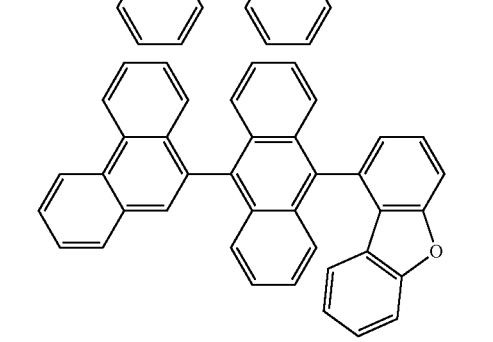
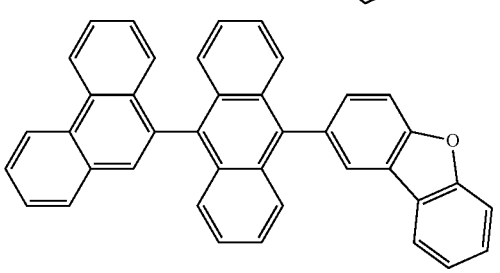

143
-continued
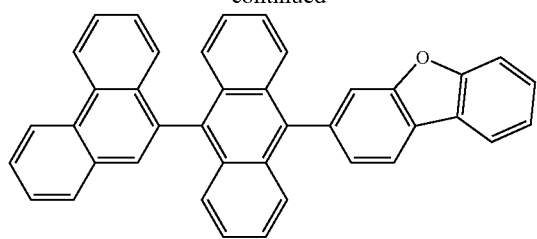
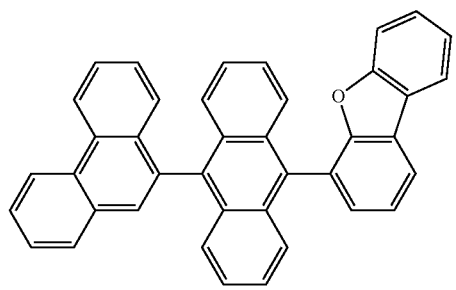
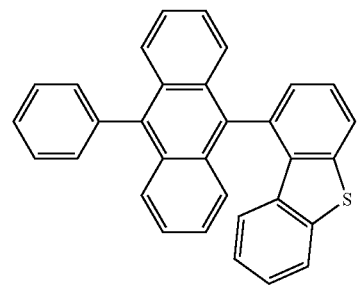
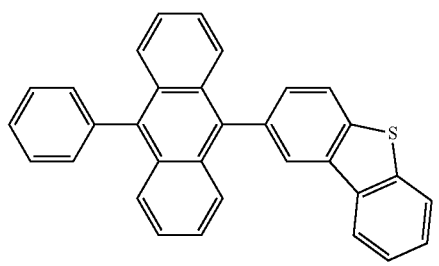
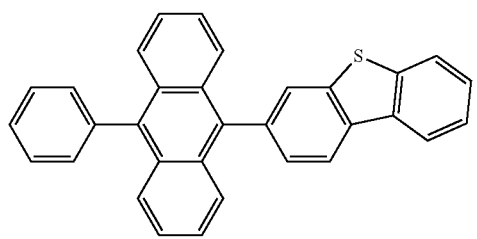
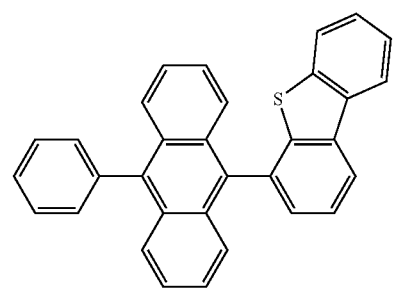
144
-continued
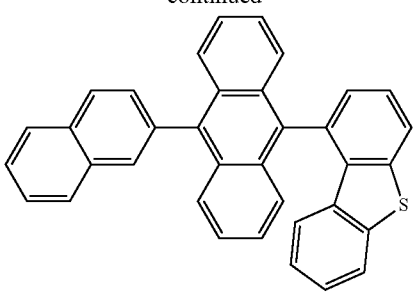
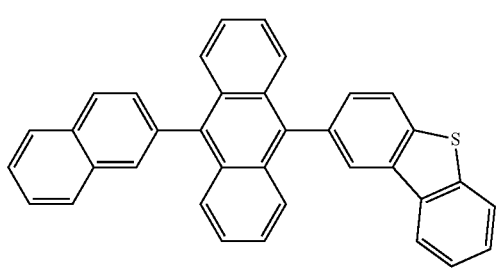
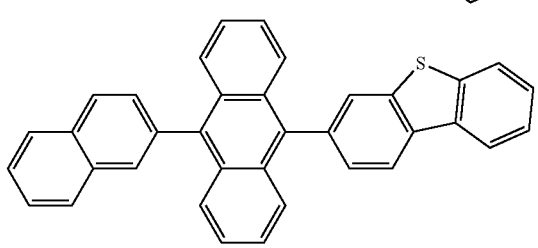
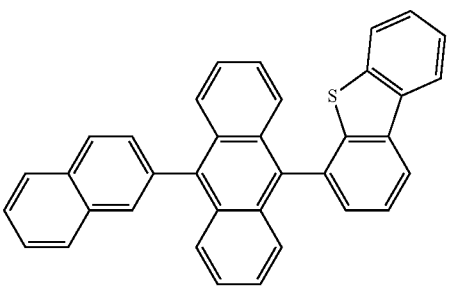
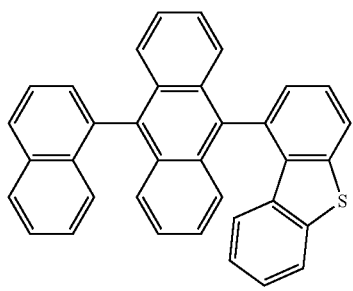
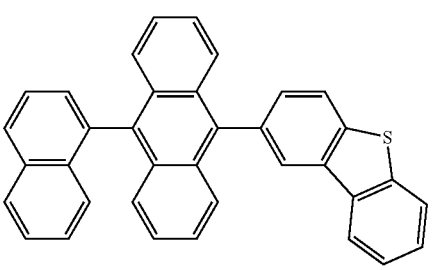

-continued
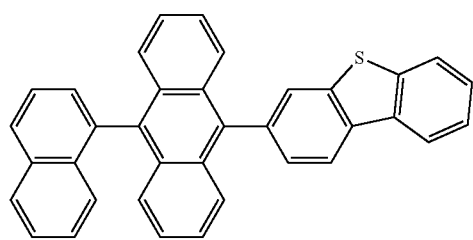
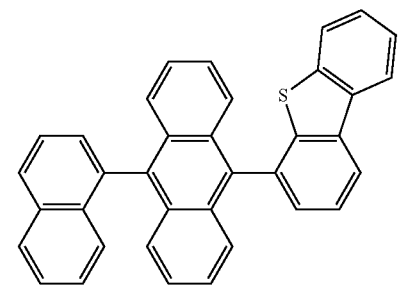
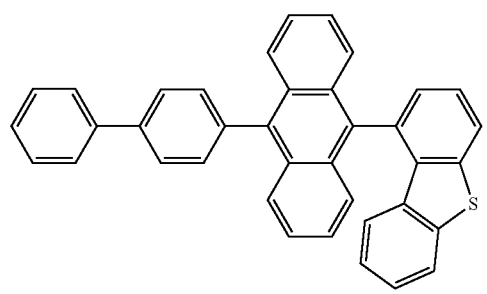
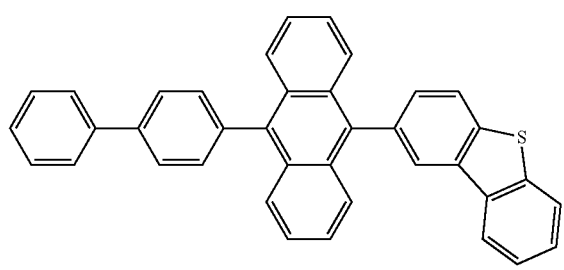
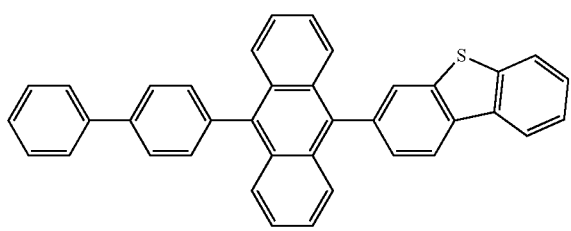
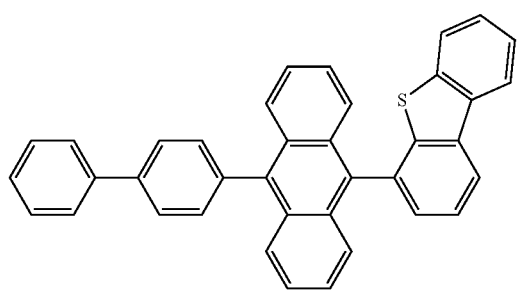
-continued
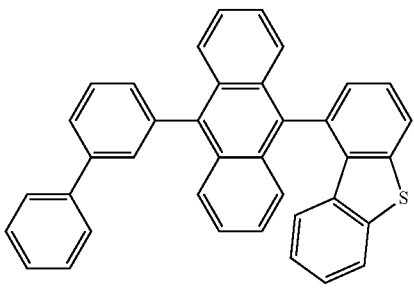
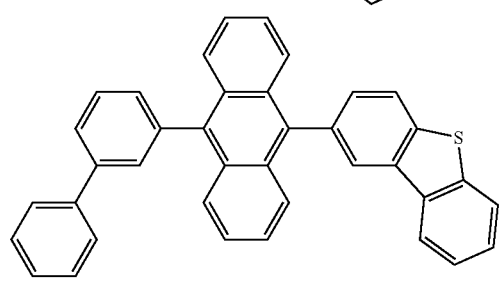
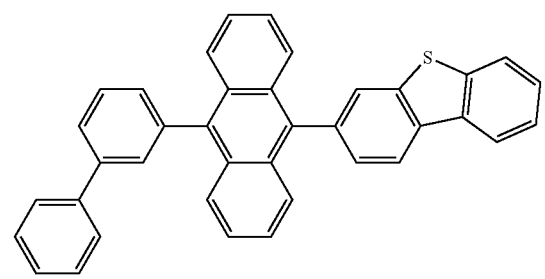
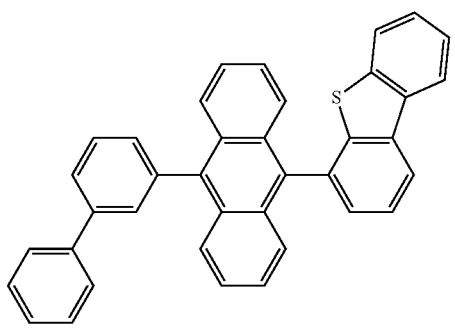
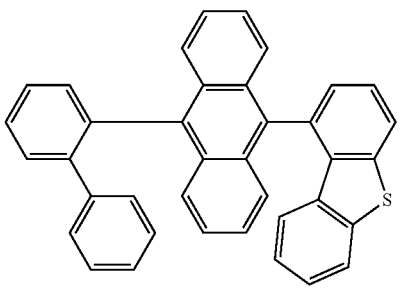
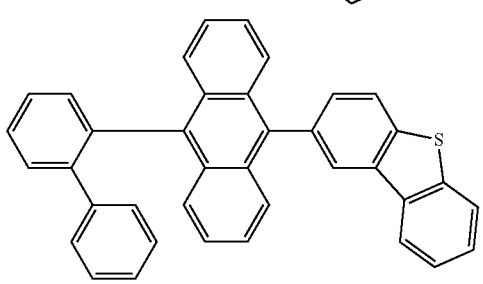

-continued
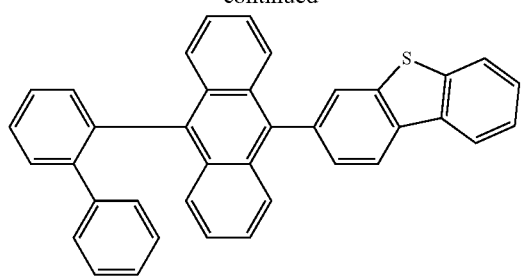
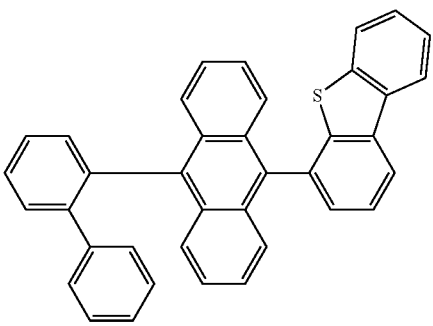
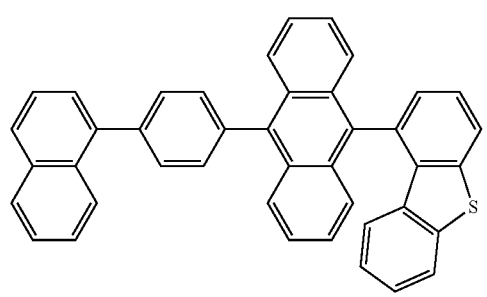
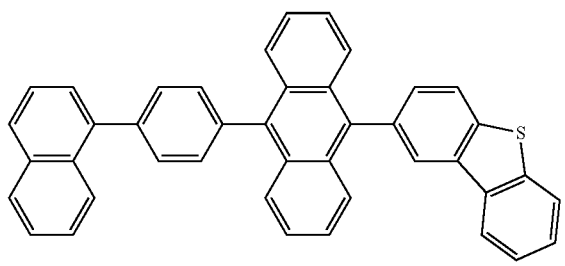
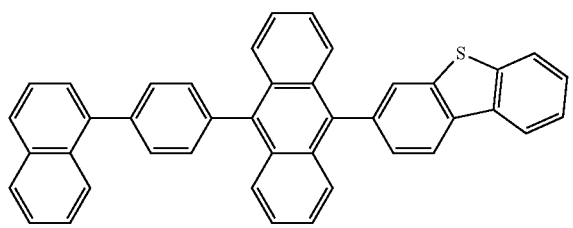
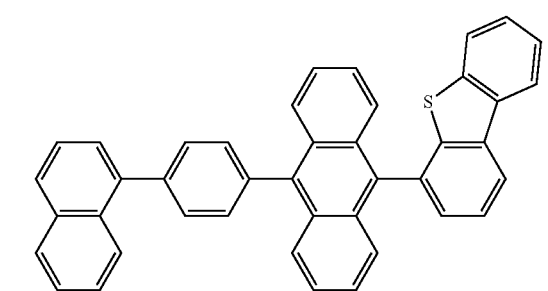
-continued
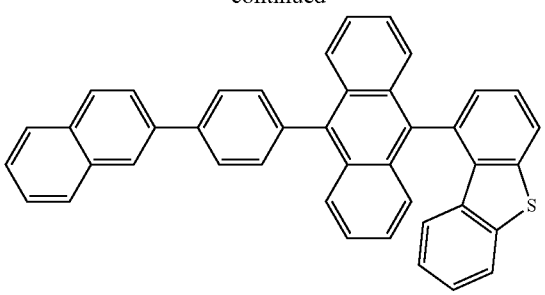
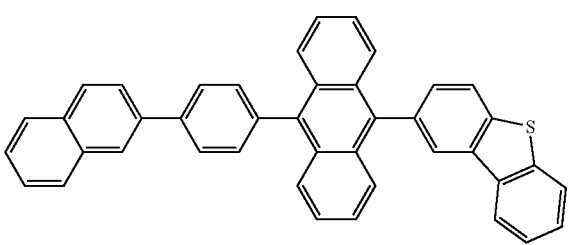
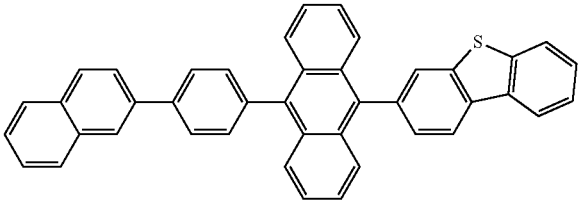
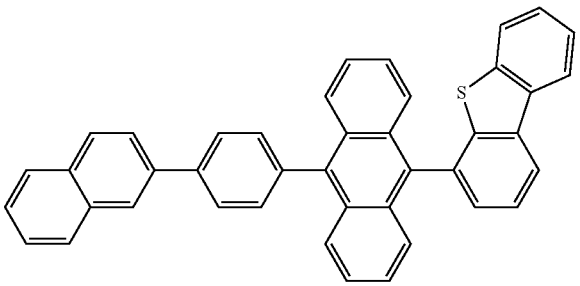
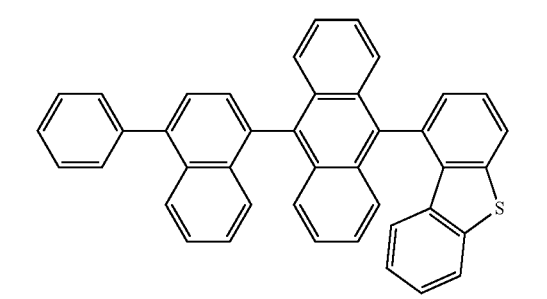
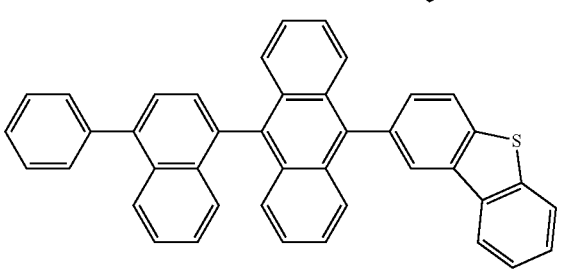

-continued

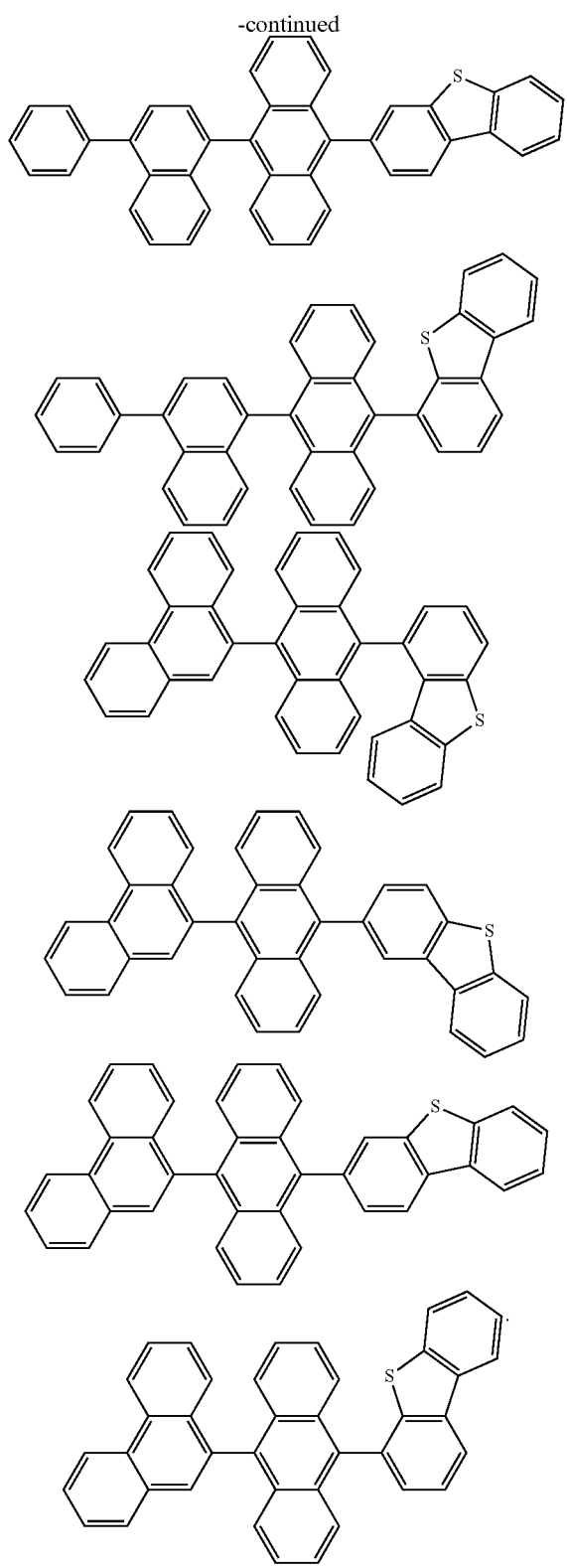

According to an exemplary embodiment of the present specification, the compounds of Formulae 1 to 5 can be prepared by using the starting materials and the reaction conditions known in the art. The type and number of substituents can be determined as a person skilled in the art appropriately selects a publicly-known starting material.

Further, the compounds of Formulae 1 to 5 can be purchased from among those commercially available.

According to an exemplary embodiment of the present specification, the organic light emitting device can comprise only the above-described hole blocking layer and the above-described electron transport layer as organic material layers, but can further comprise an additional organic material layer. For example, the organic light emitting device can further comprise an additional hole injection layer, hole transport layer, electron blocking layer, light emitting layer, hole blocking layer, electron transport layer, electron injection layer, and the like.

Figure 2:
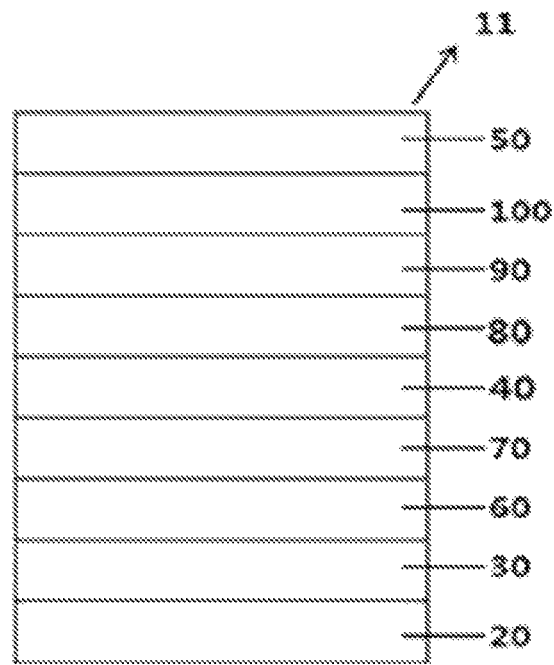
FIG. 2 illustrates an organic light emitting device 11 according to another exemplary embodiment of the present specification.

For example, the organic light emitting device of the present specification can have structures as illustrated in FIGS. 1 and 2, but is not limited thereto.

FIG. 1 exemplifies a structure of an organic light emitting device 10 in which a positive electrode 30, a light emitting layer 40, and a negative electrode 50 are sequentially stacked on a substrate 20. FIG. 1 is an exemplified structure according to an exemplary embodiment of the present specification, and the structure can further comprise other organic material layers.

FIG. 2 exemplifies a structure of an organic light emitting device in which a positive electrode 30, a hole injection layer 60, a hole transport layer 70, a light emitting layer 40, a hole blocking layer 80, an electron transport layer 90, an electron injection layer 100, and a negative electrode 50 are sequentially stacked on a substrate 20. FIG. 2 is an exemplified structure according to an exemplary embodiment of the present specification, and the structure can further comprise other organic material layers.

According to an exemplary embodiment of the present specification, the first organic material layer is provided to be brought into contact with the light emitting layer.

According to an exemplary embodiment of the present specification, the first organic material layer is a hole blocking layer, and the hole blocking layer is provided to be brought into contact with the light emitting layer.

According to an exemplary embodiment of the present specification, the second organic material layer is provided to be brought into contact with the first organic material layer.

According to an exemplary embodiment of the present specification, the second organic material layer is an electron transport layer, and the electron transport layer is provided to be brought into contact with the first organic material layer.

According to an exemplary embodiment of the present specification, the second organic material layer is an electron transport layer, the first organic material layer is a hole blocking layer, and the electron transport layer is provided to be brought into contact with the hole blocking layer.

According to an exemplary embodiment of the present specification, the electron transport layer is thicker than the hole blocking layer.

According to an exemplary embodiment of the present specification, the electron transport layer is two or more times thicker, specifically 2 times to 10 times thicker, and more specifically 2 times to 7 times thicker than the hole blocking layer.

According to an exemplary embodiment of the present specification, the light emitting layer is a blue light emitting layer.

According to an exemplary embodiment of the present specification, the electron transport layer is thicker than the blue light emitting layer.

According to an exemplary embodiment of the present specification, the blue light emitting layer is thicker than the hole blocking layer.

According to an exemplary embodiment of the present specification, the light emitting layer is a red light emitting layer.

According to an exemplary embodiment of the present specification, the red light emitting layer is thicker than the electron transport layer.

According to an exemplary embodiment of the present specification, the thickness of the red light emitting layer is the same as that of the electron transport layer.

According to an exemplary embodiment of the present specification, the light emitting layer is a green light emitting layer.

According to an exemplary embodiment of the present specification, the green light emitting layer is thicker than the electron transport layer.

According to an exemplary embodiment of the present specification, the thickness of the green light emitting layer is the same as that of the electron transport layer.

According to an exemplary embodiment of the present specification, the thicknesses of the hole blocking layer, the electron transport layer, and the light emitting layer satisfy the conditions of the thickness of the electron transport layer>the thickness of the blue light emitting layer>the thickness of the hole blocking layer, the thickness of the red light emitting layer the thickness of the electron transport layer>the thickness of the hole blocking layer, or the thickness of the green light emitting layer the thickness of the electron transport layer>the thickness of the hole blocking layer. When the thicknesses are satisfied, holes are easily blocked and electrons are actively transported, so that it is possible to manufacture a device having high efficiency, a low voltage, and a long service life.

According to an exemplary embodiment of the present specification, the second organic material layer is a layer which simultaneously injects and transports electrons, and the layer which simultaneously injects and transports electrons is provided to be brought into contact with the first organic material layer.

According to an exemplary embodiment of the present specification, the second organic material layer is a layer which simultaneously injects and transports electrons, the first organic material layer is a hole blocking layer, and the layer which simultaneously injects and transports electrons is provided to be brought into contact with the hole blocking layer.

According to an exemplary embodiment of the present specification, the layer which simultaneously injects and transports electrons is thicker than the hole blocking layer.

According to an exemplary embodiment of the present specification, the layer which simultaneously injects and transports electrons is two or more times thicker, specifically 2 times to 10 times thicker, and more specifically 2 times to 7 times thicker than the hole blocking layer.

According to an exemplary embodiment of the present specification, the light emitting layer is a blue light emitting layer.

According to an exemplary embodiment of the present specification, the layer which simultaneously injects and transports electrons is thicker than the blue light emitting layer.

According to an exemplary embodiment of the present specification, the blue light emitting layer is thicker than the hole blocking layer.

According to an exemplary embodiment of the present specification, the light emitting layer is a red light emitting layer.

According to an exemplary embodiment of the present specification, the red light emitting layer is thicker than the layer which simultaneously injects and transports electrons.

According to an exemplary embodiment of the present specification, the thickness of the red light emitting layer is the same as that of the layer which simultaneously injects and transports electrons.

According to an exemplary embodiment of the present specification, the light emitting layer is a green light emitting layer.

According to an exemplary embodiment of the present specification, the green light emitting layer is thicker than the layer which simultaneously injects and transports electrons.

According to an exemplary embodiment of the present specification, the thickness of the green light emitting layer is the same as that of the layer which simultaneously injects and transports electrons.

According to an exemplary embodiment of the present specification, the thicknesses of the hole blocking layer, the layer which simultaneously injects and transports electrons, and the light emitting layer satisfy the conditions of the thickness of the layer which simultaneously injects and transports electrons>the thickness of the blue light emitting layer>the thickness of the hole blocking layer, the thickness of the red light emitting layer the thickness of the layer which simultaneously injects and transports electrons>the thickness of the hole blocking layer, or the thickness of the green light emitting layer the thickness of the layer which simultaneously injects and transports electrons>the thickness of the hole blocking layer. When the thicknesses are satisfied, holes are easily blocked and electrons are actively injected and transported, so that it is possible to manufacture a device having high efficiency, a low voltage, and a long service life.

The combination of the hole blocking layer including Formula 1 of the present specification and the electron transport layer including at least one of Formulae 2 and 3 of the present specification blocks the introduction of holes from the light emitting layer of the organic light emitting device and makes the transportation of electrons active by engineering the HOMOs among the respective layers and allowing holes to effectively move, thereby exhibiting a positive result for light emission with a low voltage and high efficiency.

According to an exemplary embodiment of the present specification, the light emitting layer comprises the compounds of Formulae 4 and 5.

According to an exemplary embodiment of the present specification, the light emitting layer comprises the compound of Formula 4 or 5.

According to an exemplary embodiment of the present specification, the light emitting layer comprises the compound of Formula 4.

According to an exemplary embodiment of the present specification, the light emitting layer comprises the compound of Formula 5.

According to an exemplary embodiment of the present specification, the light emitting layer comprises the compounds of Formulae 4 and 5 as a host of the light emitting layer. Specifically, the host is a blue host.

According to an exemplary embodiment of the present specification, the light emitting layer comprises the compound of Formula 4 or 5 as a host of the light emitting layer.

According to an exemplary embodiment of the present specification, the light emitting layer comprises the compound of Formula 4 as a host of the light emitting layer.

According to an exemplary embodiment of the present specification, the light emitting layer comprises the compound of Formula 5 as a host of the light emitting layer.

According to an exemplary embodiment of the present specification, the light emitting layer comprises the compound of Formula 4 as a blue host of the light emitting layer.

According to an exemplary embodiment of the present specification, the light emitting layer comprises the compound of Formula 5 as a blue host of the light emitting layer.

In another exemplary embodiment, the organic light emitting device can be an organic light emitting device having a normal type structure in which a positive electrode, an organic material layer having one or more layers, and a negative electrode are sequentially stacked on a substrate.

In still another exemplary embodiment, the organic light emitting device can be an organic light emitting device having an inverted type structure in which a negative electrode, an organic material layer having one or more layers, and a positive electrode are sequentially stacked on a substrate.

When the organic light emitting device comprises a plurality of organic material layers, the organic material layers can be formed of the same material or different materials.

The organic light emitting device of the present specification can be manufactured by materials and methods known in the art, except that the first organic material layer comprises the compound of Formula 1, and the second organic material layer comprises at least one of the compounds of Formulae 2 and 3.

For example, the organic light emitting device of the present specification can be manufactured by sequentially stacking a positive electrode, an organic material layer, and a negative electrode on a substrate. In this case, the organic light emitting device can be manufactured by depositing a metal or a metal oxide having conductivity, or an alloy thereof on a substrate to form a positive electrode, forming an organic material layer including a hole injection layer, a hole transport layer, a light emitting layer, and an electron transport layer thereon, and then depositing a material, which can be used as a negative electrode, thereon, by using a physical vapor deposition (PVD) method such as sputtering or e-beam evaporation. In addition to the method described above, an organic light emitting device can be made by sequentially depositing a negative electrode material, an organic material layer, and a positive electrode material on a substrate.

In addition to the method described above, an organic light emitting device can also be made by sequentially depositing a negative electrode material, an organic material layer, and a positive electrode material on a substrate (International Publication No. WO2003/012890). However, the manufacturing method is not limited thereto.

As the positive electrode material, materials having a high work function are usually preferred so as to facilitate the injection of holes into an organic material layer. Specific examples of the positive electrode material which can be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methylthiophene), poly[3,4-(ethylene-1,2-dioxy)thiophene] (PEDOT), polypyrrole, and polyaniline; and the like, but are not limited thereto.

As the negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material such as LiF/Al or $LiO_2$/Al and Mg/Ag; and the like, but are not limited thereto.

The hole injection layer is a layer which injects holes from an electrode, and a hole injection material is preferably a compound which has a capability of transporting holes and thus has an effect of injecting holes at a positive electrode and an excellent effect of injecting holes into a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transport layer is a layer which accepts holes from a hole injection layer and transports the holes to a light emitting layer, and a hole transport material is suitably a material having high hole mobility which can accept holes from a positive electrode or a hole injection layer and transfer the holes to a light emitting layer. Specific examples thereof include an arylamine-based organic material, a conductive polymer, a block copolymer having both conjugated portions and non-conjugated portions, and the like, but are not limited thereto.

The electron blocking layer is a layer which can improve the service life and efficiency of the device by preventing electrons injected from an electron injection layer from passing through a light emitting layer and entering a hole injection layer, and can be formed at an appropriate portion between a light emitting layer and a hole injection layer by using publicly-known materials, if necessary.

A light emitting material for the light emitting layer is a material which can emit light in a visible light region by accepting and combining holes and electrons from a hole transport layer and an electron transport layer, respectively, and is preferably a material having good quantum efficiency for fluorescence or phosphorescence. Specific examples thereof include: an 8-hydroxy-quinoline aluminum complex ($Alq_3$); a carbazole-based compound; a dimerized styryl compound; BAlq; a 10-hydroxybenzo-quinoline-metal compound; benzoxazole-based, benzothiazole-based and benzimidazole-based compounds; a poly(p-phenylene-vinylene) (PPV)-based polymer; a spiro compound; polyfluorene, rubrene, and the like, but are not limited thereto.

The light emitting layer can include a host material and a dopant material. Examples of the host material include a fused aromatic ring derivative, or a hetero ring-containing compound, and the like. Specific examples of the fused aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

According to an exemplary embodiment of the present specification, one or more selected from among the following compounds can be used as the dopant material, but the dopant material is not limited thereto.

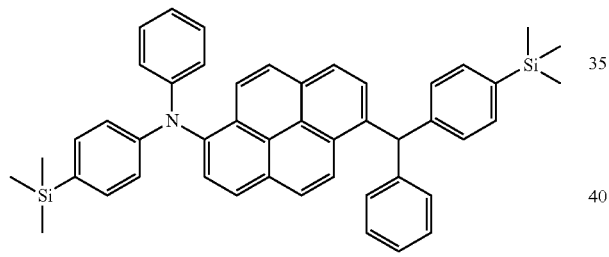

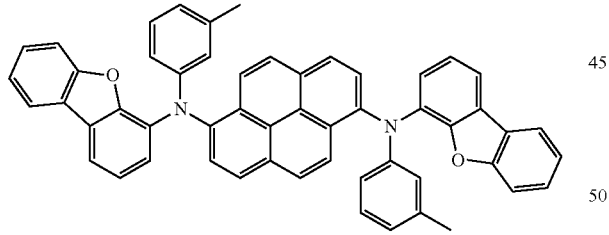

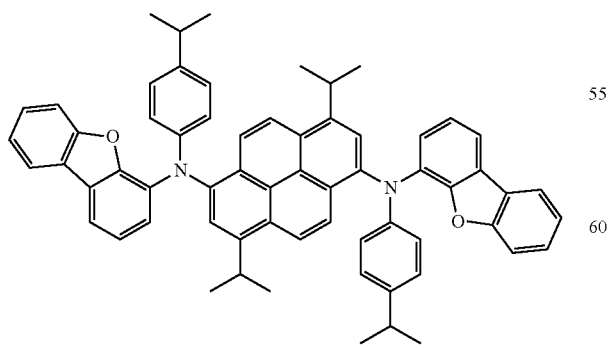

-continued

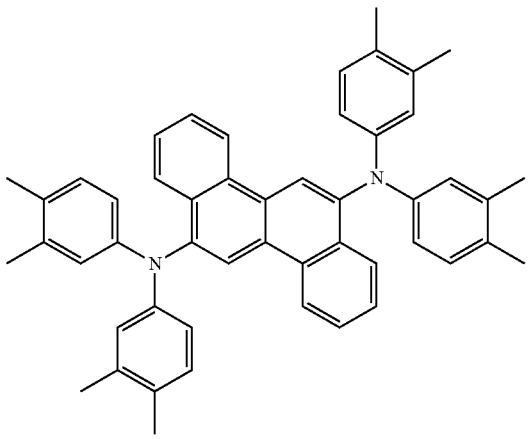

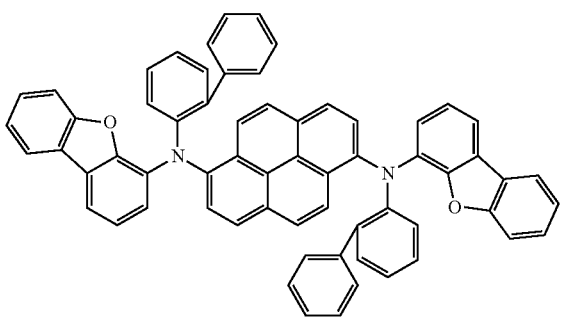

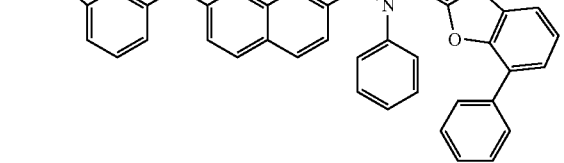

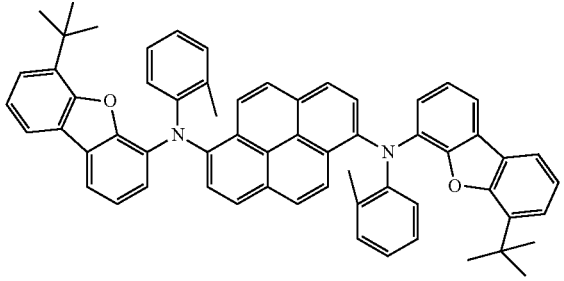

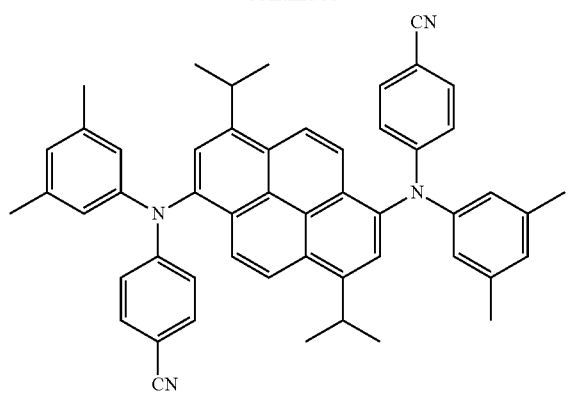

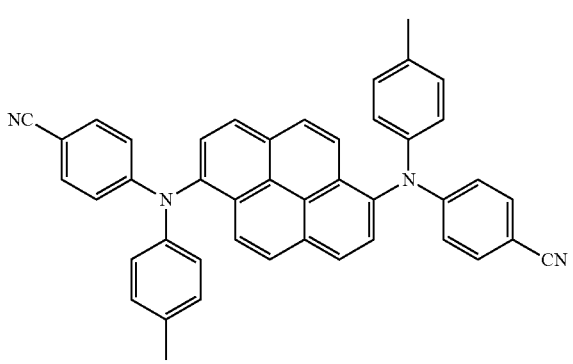

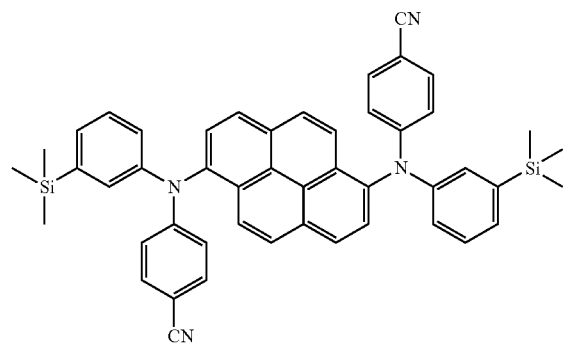

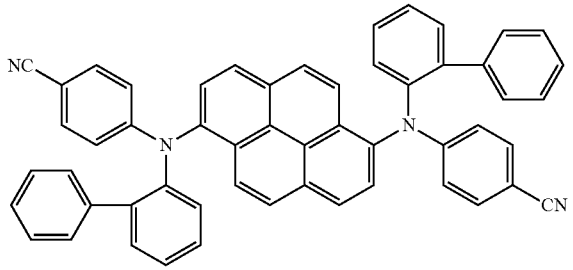

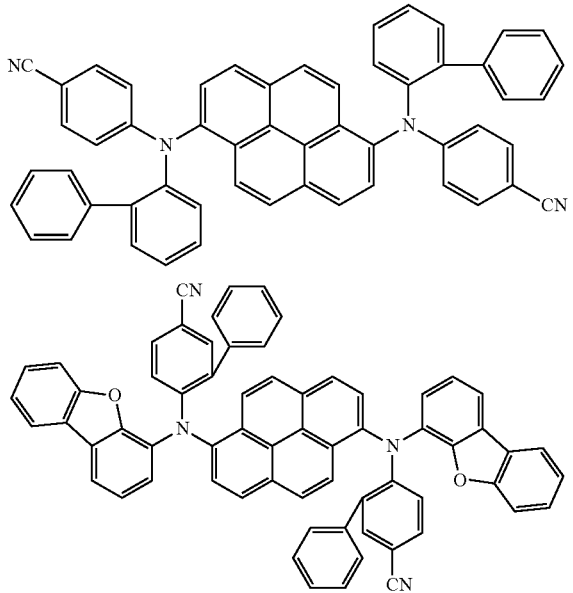

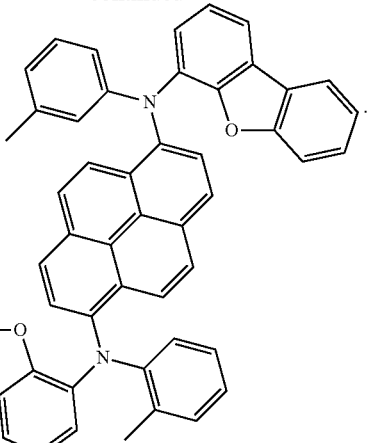

According to an exemplary embodiment of the present specification, the light emitting layer includes the dopant, and includes the dopant in an amount of 0.1 wt % to 10 wt %, and preferably 0.5 wt % to 4 wt %.

The electron transport layer is a layer which accepts electrons from an electron injection layer and transports the electrons to a light emitting layer, and when the organic light emitting device of the present specification includes an additional electron transport layer in addition to an electron transport layer including at least one of the compounds of Formulae 2 and 3, an electron transport material is suitably a material having high electron mobility which can receive electrons well from the negative electrode and transfer the electrons to a light emitting layer. Specific examples thereof include: an Al complex of 8-hydroxyquinoline, a complex including $Alq_3$, an organic radical compound, a hydroxyflavone-metal complex, and the like, but are not limited thereto. The electron transport layer can be used with any desired negative electrode material, as used according to the related art. In particular, appropriate examples of the negative electrode material are a typical material which has a low work function, followed by an aluminum layer or a silver layer. Specific examples thereof include cesium, barium, calcium, ytterbium, and samarium, in each case followed by an aluminum layer or a silver layer.

According to an exemplary embodiment of the present specification, the second organic material layer including at least one of Formulae 2 and 3 is a layer which simultaneously injects and transports electrons, can include a material used in the art as an electron injection material without limitation, and specifically, can further include a metal complex compound.

The electron injection layer is a layer which injects electrons from an electrode, and an electron injection material is preferably a compound which has a capability of transporting electrons, an effect of injecting electrons from a negative electrode, and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium (LiQ), bis(8-hydroxy-quinolinato) zinc, bis(8-hydroxyquinolinato) copper, bis(8-hydroxy-quinolinato) manganese, tris(8-hydroxy-quinolinato) aluminum, tris(2-methyl-8-hydroxy-quinolinato) aluminum, tris (8-hydroxy-quinolinato) gallium, bis(10-hydroxybenzo[h]-quinolinato) beryllium, bis(10-hydroxybenzo[h] quinolinato) zinc, bis(2-methyl-8-quinolinato) chlorogallium, bis(2-methyl-8-quinolinato)-(o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which can improve the service life and efficiency of the device by preventing holes injected from a hole injection layer from passing through a light emitting layer and entering an electron injection layer, and when the organic light emitting device of the present specification includes an additional hole blocking layer in addition to a hole blocking layer including the compound of Formula 1, the hole blocking layer can be formed at an appropriate portion between a light emitting layer and an electron injection layer by using a publicly-known material, if necessary.

The organic light emitting device according to the present specification can be a top emission type, a bottom emission type, or a dual emission type according to the materials to be used.

The structure according to an exemplary embodiment of the present specification can be operated by a principle which is similar to the principle applied to an organic light emitting device, even in an organic electronic device including an organic solar cell, an organic photoconductor, an organic transistor, and the like.

EXAMPLES

The manufacture of the organic light emitting device will be concretely described in the following Examples. However, the following Examples are provided for exemplifying the present specification, and the scope of the present specification is not limited thereby.

Comparative Example 1

A glass substrate thinly coated with indium tin oxide (ITO) to have a thickness of 1,000 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was repeated twice by using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using an oxygen plasma for 5 minutes, and then was transported to a vacuum deposition machine.

The following Compound [HI-1] and the following Compound [HI-2] were thermally vacuum deposited to have a thickness of 100 Å at a ratio of 98:2 (molar ratio) on the transparent ITO electrode thus prepared, thereby forming a hole injection layer.

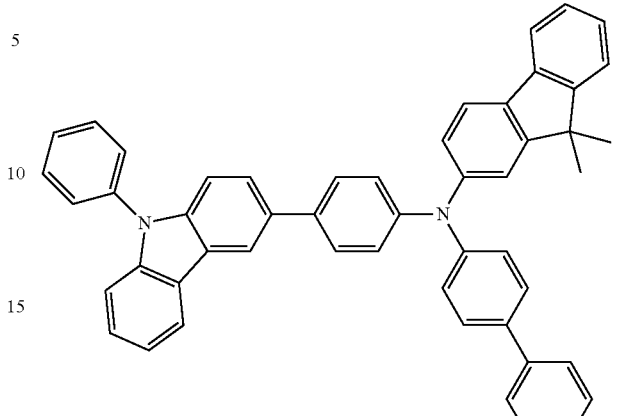

[III-1]

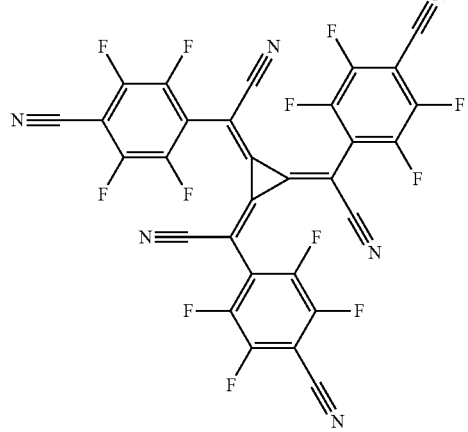

[III-2]

The following Compound [HT-1] (1,150 Å) as a material which transports holes, was vacuum deposited on the hole injection layer, thereby forming a hole transport layer.

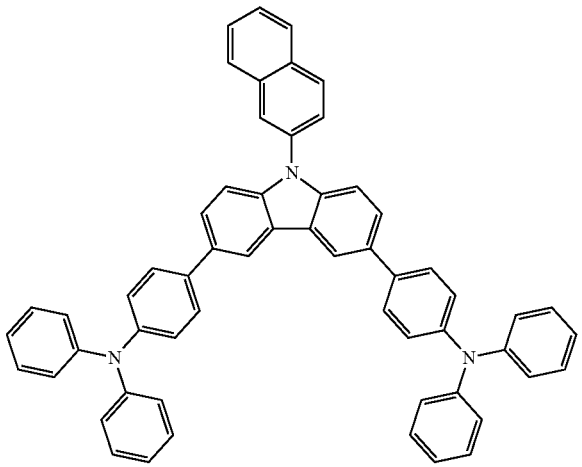

[HT-1]

Next, the following Compound [EB-1] (150 Å) was vacuum deposited to have a film thickness of 50 Å on the hole transport layer, thereby forming an electron blocking layer.
[EB-1]
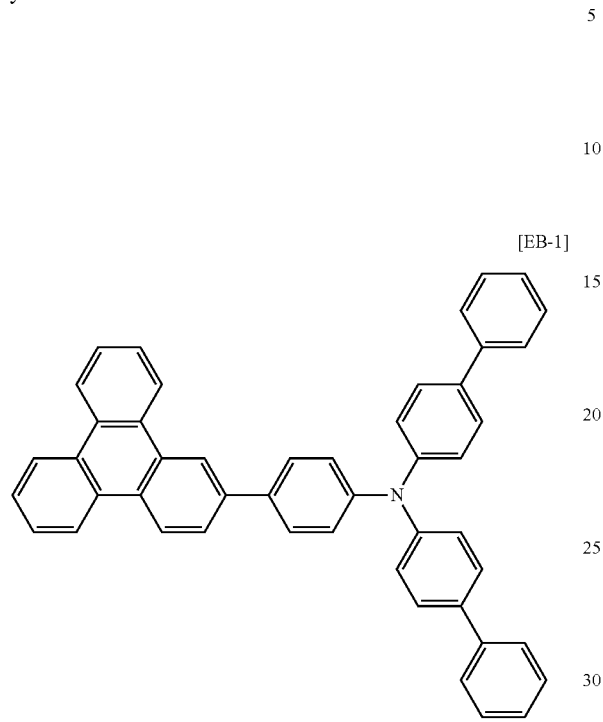
Next, the following Compounds [BH] and [BD] were vacuum deposited at a weight ratio of 40:1 to have a film thickness of 200 Å on the electron blocking layer, thereby forming a light emitting layer.
[BH]
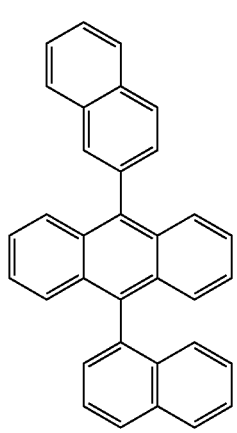
-continued
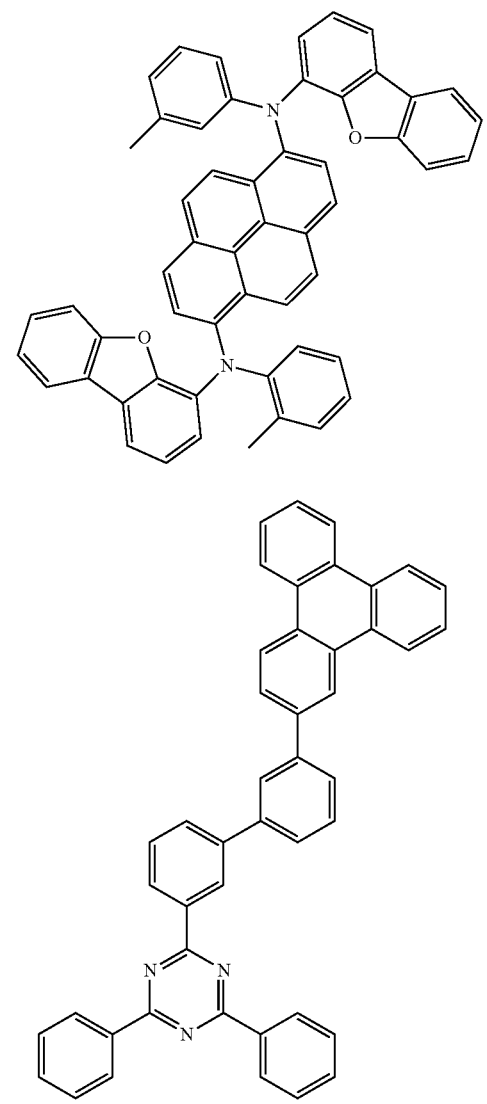
[BD]
[HB-1]
[ET-1]

[LiQ]

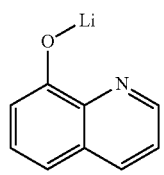

The above Compound [HB-1] was vacuum deposited to have a film thickness of 50 Å on the light emitting layer, thereby forming a hole blocking layer.

Next, the above Compound [ET-1] and the above compound LiQ (lithium quinolate) were vacuum deposited at a weight ratio of 1:1 on the hole blocking layer, thereby forming a layer which simultaneous injects and transports electrons and has a thickness of 300 Å.

Lithium fluoride (LiF) and aluminum were sequentially deposited on the layer which simultaneously injects and transports electrons to have a thickness of 12 Å and 2,000 Å, respectively, thereby forming a negative electrode.

In the aforementioned procedure, the deposition rate of the organic material was maintained at 0.4 to 0.7 Å/sec, the deposition rates of lithium fluoride and aluminum of the negative electrode were maintained at 0.3 Å/sec and at 2 Å/sec, respectively, and the degree of vacuum during the deposition was maintained at $2 \times 10^{-7}$ to $5 \times 10^{-6}$ torr, thereby manufacturing an organic light emitting device.

Examples 1 to 15 and Comparative Examples 2 to 12

Organic light emitting devices were manufactured in the same manner as in Comparative Example 1, except that the compounds shown in the following Table 1 were used for the hole blocking layer and the layer which simultaneously injects and transports electrons in Comparative Example 1.

Comparative Example 13

An organic light emitting device was manufactured in the same manner as in Comparative Example 1, except that the hole blocking layer and the layer which simultaneously injects and transports electrons were composed of a single layer, and Compound [HB-1] in the following Table 1 was used instead of the Compounds [HB-1] and [ET-1] in Comparative Example 1.

Comparative Example 14

An organic light emitting device was manufactured in the same manner as in Comparative Example 1, except that the hole blocking layer and the layer which simultaneously injects and transports electrons were composed of a single layer, and only Compound [ET-1] in the following Table 1 was used instead of Compounds [HB-1] and [ET-1] in Comparative Example 1.

1-1
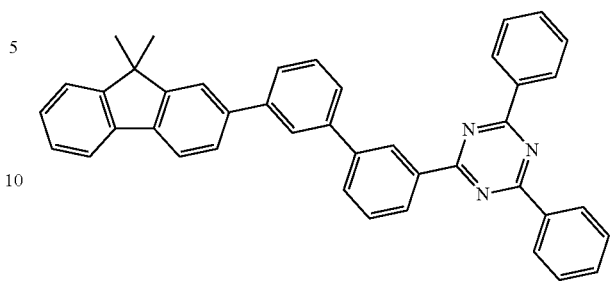

1-2
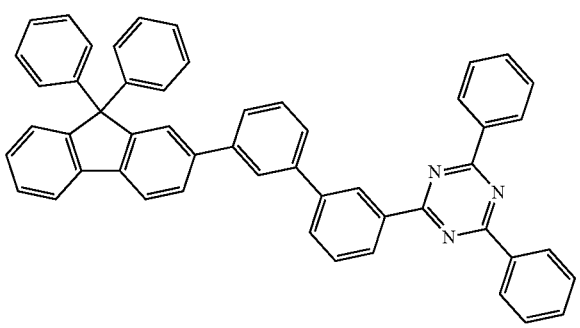

1-3
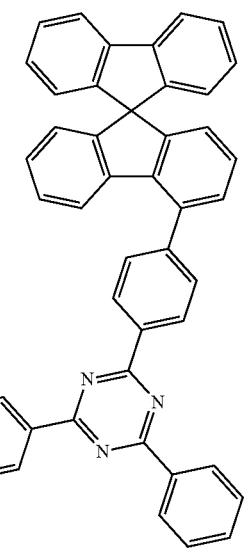

1-4
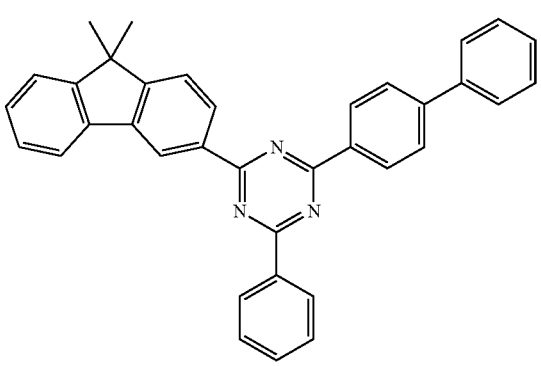

1-5
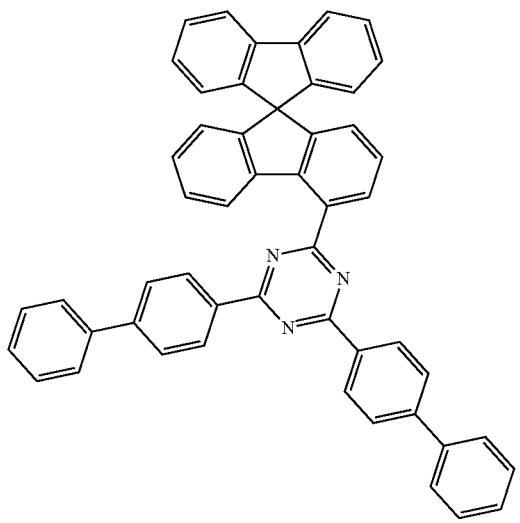
3-1
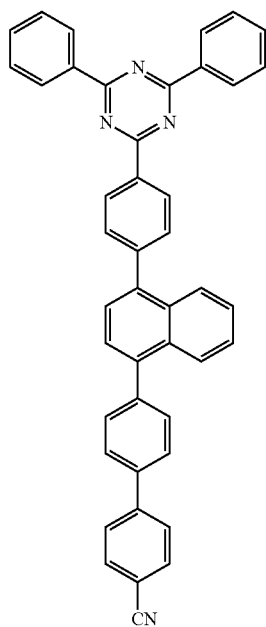
2-1
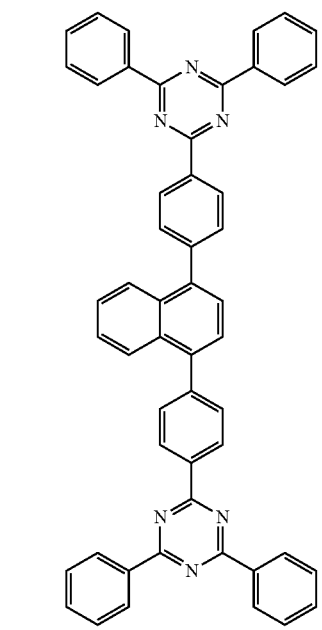
3-2
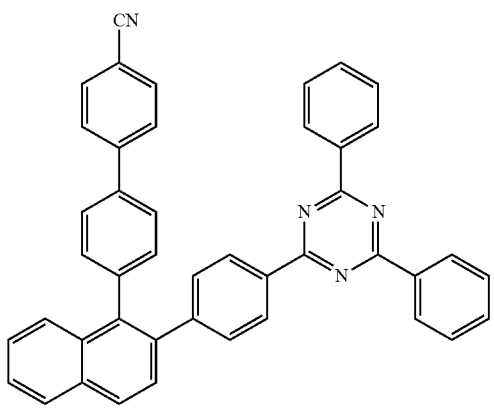
HB-2
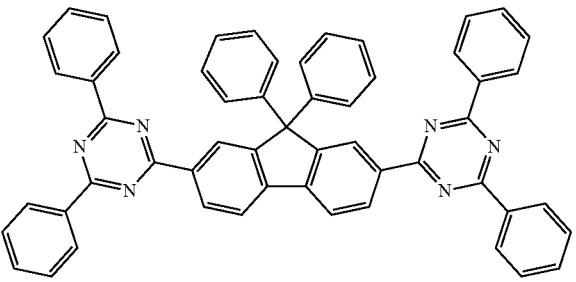

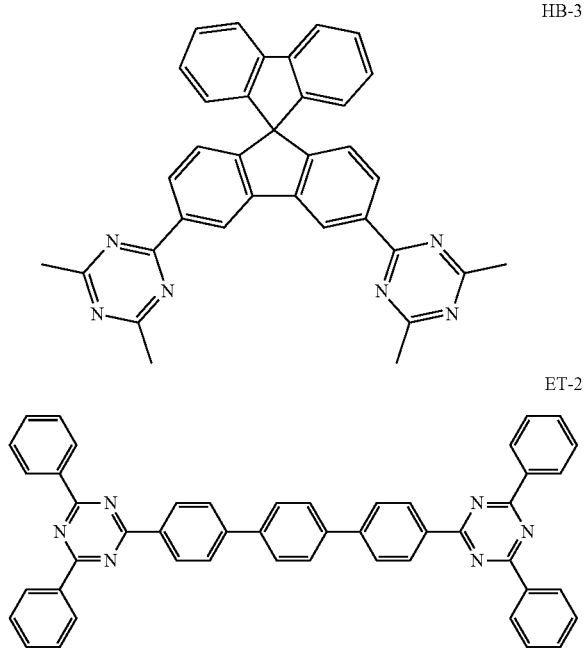

When an electric current of 20 mA/cm² was applied to the organic light emitting devices manufactured in Examples 1 to 15 and Comparative Examples 1 to 14, the driving voltage, the light emitting efficiency, and the color coordinate were measured, and time (T98) taken for the luminance to become 98% of the initial luminance (1,600 nit) at a current density of 20 mA/cm² was measured. The results are shown in the following Table 1.

TABLE 1

| | Compound (Hole blocking layer) | Compound (the layer which simultaneously injects and transports electrons) | Voltage (V@20 mA/cm²) | Efficiency (cd/A @20 mA cm²) | Color coordinate (x, y) | T98 (hr) |
|---|---|---|---|---|---|---|
| Comparative Example 1 | HB-1 | ET-1 | 4.33 | 5.93 | (0.140, 0.046) | 230 |
| Example 1 | 1-1 | 3-1 | 3.64 | 6.79 | (0.141, 0.046) | 340 |
| Example 2 | 1-1 | 2-1 | 3.63 | 6.63 | (0.143, 0.047) | 355 |
| Example 3 | 1-1 | 3-2 | 3.62 | 6.80 | (0.142, 0.048) | 345 |
| Example 4 | 1-2 | 3-1 | 3.72 | 6.78 | (0.140, 0.044) | 345 |
| Example 5 | 1-2 | 2-1 | 3.73 | 6.66 | (0.141, 0.046) | 350 |
| Example 6 | 1-2 | 3-2 | 3.75 | 6.69 | (0.140, 0.044) | 345 |
| Example 7 | 1-3 | 3-1 | 3.89 | 6.75 | (0.141, 0.046) | 340 |
| Example 8 | 1-3 | 2-1 | 3.86 | 6.70 | (0.138, 0.044) | 355 |
| Example 9 | 1-3 | 3-2 | 3.85 | 6.62 | (0.139, 0.043) | 340 |
| Example 10 | 1-4 | 3-1 | 3.91 | 6.54 | (0.142, 0.045) | 335 |
| Example 11 | 1-4 | 2-1 | 3.92 | 6.53 | (0.143, 0.044) | 330 |
| Example 12 | 1-4 | 3-2 | 3.93 | 6.52 | (0.142, 0.046) | 335 |
| Example 13 | 1-5 | 3-1 | 3.95 | 6.47 | (0.143, 0.047) | 330 |
| Example 14 | 1-5 | 2-1 | 3.96 | 6.49 | (0.143, 0.045) | 335 |
| Example 15 | 1-5 | 3-2 | 3.95 | 6.48 | (0.142, 0.044) | 330 |
| Comparative Example 2 | 1-1 | ET-1 | 4.14 | 6.32 | (0.141, 0.045) | 250 |
| Comparative Example 3 | 1-2 | ET-1 | 4.05 | 6.34 | (0.143, 0.048) | 245 |
| Comparative Example 4 | 1-3 | ET-1 | 4.07 | 6.31 | (0.143, 0.046) | 265 |
| Comparative Example 5 | HB-1 | 3-1 | 4.12 | 6.07 | (0.141, 0.045) | 330 |
| Comparative Example 6 | HB-1 | 2-1 | 4.13 | 6.06 | (0.143, 0.042) | 325 |
| Comparative Example 7 | HB-1 | 3-2 | 4.13 | 6.01 | (0.143, 0.046) | 335 |
| Comparative Example 8 | HB-2 | 2-1 | 4.58 | 5.85 | (0.141, 0.047) | 300 |
| Comparative Example 9 | HB-3 | 2-1 | 4.12 | 6.05 | (0.145, 0.048) | 75 |
| Comparative Example 10 | 1-1 | ET-2 | 4.01 | 6.28 | (0.143, 0.046) | 115 |
| Comparative Example 11 | HB-2 | ET-2 | 4.55 | 5.76 | (0.142, 0.047) | 150 |
| Comparative Example 12 | HB-3 | ET-2 | 4.12 | 6.05 | (0.145, 0.048) | 30 |
| Comparative Example 13 | HB-1 | | 4.73 | 6.03 | (0.143, 0.047) | 160 |
| Comparative Example 14 | ET-1 | | 4.35 | 5.61 | (0.143, 0.049) | 255 |

As shown in Table 1, Examples 1 to 15 are examples in which the compound of Formula 1 of the present specification is used as a material for a hole blocking layer and the compound of at least one of Formulae 2 and 3 of the present specification is used as a material for a layer which simultaneously injects and transports electrons, and exhibit characteristics of an organic light emitting device in which the compound including Formula 1 of the present specification, and at least one of Formulae 2 and 3 of the present specification is used. Comparative Example 1 exhibits characteristics of an organic light emitting device in which Compound HB-1 as a hole blocking material and Compound ET-1 as an electron transport material used in the organic light emitting device in the related art are used.

Comparative Examples 2 to 7 are comparative examples in which the compound of Formula 1 of the present specification or the compound of at least one of Formulae 2 and 3 of the present specification is used instead of Compound HB-1 as the hole blocking material or Compound ET-1 as the electron transport material in Comparative Example 1 which is an organic light emitting device in the related art, and exhibit characteristics of an organic light emitting device in which Formulae 1, 2, and 3 of the present specification are used, respectively.

Comparative Examples 13 and 14 exhibit characteristics of a device when a layer between a negative electrode and a light emitting layer is used as a single layer including Compound HB-1 or Compound ET-1.

The organic light emitting devices in Examples 1 to 15 commonly exhibit the low voltage, high efficiency, and long service life characteristics as compared to Comparative Example 1 to 14, and specifically, the compound of Formula 1 of the present specification exhibits the high efficiency characteristics, and the compounds of Formulae 2 and 3 of the present application exhibit the long service life characteristics.

Specifically, the organic light emitting devices in Examples 1 to 15 exhibited the results in which as a whole, the light emitting efficiency was increased by 5% or more, the driving voltage was lowered by 5 to 12%, and the service life was equivalent or increased, as compared to the organic light emitting devices in Comparative Example 1 to 14.

Comparative Example 8 is a device in which Compound HB-2 in which a triazine group in which an aryl group is substituted is connected to both sides of a fluorene core is used as a hole blocking layer, and showed characteristics in which the voltage was significantly increased. From this result, it could be seen that in the structure in the structure as the hole blocking layer in which two triazine groups were connected, only electron injection property was improved and characteristics of transferring electrons to the light emitting layer deteriorated.

Comparative Example 9 is a device in which Compound HB-3 in which a triazine group in which an alkyl group is substituted is connected to both sides of a fluorene core is used as a hole blocking layer, and showed characteristics in which the service life was significantly reduced. From this result, it could be seen that the alkyl group was a substituent which significantly reduces the service life of the device in the hole blocking layer.

Comparative Example 10 is a device in which Compound ET-2 having a triazine group at both sides of terphenyl is used as an electron transport material, and showed characteristics in which the service life was significantly reduced. From this result, it could be seen that the compound having a triazine group at both sides without having naphthalene as a central core had a disadvantage in that the stability significantly deteriorated.

Comparative Examples 11 and 12 are organic light emitting devices in which Compounds HB-2, HB-3, and ET-2 as the compounds in Comparative Example 8 to 10 are each combined as a hole blocking material and an electron transport material, and it could be seen that characteristics of the device were not improved.

Comparative Example 13 is a device in which the hole blocking layer and the electron transport layer are composed of a single layer by using the Compound HB-1 in Comparative Example 1, and showed characteristics in which the voltage was significantly increased, and the service life was reduced.

Comparative Example 14 is a device in which the hole blocking layer and the electron transport layer are composed of a single layer by using the Compound ET-1 in Comparative Example 1, and showed characteristics in which the efficiency was significantly lowered, and the service life was reduced.

Accordingly, it can be seen that when a device is composed of two layers by dividing the hole blocking layer and the layer which simultaneously injects and transports electrons, instead of using the layer between the negative electrode and the light emitting layer as a single layer, the characteristics thereof are excellent.

Through Examples 1 to 15 and Comparative Examples 1 to 14, it could be confirmed that when the compound of Formula 1 of the present specification was used as a hole blocking layer material and a compound of at least one of Formulae 2 or 3 of the present specification was combined as a layer which simultaneously injects and transports electrons, it was possible to achieve high efficiency characteristics while maintaining long service life characteristics of the organic light emitting device.

Although the preferred exemplary embodiments (a combination experiment of a hole blocking layer and a layer which simultaneously injects and transports electrons) of the present invention have been described above, the present invention is not limited thereto, and various modifications can be made and carried out within the scopes of the claims and the detailed description of the invention, and also fall within the scope of the invention.

The invention claimed is:

1. An organic light emitting device, comprising:
a positive electrode;
a negative electrode provided to face the positive electrode;
a light emitting layer provided between the positive electrode and the negative electrode;
a first organic material layer provided between the negative electrode and the light emitting layer; and
a second organic material layer provided between the negative electrode and the first organic material layer,
wherein the first organic material layer is a hole blocking layer, and consists of a compound selected from among the following compounds:

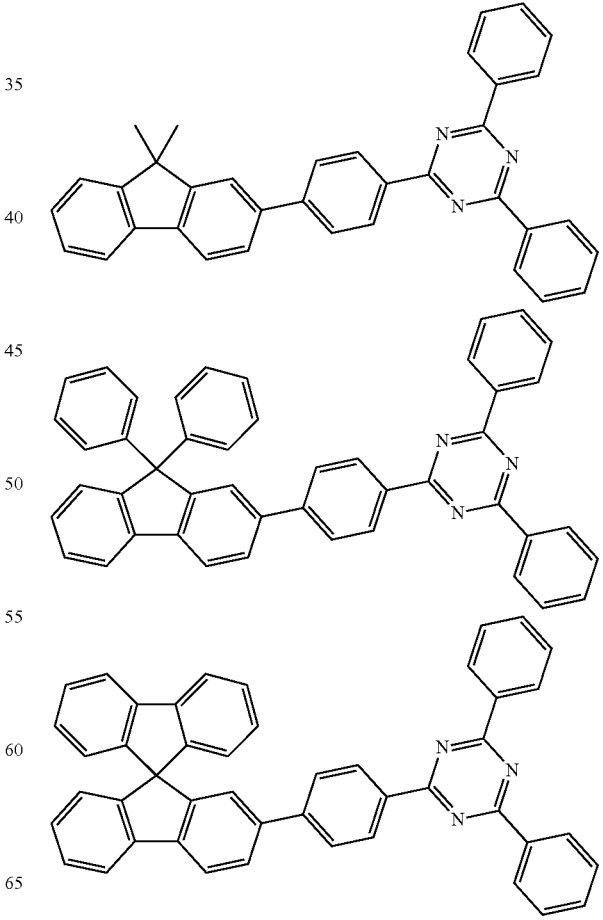

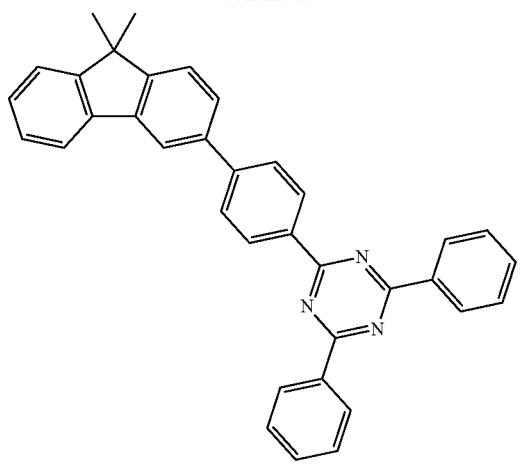
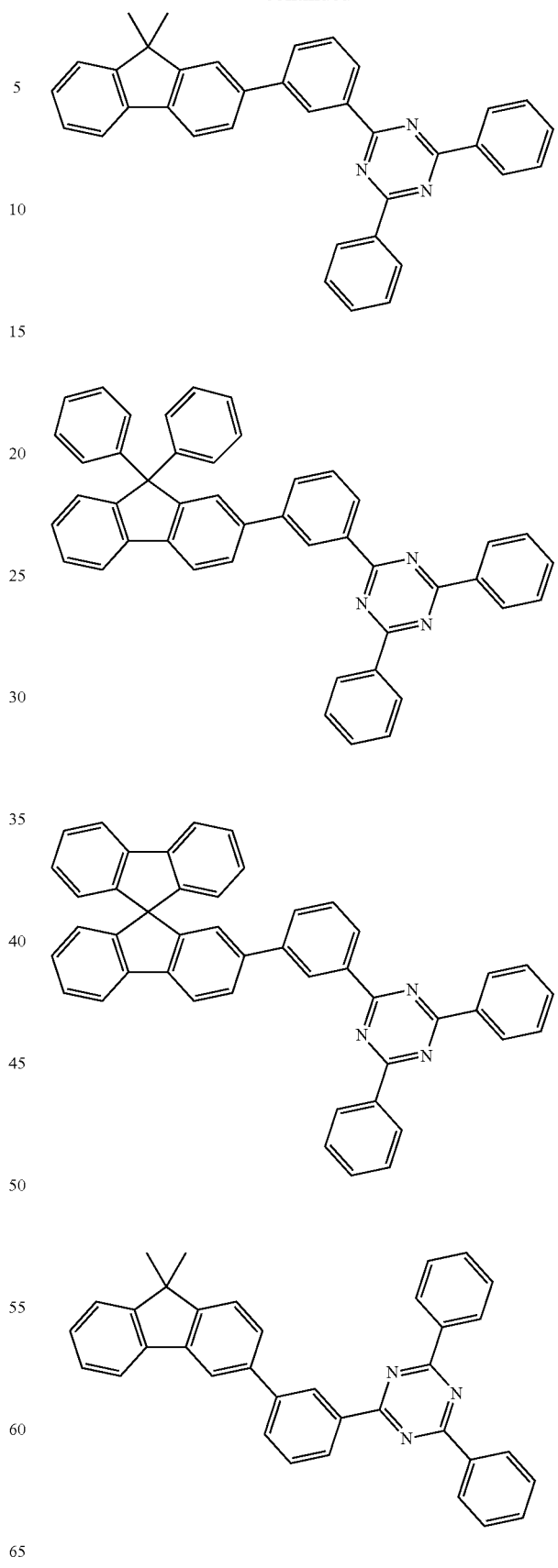

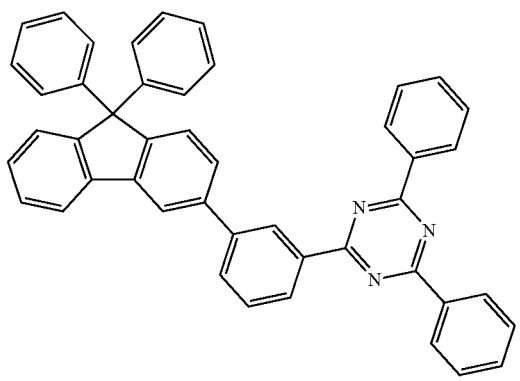
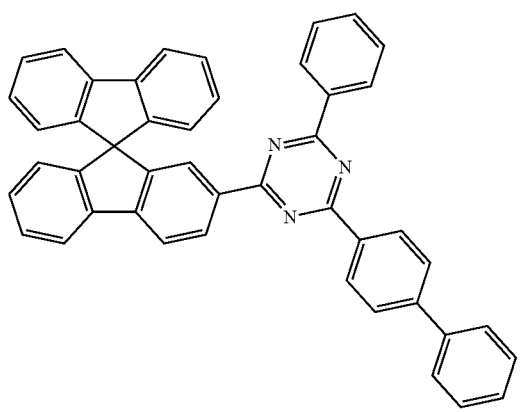
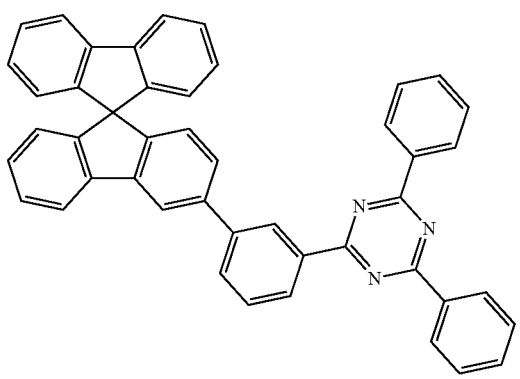
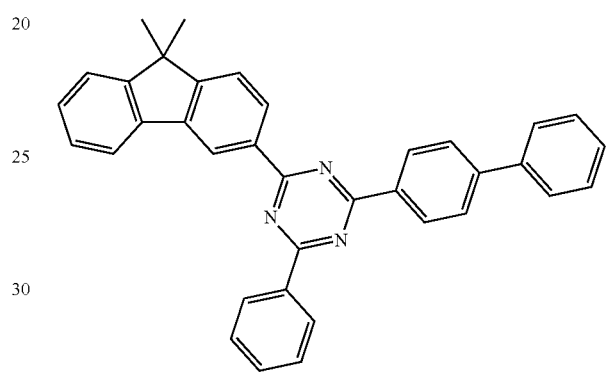
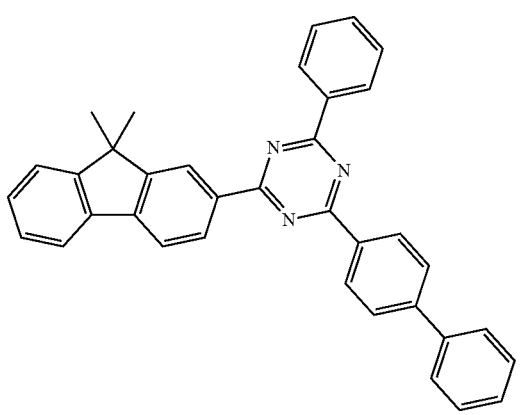
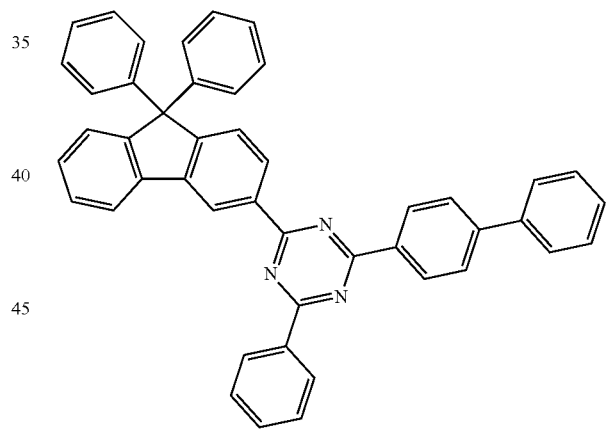
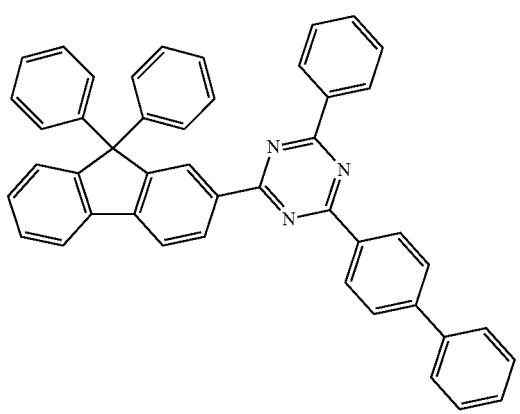
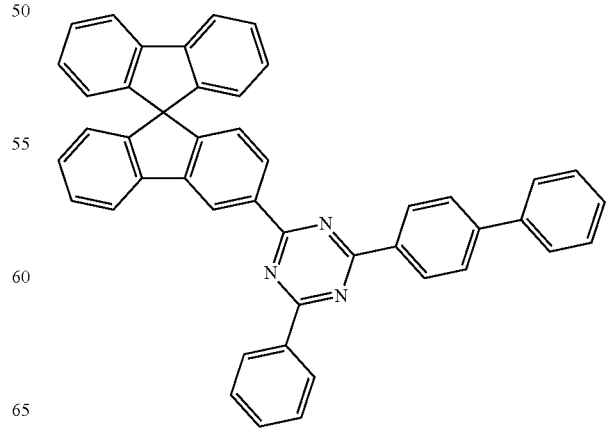

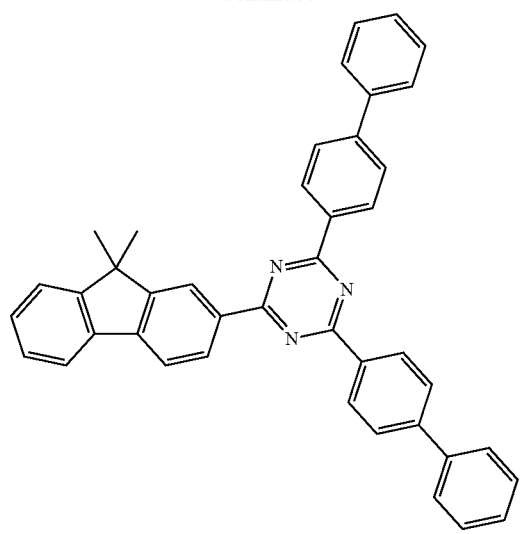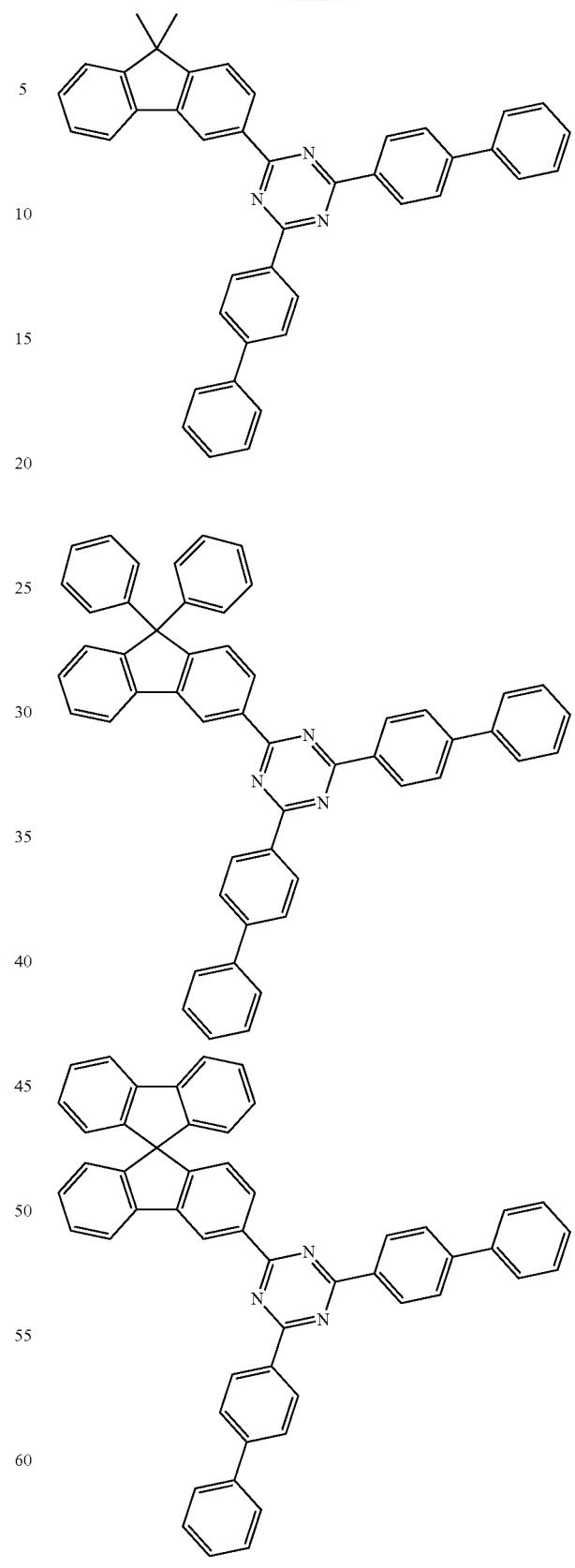

177
-continued
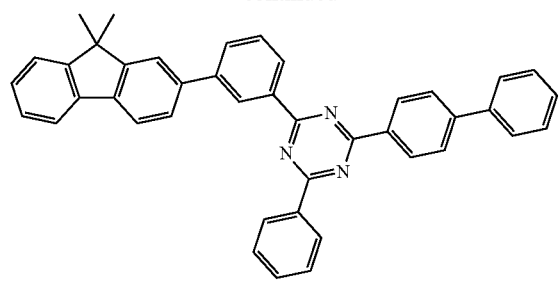
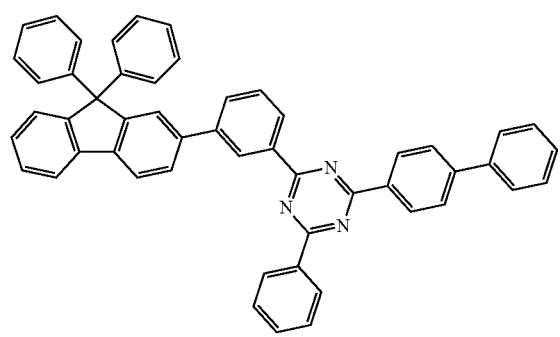
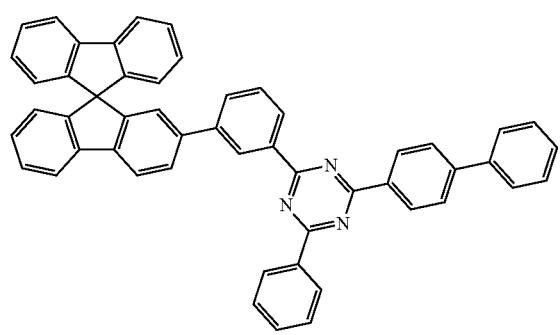
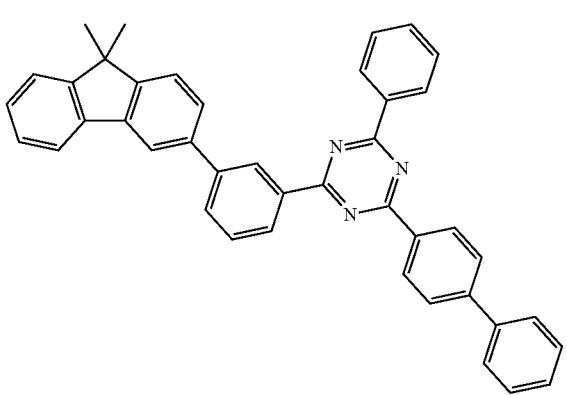
178
-continued
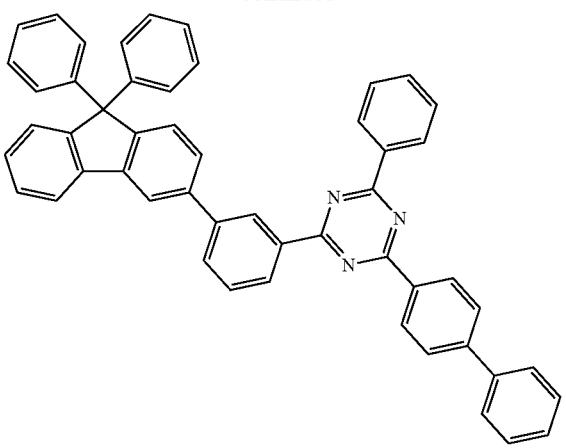
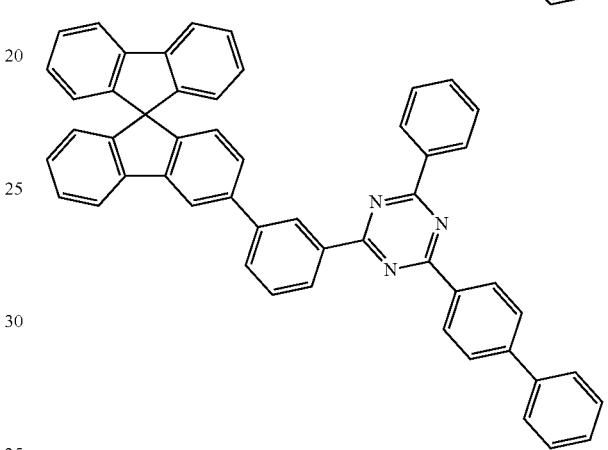
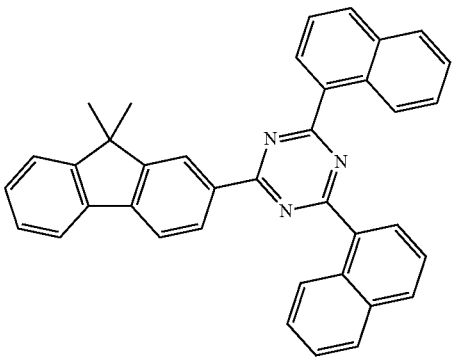
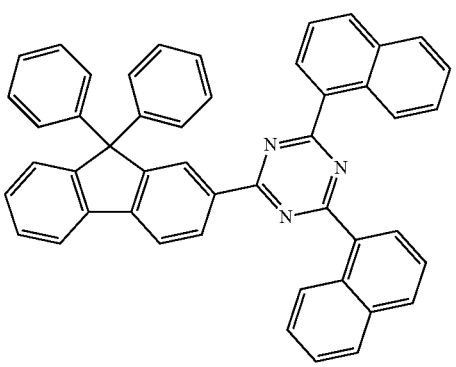

179
-continued
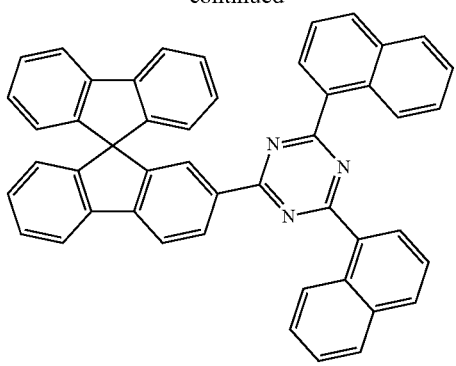
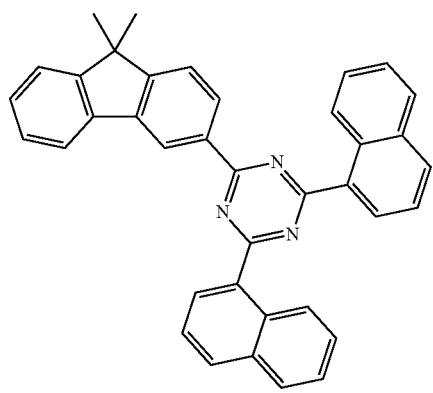
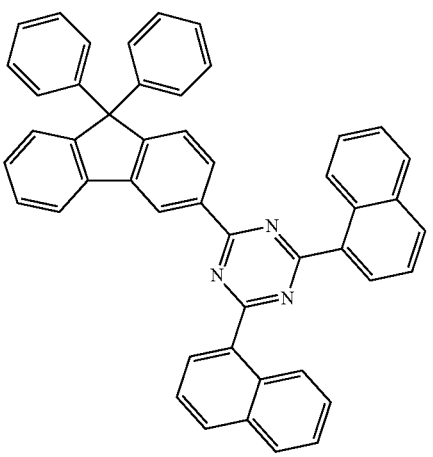
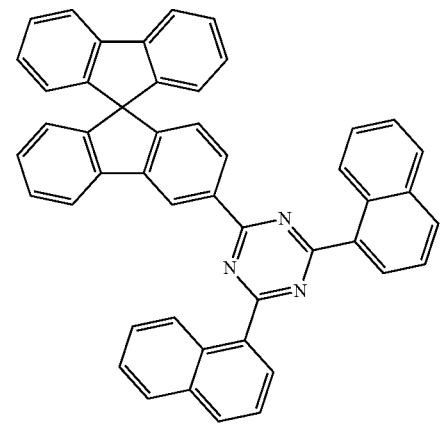
180
-continued
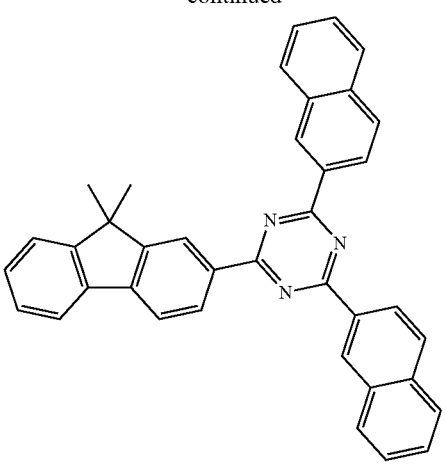
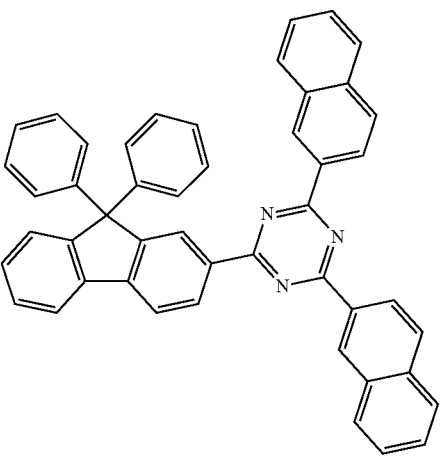
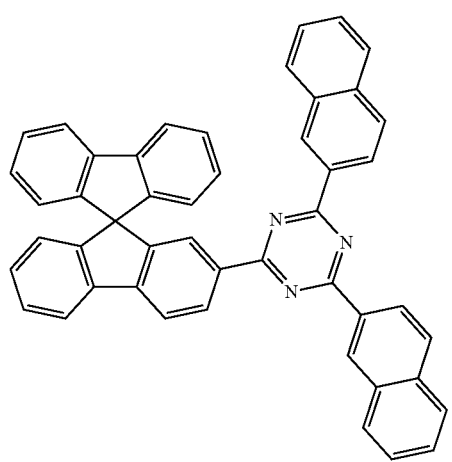

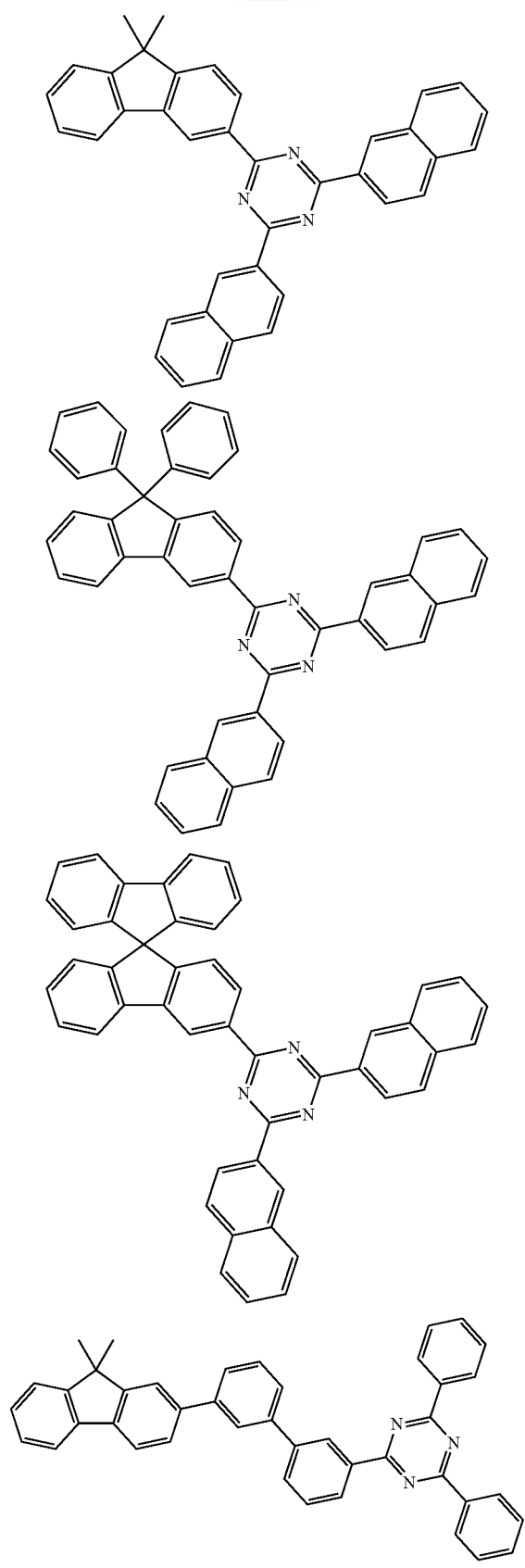
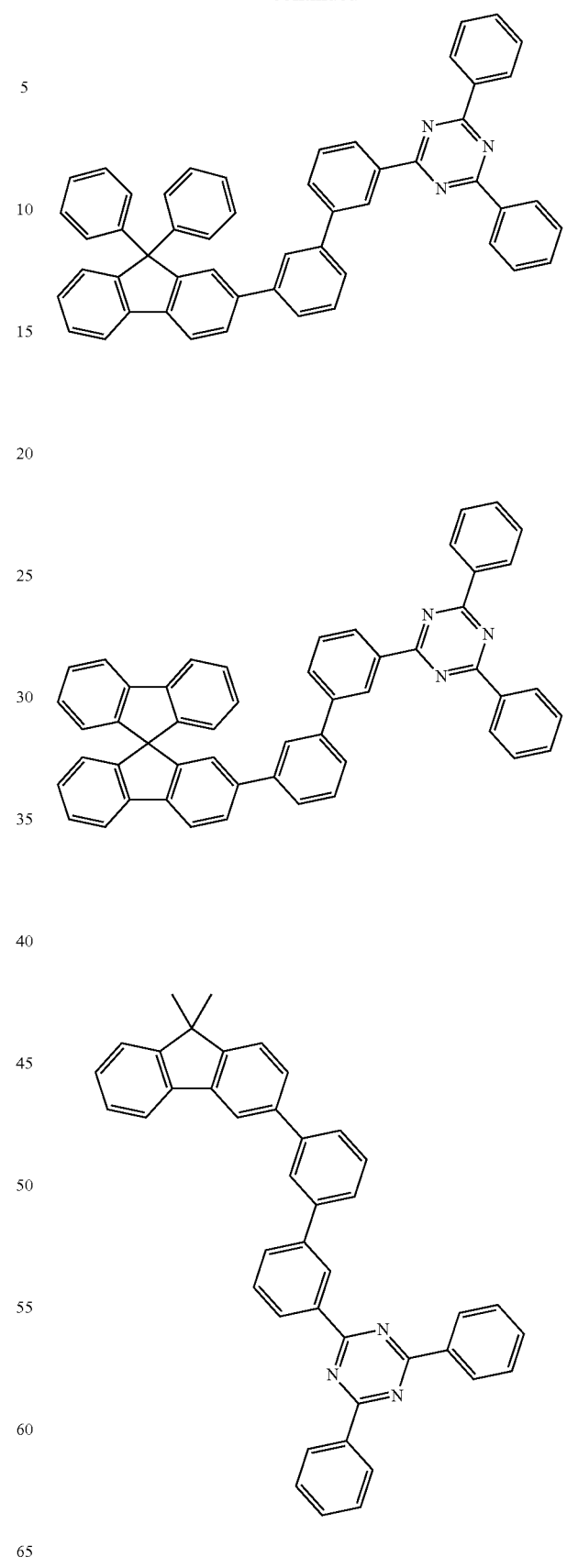

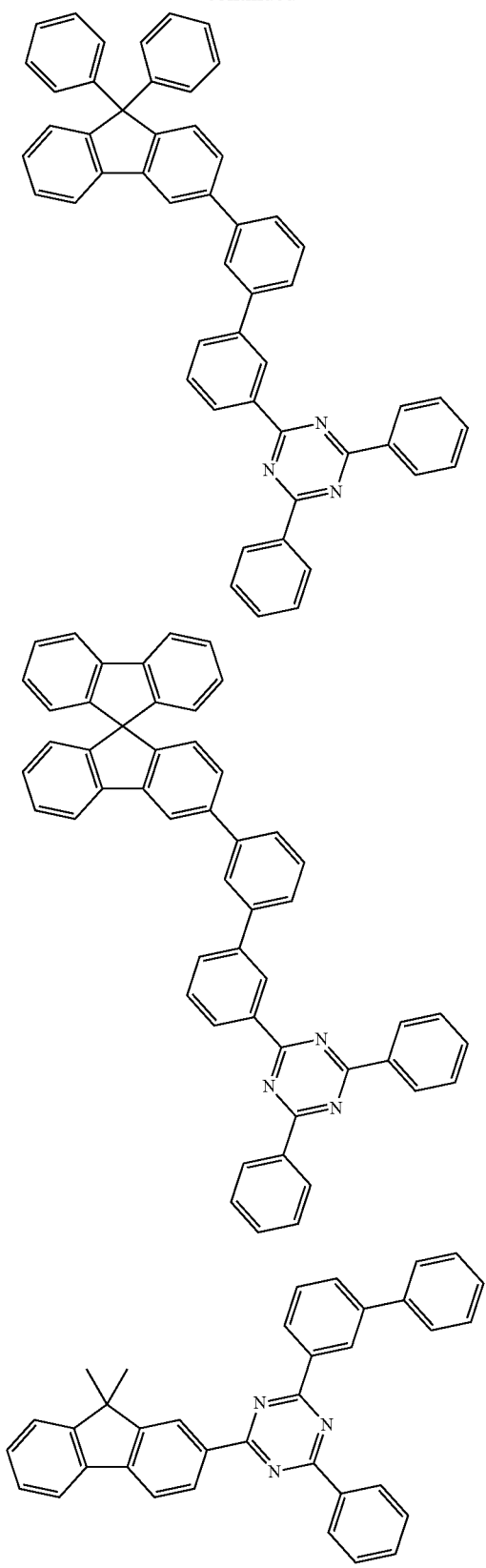
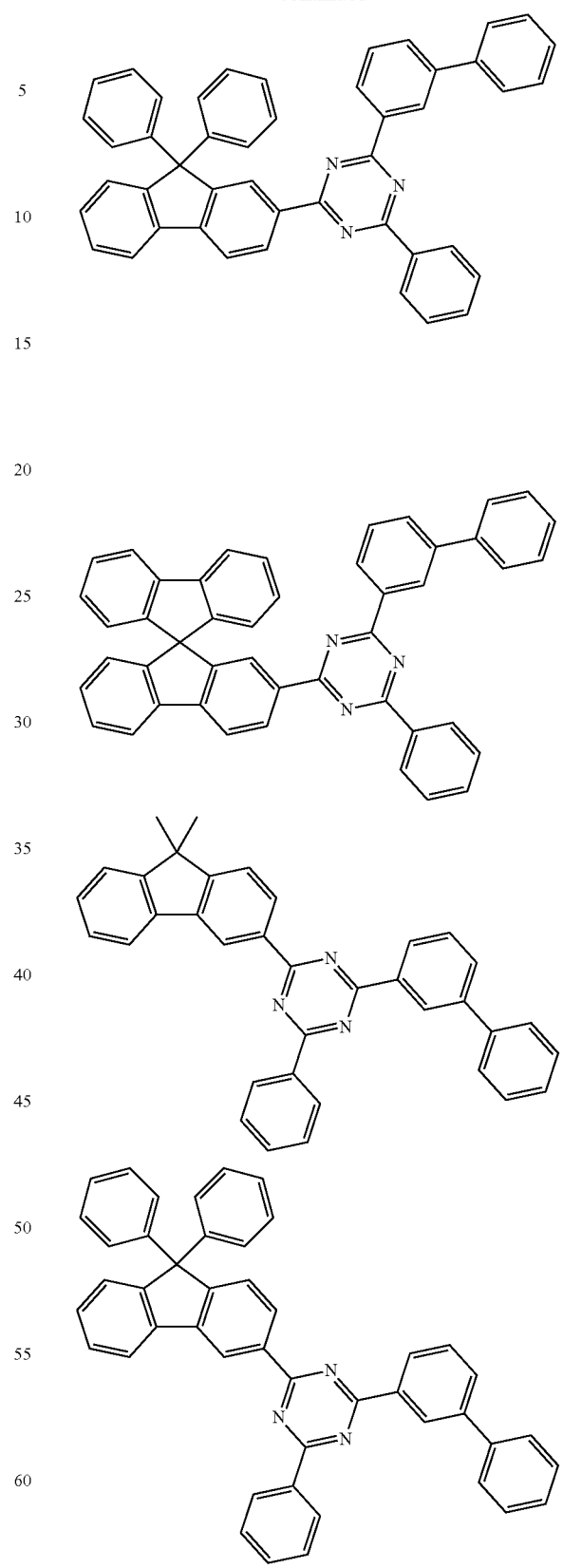

185
-continued
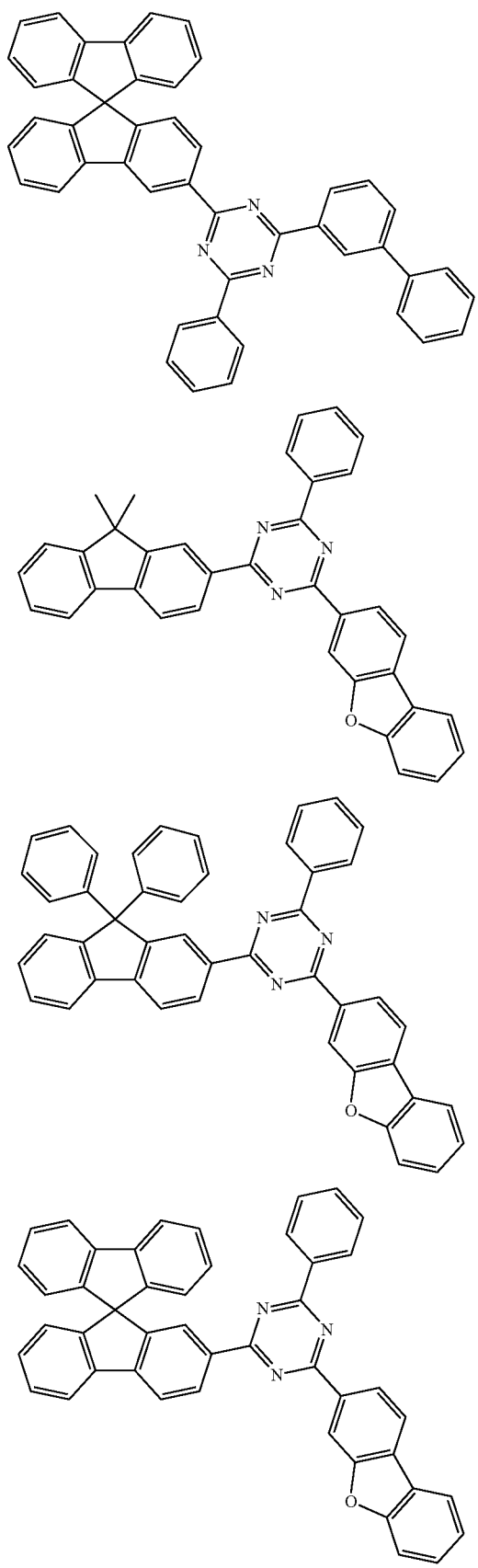
186
-continued
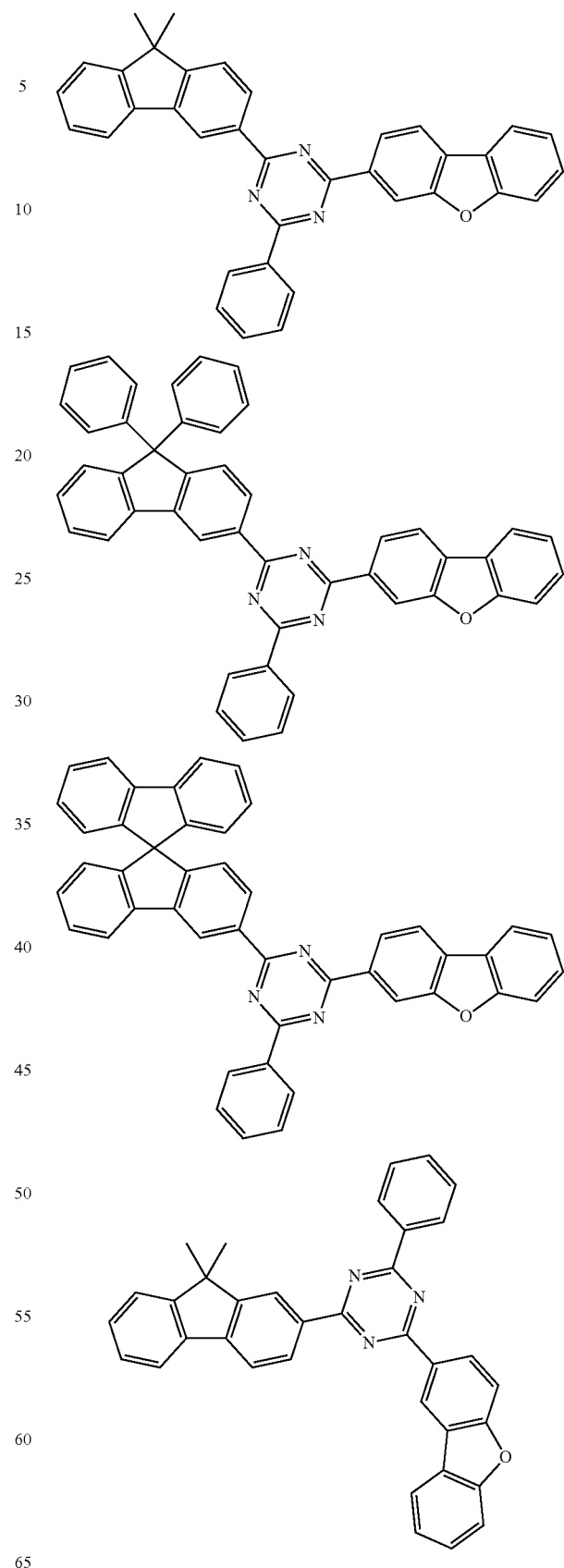

187
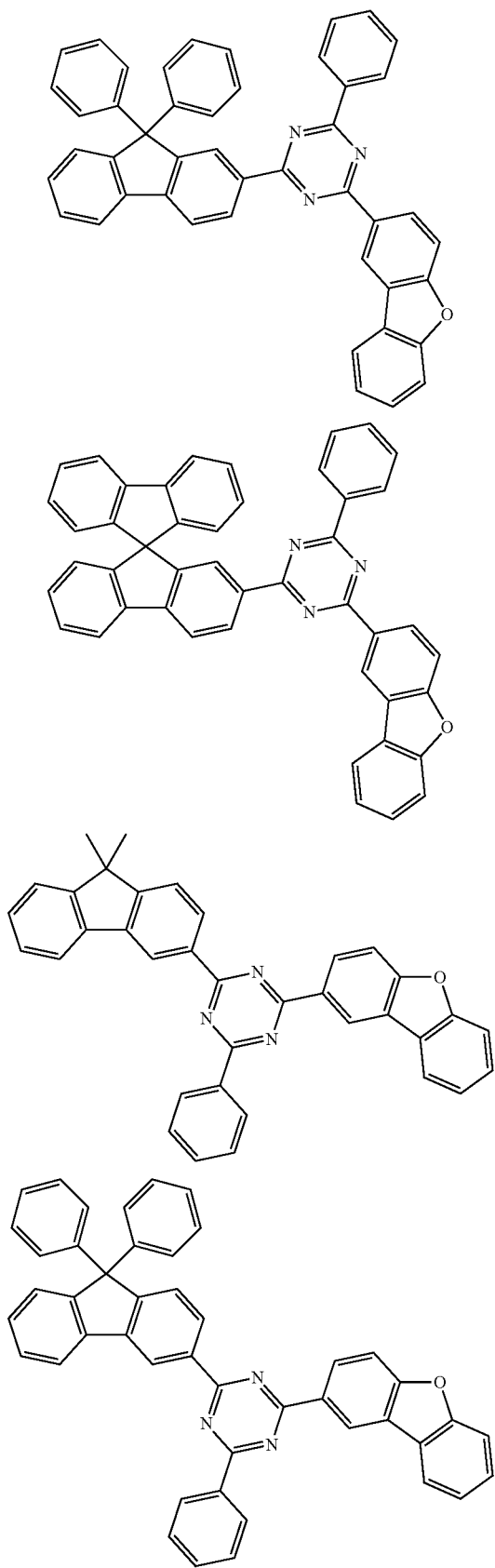
188
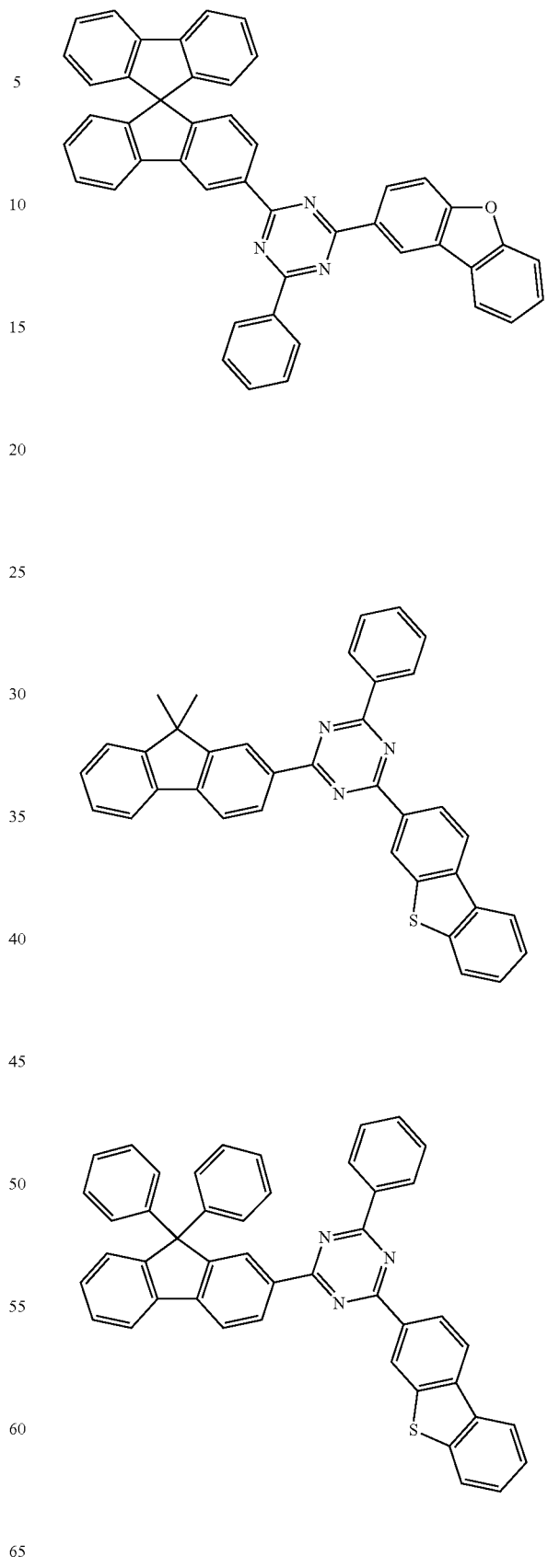

189
-continued
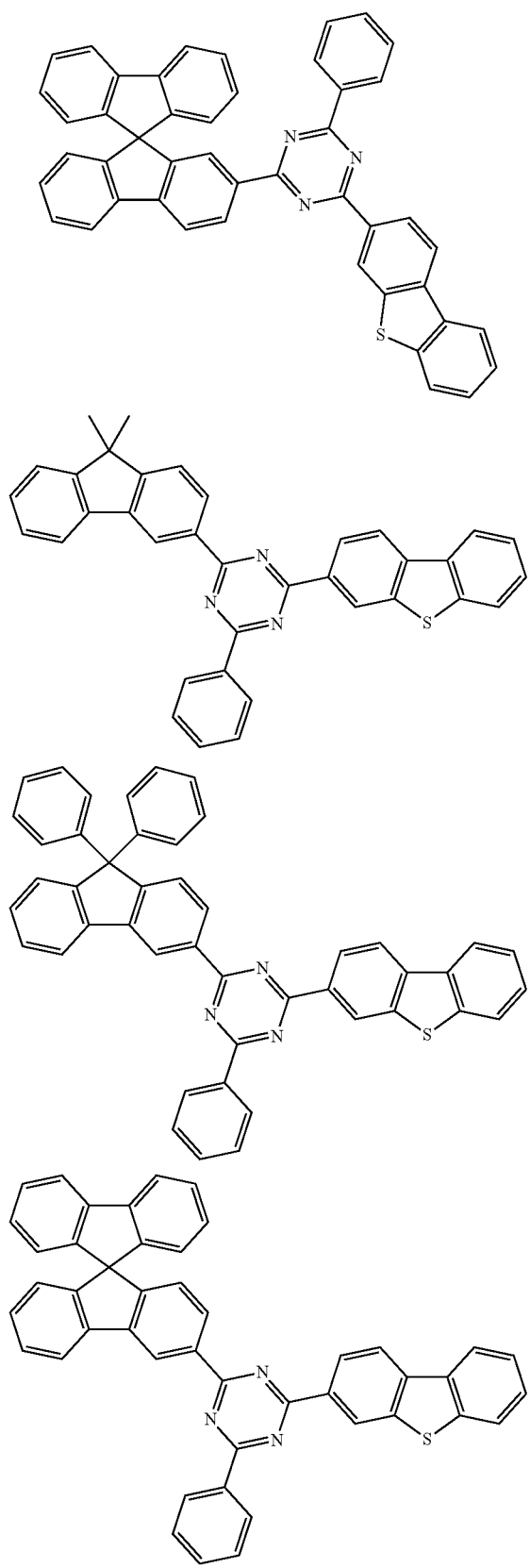
190
-continued
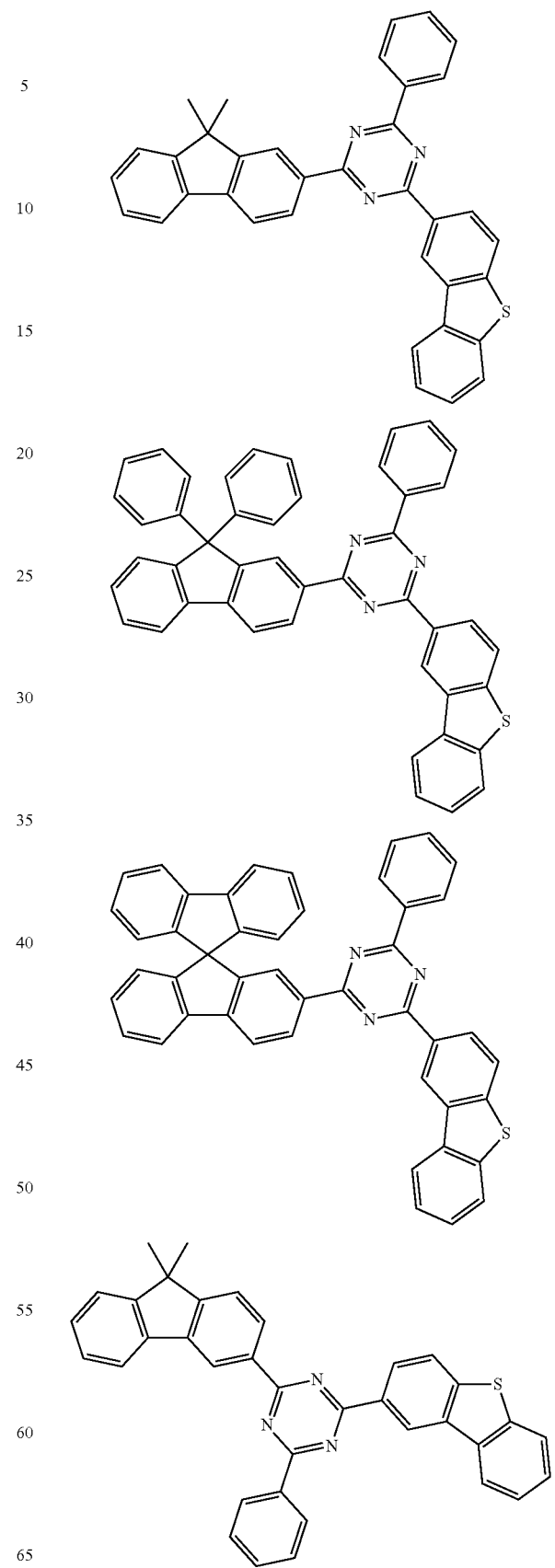

191
-continued
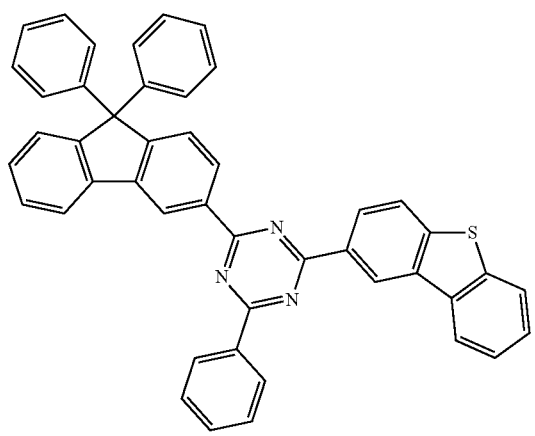
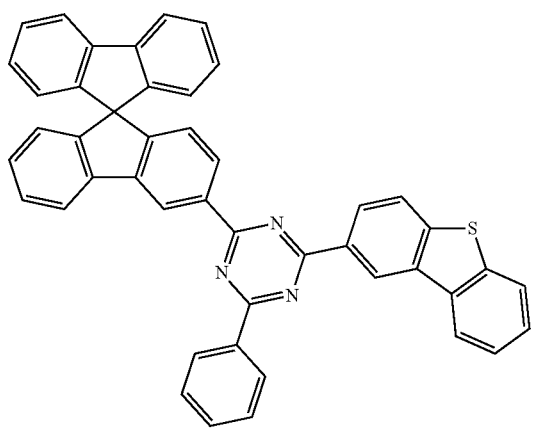
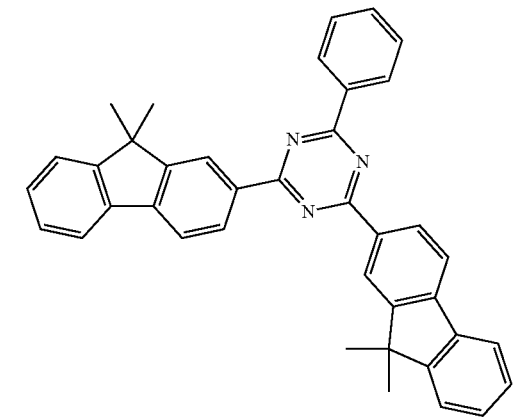
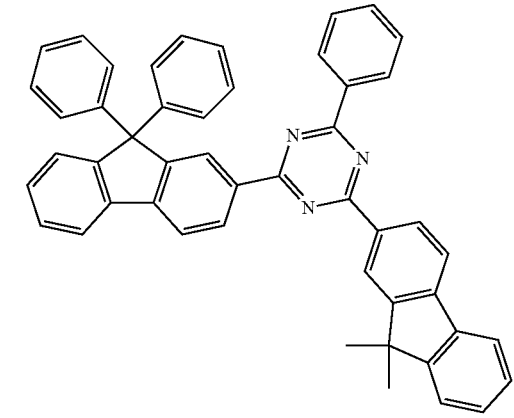
192
-continued
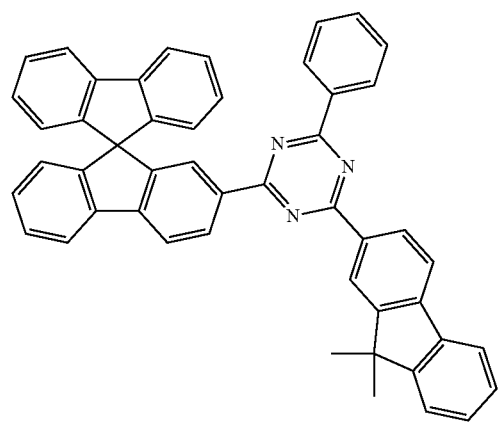
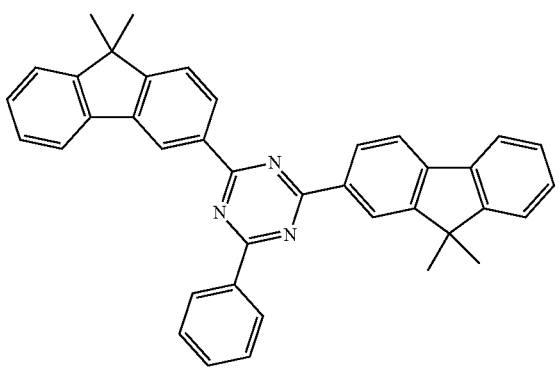
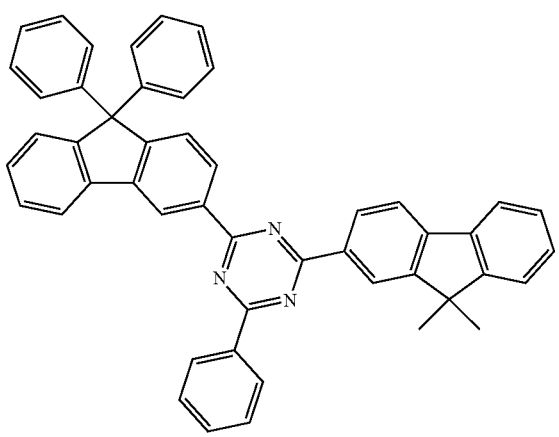
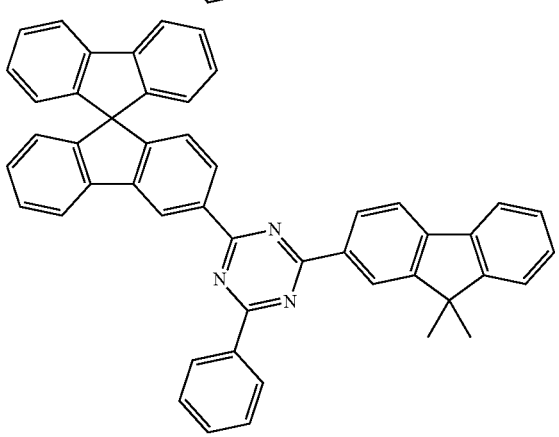

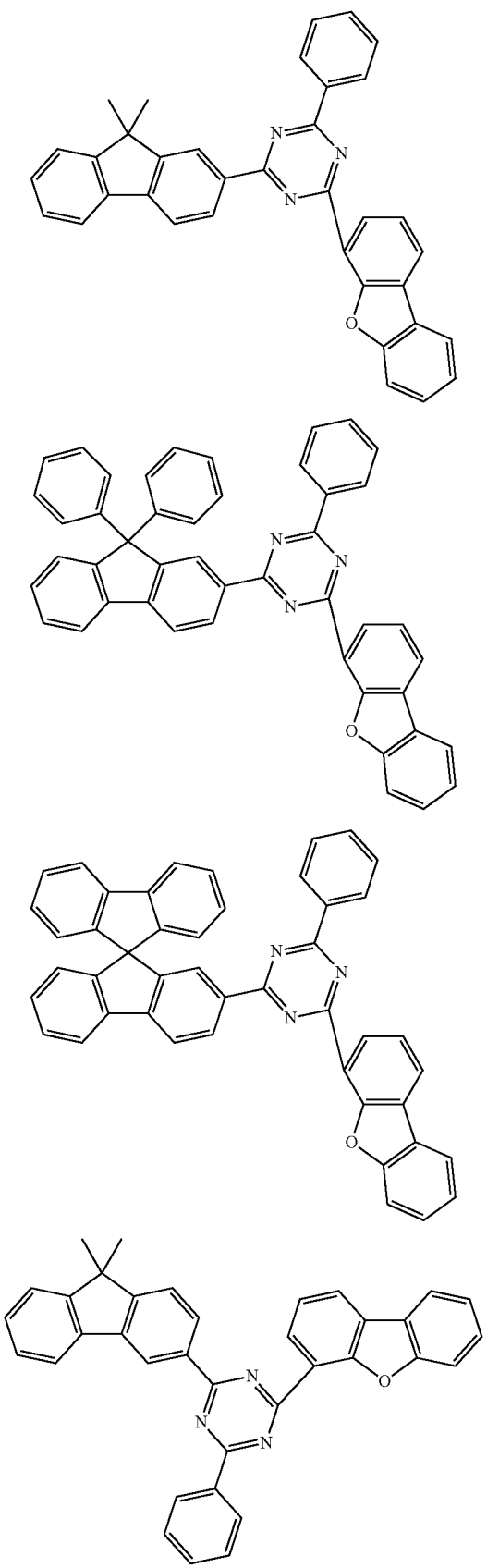

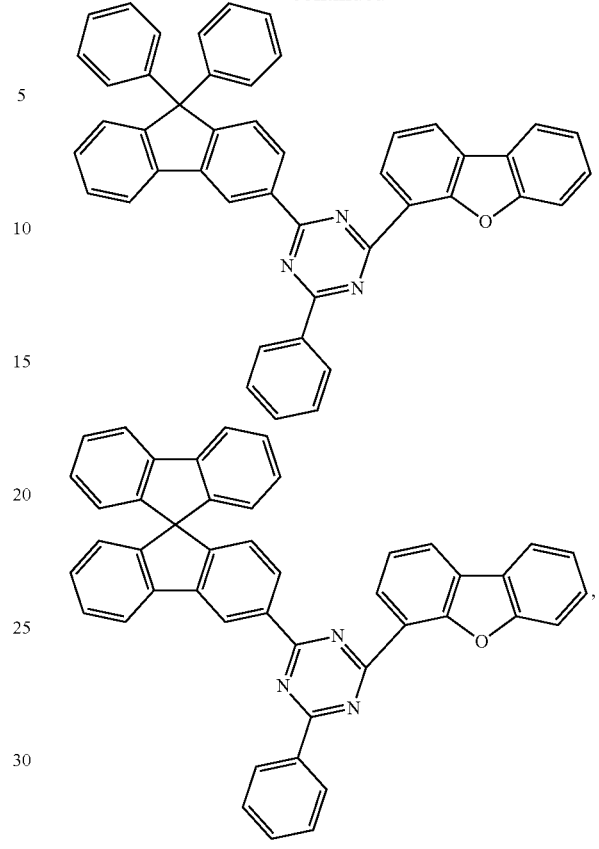

and
the second organic material layer is an electron injection layer, an electron transport layer, or a layer which simultaneously injects and transports electrons, and comprises a compound of the following Formula 3, and
wherein the second organic material layer is 2 times to 7 times thicker than the hole blocking layer:

[Formula 3]

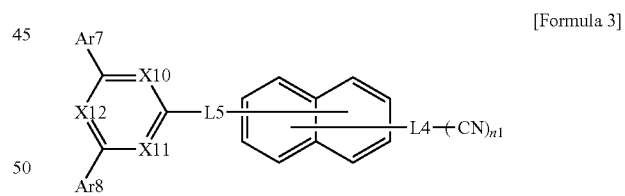

wherein in Formula 3:
at least one of X10 to X12 is N, and each remaining one is CH;
L4 is a divalent or trivalent aromatic hydrocarbon group having 6 to 30 carbon atoms;
L5 is a direct bond or an arylene group having 6 to 30 carbon atoms;
Ar7 and Ar8 are the same as or different from each other, and are each independently an aryl group having 6 to 30 carbon atoms; and
n1 is 1 or 2.

2. The organic light emitting device of claim 1, wherein the first organic material layer is provided to be brought into contact with the light emitting layer.

3. The organic light emitting device of claim 1, wherein the second organic material layer is provided to be brought into contact with the first organic material layer.

4. The organic light emitting device of claim 1, wherein Formula 3 is any one of the following Formulae 3-1 to 3-8:

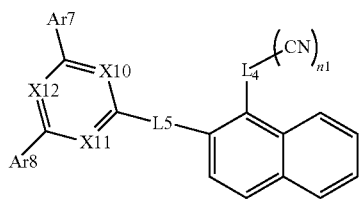

Formula 3-1

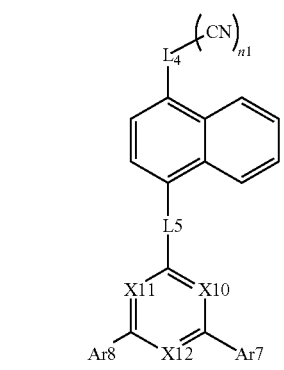

Formula 3-2

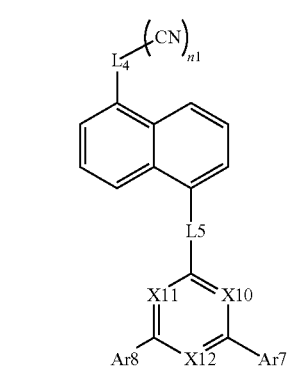

Formula 3-3

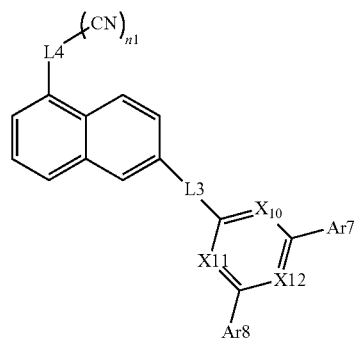

Formula 3-4

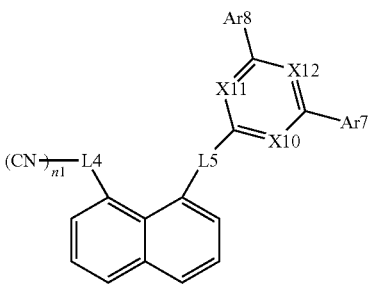

Formula 3-5

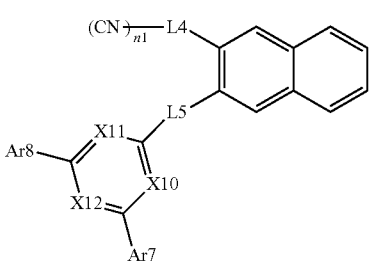

Formula 3-6

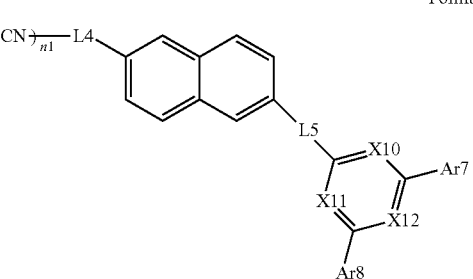

Formula 3-7

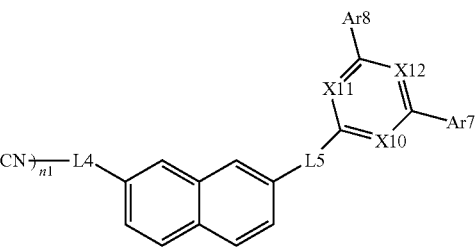

Formula 3-8 wherein in Formulae 3-1 to 3-8:
the definitions of X10 to X12, L4, L5, Ar7, Ar8, and n1 are the same as those defined in Formula 3.

5. The organic light emitting device of claim 1, wherein L1 and L5 are the same as or different from each other, and are each independently a direct bond or an arylene group.

6. The organic light emitting device of claim 1, wherein Ar1 and Ar2 are the same as or different from each other, and are each independently:
an aryl group which is unsubstituted or substituted with an alkyl group; or
a heteroaryl group.

7. The organic light emitting device of claim 1, wherein Ar7 and Ar8 are the same as or different from each other, and are each independently an aryl group which is unsubstituted or substituted with an aryl group.

8. The organic light emitting device of claim 1, wherein the compound of Formula 3 is selected from among the following compounds:

197
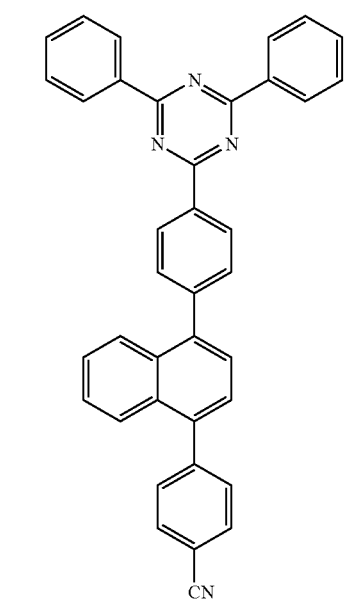
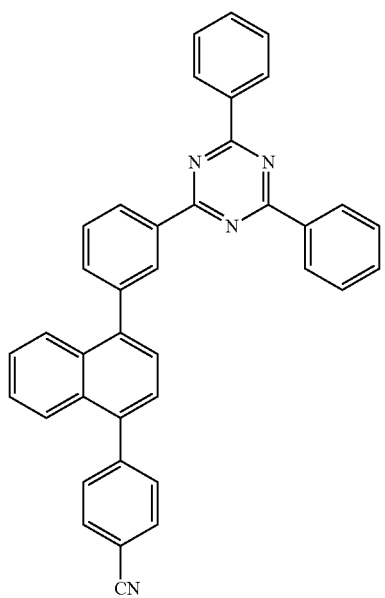
198
-continued
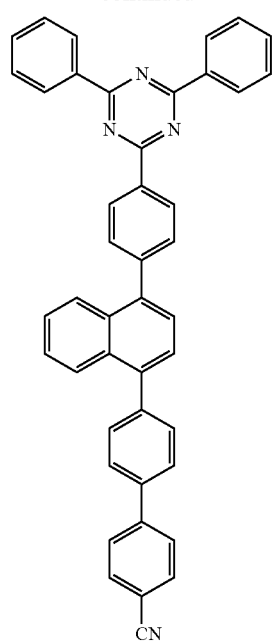
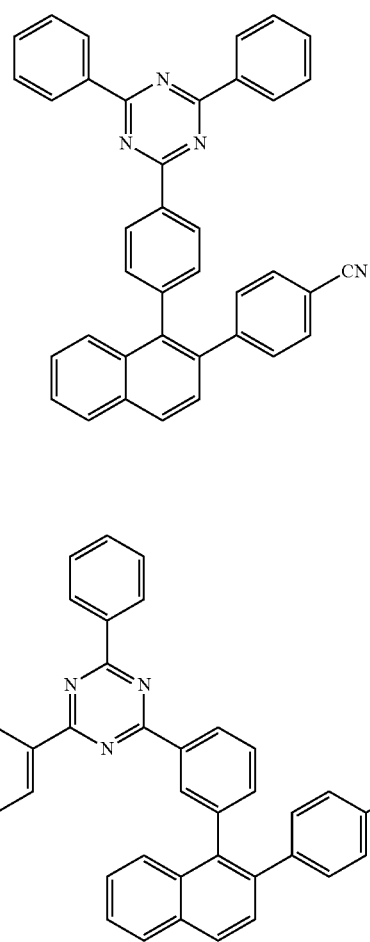

199
-continued
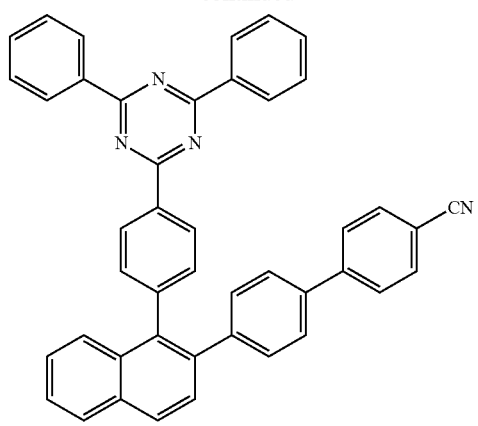
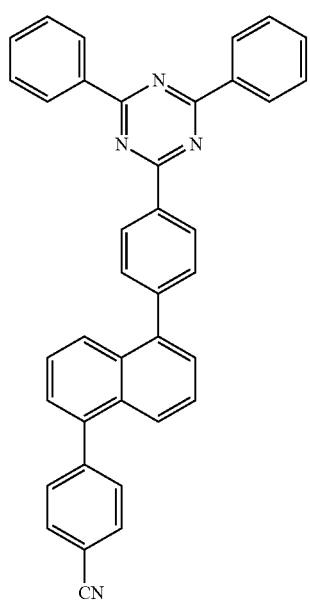
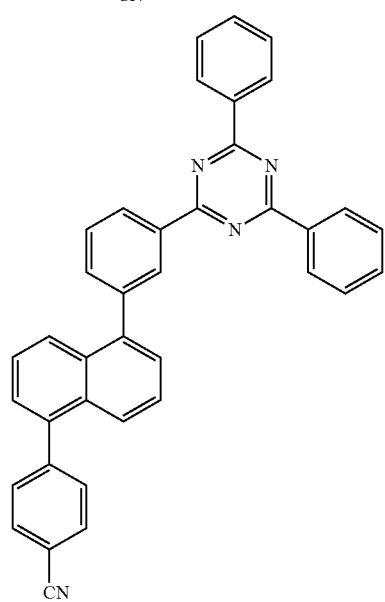
200
-continued
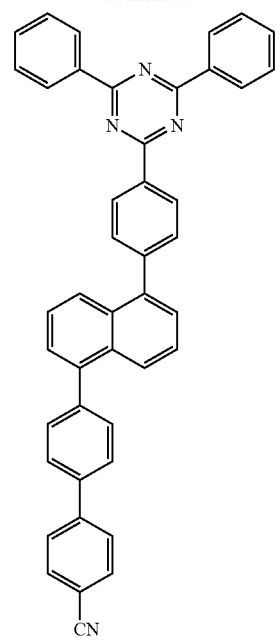
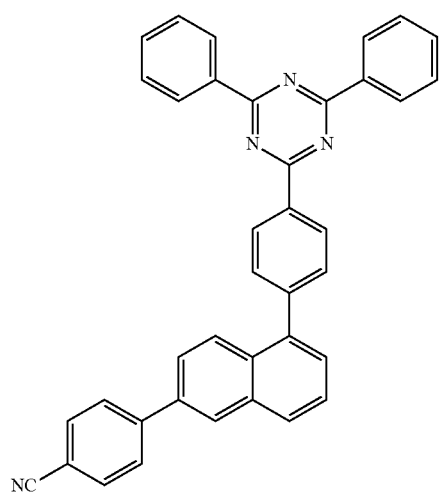
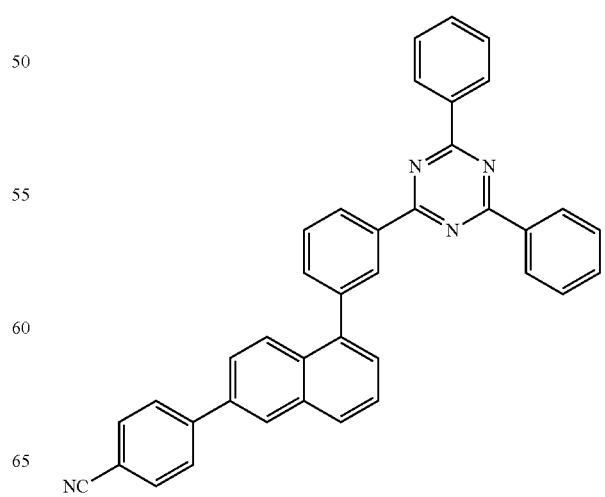

201
-continued
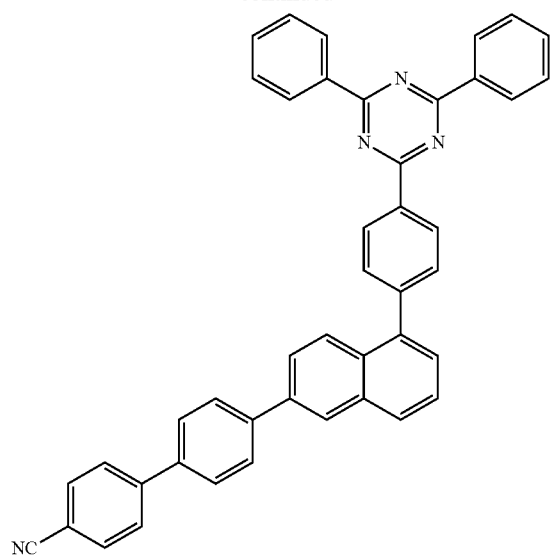
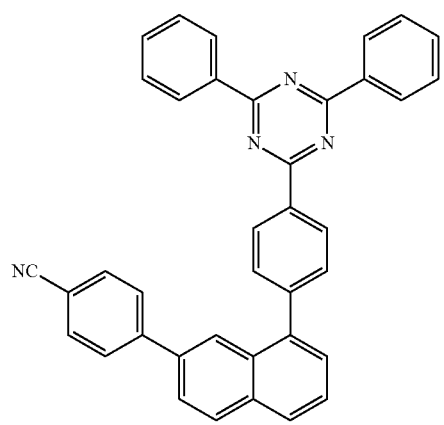
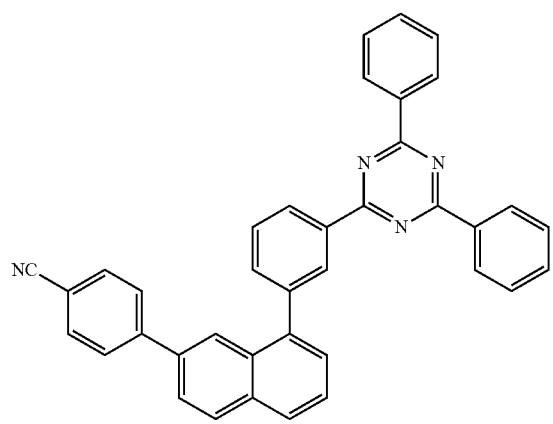
202
-continued
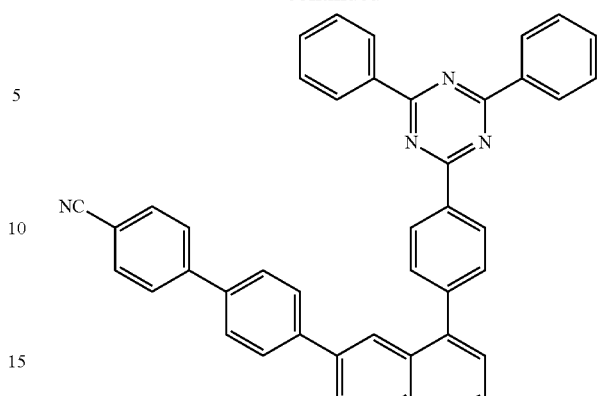
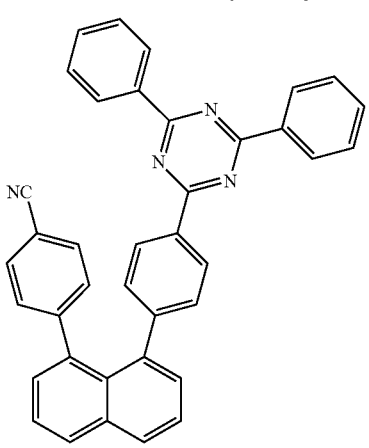
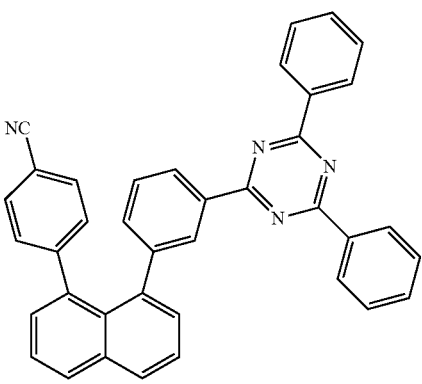
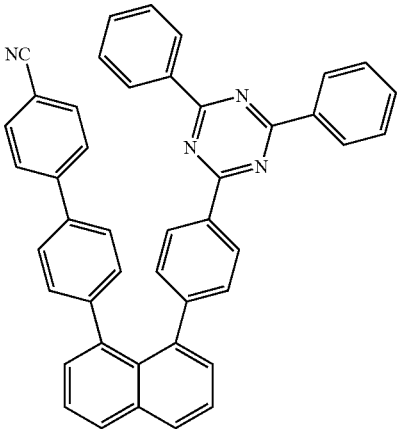

203
-continued
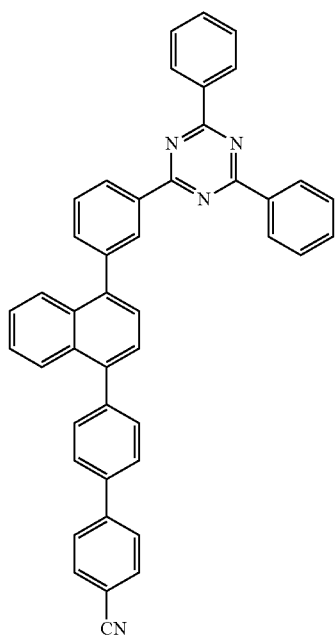
204
-continued
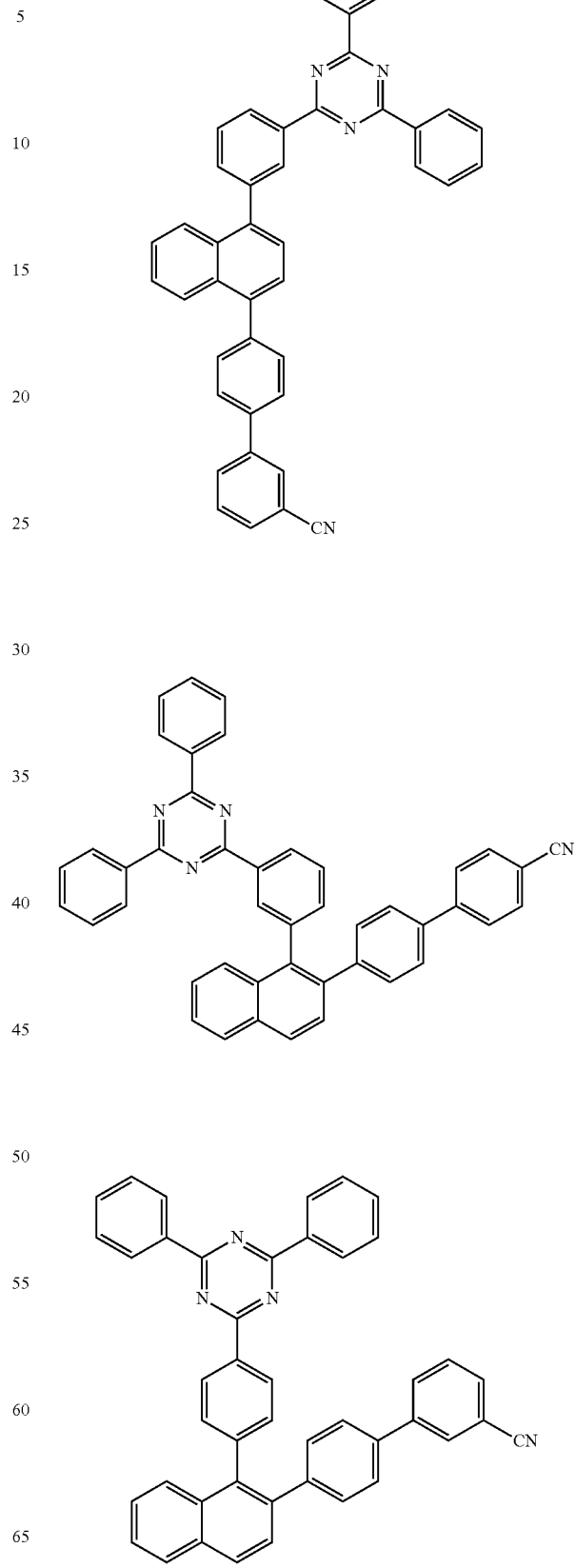
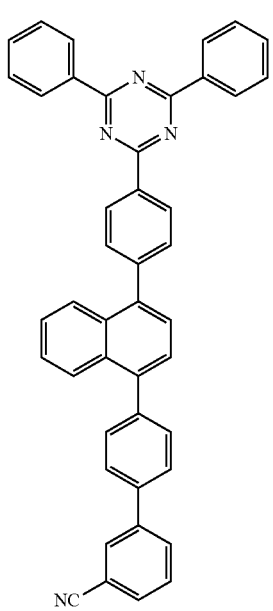

205
-continued
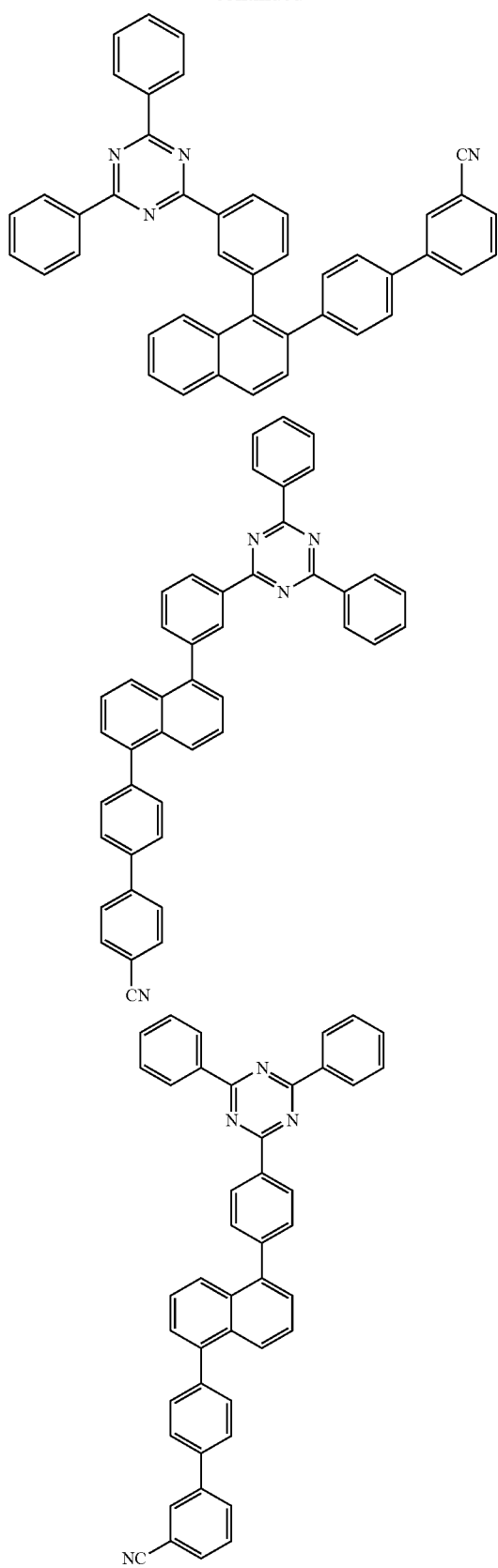
206
-continued
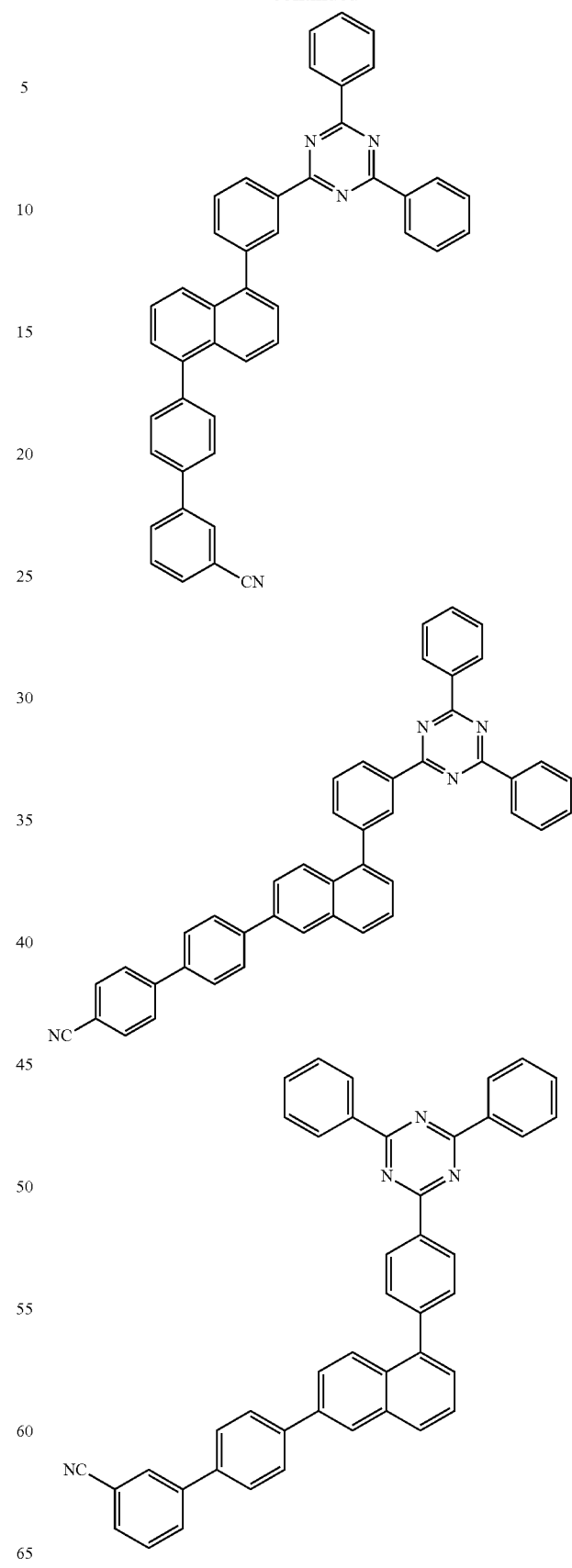

207
-continued
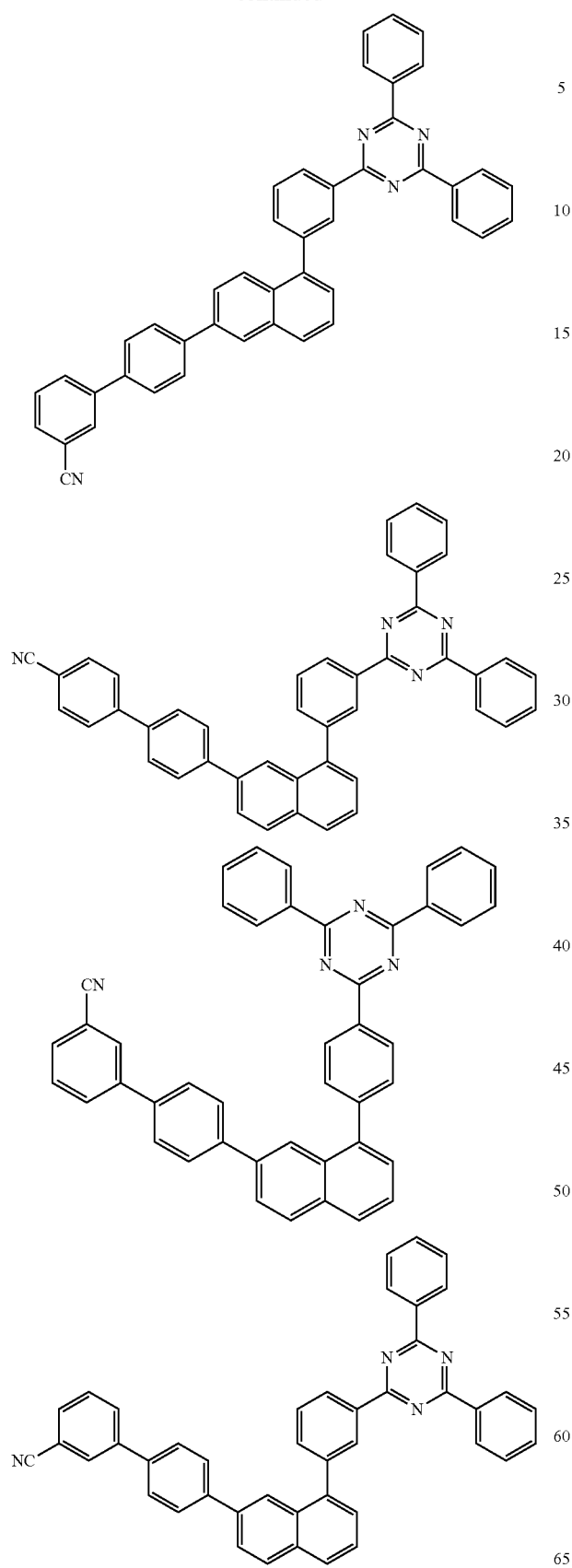
208
-continued
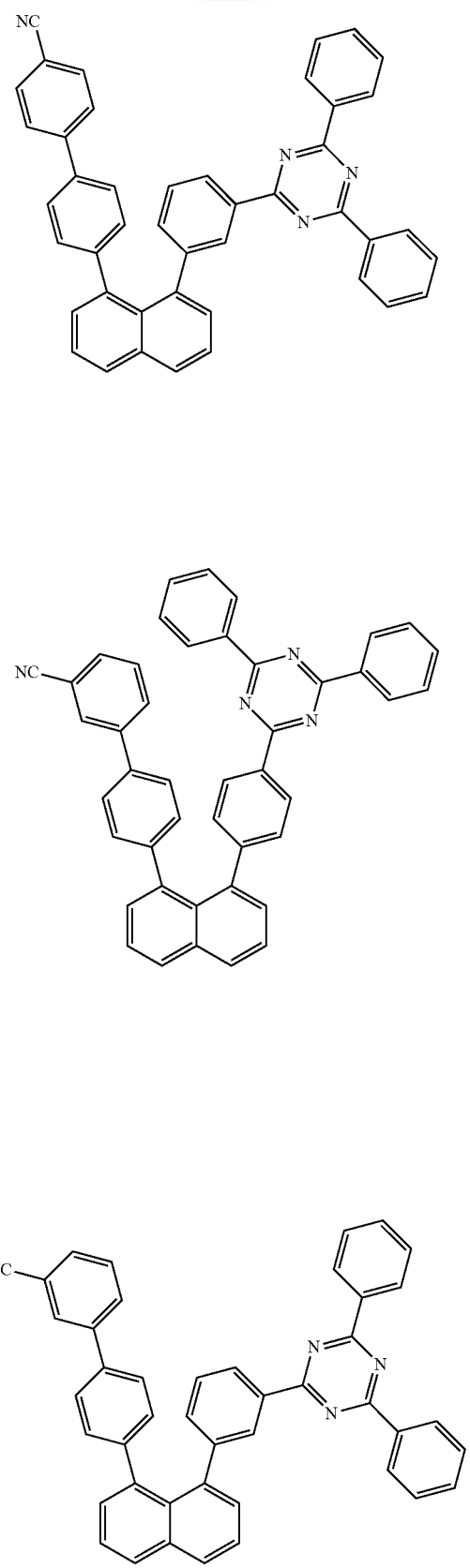

209
-continued
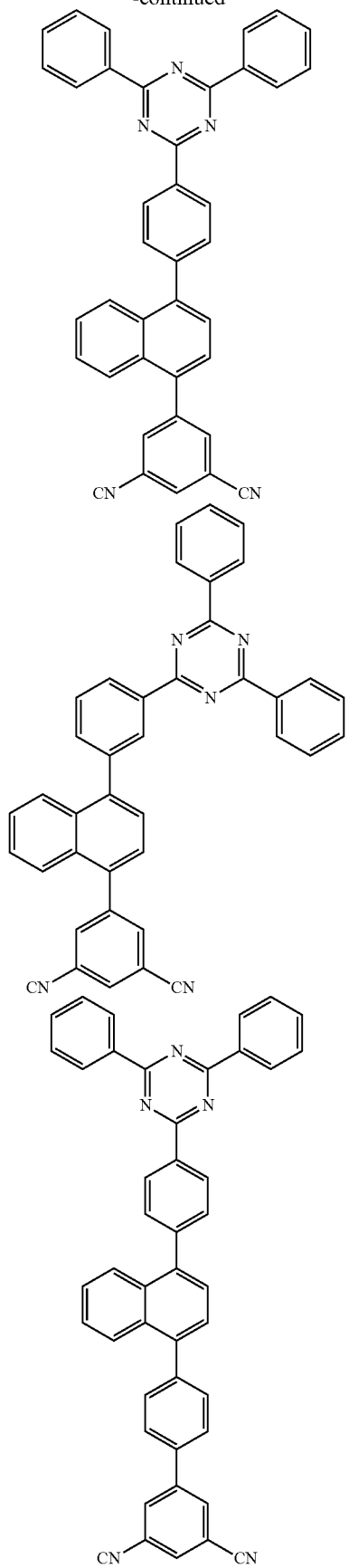
210
-continued
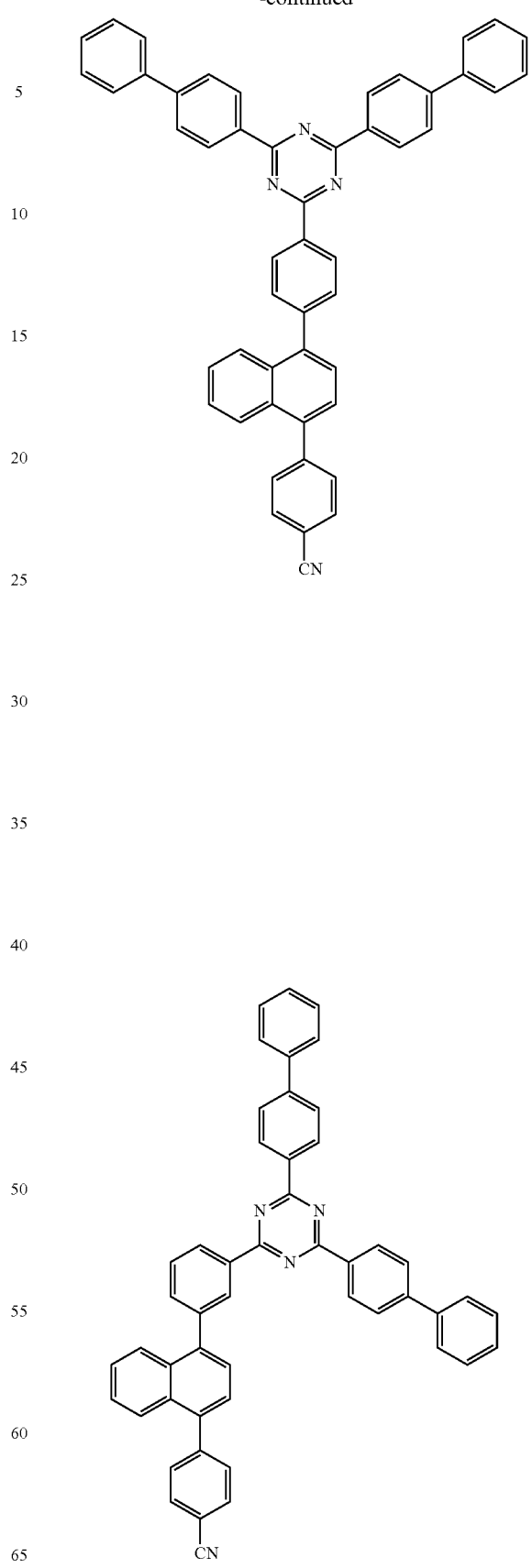

211
-continued
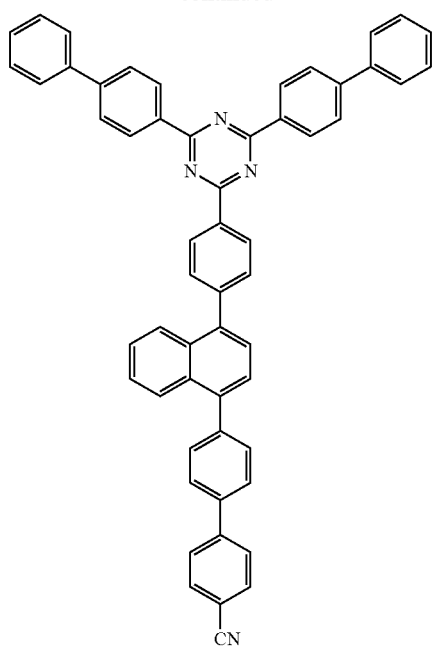
212
-continued
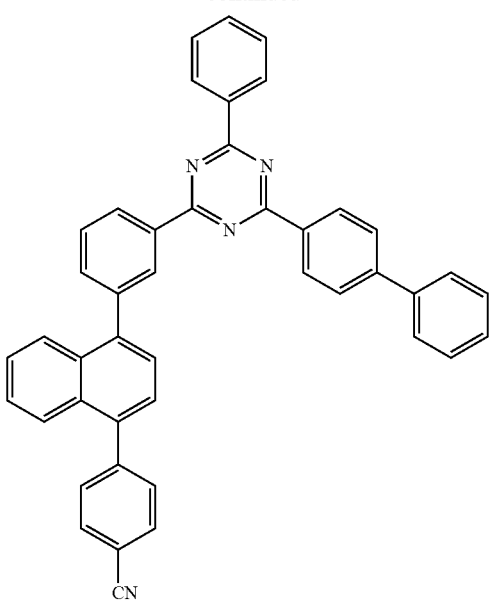
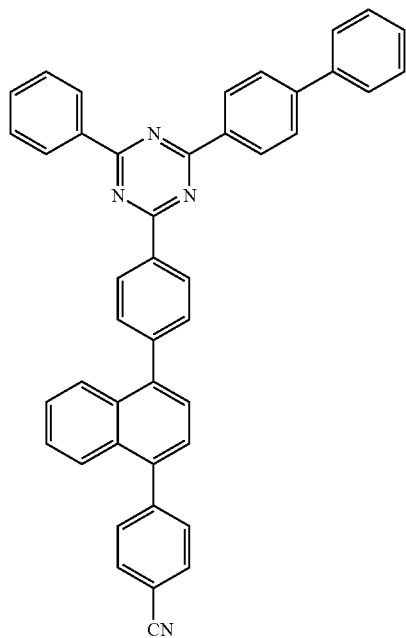
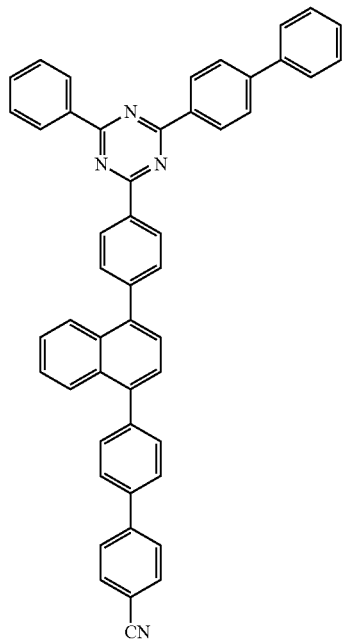

213
-continued
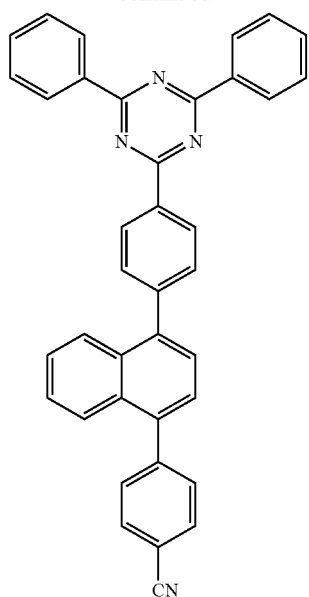
214
-continued
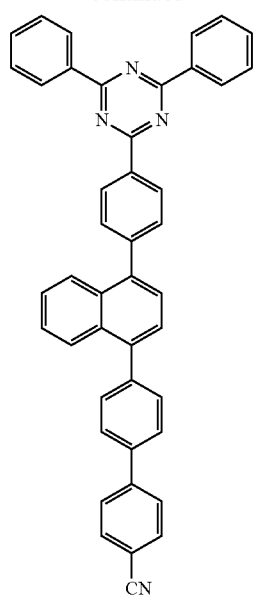
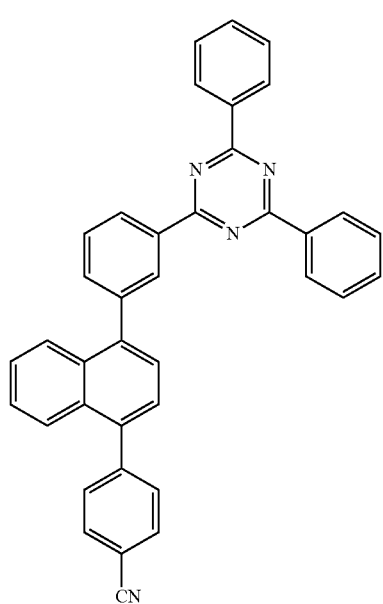
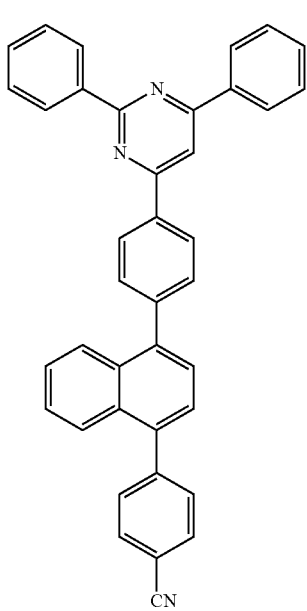

215
-continued
216
-continued
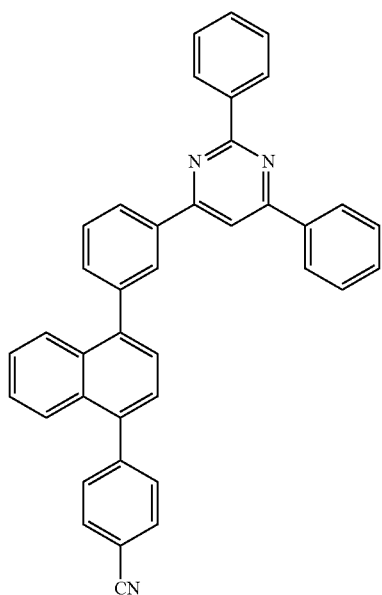
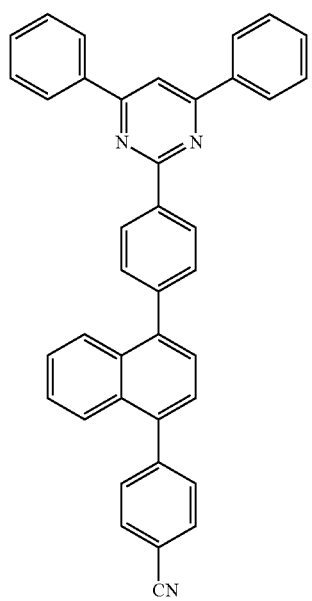

217
-continued
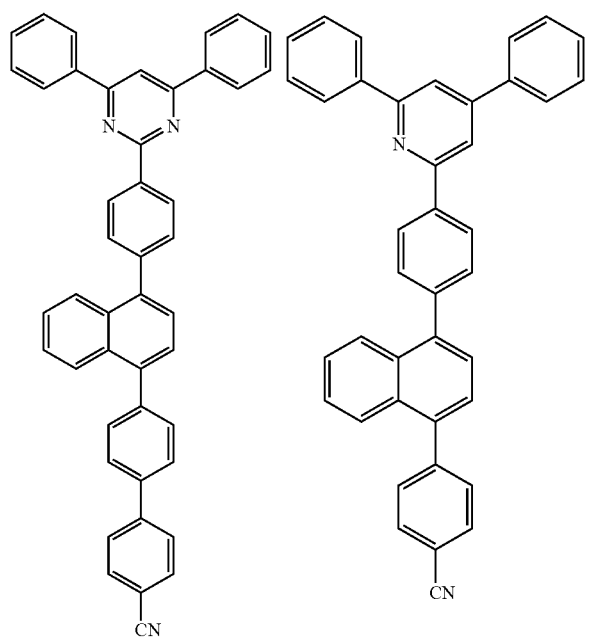
218
-continued
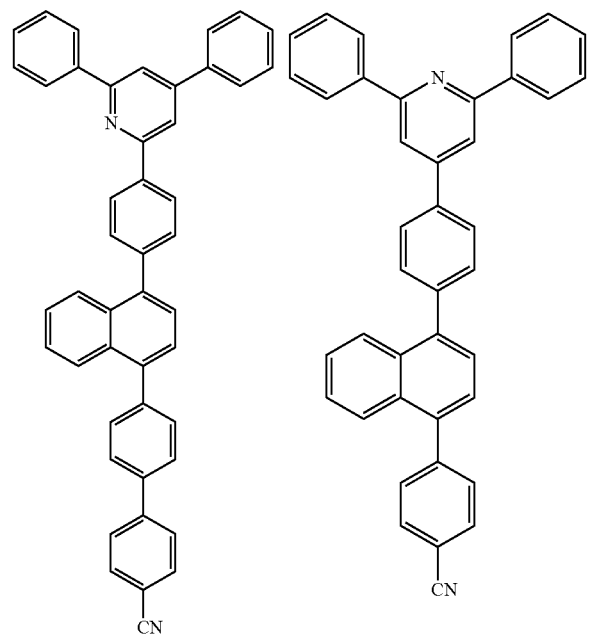
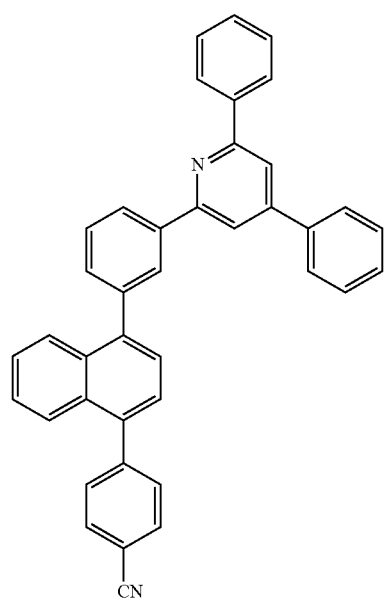
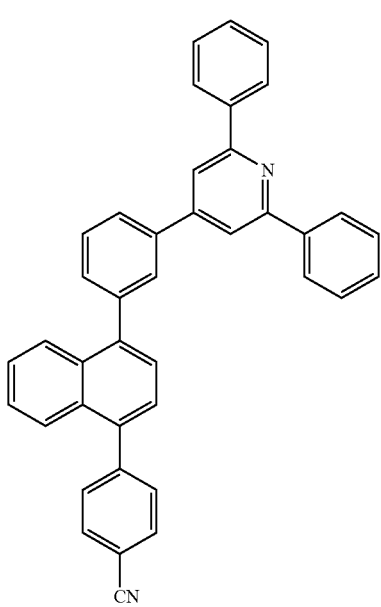

219
-continued
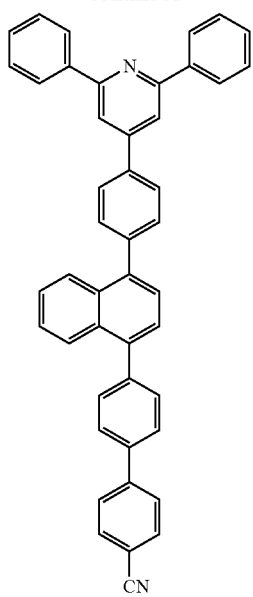
220
-continued
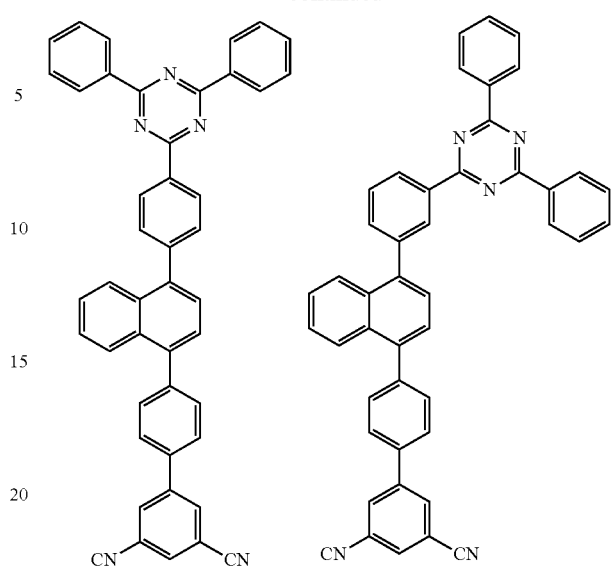
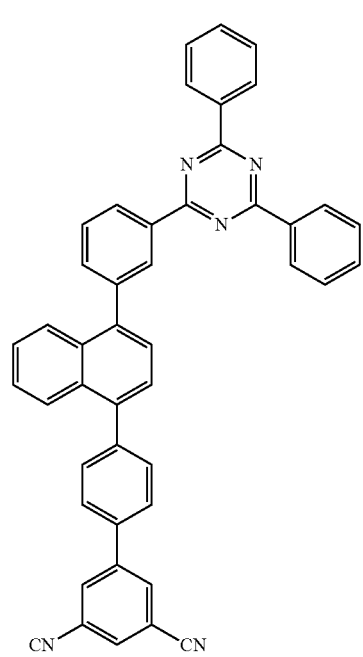
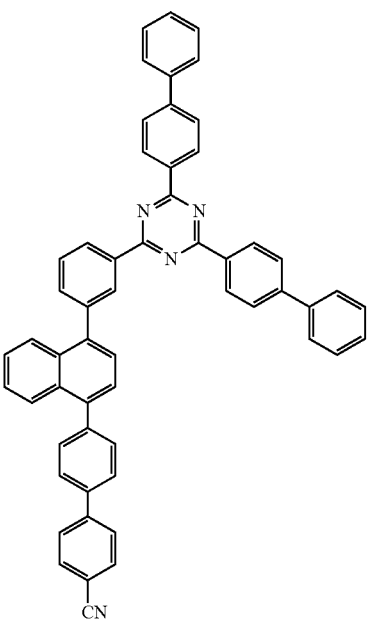

221
-continued
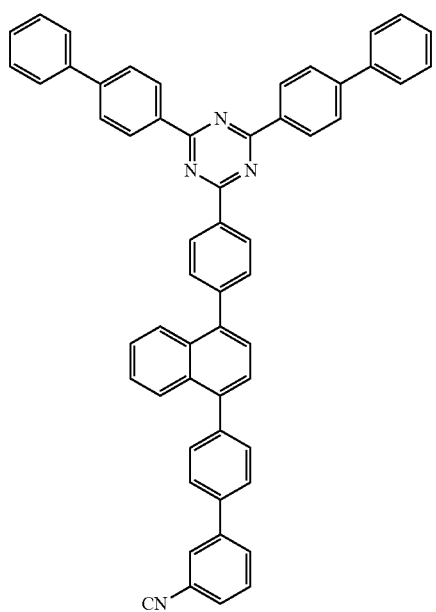
222
-continued
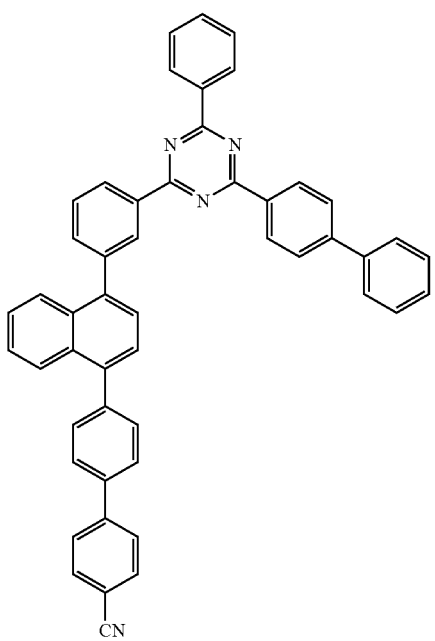
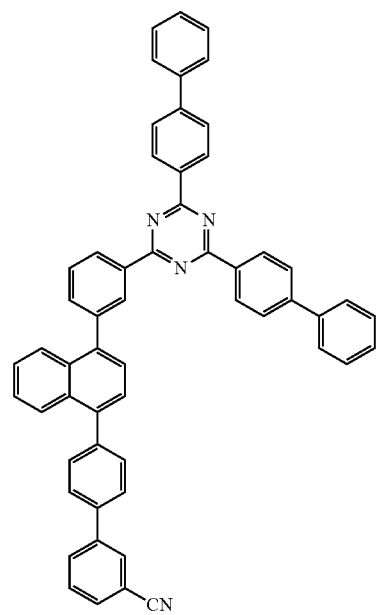
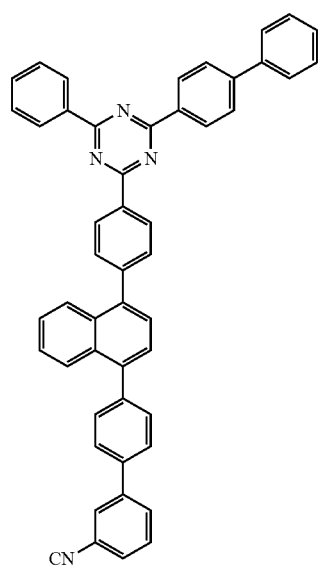

223
-continued
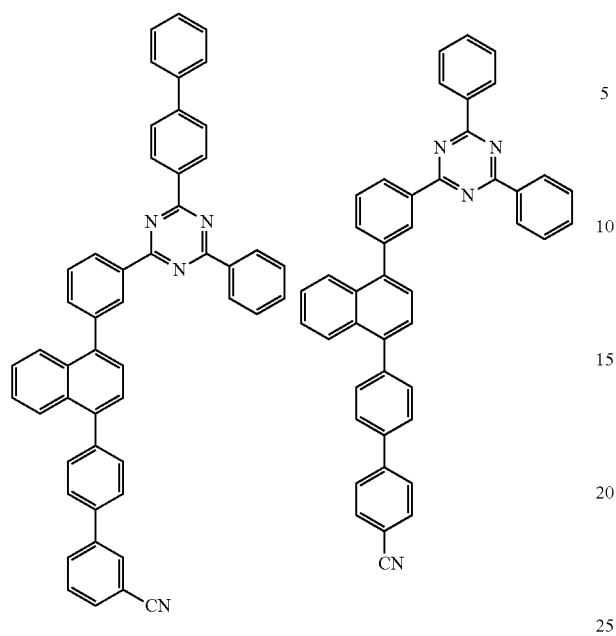
224
-continued
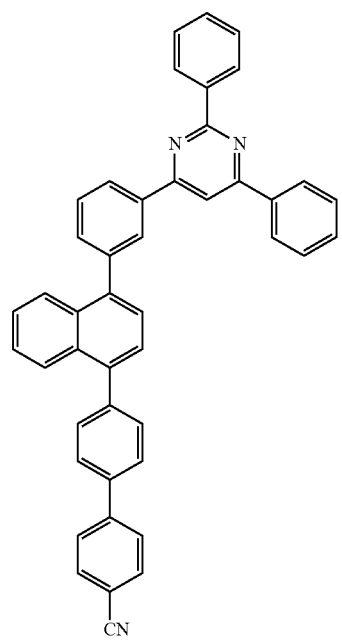
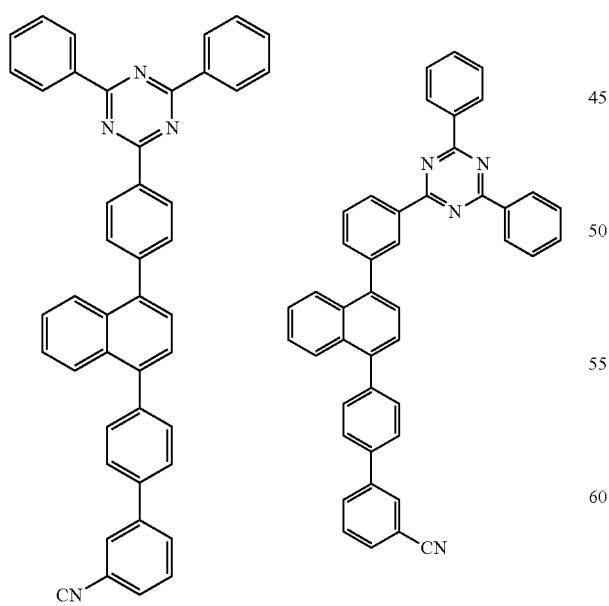
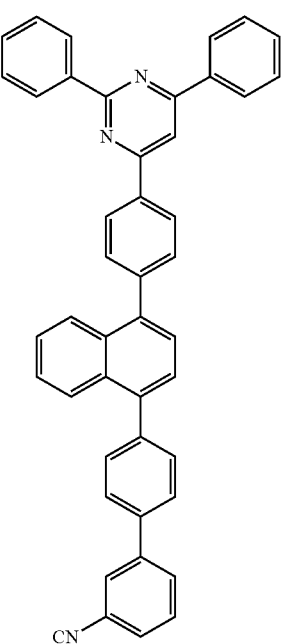

225
-continued
226
-continued
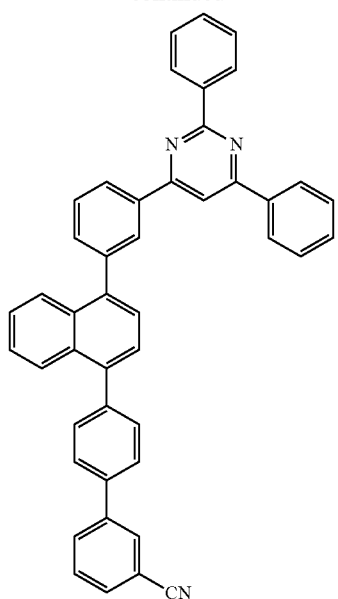
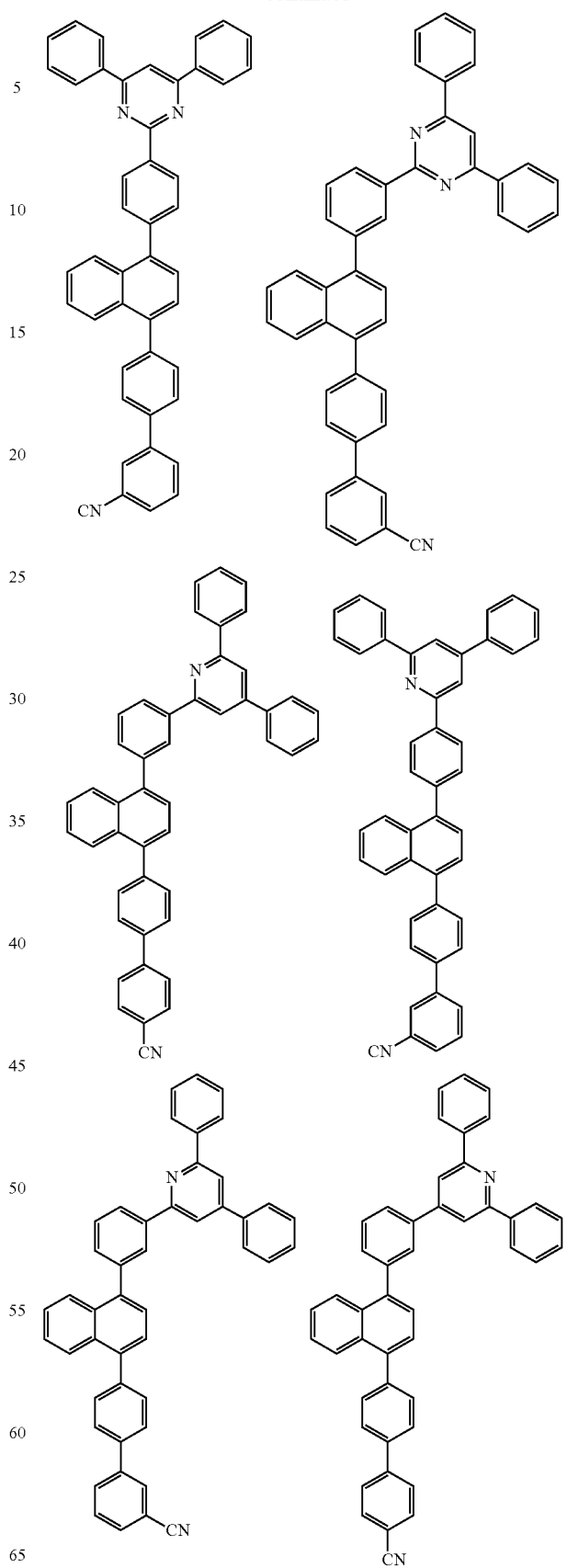

-continued

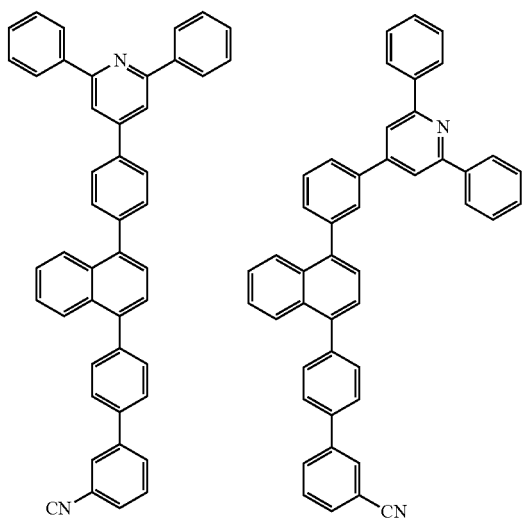

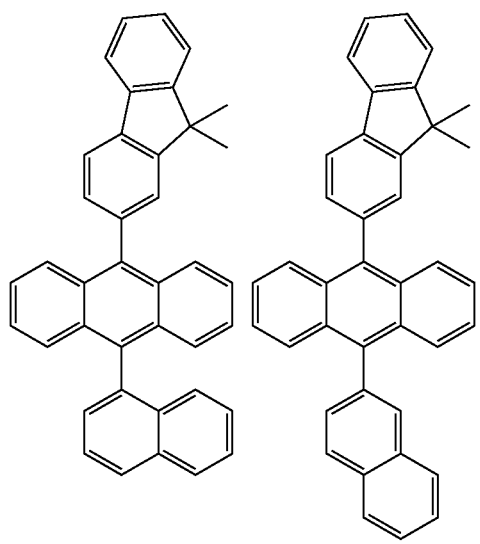

9. The organic light emitting device of claim 1, wherein the light emitting layer comprises a compound of Formula 4:

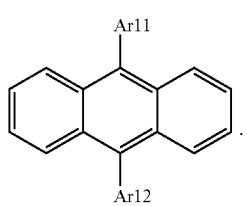

Formula 4 wherein in Formula 4:

Ar11 and Ar12 are the same as or different from each other, and are each independently a substituted or unsubstituted aryl group.

10. The organic light emitting device of claim 9, wherein the compound of Formula 4 is selected from among the following compounds:

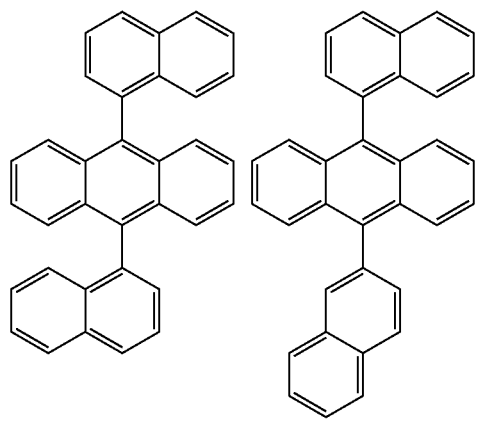

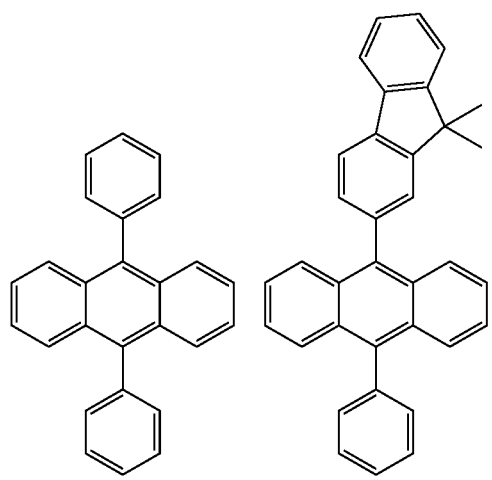

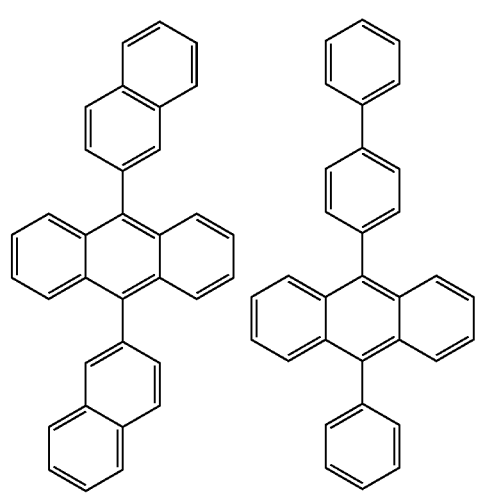

229
-continued
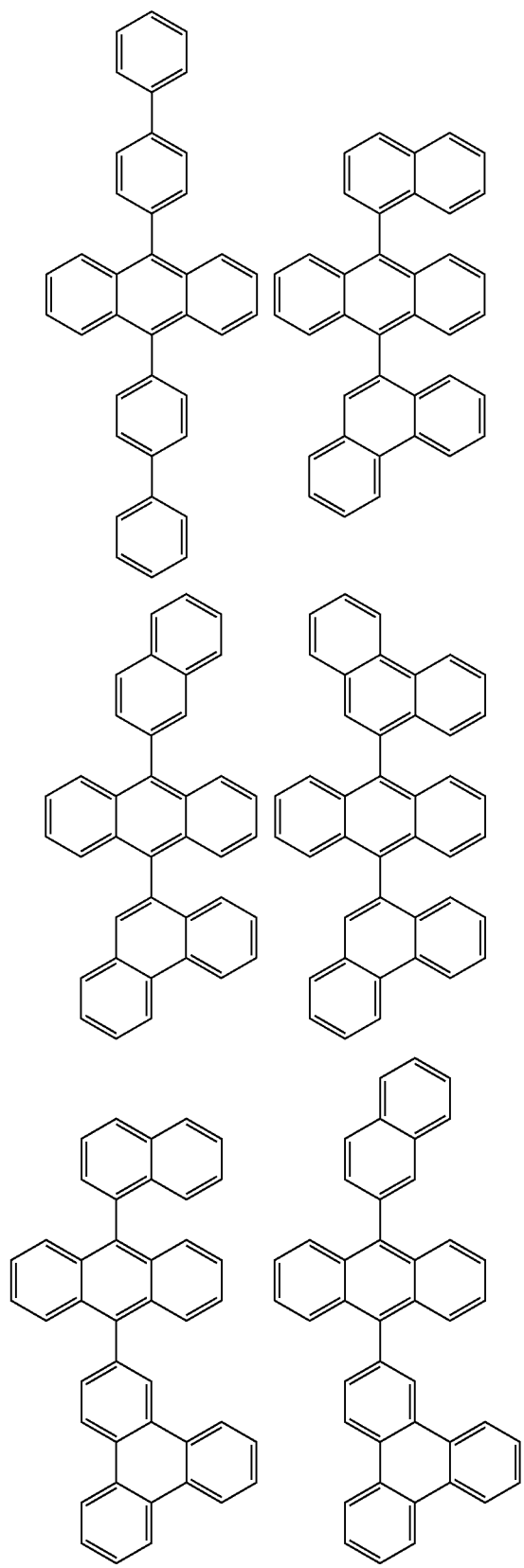
230
-continued
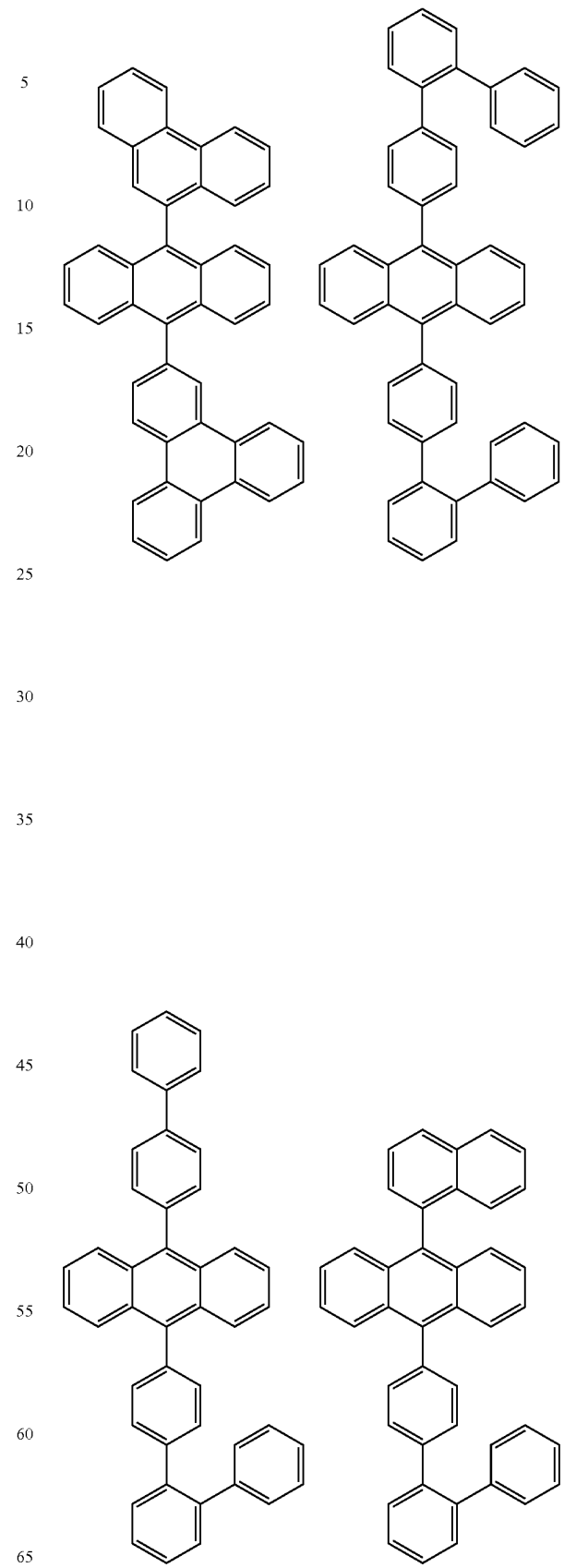

231
-continued
232
-continued
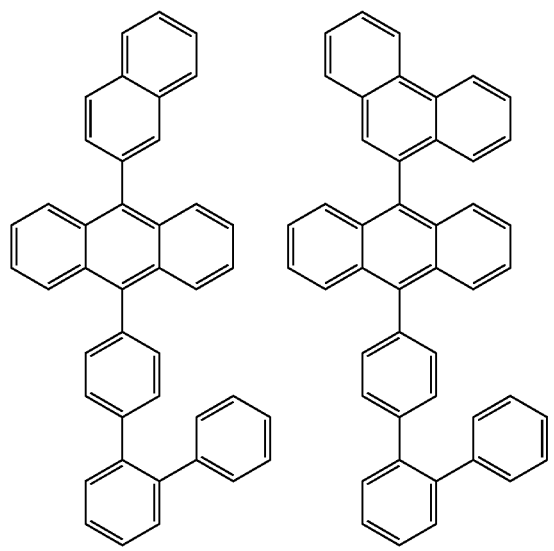
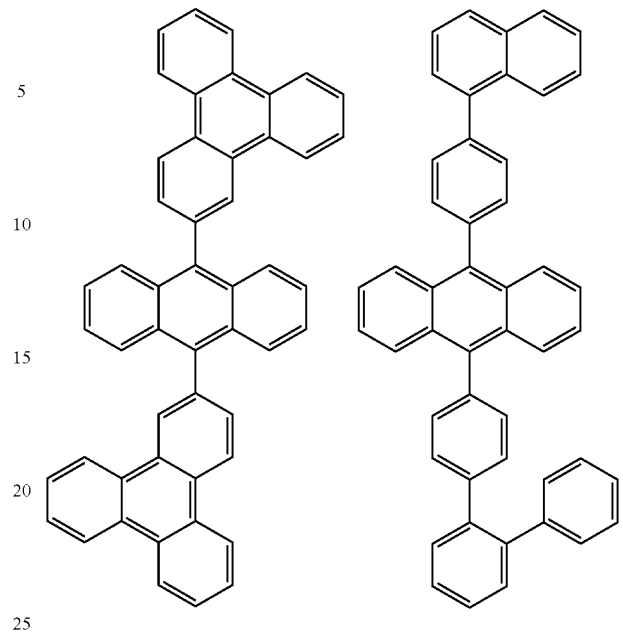
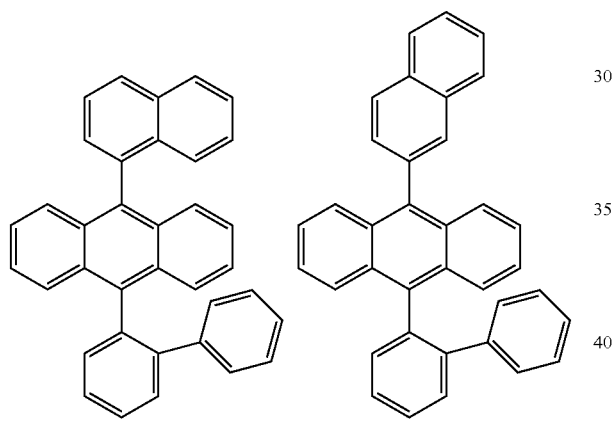
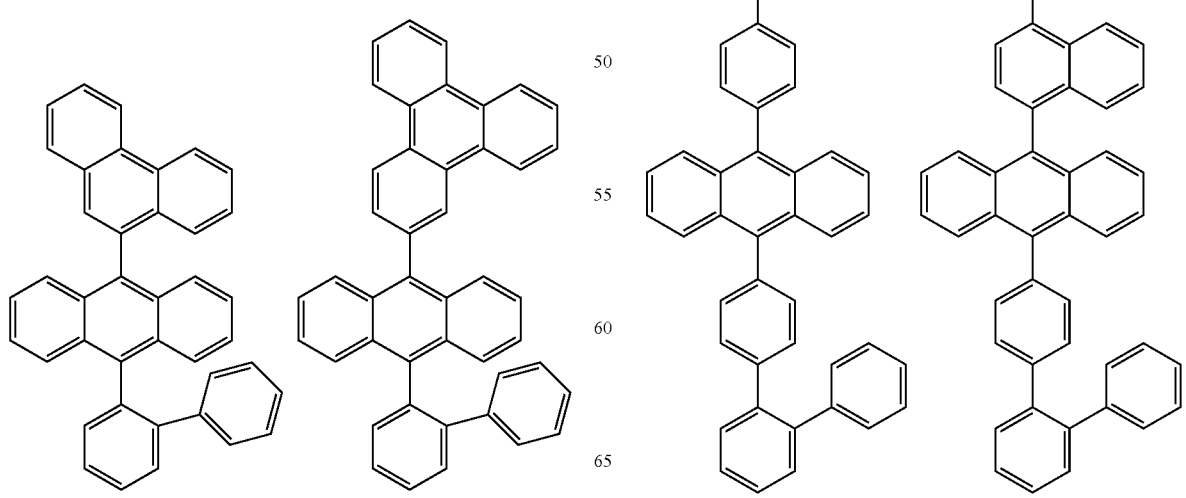

233
-continued
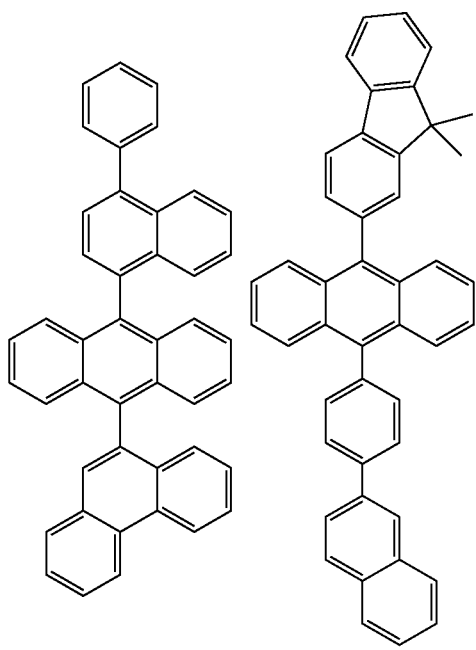
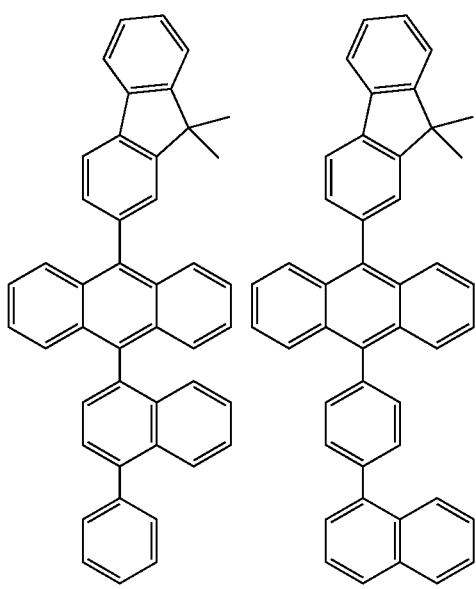
234
-continued
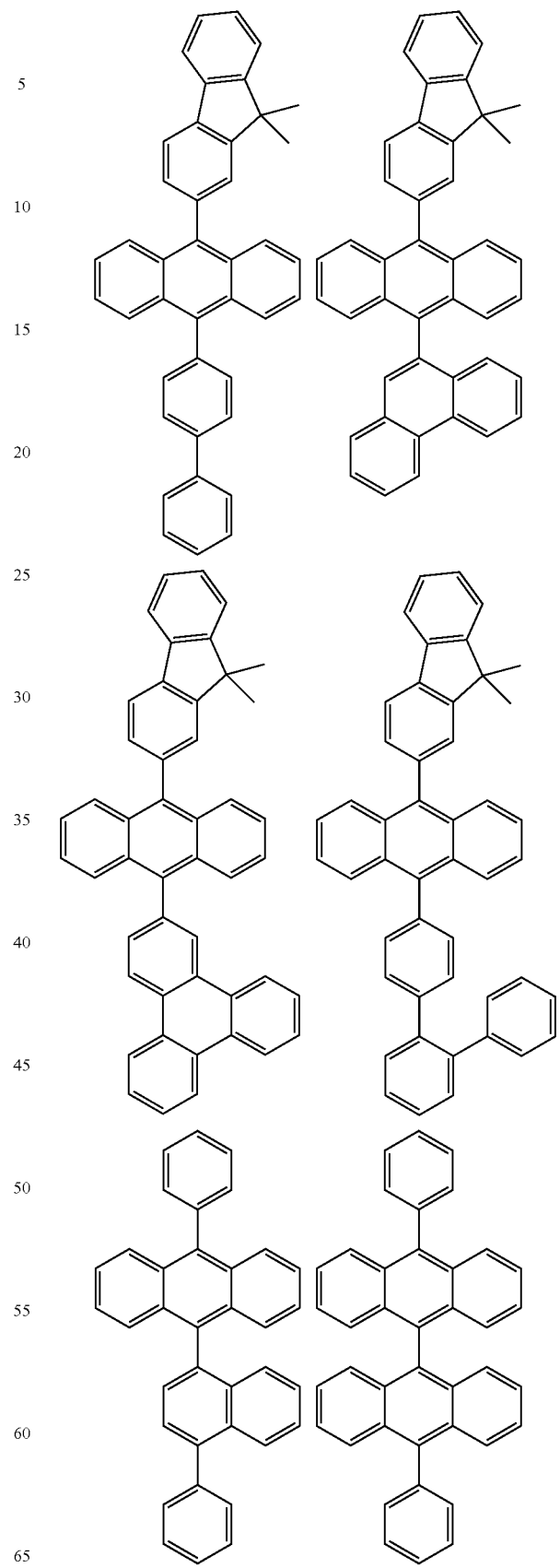

235
-continued
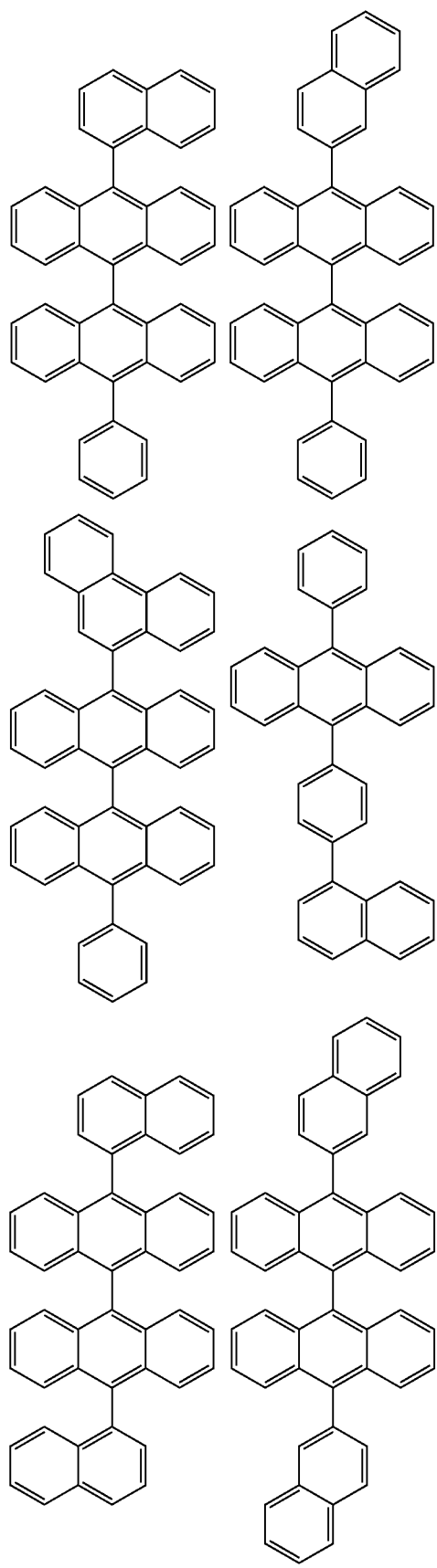
236
-continued
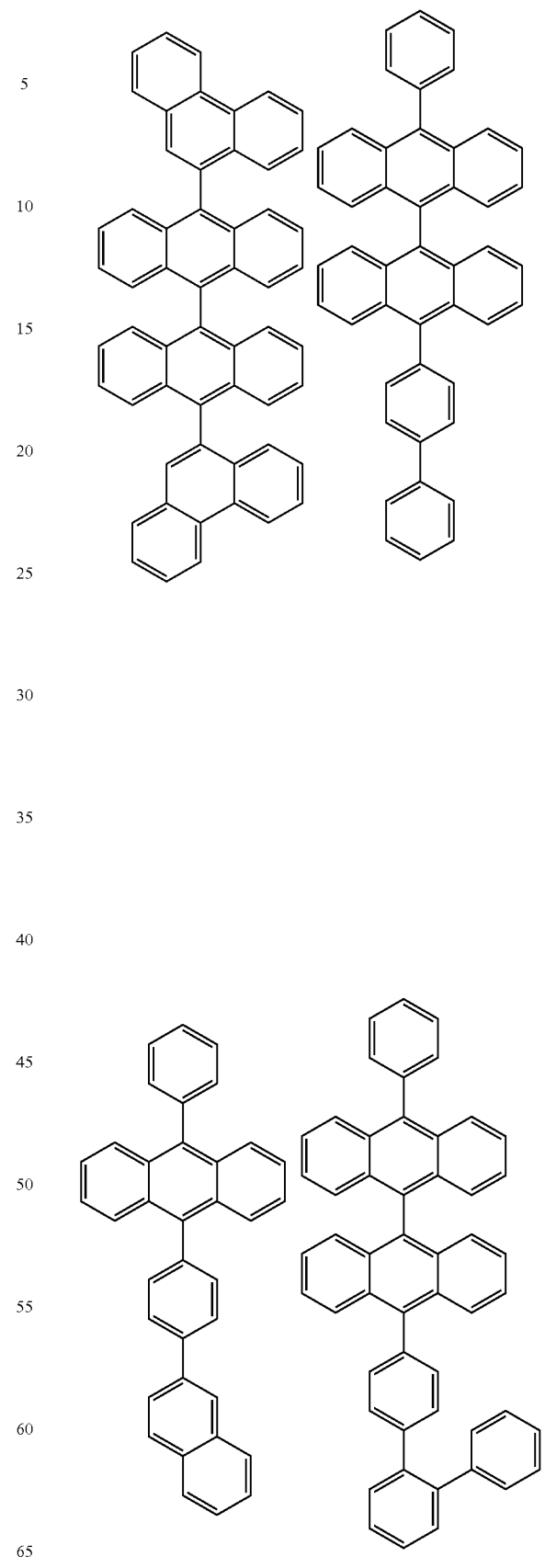

237
-continued
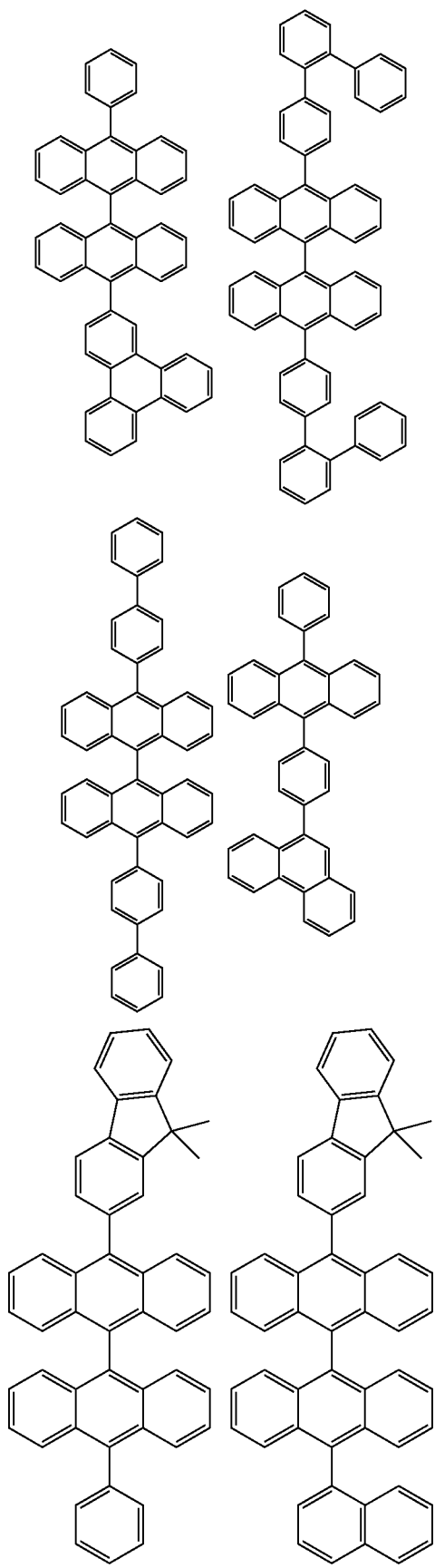
238
-continued
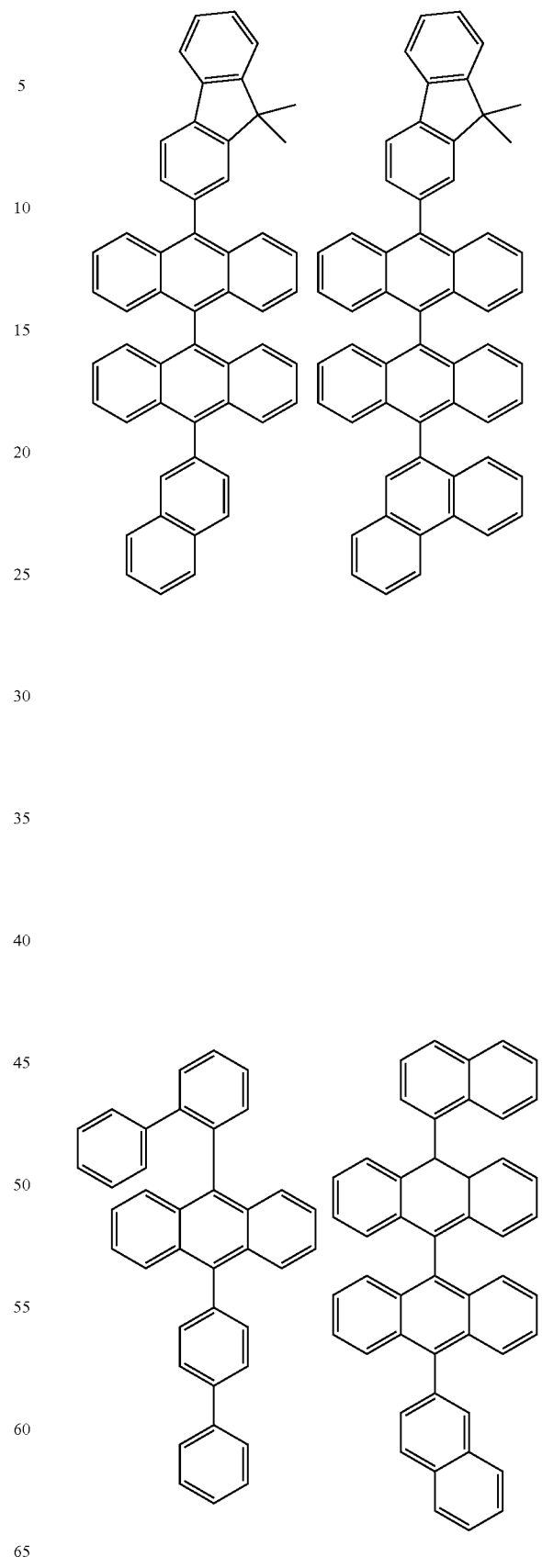

239
-continued
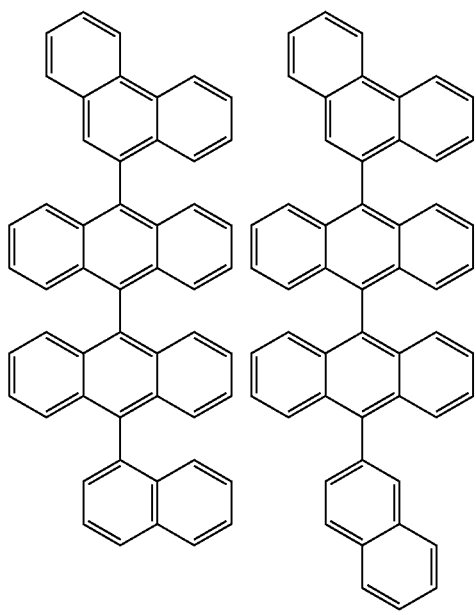
240
-continued
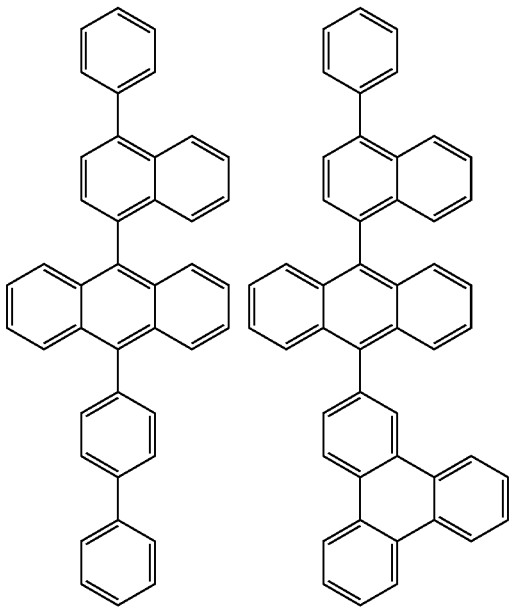
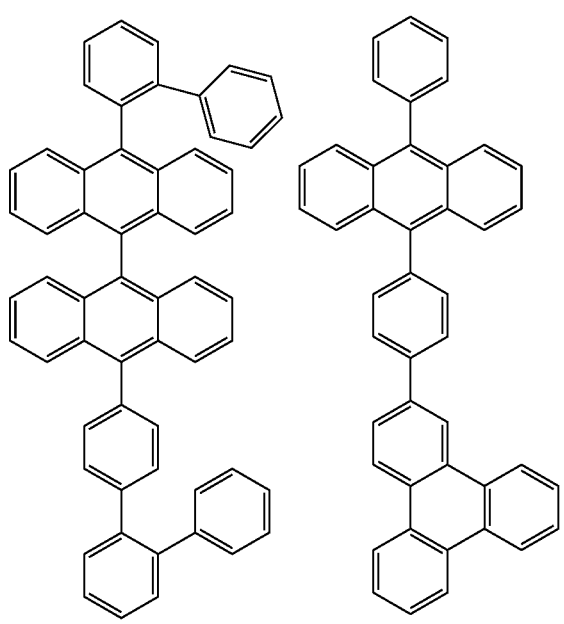
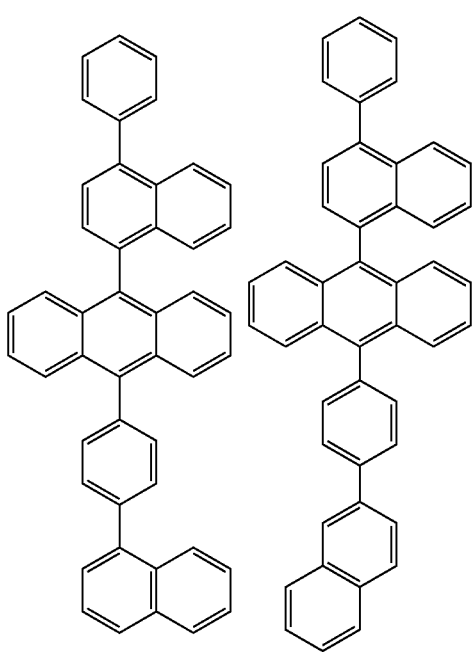

-continued
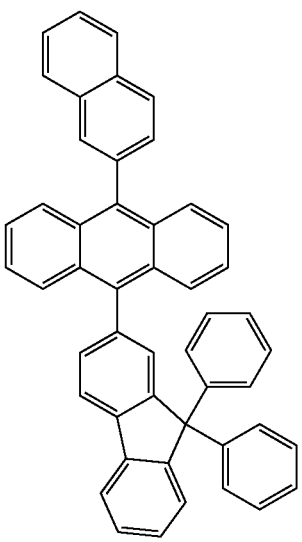
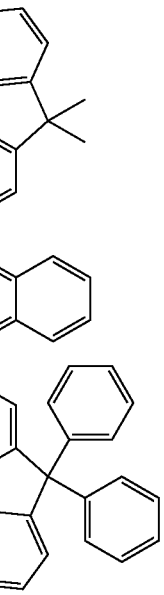
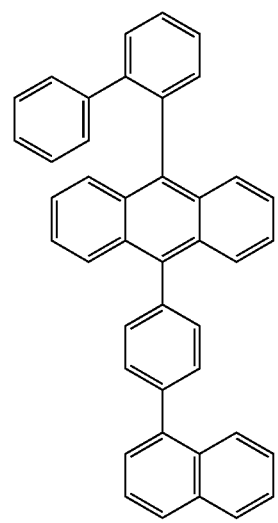
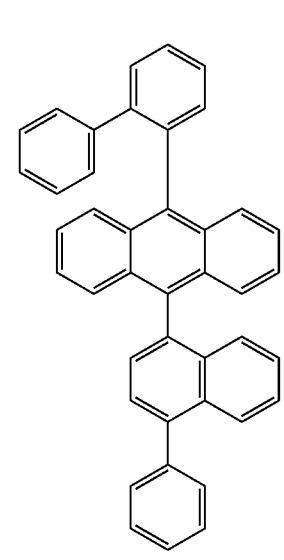
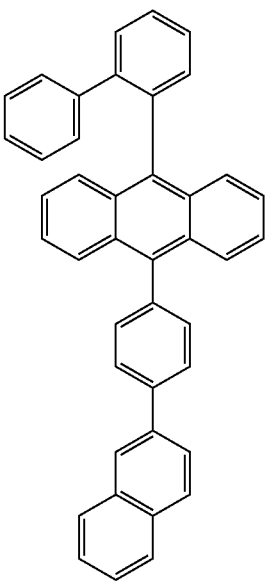
-continued
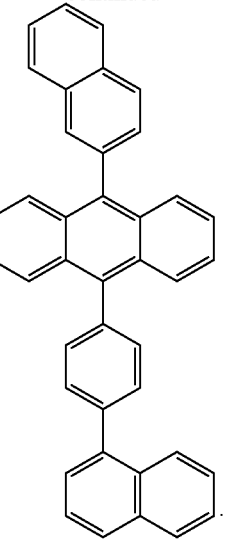
11. The organic light emitting device of claim 1, wherein the light emitting layer comprises a compound of Formula 5:
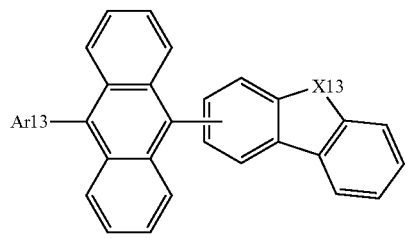
Formula 5
wherein in Formula 5:
X13 is O or S; and
Ar13 is a substituted or unsubstituted aryl group.
12. The organic light emitting device of claim 11, wherein the compound of Formula 5 is selected from among the following compounds:
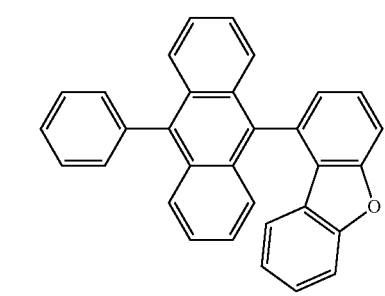
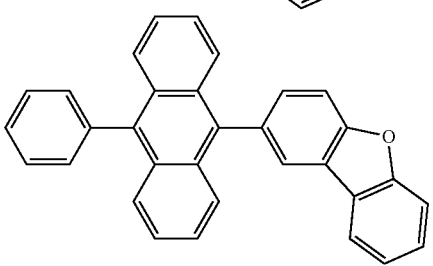

243
-continued
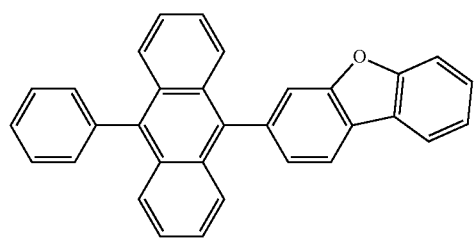
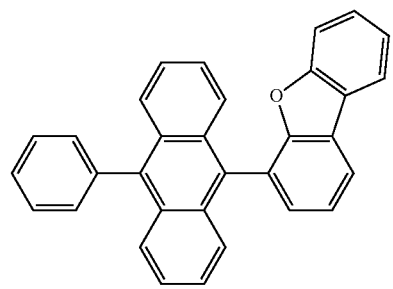
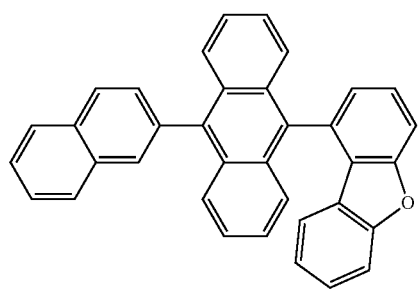
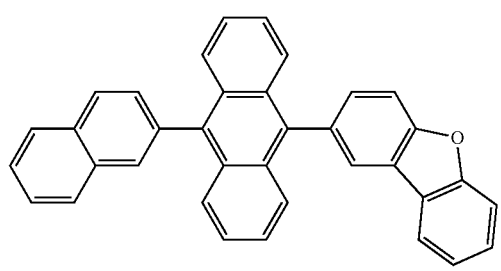
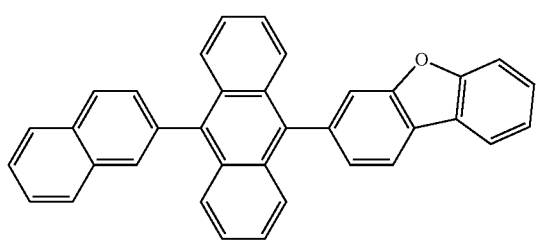
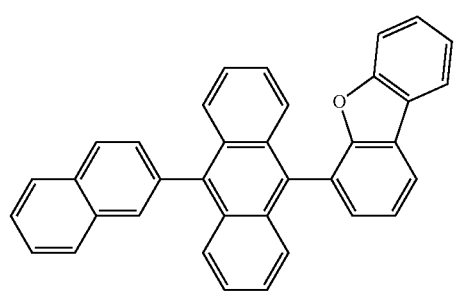
244
-continued
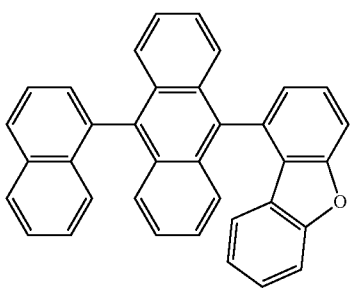
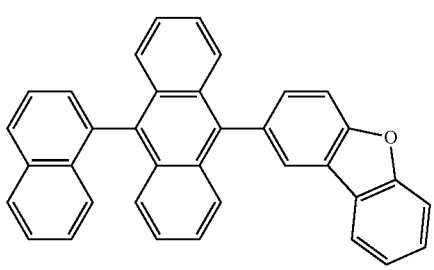
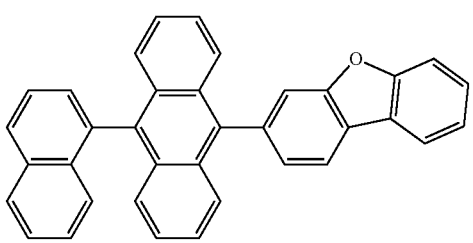
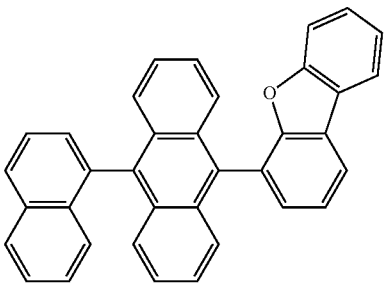
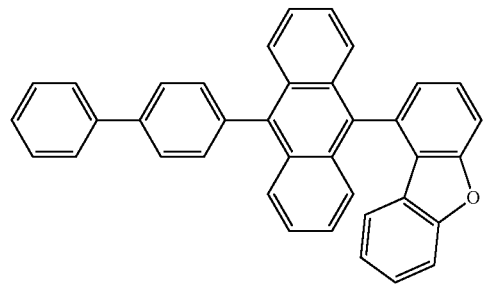
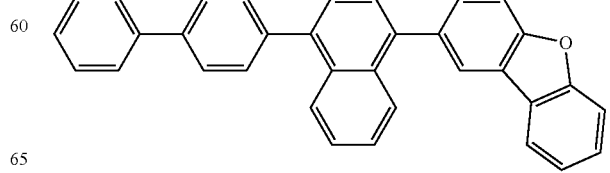

-continued
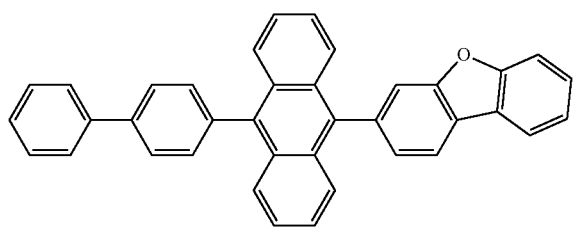
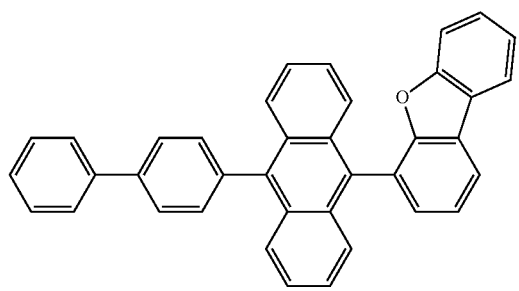
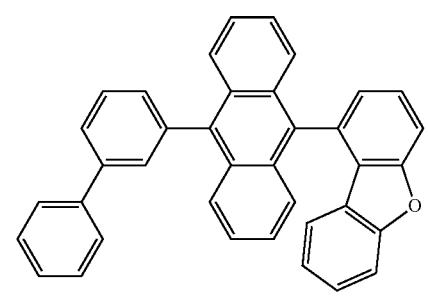
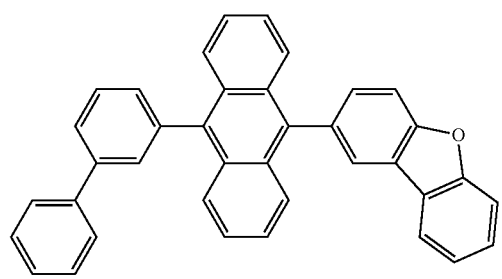
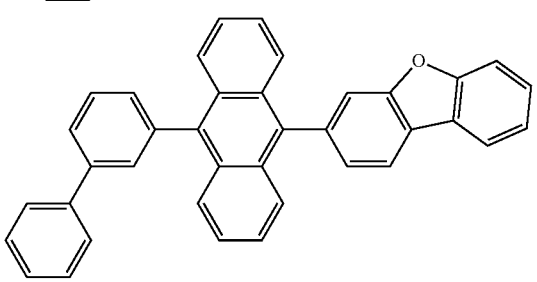
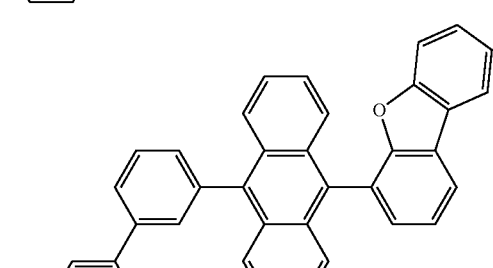
-continued
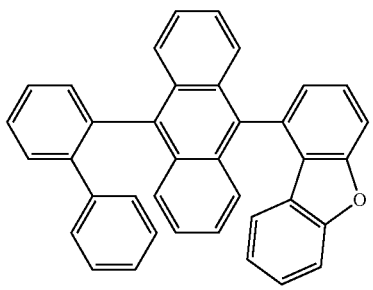
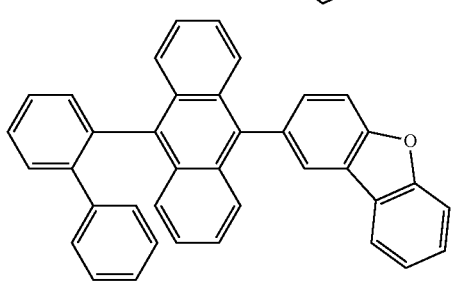
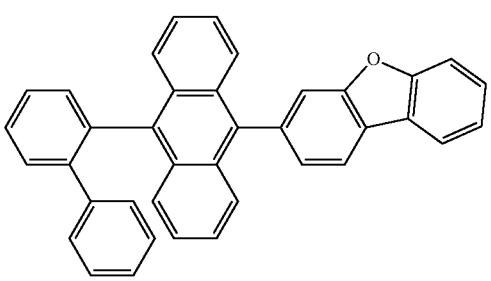
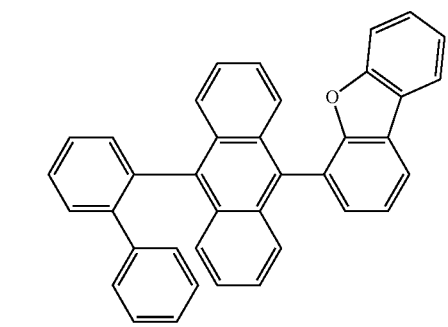
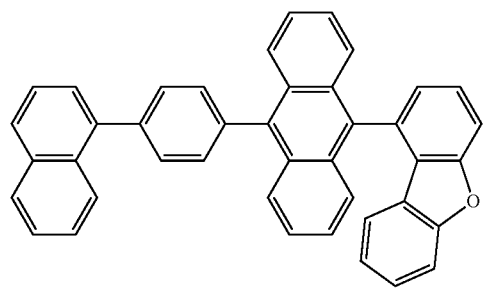
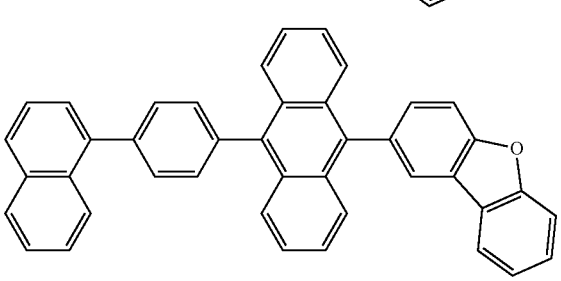

247
-continued
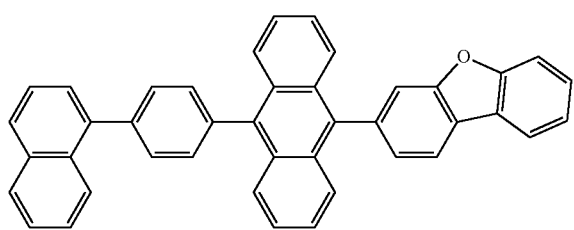
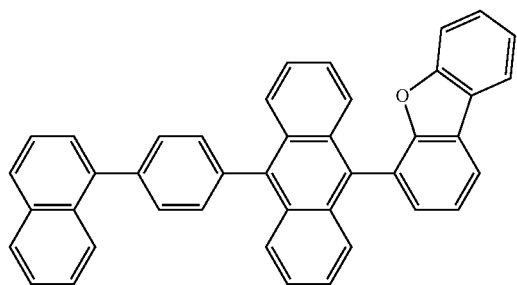
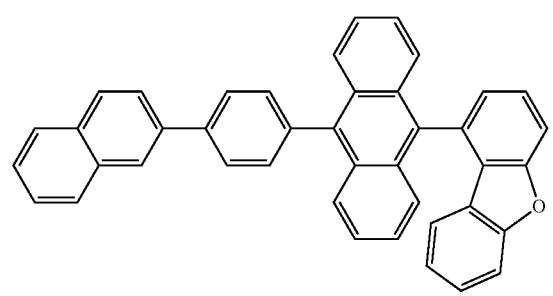
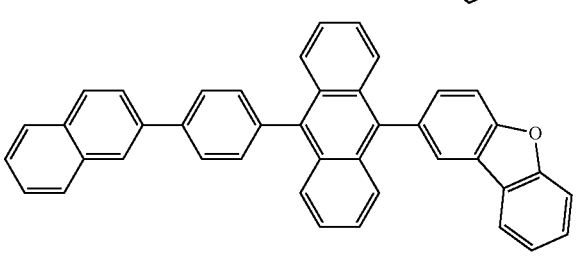
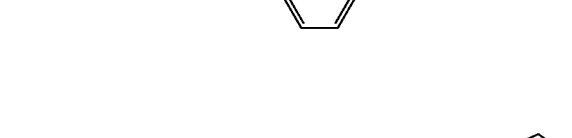
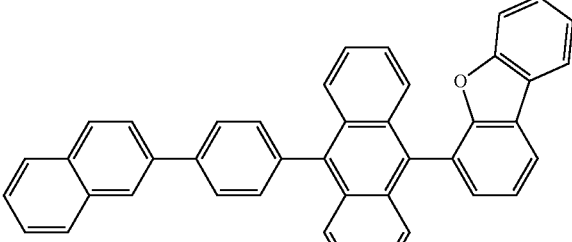
248
-continued
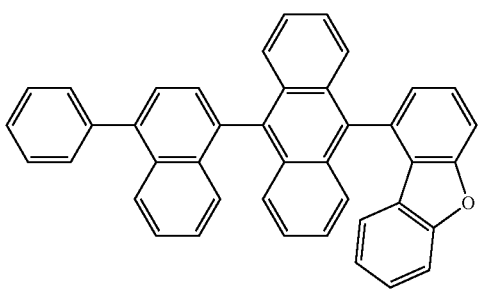
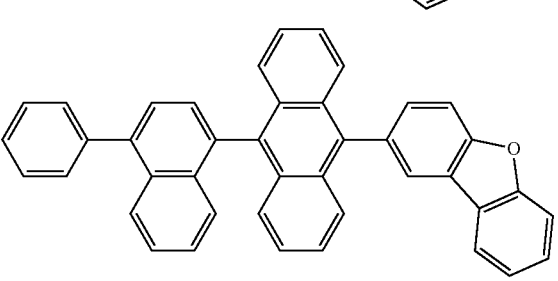
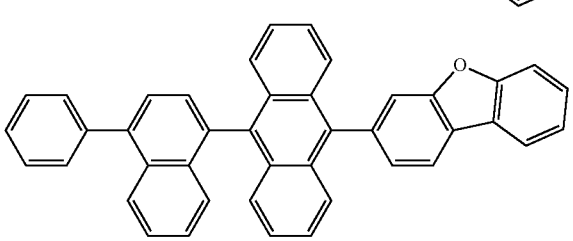
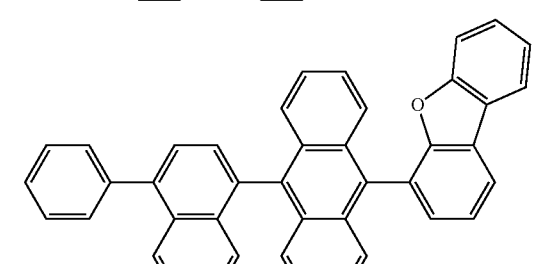
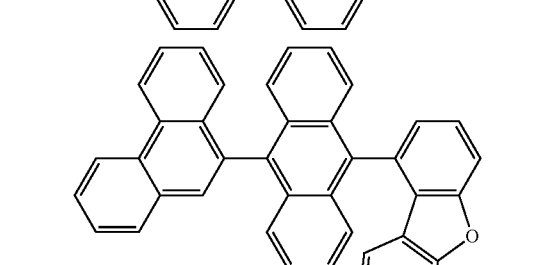
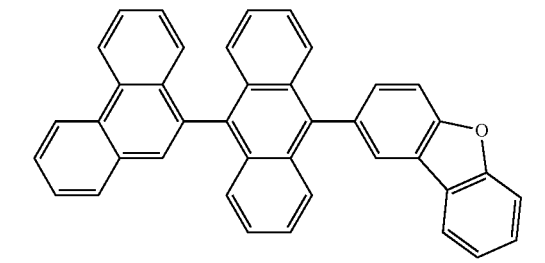

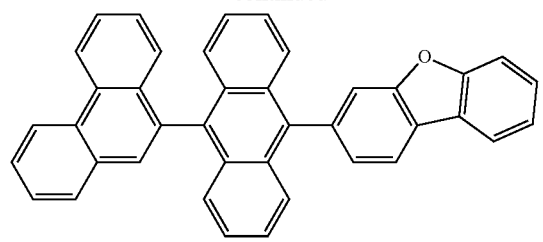
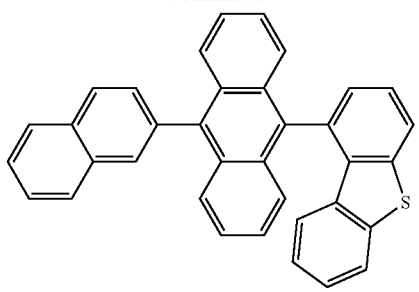
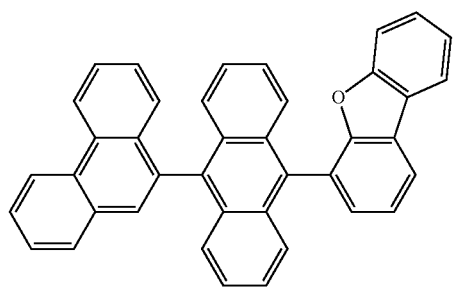
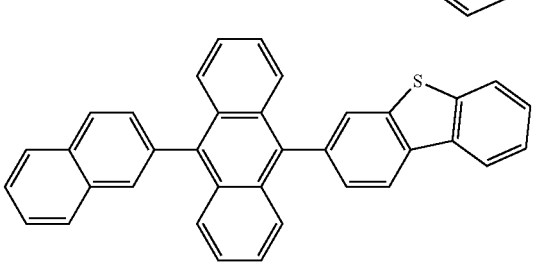
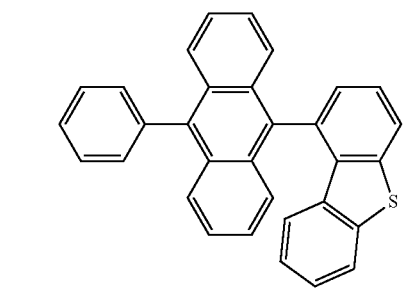
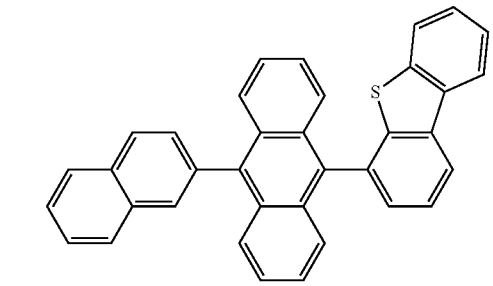
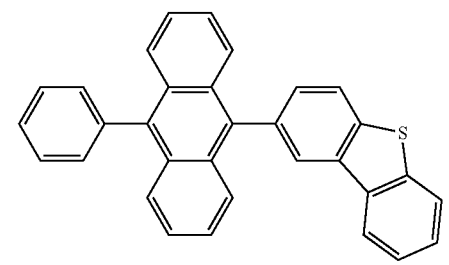
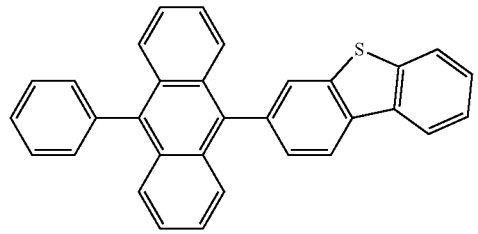
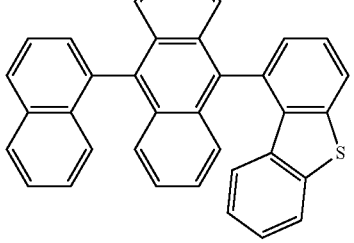
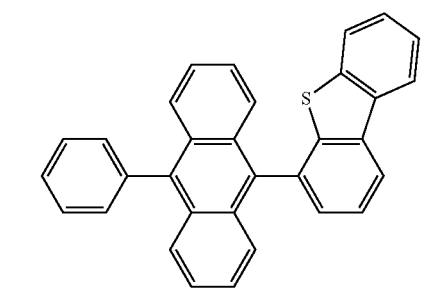
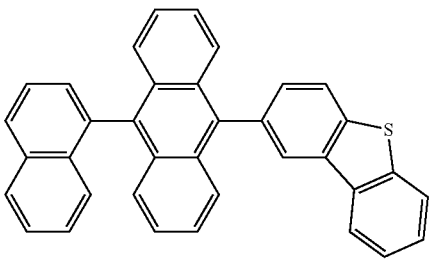

251
-continued
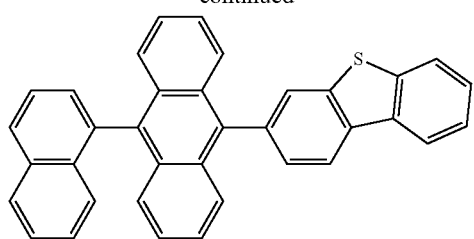
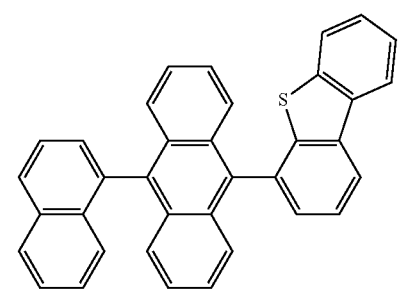
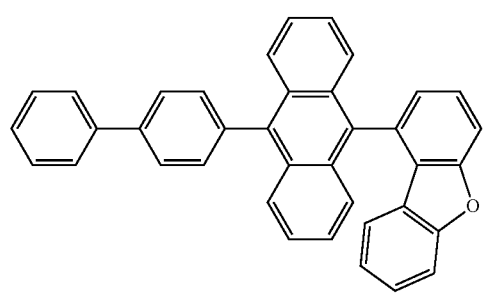
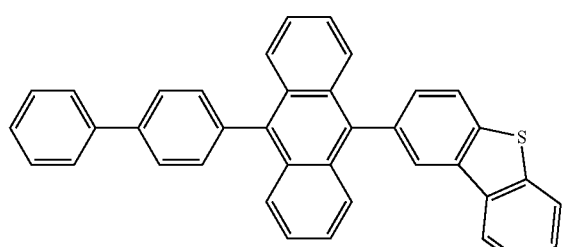
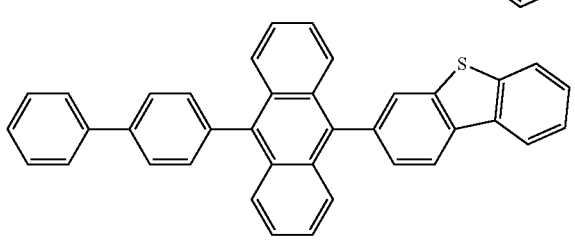
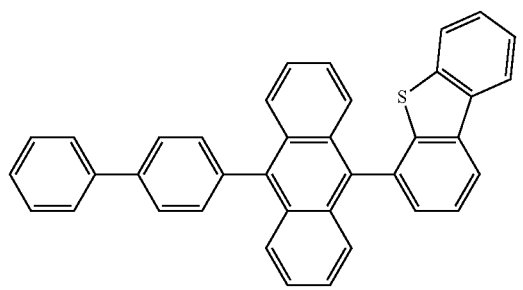
252
-continued
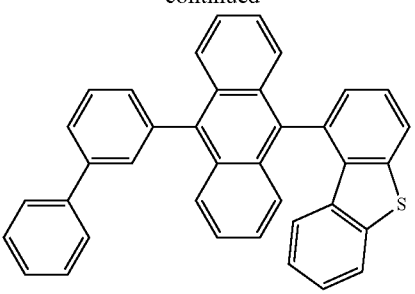
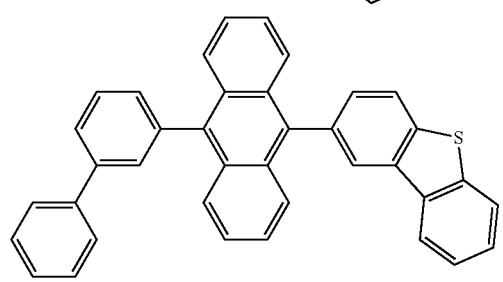
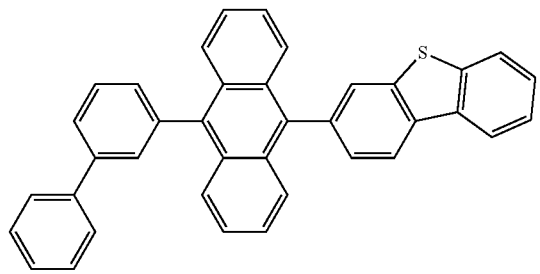
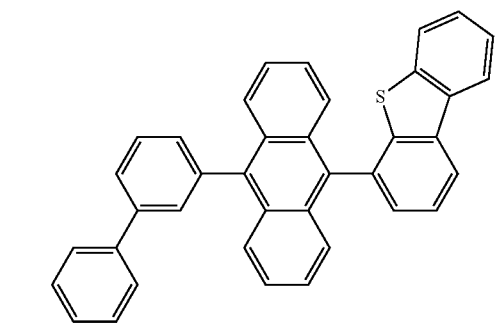
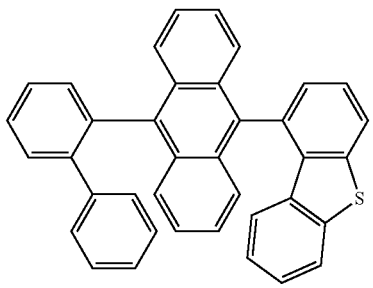
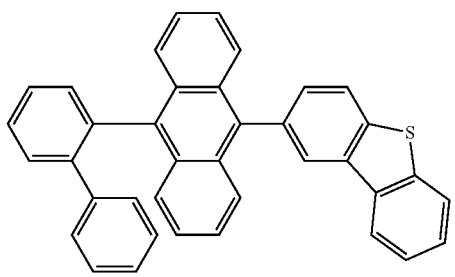

-continued
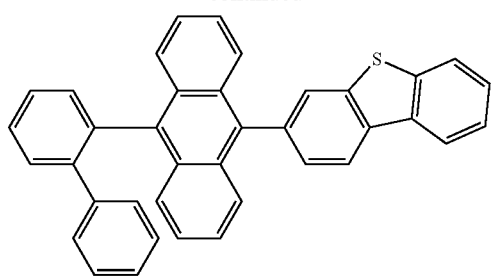
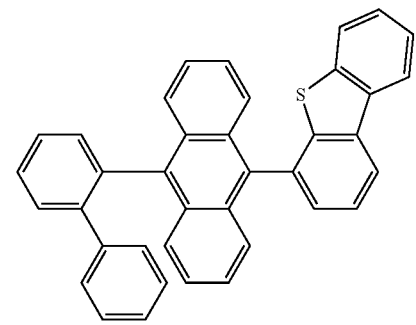
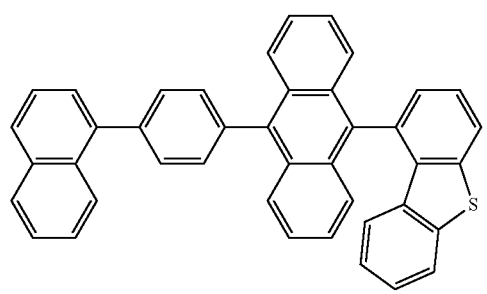
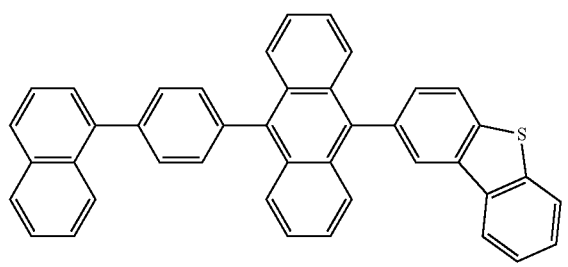
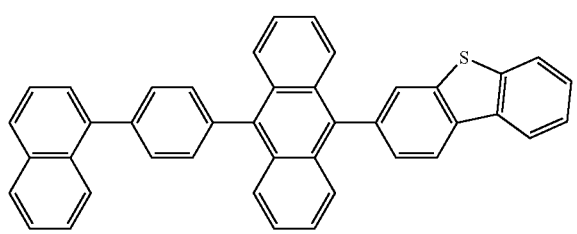
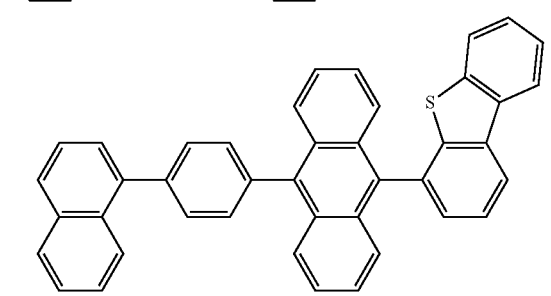
-continued
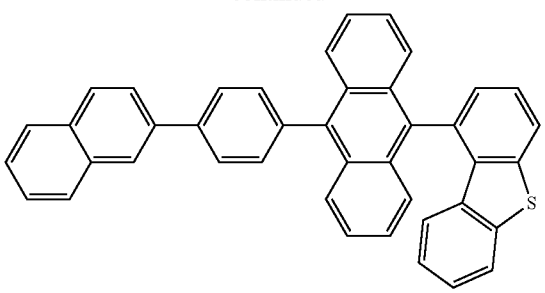
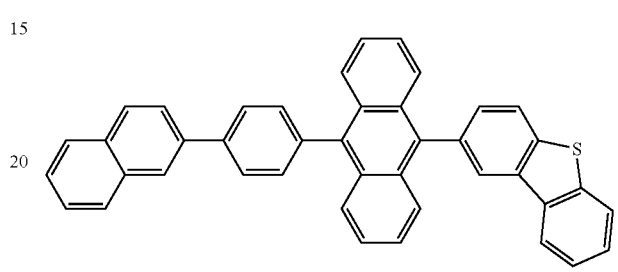
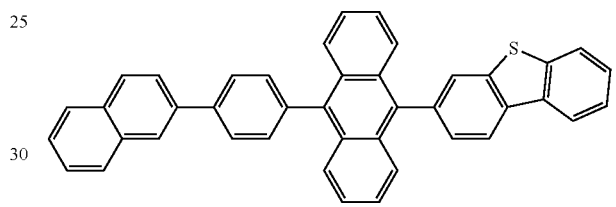
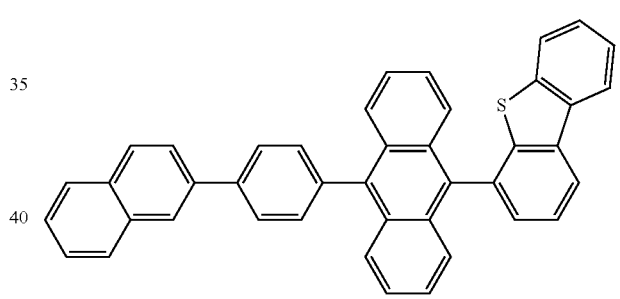
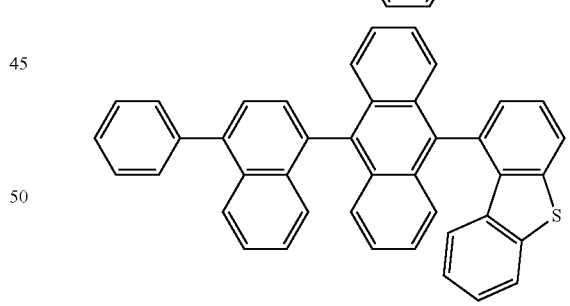
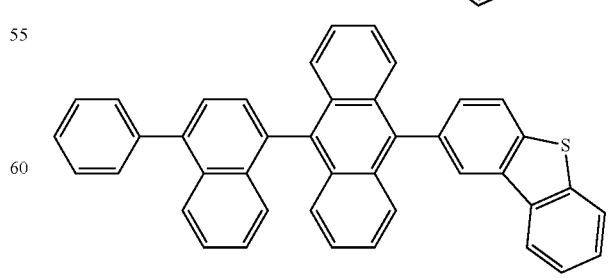

255
-continued
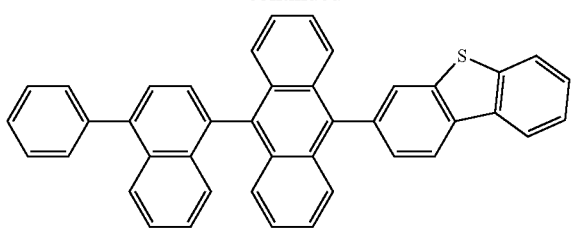
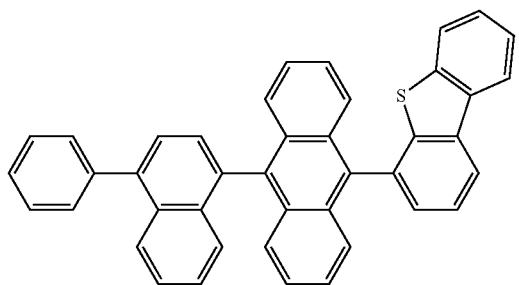
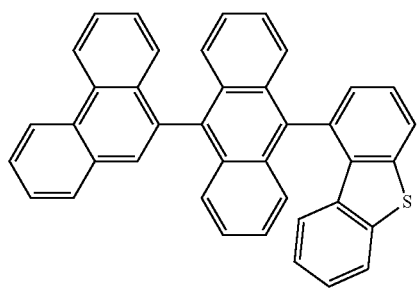
256
-continued
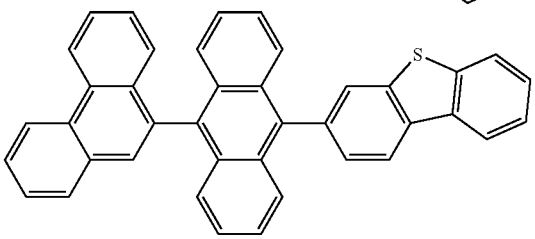
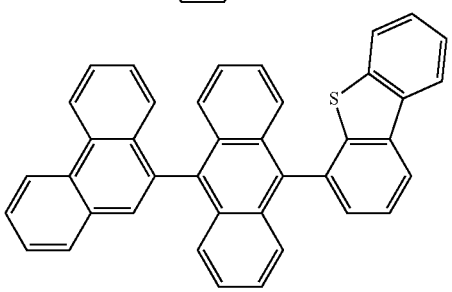
* * * * *

UNITED STATES PATENT AND TRADEMARK OFFICE
CERTIFICATE OF CORRECTION

| | |
|---|---|
| PATENT NO. | : 12,490,653 B2 |
| APPLICATION NO. | : 16/761908 |
| DATED | : December 2, 2025 |
| INVENTOR(S) | : Cha et al. |

Page 1 of 1

It is certified that error appears in the above-identified patent and that said Letters Patent is hereby corrected as shown below:

In the Claims

In Claim 9, at Column 227, the structure at Lines 28-36 should be as follows:

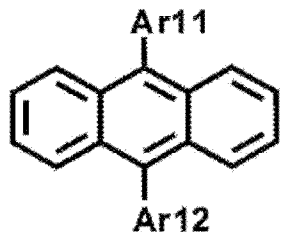

In Claim 12, at Column 251, the third structure at Lines 26-37 should be as follows:

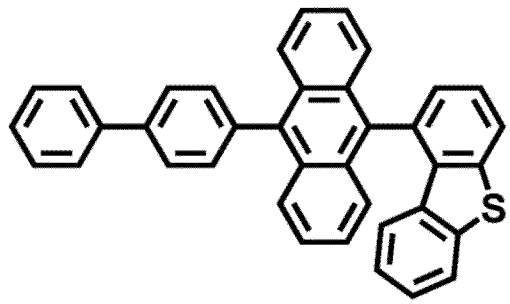

Signed and Sealed this
Twentieth Day of January, 2026

John A. Squires
*Director of the United States Patent and Trademark Office*